United States Patent
Hargis et al.

(10) Patent No.: US 12,292,566 B2
(45) Date of Patent: May 6, 2025

(54) LASER SYSTEMS AND OPTICAL DEVICES FOR LASER BEAM SHAPING

(71) Applicant: IDEX HEALTH & SCIENCE LLC, Rohnert Park, CA (US)

(72) Inventors: David E. Hargis, San Diego, CA (US); John O'Shaughnessy, Carlsbad, CA (US); Jeffrey M. Bendick, Carlsbad, CA (US)

(73) Assignee: IDEX HEALTH & SCIENCE LLC, Rohnert Park, CA (US)

( * ) Notice: Subject to any disclaimer, the term of this patent is extended or adjusted under 35 U.S.C. 154(b) by 829 days.

(21) Appl. No.: 17/390,348

(22) Filed: Jul. 30, 2021

(65) Prior Publication Data
US 2022/0163786 A1    May 26, 2022

Related U.S. Application Data
(60) Provisional application No. 63/059,912, filed on Jul. 31, 2020.

(51) Int. Cl.
| | | |
|---|---|---|
| *G02B 26/08* | (2006.01) | |
| *B81B 3/00* | (2006.01) | |
| *G02B 26/10* | (2006.01) | |

(52) U.S. Cl.
CPC .......... *G02B 26/085* (2013.01); *B81B 3/0067* (2013.01); *G02B 26/105* (2013.01); *B81B 2201/042* (2013.01)

(58) Field of Classification Search
CPC .... G02B 26/10; G02B 26/101; G02B 26/105; G02B 26/08; G02B 26/0816;
(Continued)

(56) References Cited

U.S. PATENT DOCUMENTS

| | | |
|---|---|---|
| 4,296,995 A | 10/1981 | Bickel |
| 4,550,240 A | 10/1985 | Toida et al. |

(Continued)

FOREIGN PATENT DOCUMENTS

| | | |
|---|---|---|
| DE | 41 13 279 | 10/1992 |
| DE | 195 08 754 | 6/1999 |

(Continued)

OTHER PUBLICATIONS

AdlOptica brochure for πShaper 6_6, available from https://web.archive.org/web/20121115085807/http://www.pishaper.com/pdfs/pishaper_6_6_leaflet.pdf, archive date of Nov. 15, 2012.

(Continued)

*Primary Examiner* — Derek S. Chapel
*Assistant Examiner* — Adam W Booher
(74) *Attorney, Agent, or Firm* — Knobbe, Martens, Olson & Bear, LLP

(57) ABSTRACT

Various embodiments of a laser illumination system are disclosed. In an example, a system includes one or more lasers, a beam combiner (if multiple lasers are used) configured to direct a combined light beam along a path, a focusing optical element to receive the light beam and focus the received light towards a focus point, a MEMS mirror positioned to receive light from the focusing optical element and output a moving light beam, moving in an angular range $ar_1$ and at a frequency $f_1$, a collimating element configured to receive the beam output by the MEMS mirror and output a beam that is more collimated than the light received from the MEMS mirror, and a CLA positioned to receive the light beam from the collimating optical element, alter the received light beam, and output a substantially flat-top distribution of light that propagates through an objective lens to a target plane.

30 Claims, 65 Drawing Sheets

(58) Field of Classification Search
CPC ...... G02B 26/0833–0866; G02B 27/09; G02B 27/0911; G02B 27/0916; G02B 27/0927; G02B 27/0933; G02B 27/0938–0977; G02B 19/0052; B81B 3/0067; B81B 2201/04; B81B 2201/042; H01S 3/005
See application file for complete search history.

(56) References Cited

U.S. PATENT DOCUMENTS

| | | | |
|---|---|---|---|
| 4,573,465 A | 3/1986 | Sugiyama et al. | |
| 4,632,554 A | 12/1986 | Pearce | |
| 4,722,591 A | 2/1988 | Haffner | |
| 4,817,101 A | 3/1989 | Wyeth et al. | |
| 4,826,299 A | 5/1989 | Powell | |
| 4,938,593 A | 7/1990 | Morris et al. | |
| 4,983,042 A | 1/1991 | Korner et al. | |
| 5,106,192 A | 4/1992 | Tucker et al. | |
| 5,109,447 A | 4/1992 | Can | |
| 5,147,349 A | 9/1992 | Johnson et al. | |
| 5,152,759 A | 10/1992 | Parel et al. | |
| 5,258,989 A | 11/1993 | Raven | |
| 5,260,578 A | 11/1993 | Bliton et al. | |
| 5,289,557 A | 2/1994 | Sheinis et al. | |
| 5,295,143 A | 3/1994 | Rao et al. | |
| 5,304,167 A | 4/1994 | Freiberg | |
| 5,325,393 A | 6/1994 | Nighan, Jr. et al. | |
| 5,343,038 A | 8/1994 | Nishiwaki et al. | |
| 5,394,492 A | 2/1995 | Hwang | |
| 5,446,532 A | 8/1995 | Yamazaki | |
| 5,491,344 A | 2/1996 | Kenny et al. | |
| 5,544,271 A | 8/1996 | Lim | |
| 5,617,500 A | 4/1997 | Shionoya et al. | |
| 5,633,695 A | 5/1997 | Feke et al. | |
| 5,659,642 A | 8/1997 | King et al. | |
| 5,668,903 A | 9/1997 | Neuberger et al. | |
| 5,674,698 A | 10/1997 | Zarling et al. | |
| 5,698,397 A | 12/1997 | Zarling et al. | |
| 5,736,410 A | 4/1998 | Zarling et al. | |
| 5,771,325 A | 6/1998 | Neuberger | |
| 5,814,820 A | 9/1998 | Dong et al. | |
| 5,823,942 A | 10/1998 | Toida | |
| 5,824,269 A | 10/1998 | Kosaka et al. | |
| 5,866,911 A | 2/1999 | Baer | |
| 5,883,378 A | 3/1999 | Irish et al. | |
| 5,952,668 A | 9/1999 | Baer | |
| 6,048,444 A | 4/2000 | Takahashi et al. | |
| 6,081,544 A | 6/2000 | Zamel et al. | |
| 6,101,201 A | 8/2000 | Hargis et al. | |
| 6,110,165 A | 8/2000 | Ota | |
| 6,133,995 A | 10/2000 | Kubota | |
| 6,175,440 B1 | 1/2001 | Conemac | |
| 6,214,033 B1 | 4/2001 | Ii et al. | |
| 6,215,807 B1 | 4/2001 | Reilly | |
| 6,221,671 B1 | 4/2001 | Groner et al. | |
| 6,222,961 B1 | 4/2001 | Engelhardt et al. | |
| 6,462,345 B1 | 10/2002 | Simon et al. | |
| 6,480,513 B1 | 11/2002 | Kapany et al. | |
| 6,490,309 B1 | 12/2002 | Okazaki et al. | |
| 6,510,001 B1 | 1/2003 | Engelhardt et al. | |
| 6,557,369 B1 | 5/2003 | Phelps et al. | |
| 6,592,822 B1 | 7/2003 | Chandler | |
| 6,603,780 B2 | 8/2003 | Miyai | |
| 6,614,031 B2 | 9/2003 | Engelhardt et al. | |
| 6,654,165 B2 | 11/2003 | Engelhardt et al. | |
| 6,677,566 B2 | 1/2004 | Knebel et al. | |
| 6,737,635 B2 | 5/2004 | Engelhardt et al. | |
| 6,750,457 B2 | 6/2004 | Heffelfinger et al. | |
| 6,836,489 B2 | 12/2004 | Nishimura et al. | |
| 6,867,899 B2 | 3/2005 | Knebel | |
| 6,867,919 B2 | 3/2005 | Seyfried | |
| 6,920,159 B2 | 7/2005 | Sidorin et al. | |
| 6,958,470 B2 | 10/2005 | Hoffmann | |
| 6,980,293 B1 | 12/2005 | Harada | |
| 7,005,654 B2 | 2/2006 | Seyfried | |
| 7,098,447 B2 | 8/2006 | Moellmann | |
| 7,133,130 B2 | 11/2006 | Storz et al. | |
| 7,151,633 B2 | 12/2006 | Storz et al. | |
| 7,280,567 B2 | 10/2007 | Ningyi et al. | |
| 7,280,570 B2 | 10/2007 | Seyfried et al. | |
| 7,330,493 B2 | 2/2008 | Ningyi et al. | |
| 7,394,063 B2 | 7/2008 | Schreiber | |
| 7,426,027 B2 | 9/2008 | Noguchi et al. | |
| 7,428,104 B2 | 9/2008 | Engelhardt | |
| 7,430,231 B2 | 9/2008 | Ningyi et al. | |
| 7,433,119 B2 | 10/2008 | Gugel | |
| 7,457,330 B2 | 11/2008 | Ningyi et al. | |
| 7,468,998 B2 | 12/2008 | Ningyi et al. | |
| 7,474,462 B2 | 1/2009 | Ulrich et al. | |
| 7,489,429 B2 | 2/2009 | Scaggs | |
| 7,505,495 B2 | 3/2009 | Fratti et al. | |
| 7,522,651 B2 | 4/2009 | Ningyi et al. | |
| 7,535,937 B2 | 5/2009 | Ningyi et al. | |
| 7,535,938 B2 | 5/2009 | Ningyi et al. | |
| 7,542,489 B2 | 6/2009 | Ningyi et al. | |
| 7,548,567 B2 | 6/2009 | Kupershmidt et al. | |
| 7,564,624 B2 | 7/2009 | Leimbach et al. | |
| 7,599,115 B2 | 10/2009 | Gugel | |
| 7,599,413 B2 | 10/2009 | Ningyi et al. | |
| 7,606,273 B2 | 10/2009 | Sheng-Bai et al. | |
| 7,633,979 B2 | 12/2009 | Ningyi et al. | |
| 7,660,035 B2 | 2/2010 | Bohm et al. | |
| 7,724,363 B2 | 5/2010 | Wachsmuth et al. | |
| 7,733,932 B2 | 6/2010 | Faybishenko | |
| 7,742,226 B2 | 6/2010 | Bewersdorf et al. | |
| 7,813,390 B2 | 10/2010 | Ningyi et al. | |
| 7,835,601 B2 | 11/2010 | Seyfried et al. | |
| 7,899,105 B1 | 3/2011 | Hargis et al. | |
| 7,903,706 B2 | 3/2011 | O'Shaughnessy et al. | |
| 7,949,025 B2 | 5/2011 | Olea | |
| 7,999,935 B2 | 8/2011 | Dyba | |
| 8,238,389 B2 | 8/2012 | Hargis et al. | |
| 8,403,543 B2 | 3/2013 | Kim et al. | |
| 8,794,802 B2 | 8/2014 | Wu et al. | |
| 8,975,572 B2 | 3/2015 | Hargis | |
| 9,014,224 B2 | 4/2015 | O'Shaughnessy | |
| 9,413,130 B2 | 8/2016 | Hargis et al. | |
| 10,114,213 B2 | 10/2018 | Hargis et al. | |
| 10,401,617 B2 | 9/2019 | Hargis et al. | |
| 2001/0017868 A1 | 8/2001 | Kraenert et al. | |
| 2001/0021210 A1 | 9/2001 | Nakaya et al. | |
| 2002/0061032 A1 | 5/2002 | Miura et al. | |
| 2002/0097772 A1 | 7/2002 | Dautremont-Smith et al. | |
| 2003/0058530 A1 | 3/2003 | Kawano | |
| 2003/0214987 A1 | 11/2003 | Yamanaka et al. | |
| 2004/0027631 A1 | 2/2004 | Nagano et al. | |
| 2004/0210289 A1 | 10/2004 | Wang et al. | |
| 2005/0180474 A1 | 8/2005 | Buchold et al. | |
| 2005/0201441 A1 | 9/2005 | Seyfried et al. | |
| 2005/0207160 A1 | 9/2005 | Babayoff | |
| 2005/0220458 A1 | 10/2005 | Kupershmidt et al. | |
| 2005/0281298 A1 | 12/2005 | Kupershmidt et al. | |
| 2006/0097188 A1 | 5/2006 | Seyfried | |
| 2006/0239317 A1 | 10/2006 | Yoshida et al. | |
| 2006/0245049 A1 | 11/2006 | Knebel | |
| 2006/0273260 A1 | 12/2006 | Casstevens et al. | |
| 2007/0024978 A1 | 2/2007 | Jackson et al. | |
| 2007/0195850 A1 | 8/2007 | Schluter et al. | |
| 2008/0025677 A1 | 1/2008 | Sasaki | |
| 2008/0089369 A1 | 4/2008 | Ningyi et al. | |
| 2009/0097507 A1 | 4/2009 | Zhu et al. | |
| 2009/0257054 A1 | 10/2009 | Hargis et al. | |
| 2009/0274176 A1 | 11/2009 | O'Shaughnessy et al. | |
| 2009/0323203 A1 | 12/2009 | Adams et al. | |
| 2010/0006772 A1 | 1/2010 | Gugel | |
| 2010/0073757 A1 | 3/2010 | Birk et al. | |
| 2010/0111768 A1 | 5/2010 | Banerjee et al. | |
| 2010/0177375 A1 | 7/2010 | Seyfried | |
| 2010/0232011 A1 | 9/2010 | Seyfried | |
| 2011/0063832 A1 | 3/2011 | Hu | |
| 2011/0134949 A1 | 6/2011 | O'Shaughnessy | |
| 2011/0222054 A1 | 9/2011 | Krishnamachari | |
| 2011/0273768 A1 | 11/2011 | Krishnamachari et al. | |
| 2012/0099318 A1 | 4/2012 | Liu | |
| 2014/0160786 A1 | 6/2014 | Hargis | |

(56) References Cited

U.S. PATENT DOCUMENTS

| | | | |
|---|---|---|---|
| 2015/0124227 A1 | 5/2015 | Kobayashi | |
| 2016/0028210 A1 | 1/2016 | O'Shaughnessy | |
| 2018/0203249 A1* | 7/2018 | Filhaber | G02B 27/30 |
| 2020/0026090 A1 | 1/2020 | Hargis et al. | |
| 2020/0096762 A1 | 3/2020 | Hargis et al. | |
| 2021/0210923 A1* | 7/2021 | Song | G01S 7/4817 |

FOREIGN PATENT DOCUMENTS

| | | |
|---|---|---|
| JP | 07-318810 | 12/1995 |
| WO | WO 10/065779 | 6/2010 |

OTHER PUBLICATIONS

*Laser Beam Shaping: Theory and Techniques, Second Edition*, edited by Fred M Dickey, CRC Press-Taylor & Francis Group, p. 314, Jun. 23, 2014.

Olympus Confocal Laser Scanning Biological Microscope, FV1000, Fluoview—Always Evolving, available at http://www.olympusamerica.com/files/seg_bio/fv1000_brochure.pdf.

Osela brochure for Top Hat Beam Shaper, available at https://www.osela.com/wp-content/uploads/2015/08/Top-Hat-beam-shaper.pdf This document appears to be referenced at https://web.archive.org/web/20140424145527/http:/www.osela.com/products/top-hat-beam-shaper/, which was archived Apr. 24, 2014. For the purpose of examination, Applicant requests that this document be treated as having a date of at least as early as Apr. 24, 2014.

Osela High Power Machine Vision Laser, archived Dec. 11, 2019 at:https://web.archive.org/web/20191211192646/http://www.iberoptics.com/en/machine-vision-lasers/osela_high-power-machine-vision-laser-ils-2759.html/.

Osela Line Generating Optics Powell, archived Dec. 11, 2019 at:https://web.archive.org/web/20191211192651/http://www.iberoptics.com:80/en/machine-vision-lasers/osela_line-generating-optics-powell-4043.html.

Osela Machine Vision Laser Streamline, archived Dec. 11, 2019 at:https://web.archive.org/web/20191211192701/http://www.iberoptics.com:80/en/machine-vision-lasers/osela_machine-vision-laser-streamline-ose-sl-2757.html.

Osela Machine Vision Lasers, archived Dec. 11, 2019 at:https://web.archive.org/web/20191211192711/http://www.iberoptics.com:80/en/machine-vision-lasers/osela_osela-machine-vision-lasers-2756.html.

Osela Mini Machine Vision Laser Compactline, archived Dec. 11, 2019 at:https://web.archive.org/web/20191211192706/http://www.iberoptics.com:80/en/machine-vision-lasers/osela_mini-machine-vision-laser-compactline-ose-cl-2760.html.

Osela Pulsed Machine Vision Laser, archived Dec. 11, 2019 at:https://web.archive.org/web/20191211192716/http://www.iberoptics.com/en/machine-vision-lasers/osela_pulsed-machine-vision-laser-slp-4054.html.

Powell Lens Buyer's Guide, downloaded from http://www.laserlineoptics.com/powell_primer.html on Mar. 13, 2015.

About the Powell Lens, with an archive date of Aug. 9, 2012, available at:https://web.archive.org/web/20120809013246/http://laserlineoptics.com/powell_primer.html.

* cited by examiner

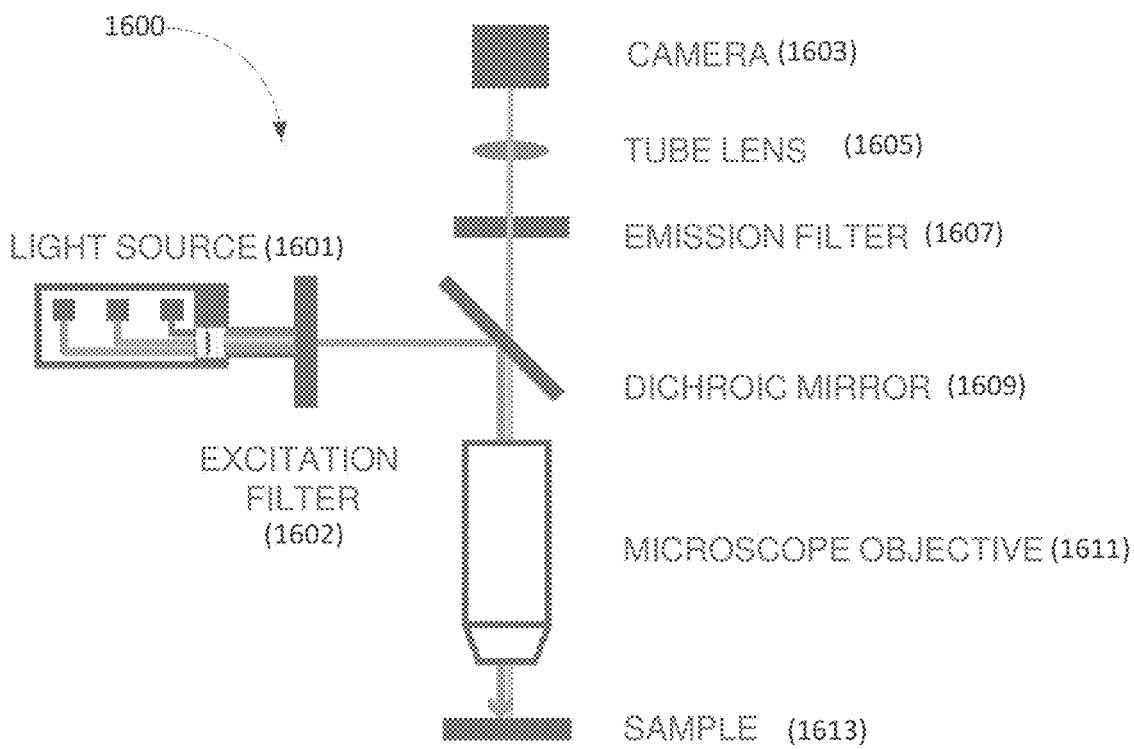
*FIG. 16*
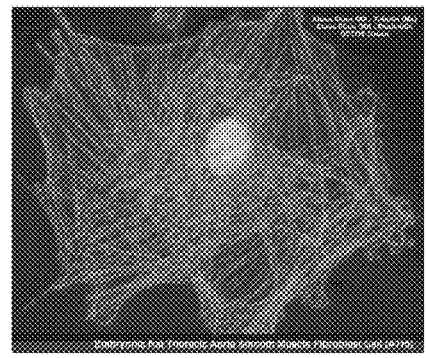
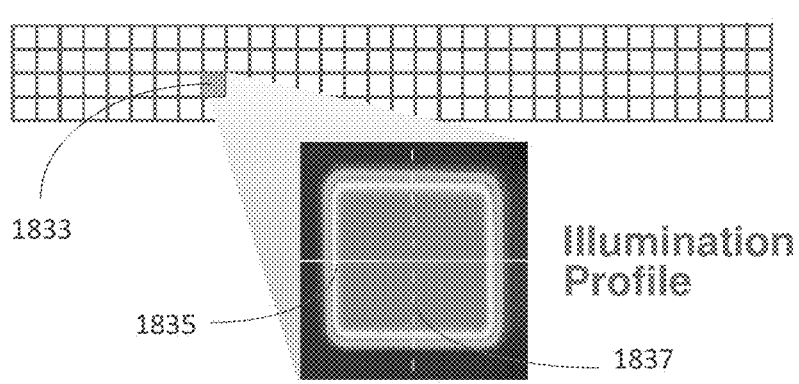
*FIG. 18*

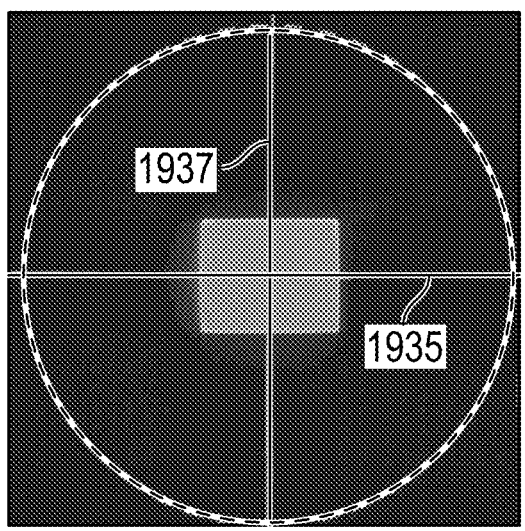
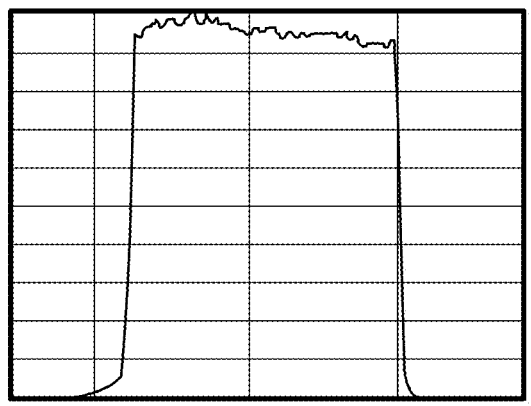
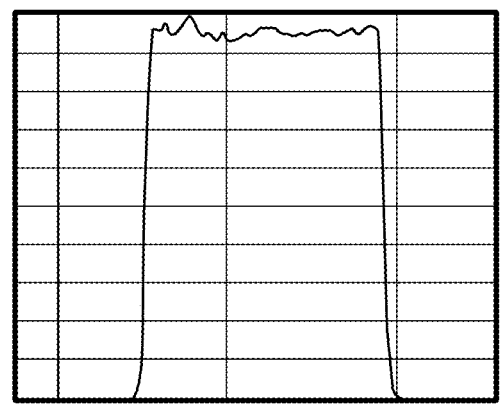
FIG. 19B

LASER SYSTEMS AND OPTICAL DEVICES FOR LASER BEAM SHAPING

CROSS-REFERENCE TO RELATED APPLICATIONS

This non-provisional patent application claims priority under 35 U.S.C. 119(e) from U.S. Provisional Application Ser. No. 63/059,912 filed on Jul. 31, 2020 entitled "LASER SYSTEMS AND OPTICAL DEVICES FOR LASER BEAM SHAPING", which is hereby incorporated by reference herein in its entirety.

BACKGROUND

Field

This disclosure generally relates to optical (e.g., fluorescent, spectroscopic, scatter) analysis of biological samples contained in flow cells and to, for example, compact, thermally stable multi-laser systems configured to couple to flow cells, optical fibers, or other target objects and to provide illumination thereto.

This disclosure also relates generally to optical systems for directing light to a sample contained in a flow cell.

Description of Related Art

Optical analysis of samples contained in flow cells, such as laser-induced fluorescence, involves illuminating biological samples with laser light in order to test samples which may, for example, be tagged with fluorescent dyes. Fluorescent dyes absorb light at certain wavelengths and in turn emit their fluorescence energy at a different wavelength. This emission can be detected to ascertain properties of the sample contained in the flow cell. Existing systems for fluorescent analysis of flow cells, however, suffer from various drawbacks, such as measurement error.

SUMMARY

Embodiments described herein have several features, no single one of which is solely responsible for their desirable attributes. Without limiting the scope of the invention as expressed by the claims, some of the advantageous features will now be discussed briefly.

Various embodiments described herein provide the ability to perform optical measurements on samples contained in flow cells while addressing some of the drawbacks encountered with conventional approaches, such as laser beam alignment to the flow cell, achieving uniform intensity over a cross-sectional area of the flow cell and/or achieving a sufficiently small spot size configured to selectively illuminate a portion of the flow cell.

Various embodiments described herein provide advantages such as uniformity of intensity of light, beam shape of the illuminating light and intensity noise in the illuminating light. A wide range of embodiments are disclosed. In some implementations, a system includes lasers configured to output light, a beam combiner aligned to receive light from the lasers and direct a combined light beam along a path, a focusing optical element to receive the combined light beam and focus the received light towards a focus point, a MEMS mirror positioned to receive light from the focusing optical element and output a moving light beam, moving in an angular range $ar_1$ and at a frequency $f_1$, a collimating element configured to receive the beam output by the MEMS mirror and output a beam that is more collimated than the light received from the MEMS mirror, and a cylindrical lens array (CLA) positioned to receive the light beam from the collimating optical element, alter the light received from the collimating optical element, and output a substantially flat-top distribution of light.

One innovation is an illumination system that includes two or more lasers configured to output light, one or more beam combiners aligned to receive light from the two or more lasers and direct a combined light beam along a path, a focusing optical element configured to receive the combined light beam and focus the received light towards a focus point, and a microelectromechanical system (MEMS) mirror positioned to receive light propagating from the focusing optical element and configured be driven to output a moving light beam, moving in a certain angular range $ar_1$ and at a certain frequency $f_1$. The moving beam can be moved to have a motion vector in a first direction (e.g., along an x-axis) and/or a second direction (e.g., along a y-axis), the first and second direction being orthogonal. The system can also include a collimating optical element configured to receive the moving light beam output by the MEMS mirror. The collimating optical element outputs a light beam that is more collimated than the light received from the MEMS mirror (that is, that has been reflected from the MEMS mirror). In some embodiments, a mirror galvanometer is used instead of the MEMS mirror. The system also includes a cylindrical lens array (CLA) positioned (or aligned) to receive the light beam from the collimating optical element, and configured to alter the distribution of light received from the collimating optical element. The CLA is a 1D cylindrical array of lenses. The CLA is configured to output a substantially flat-top line beam from the light received from the collimating optical element. The system can also include an objective lens system positioned to receive light from the CLA and propagate an output beam to a sample plane, the output beam being a flat top line beam, or a substantially flat top line beam. In some examples, the illumination system includes only one laser (e.g., a laser diode), and accordingly such systems do not include a beam combiner.

Various embodiments can include one or more other features or characteristics. For example, in some embodiments the MEMS mirror is driven to move the light beam back and forth in the angular range $ar_1$, and at a frequency $f_1$. In some embodiments, the CLA includes an array of cylindrical lenses (or lenslets). The angular range $ar_1$ of the moving light beam output from the MEMS mirror is such that the centroid of the light beam received at the CLA moves across a surface of the CLA a distance that is less than or equal to a dimension (e.g., width) of a lens of the CLA (e.g., a lenslet width). For example, the lenslet width d illustrated in FIG. 42. In some embodiments, the distance is less than or equal to 10% of the width of a lens of the CLA. In some embodiments, the distance is less than or equal to 20%, 30%, 40%, 50%, 60%, 70%, 80%, 90%, or 100% of the width of a lens of the CLA. In some embodiments, the two or more lasers comprises three lasers. In some embodiments, only one laser is used, and a beam combiner is not needed. The one or more beam combiners may include one or more dichroic mirrors. In some embodiments, the illumination system further includes a set of beam conditioning optics for each laser, each set of beam conditioning optics positioned and configured to receive light from one of the lasers and provide an output beam to the one or more beam combiners. The beam conditioning optics can include anamorphic prisms that shape the laser beam to be more of an elliptical shape (e.g., when viewed in a plane orthogonal to the beam direction. In some embodiments, the MEMS mirror moves the light beam to have an angular range ar1 of less than two degrees. In some embodiments, the angular range ar1 is less than one degree. In some embodiments, the angular range ar1 is less than 0.5 degrees. In various implementations, the frequency f1 of the moving light beam can be between 0.1 and 50 kHz. For example, in some embodiments, the frequency f1 is between 50 Hz and 10 kHz, depending on the application. The MEMS mirror can move the light beam in one dimension, or in two dimensions. In many implementations, all or nearly all of the movement of the light beam by the MEMS mirror is in one direction to keep the beam on a one-dimensional beam shaper (e.g., a cylindrical lens array). In an example, the MEMS mirror is driven to move an incident light beam in a first direction (e.g., an angular range ar1 of less than two degrees) and also moves the light beam in a second direction orthogonal to the first direction. The movement of the light beam in the second direction can be at an angular range ar2 that is a fraction of the angular range ar1 of the movement in the first direction (e.g., which provides for a small amount of dithering in the second direction). In an example, the MEMS mirror can be driven to provide movement of the light beam in the second direction at an angular range ar2 that is less than 50% of the movement of the angular range ar1. Typically, when the MEMS mirror moves the beam in a second direction, the angular movement in the second direction is less than 10% of the movement in the first direction, and can be less than 1% or 01.% of the movement in the first direction. In other some examples, the MEMS mirror is driven to produce movement of the light beam in the second direction at an angular range ar2 that is less than 40%, 30%, 20%, 10%, 5%, 4%, 3%, 2%, 1%, 0.5%, 0.4%, 0.3%, 0.2%, or 0.1% of the movement of the light beam in the first direction in the angular range $ar_1$. In some embodiments, the illumination system also includes a diffuser positioned between the collimating optical element and the CLA. In some embodiments the diffuser comprises glass. In some embodiments the diffuser comprises an engineered diffuser.

Another innovation includes a method of illuminating a target, the method comprising receiving light from one or more lasers at one or more beam combiners, each of the one or more beam combiners aligned to receive light from a corresponding one of the one or more lasers, combining, by the one or more beam combiners, the received light and directing the received light along a common path, receiving the light propagating along the common path at a focusing optical element and focusing the light towards a focus point, receiving the focused light at a MEMS mirror positioned to receive light propagating from the focusing optical element and configured to output a moving light beam, moving in a certain angular range arm and at a certain frequency f1, receiving light output by the MEMS mirror at a collimating optical element and output collimated light, and receiving the collimated light at a cylindrical lens array (CLA), and propagate light from the CLA to a target. In some embodiments, the target comprises a flow cell.

Another innovation includes an illumination system, comprising at least one laser configured to emit light, a mirror system positioned to receive light emitted from the at least one laser, the mirror system driven to provide a moving light beam moving in a first angular range ar1 along a first direction and at a certain frequency f1, a collimating optical element configured to receive the moving light beam from the mirror system and output a light beam that is more collimated than the light received from the mirror system, a cylindrical lens array (CLA) positioned to receive the light beam from the collimating optical element and configured to alter the distribution of light received from the collimating optical element and output a substantially flat-top distribution of light, and an objective lens system positioned to receive the light from the CLA and propagate an output beam to a sample plane, the output beam being a flat top line beam. In some embodiments, the mirror system comprises a mirror galvanometer. In some embodiments, the mirror system comprises a MEMS mirror.

Another innovation includes a method of illuminating a target, the method comprising outputting a light beam from at least one laser, receiving the collimated light beam at a MEMS mirror positioned to receive the light from the laser, and driving the MEMS mirror to provide a moving light beam moving in a first angular range ar1 along a first direction and at a certain frequency f1, receiving the moving light beam from the MEMS mirror at a cylindrical lens array (CLA) which forms the collimated light into a flat top line beam, and propagating the flat top line beam through an objective lens positioned to receive the light from the CLA, and propagating an output beam to a sample plane, the output beam being a flat top line beam. In some embodiments, the target comprises a flow cell. In some embodiments, the method further comprises driving the MEMS mirror such that the moving light beam has motion in a first direction and a second direction that is orthogonal to the first direction. In some implementations, the motion of the moving light beam in the first direction is larger than the motion of the moving beam in the second direction. In some preferred embodiments, the motion of the moving light beam in the second direction provides a small amount of dithering of the beam to mitigate noise in the flat top line beam. In an example, the motion of the moving light beam in the first direction is up to 5× larger than the motion of the moving beam in the second direction. In another example, the motion of the moving light beam in the first direction is up to 10× larger than the motion of the moving beam in the second direction. In another example, the motion of the moving light beam in the first direction is up to 100× larger than the motion of the moving beam in the second direction. In another example, the motion of the moving light beam in the first direction is up to 1000× larger than the motion of the moving beam in the second direction. In another example, the motion of the moving light beam in the first direction is up to 10000× larger than the motion of the moving beam in the second direction.

Another innovation includes a method of illuminating a target, the method comprising outputting a light beam from at least one laser, receiving the collimated light beam at a MEMS mirror positioned to receive the light from the laser, and driving the MEMS mirror to provide a moving light beam moving in a certain angular range ar1 and at a certain frequency $f_1$, receiving the moving light beam from the MEMS mirror, receiving the collimated light at an engineered diffuser which forms the light into a flat top line beam, propagate the light through an objective lens system positioned to receive the light from the engineered diffuser, and propagate the flat top line beam to a target. In some embodiments, the target comprises a flow cell. In some embodiments, the method further comprises driving the MEMS mirror such that the moving light beam has motion in a first direction and a second direction that is orthogonal to the first direction. In some embodiments, the motion of the moving light beam in the first direction is larger than the motion of the moving light beam in the second direction.

Various embodiments disclosed herein, for example, comprise a laser system for directing light for optical measurements, such as laser-induced fluorescence. The laser system can include a thermally conductive housing defining an interior chamber, and a thermoelectric controller thermally coupled to the housing. The laser system can include a plurality of optical input ports, and the optical input ports can be configured to engage a plurality of lasers and or light emitting diodes (LEDs). The lasers and or LEDs can be free-space, fiber coupled, or a combination of free space and fiber coupled. The plurality of lasers and or LEDs can be collimated to generate a plurality of laser and or LED beams which can be combined using dichroic beam combiners to produce a single beam of multiple wavelengths. This single multi-wavelength beam can then be focused towards a moving diffuser with a focusing lens. The size of the beam on the moving diffuser can be controlled by the separation between the lens and the moving diffuser, the focal length of the lens and the diameter of the single multi-wavelength beam incident on the focusing lens.

The thermoelectric controller can be configured to maintain the interior chamber at a substantially constant temperature.

The plurality of beams of light produced by the one or more optical elements can comprise a plurality of substantially elliptical beams of light. The one or more optical elements can comprise a plurality of anamorphic microlenses. The laser system can include one or more output windows, and the one or more output windows can be configured to transmit the beams of light out of the internal chamber.

The flow cell connector can be configured to attach the flow cell to the outside of the housing. The housing can be hermetically sealed.

Certain innovations disclosed here are related to optical analysis of biological samples contained in flow cells. Certain innovations disclosed here are related to optical fibers connected to confocal microscopes, or "lab-on-a-chip" devices. For example, certain innovations are related to compact, thermally stable multi-laser systems configured to couple to flow cells, optical fibers, or other target objects and to provide illumination thereto. Aspects of this disclosure are related to, and can be used in, optical systems for directing light to a sample contained in a flow cell. Aspects of this disclosure are related to, and can be used in, a compact, thermally stable, optical fiber array attachable to a flow cell for directing laser light to the flow cell for optical measurements such as laser-induced fluorescence.

An innovation includes an illumination system that can be used to direct light at targets for optical measurements. The illumination system can include one or more lasers. The illumination system can include a thermally conductive housing defining an interior chamber, and a thermoelectric controller thermally coupled to the housing. The illumination system can include a plurality of optical input ports, and the optical input ports can be configured to engage a plurality of input optical fibers and receive light from the input optical fibers. The illumination system can include a plurality of waveguides contained within the interior chamber, and the waveguides can be configured to receive the light from the optical input ports and output the light into the internal chamber. The illumination system can include one or more optical elements configured to receive the light output by the waveguides and output a plurality of beams of light. The illumination system can include a flow cell connector configured to attach a flow cell to the housing, and the flow cell connector can be configured to position the flow cell to intersect the beams of light.

An innovation includes an illumination system, including one or more lasers configured to output light having at least one wavelength, one or more beam combiners each aligned to receive light from a corresponding one of the one or more lasers, the one or more beam combiners configured to direct the received light along a path, a focusing optical element configured to receive light from the one or more beam combiners and focus the received light towards a focus point, a diffuser positioned spaced apart from the focus point to receive defocused light from the focusing element, the diffuser configured to diffuse the received defocused light and output diffused light, an actuator coupled to the diffuser and configured to vibrate the diffuser, a collimating optical element configured to receive light output by the diffuser and configured to substantially collimate the light, and a microlens array configured to receive light output by the diffuser and configured to alter the distribution of light.

Various embodiments of the illumination systems disclosed here can include one, all, or any combination of features of this paragraph, or other features disclosed herein. The one or more lasers can include a plurality of lasers. The one or more beam combiners can include one or more dichroic mirrors. The illumination system can include at least one filter configured to filter a portion of the light output by a corresponding one of the one or more lasers. The diffuser of the illumination system can be positioned (or located) between the focusing optical element and the focus point to diffuse the light as the light is converging towards the focus point. The diffuser of the illumination system can be positioned (or located) between the focus point and the collimating optical element to diffuse the light as the light is diverging away from the focus point. The diffuser can be positioned (or located) so that light from the focusing element forms a spot on the diffuser, the spot having a first width along a first direction and a second width along a second direction that is orthogonal to the first direction, the first width being larger than the second width, and wherein the actuator is configured to vibrate the diffuser in the first direction. The focusing element can be configured so that light from the focusing element forms a spot on the diffuser, the spot having a first width along a first direction and a second width along a second direction that is orthogonal to the first direction, the first width being larger than the second width, and wherein the actuator is configured to vibrate the diffuser in the first direction. The diffuser can be positioned so that light from the focusing element forms a spot on the diffuser, the spot having a first width along a first direction and a second width along a second direction that is orthogonal to the first direction, the first width being larger than the second width, and wherein the actuator is configured to vibrate the diffuser in the first direction. The diffuser can be positioned at a location, and the focusing element can be configured, so that light from the focusing element forms a spot on the diffuser, the spot having a first width along a first direction and a second width along a second direction that is orthogonal to the first direction, the first width being larger than the second width, and wherein the actuator is configured to vibrate (or rapidly move) the diffuser in the first direction. The actuator can be configured to vibrate (or rapidly move) the diffuser in a one-dimensional motion. The actuator can be configured to vibrate (or rapidly move) the diffuser in a two-dimensional motion in a plane that is substantially orthogonal to the optical axis of the focusing optical element. The actuator can be configured to vibrate the diffuser in a circular motion. The microlens array can be configured to output a substantially flat-top distribution of light. The diffuser can be positioned at least about 0.2 mm from the focus point, for example, at a location so that the light focused by the focusing optical element is incident of the diffuser before the light reaches the focus point, or at a location so that the light focused by the focusing optical element is incident on the diffuser after the light propagates through the focus point. The focusing optical element can be configured to focus the light to a spot having a first area at the focus point. The diffuser can be positioned so that the light focused by the focusing optical element forms a spot on the diffuser that has a second area larger than the first area. The second area can be at least about 50% larger than the first area. The illumination system can further include one or more additional optical elements configured to receive light from the micro-lens array and focus the received light onto a target.

Another innovation includes an illumination system including one or more light sources, a focusing optical element configured to receive light emitted by the one or more light sources and focus the received light towards a focus point, and a dynamic diffuser positioned to receive light propagating through the focusing optical element and to vibrate to diffuse the received light, the position of the optical element being at a location other than the focus point. The focusing optical element of the illumination system can include an aspherical lens. The dynamic diffuser can be positioned (or located) between the focusing optical element and the focus point so that the light being focused by the focusing optical element impinges on the dynamic diffuser before reaching the focus. The dynamic diffuser can be positioned (or located) so that the light being focused by the focusing optical element impinges on the dynamic diffuser before reaching the focus point. The focusing optical element can be configured such that light focused by the focusing optical element forms a spot of light on the dynamic diffuser that is generally elliptical in shape, having a major axis and a minor axis. The dynamic diffuser is configured to move in at least one dimension in the same direction (or substantially the same direction) as the major axis. The system can include an actuator that vibrates (or moves) the diffuser. In some embodiments, the dynamic diffuser is configured to move in a direction along a line that is parallel, or substantially parallel, to the major axis.

An innovation includes a method of illuminating a target, the method comprising receiving light from one or more lasers by one or more beam combiners, each of the one or more beam combiners aligned to receive light from a corresponding one of the one or more lasers; combining, by the one or more beam combiners, the received light and directing the received light along a common path, receiving propagating along the common path at a focusing optical element and focusing the light towards a focus point, receiving the focused light at a diffuser positioned at a location spaced apart from the focus point, diffusing the light, at least in part by vibrating the diffuser, and outputting diffused light, receiving light output by the diffuser at a collimating optical element configured to collimate the light from the diffuser, and receiving the collimated light at a microlens array, the microlens array configured to alter the distribution of the collimated light for illuminating a target. The target can be a flow cell, or contained in a flow cell. The diffuser can be positioned between the focusing optical element and the focus point. The diffuser can be positioned between the focus point and the collimating optical element. The method can further include vibrating the diffuser by moving the diffuser in a circular motion. Vibrating the diffuser includes moving the diffuser in a two-dimensional motion in a plane. The two-dimensional motion can be substantially orthogonal to an optical axis of the focusing optical element.

BRIEF DESCRIPTION OF THE DRAWINGS

The following drawings and the associated descriptions are provided to illustrate embodiments of the present disclosure and do not limit the scope of the claims.

FIG. 11A depicts parallel collimated beams with identical beam separations, $d_0$.

FIG. 11N depicts co-linear focused beams.

FIG. 16 illustrates an embodiment of an optical system configured to analyze a sample, for example using laser induced fluorescence.

FIG. 18 illustrates an example of a flow cell comprising an array of tiles.

FIG. 19B depicts an example of a uniform intensity profile obtained by shaping the intensity profile for light output by an example light source shown in FIG. 19A using a beam shaping optical system.

FIG. 23D shows the beam profile with the spacing between the dynamic diffuser and focusing lens equal to the focal distance.

DETAILED DESCRIPTION

Although certain preferred embodiments and examples may be disclosed herein, inventive subject matter extends beyond the specifically disclosed embodiments to other alternative embodiments 79
and/or uses of the inventions, and to modifications and equivalents thereof. Thus, the scope of the inventions herein disclosed is not limited by any of the particular embodiments described below. For example, in any method or process disclosed herein, the acts or operations of the method or process may be performed in any suitable sequence and are not necessarily limited to any particular disclosed sequence.

For purposes of contrasting various embodiments with the prior art, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Figure 1:
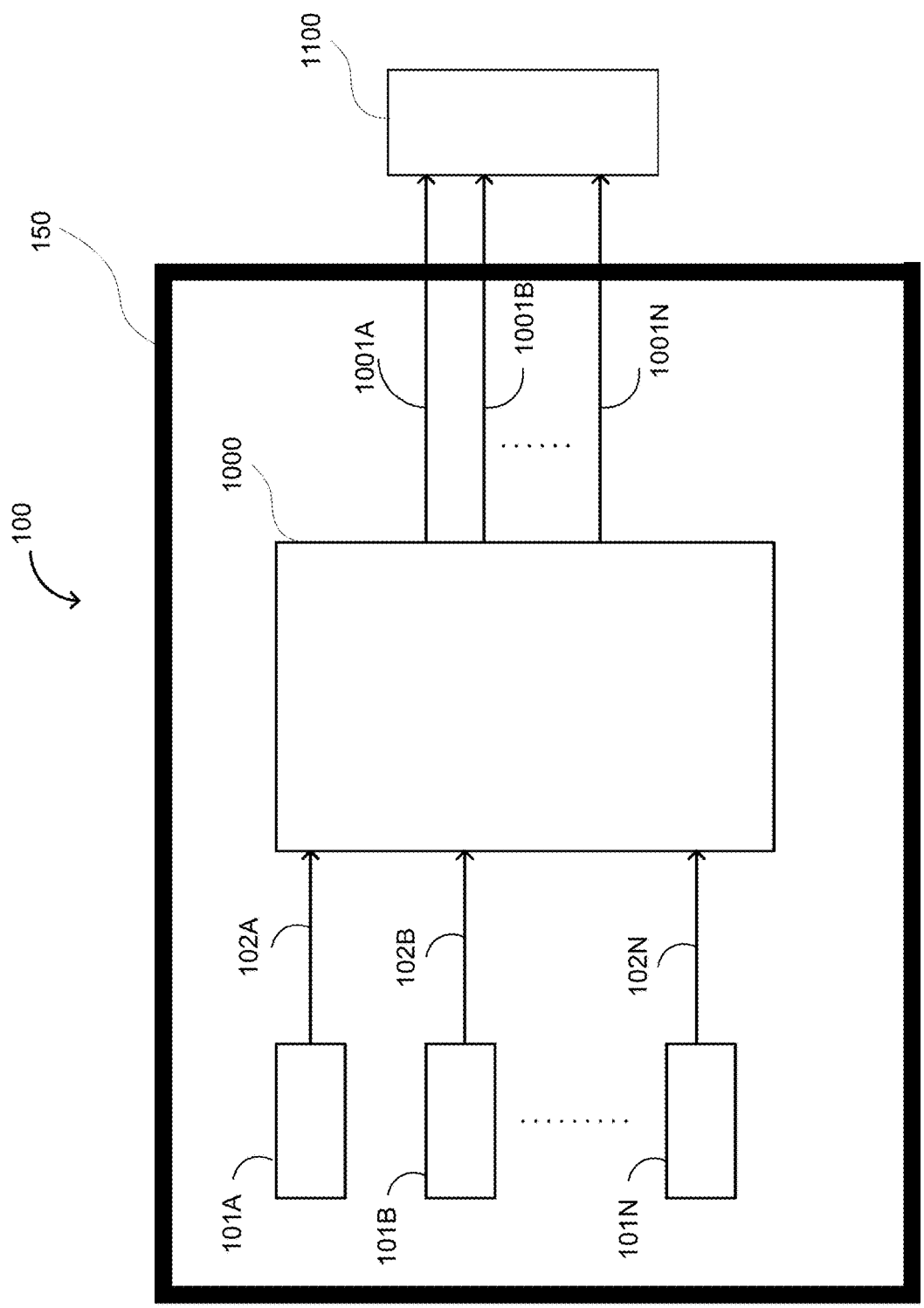
FIG. 1 depicts an example embodiment of a multi-laser system.

FIG. 1 depicts an example embodiment of a multi-laser system. The multi-laser system 100 depicted in FIG. 1 may comprise a mounting mechanism, mounting system (e.g., mounting alignment system), etc. for a flow cell, a flow cell mount, a light pipe, a waveguide, an optical fiber, and/or a lab on a chip.

In some embodiments, the temperature across the enclosure may be stable over time and with changes in the ambient temperature. The constant temperature over time may help with long term system performance. For example, if the enclosure temperature were to change with time, then the system performance would also potentially degrade with time. This could eventually result in servicing the system, e.g., to realign the system.

The thermally stable enclosure 150 comprises a material with high thermal conductivity. In some embodiments, a material with thermal conductivity of at least about 5 W/(m K), (e.g., between about 5 W/(m K) and about 2000 W/(m K)) is used. In some embodiments, a material with thermal conductivity at least about 50 W/(m K) (e.g., between about 50 W/(m K) and about 2000 W/(m K)) is used. In other embodiments, a material with thermal conductivity of about 375 W/(m K) or greater is used. In other embodiments, a material with thermal conductivity of at least about 380 W/(m K) is used. In some embodiments, a material with thermal conductivity between about 125 W/(m K) and about 425 W/(m K)) is used. In some embodiments, a material with thermal conductivity between about 375 W/(m K) and about 425 W/(m K)) is used. In some embodiments, a material with thermal conductivity between about 125 W/(m K) and about 250 W/(m K)) is used. In some embodiments, a material with thermal conductivity between about 200 W/(m K) and about 250 W/(m K)) is used. In some embodiments, the material has a heat capacity corresponding o the heat capacity of the materials described herein. The use of such thermally conductive material helps ensure a relatively reduced temperature variation within the enclosure 150, even when the ambient temperature outside of the enclosure varies relatively widely.

As described more fully below, a temperature controller in thermal contact with the enclosure adjusts the temperature of the enclosure in response to variations in ambient conditions. A highly thermally conductive enclosure enables the temperature controller to more quickly and effectively maintain the enclosure and system temperature without temperature gradients in response to such variations in ambient conditions. A variety of thermally conductive materials can be used (e.g., copper, aluminum, copper tungsten, ceramics, epoxy, etc.). In some embodiments, a material with a thermal conductivity of at least 5 W/(m K) may be used. In other embodiments, a material with a thermal conductivity of less than 5 W/(m K) may be used. The thermally conductive material can be used to form the entire enclosure, or merely a portion thereof. In certain embodiments, the enclosure can include, or can substantially include, highly thermally conductive material. For example, highly thermally conductive material can be used to form the top, the bottom, or any number of the sides of the enclosure 150, or any combination thereof. In some embodiments, a majority of the enclosure 150 is made of the thermally conductive material. In some embodiments, only a relatively small portion of the enclosure 150 is made of the thermally conductive material. In some embodiments, a portion of the enclosure 150 is made of the substantially thermally conductive material. In some embodiments, multiple thermally conductive materials can be used, with some areas of the enclosure 150 being more thermally conductive than others.

The multi-laser system 100 includes a plurality of lasers 101A-101N, enclosed within the thermally stable enclosure 150. The plurality of lasers 101A-101N may comprise diode lasers, solid-state lasers, frequency-doubled lasers, and/or other types of lasers. The plurality of lasers 101A-101N output a plurality of respective laser beams 102A-102N. Each of the laser beams 102A-102N may have a wavelength different from the other laser beams.

As shown in FIG. 1, the multi-laser system 100 further includes a beam positioning system 1000. To achieve a desired spatial arrangement of the laser beams 102A-102N, the inherent laser beam boresight and centration errors present in lasers 101A-101N, as well angular and lateral positioning errors present in the multi-laser system's opto-mechanical components can be compensated for. In some embodiments, the beam positioning/combining system 1000 may include mechanical and/or opto-mechanical provisions to perform such compensation.

Mechanical provisions to the laser mounting may be used to adjust the angular and/or lateral position of the lasers so that the boresight and centration errors of the lasers 101A-101N as well as the angular and lateral positioning errors of the opto-mechanical components are compensated for. The aligned laser beams may then be positioned or combined by the beam positioning/combining system 1000 into a desired spatial arrangement that a specific application requires.

Opto-mechanical provisions to the beam positioning/alignment system may be used to allow for angular and lateral position adjustment of the laser beams. This adjustment capability may help compensate for the lasers' boresight and centration errors as well as the angular and lateral positioning errors of the opto-mechanical components to achieve a desired spatial arrangement of the laser beams.

In embodiments in which the system is used perform testing of biological samples, flow cells are illuminated with laser beams. Fluorescent dyes absorb light at certain wavelengths and in turn emit their fluorescence energy at a different wavelength. This emission can be detected to ascertain properties of the fluid in the flow cell. Temperature variations may cause the wavelength and/or the intensity of light output by the lasers to vary. Such variations in the laser beams directed into the flow cell may cause fluctuations in output fluorescent signals, which may introduce inaccuracy in the optical measurements. Temperature variations and/or temperature gradients also may cause movement of the optical elements (e.g., due to thermal expansion) and resultant shifting of the laser beams. These pointing errors may cause the laser beams to deviate from the flow cell, such that the signal changes, or is altogether lost, again introducing inaccuracy in the test results.

Temperature variations can result from ambient temperature fluctuations. Accordingly, reducing the temperature variation of and the presence of temperature gradients within the laser beam system can improve the accuracy and usability of the test results.

Figure 2:
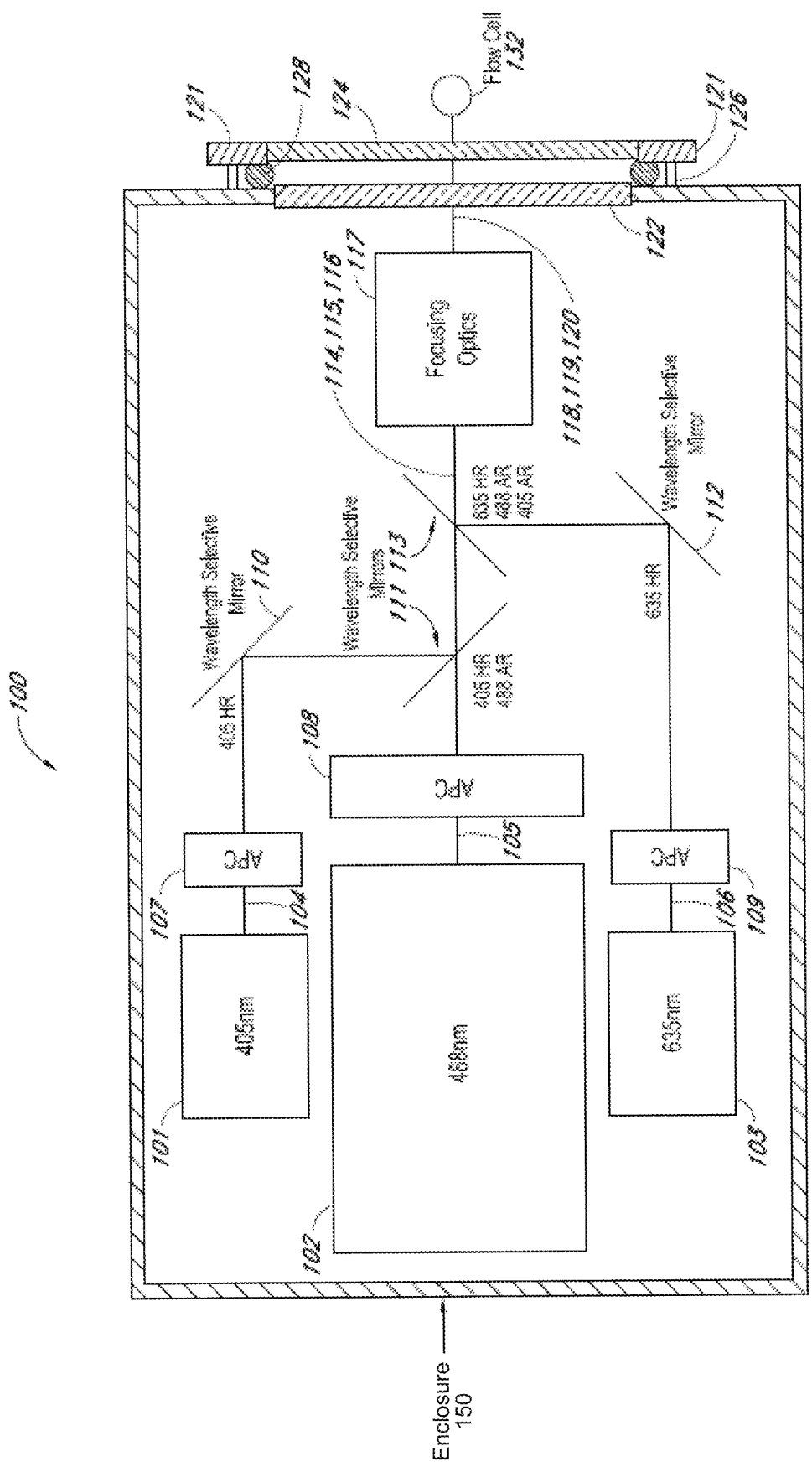
FIG. 2 depicts another example embodiment of a multi-laser system.

Various embodiments described herein may address one or more of these problems. FIG. 2 is a top view of another example embodiment of the multi-laser system 100. The multi-laser system 100 depicted in FIG. 2 comprises a thermally stable enclosure 150 configured to mechanically and/or thermally couple to a flow cell 132. The thermally stable enclosure 150 helps to isolate the laser and optics within the enclosure 150 from the ambient environment, which may have varying temperature. In some embodiments, the enclosure 150 can achieve thermal stability through the use of a temperature controller, as discussed in relation to FIG. 3 below. In various embodiments, the enclosure 150 helps reduce variations in the temperature of the various components of the multi-laser system 100. By maintaining the temperature within the enclosure within a relatively small range, thermally induced laser wavelength and intensity fluctuations as well as pointing instabilities of the laser beams can be reduced or minimized and alignment of the laser beams to a target object may be maintained over a range of ambient temperatures (e.g., between about 10° C. and about 55° C.). Accordingly, the use of a thermally stable enclosure 150 may help achieve more accurate test results.

Some materials expand and contract when heated or cooled. Changes in the enclosure temperature or temperature variations across the enclosure can result in a change in the relative positions of lasers, mirrors, lenses, and the target object (e.g., flow cell). Some lasers exhibit beam pointing that is temperature dependent. This may be due in part to the fact that different materials are used in the construction of the laser (e.g., metals, glass, adhesives, etc.). The different materials may have different thermal expansion coefficients, which may cause beam deviations when the laser system's temperature changes. Some mirror and lens systems also show some temperature dependence for the same reason.

The multi-laser system 100 depicted in FIG. 2 includes a plurality of lasers 101, 102, 103 enclosed within the thermally stable enclosure 150. Although FIG. 2 includes three lasers, a different number of lasers can be used. The multi-laser system 100 shown in FIG. 2 includes a 405 nm laser, a 488 nm laser and a 635 nm laser, but other wavelengths can also be used (e.g., lasers having wavelengths of 375 nm, 440 nm, 515 nm, 561 nm, 594 nm, 640 nm, etc.).

The plurality of lasers 101, 102, 103 output a plurality of respective laser beams 104, 105, 106. Laser beam 104 has a first wavelength, laser beam 105 has a second wavelength, and laser beam 106 has a third wavelength. The first, second, and third wavelengths are different from one another. In FIG. 2, these wavelengths are 405 nm, 488 nm and 635 nm, respectively, but other wavelengths can also be used (e.g., 375 nm, 440 nm, 515 nm, 561 nm, 594 nm, 640 nm, etc.).

As shown in the example embodiment of FIG. 2, the multi-laser system 100 further includes a plurality of automatic power control (APC) modules 107, 108, 109. In some embodiments, the APC modules 107, 108, 109 may each comprise a beamsplitter (not shown) and a photodetector (not shown) configured to sample light from the laser beams 104, 105, 106, respectively, and to feed back the signal from the detector in communication with a laser controller (not shown) to adjust the output power of lasers 101, 102, 103, respectively. Other approaches may also be possible.

Referring still to FIG. 2, the beam positioning system comprises a plurality of wavelength selective mirrors 110, 111, 112, 113. In various embodiments, some of the wavelength selective 110, 111, 112, 113 mirrors have significantly different reflection or transmission properties at different wavelengths. Accordingly, the wavelength selective mirrors 110, 111, 112, 113 can separate or combine laser beams with different wavelengths. In some embodiments, the mirrors 110, 112 may be broadband, for example because light is not transmitted through the mirrors 110, 112. Through the use of suitable optical coatings, wavelength selective mirrors exhibit high reflection over some range of wavelengths and high transmission over another range of wavelengths. The wavelength selective mirrors are appropriate for the wavelengths of the laser sources. For example, various of the wavelength selective mirrors will selectively reflect (or transmit) light propagating from one laser at a first wavelength and not light propagating from another laser at a second wavelength. The example embodiment of FIG. 2 depicts four wavelength selective mirrors 110, 111, 112, 113. In other embodiments, a different number of wavelength selective mirrors may be used (e.g., see FIG. 2A). In some embodiments, the wavelength selective mirrors may comprise dichroic mirrors. In some embodiments, the wavelength selective mirrors may comprise trichroic mirrors. In some embodiments, the wavelength selective mirrors may comprise dichroic and trichroic mirrors. Dichroic mirrors can separate or combine lasers with two different wavelengths. In various embodiments dichroic mirrors may allow at least one wavelength to substantially or totally pass through and may substantially or totally reflect at least one wavelength. Trichroic mirrors can separate or combine lasers with three different wavelengths. Trichroic mirrors may be configured and/or optimized for reflecting three wavelengths. In some embodiments, trichroic mirrors they may be configured such that the reflected radiation has three wavelength peaks. In some embodiments, trichroic mirrors may be configured to have or one broad peak that covers multiple wavelengths. In other embodiments, the wavelength selective mirrors may include mirrors configured for a selective different number of wavelengths. Alternatively, non-wavelength selective mirrors, or substantially non-wavelength selective mirrors, that do not selectively reflect (or transmit) light of one laser and not light of another laser may be inserted in the path of the beam to redirect and/or alter the beam path or the beam. Various embodiments may have additional and/or other optical elements in the optical path.

The wavelength selective mirrors 110, 111, 112, 113 are configured with highly reflective and anti-reflective coatings in accordance with the wavelengths of the plurality of laser beams 104, 105, 106. As shown in FIG. 2, wavelength selective mirror 110 is configured to be highly reflective of the wavelength of the laser beam 104 (e.g., 405 nm, all wavelengths); wavelength selective mirror 111 is configured to be highly reflective of the wavelength of the laser beam 104 (e.g., 405 nm) and anti-reflective of the wavelength of the laser beam 105 (e.g., 488 nm); wavelength selective mirror 112 is configured to be highly reflective of the wavelength of the laser beam 106 (e.g., 635 nm, all wavelengths), and wavelength selective mirror 113 is configured to be highly reflective of the wavelength of the laser beam 106 (e.g., 635 nm), and anti-reflective of the wavelengths of the laser beams 104 (e.g., 405 nm) and 105 (e.g., 488 nm). In other embodiments, the wavelength selective mirrors can be configured to be highly reflective of some wavelengths and anti-reflective of some other wavelengths in order to separate or combine the wavelengths as necessary.

In some embodiments, this plurality of wavelength selective mirrors 110, 111, 112, 113 may be supported by a plurality of respective flexure mounts (not shown). Flexure mounts are less likely to move with external vibrations and thus are less likely to require adjustment. Flexure mounts reduce impact on the optics from shocks such as may be introduced by shipping of the system. Additionally, flexure mounts typically exhibit less hysteresis than rolling or sliding contacts. Flexure mounts are typically fabricated from materials which make them relatively less sensitive to temperature variations. Flexure mounts may also be smaller than conventional spring-loaded mounts. In some embodiments, the flexure mounts may comprise a nickel-iron alloy material for example. Other materials may also be used. In other embodiments, the plurality of wavelength selective mirrors 110, 111, 112, 113 may be supported by a plurality of respective spring-loaded mirror mounts (not shown). In other embodiments, the plurality of wavelength selective mirrors 110, 111, 112, 113 may be supported by a plurality of respective glue-block mounts (not shown).

In the multi-laser system 100 shown in FIG. 2, three optical paths are depicted. A first optical path at a wavelength of 405 nm originates at laser 101, passes through the APC 107, where a portion of the signal is picked off (e.g., by a beam splitter), is then highly reflected at wavelength selective mirrors 110 and 111 and transmitted through wavelength selective mirror 113, and then arrives at the focusing optics 117. A second optical path at a wavelength of 488 nm originates at laser 102, passes through the APC 108, where a portion of the signal is picked off (e.g., by a beam splitter), is then transmitted through wavelength selective mirrors 111 and 113, and then arrives at the focusing optics 117. A third optical path at a wavelength of 635 nm originates at laser 103, passes through the APC 109, where a portion of the signal is picked off (e.g., by a beam splitter), is then reflected at wavelength selective mirrors 112 and 113, and then arrives at the focusing optics 117. Propagating along these paths, laser beams 104, 105, 106, which may have originally been far from one another, are repositioned to be closer together as beams 114, 115, 116 and, after the focusing optics, beams 118, 119, 120, respectively. In some embodiments, the beams 118, 119, 120 are parallel to one another. In other embodiments, the beams 118, 119, 120 are not parallel to one another. Other mirrors and optical components (e.g., lenses, prisms, polarization rotators, waveplates, etc.) can be included to alter the laser beams and/or optical paths.

Still referring to FIG. 2, the multi-laser system 100 further includes optional beam focusing optics 117 to provide size reduction and/or shaping to the output laser beams 118, 119, 120. For example, the focusing optics 117 may focus a laser beam down to a smaller spot, generally referred to herein as a focus point. Due to non-ideal optical elements and configurations, the "focus point" where focusing optics focus the light the may not be an actual "point" but instead represent and area larger than a point, for example, a small spot shaped area. Additionally, the focusing optics 117 may change the shape of the laser beams. In some embodiments, for example, the laser beams 118, 119, 120 can have a generally Gaussian profile, so that when illuminating a flow cell, the intensity of the light illuminating the center of the flow cell is significantly greater than the intensity of the light illuminating the peripheral edges of the flow cell. Accordingly, the beams of light 118, 119, 120 can be elongated (e.g., elliptical) beams, so that the relatively high intensity center regions of the light beams extend across the entire width of the flow cell, while the relatively low intensity outer regions of the light beams do not strike the flow cell. By using an elongated (e.g., elliptical) beam of light, a more uniform distribution of light across the width of the flow cell or other target output can be achieved while illuminating a relatively small longitudinal area along the length of the flow cell and maintaining substantially uniform high light intensity.

In some embodiments, the beams 114, 115, 116 enter the beam focusing optics 117 and can have circular cross-sections with a Gaussian fall-off. In some embodiments, the beam focusing optics 117 may include an anamorphic lens system which may produce non-rotationally symmetric or elongated beam such as a beam with elliptical cross-section and spot size. In other embodiments, the beam focusing optics 117 may include cylindrical lenses. In some embodiments, the beam focusing optics 117 may include spherical lenses. In some embodiment, the beam focusing optics 117 may include Powell lenses (Gaussian to flat-top transformers). In some embodiments, the beam focusing optics 117 may include aspherical lenses. The focusing optics may be achromatic with reduced chromatic aberration thereby reducing positioning error which may otherwise result from different color laser beams. Accordingly, achromatic anamorphic optics, achromatic elliptical optics, achromatic spherical optics and achromatic aspherical optics, may be used. In some embodiments, lenses can be an anamorphic microlens array. In some embodiments, refractive and/or diffractive optics can be used to produce the elongated beams of light 118, 119, 120. Other types of optics are possible.

In cases where the laser comprises a semiconductor laser, the laser beam output may already be elliptical-shaped, and optics to convert the elliptical beam into a circular beam can be excluded. In such cases, there would be no need to include anamorphic focusing optics to make the elliptical-shaped beam spherical (e.g., rotationally symmetric). Spherical or rotationally symmetric optics may be employed without anamorphic elements.

The output laser beams 118, 119 and 120 depicted in FIG. 2 may have respective spot sizes of between about 55 μm and about 110 μm in one direction and between about 5 μm and about 15 μm in another direction (e.g., perpendicular to the one direction). In other embodiments, the laser beams may have respective spot sizes of between about 70 μm and about 110 μm in one direction and between about 5 μm and about 15 μm in another direction (e.g., perpendicular to the one direction). In other embodiments, the laser beams may have respective spot sizes of between about 50 μm and about 150 μm in one direction and between about 5 μm and about 20 μm in another direction (e.g., perpendicular to the one direction). In other embodiments, the laser beams may have spot sizes of between about 55 μm and about 100 μm in one direction and between about 5 μm and about 15 μm in another direction (e.g., perpendicular to the one direction). In other embodiments, the laser beams may have spot sizes of between about 70 μm and about 100 μm in one direction and between about 5 μm and about 15 μm in another direction (e.g., perpendicular to the one direction). In other embodiments, the laser beams may have respective spot sizes of between about 50 μm and about 150 μm in one direction and between about 5 μm and about 20 μm in another direction (e.g., perpendicular to the one direction). In some embodiments, the output laser beams 118, 119, 120 may have respective spot sizes of about 80 μm in one direction and about 10 μm in another direction (e.g., perpendicular to the one direction). In other embodiments, the output laser beams 118, 119, 120 may have respective spot sizes of about 100 μm in one direction and about 10 μm in another direction (e.g., perpendicular to the one direction). The directions may correspond to major and minor axes of an ellipse for a beam with an elliptical cross-section and spot shape. Other sizes and shapes are possible for the light beams.

Still referring to FIG. 2, the multi-laser system 100 includes coupling to a flow cell 132. The multi-laser system 100 can include an output window 121 that allows the beams of light 118, 119, 120 to exit the enclosure 150. The output window 121 can be made from, for example, fused silica, glass, acrylic, or a variety of other transparent materials (e.g., plastic). In some embodiments, the enclosure 150 includes an aperture 122 in a wall thereof and the output window 121 comprises a transparent window pane 124 positioned over the aperture 122. The window pane 124 can be made from, for example, fused silica, glass, acrylic, or a variety of other transparent materials (e.g., plastic). The aperture 122 and window pane 124 can assume a variety of shapes, but in some embodiments they are rectangular, circular, or elliptical. The window 121 can be attached to the enclosure 150 by a plurality of fasteners such as bolts 126. In FIG. 2, only two bolts 126 are shown, but in some embodiments, additional bolts can be positioned along the edges of the window 121. In some embodiments, the window 121 can include a flange for mounting the window. The flange may have a plurality of through holes through which fasteners (e.g., bolts 126) can pass to secure the window 121 to the enclosure 150. A seal 128 (e.g., an O-ring) can be positioned between the enclosure 150 and the window 121. The bolts 126 can be tightened, causing the O-ring 128 to be compressed between the enclosure 150 and the window 121. In some embodiments, the O-ring 128 produces a hermetic seal. Other approaches can be used to fasten the window 121 to the enclosure 150. The window 121 can be secured to the enclosure 150 by an adhesive, epoxy, or cement.

In some embodiments, the seal described may produce a hermetic seal. A hermetic seal may help reduce particles and contamination from outside the enclosure. A hermetic seal may also help to prevent or reduce the flow of air currents and thus prevent or reduce the flow of ambient temperature changes into the enclosure. This in turn may help reduce temperature instability within the enclosure. In some of the embodiments discussed above, the entire enclosure 150 is hermetically sealed from the ambient air. Thus, the interior of the enclosure 150 is isolated from air currents which can cause temperature variation, and the internal optical elements are protected from external contaminants. In some embodiments a getter (not shown) is located inside the enclosure 150 which can reduce contaminant particles or chemical species. Additionally, a desiccant (not shown) can be positioned inside the enclosure 150 to reduce moisture.

Although FIG. 2 shows a single output window, multiple output windows can be used. For example, each beam of light 118, 119, 120 can exit the enclosure 150 via a respective output window. In some embodiments, it is desirable that as much as possible of the enclosure 150 comprise the thermally conductive material, to better achieve temperature uniformity. Accordingly, the output windows can be separated by thermally conductive material and can cover only as much area as necessary to allow light beams 118, 119, 120 to leave the enclosure 150. However, in some embodiments, a single output window is easier and less expensive to construct.

The multi-laser system 100 can include a flow cell connector (not shown) that is mechanically and thermally coupled to the enclosure 150, and the flow cell connector is configured to secure a flow cell 132 so that it intersects and maintains the alignment of the beams of light 118, 119, 120. In some embodiments, the flow cell connector can permanently attach the flow cell 132 to the enclosure 150. However, in some embodiments, the flow cell connector can allow the flow cell 132 to be removably attached to the enclosure 150. In some embodiments, the flow cell connector can be compatible with multiple types and/or sizes of flow cells. For example, the flow cell connector can include a clip, a friction or pressure fit coupling, a threaded portion configured to receive a corresponding threaded portion of the flow cell 132, or a variety of other connectors known in the art or yet to be devised. The flow cell 132 can be a capillary flow cell, and at least part of the flow cell can comprise a transparent material (e.g., fused silica or glass) that allows the light beams 118, 119, 120 to enter the flow cell 132 and interact with a sample fluid contained within the flow cell 132. The flow cell 132 can be a thin hollow tube, forming a flow path that has a diameter of about 10 μm. Other flow cell types and/or sizes can be used, and the flow cell 132 can be oriented differently than as shown in FIG. 1. In some embodiments, the beams of light 118, 119, 120 strike the flow cell over areas centered about 110 μm to about 140 μm apart from each other, and in some embodiments, about 125 μm apart from each other. In some embodiments, the beams of light 118, 119, 120 strike the flow cell over areas centered about 100 μm to about 150 μm apart from each other. In some embodiments, the beams of light 118, 119, 120 strike the flow cell over areas centered about 100 μm to about 500 μm apart from each other. In some embodiments, the beams of light 118, 119, 120 strike the flow cell over areas centered up to about 500 μm apart from each other. In some embodiments, the thermal expansion coefficient of the thermally stable enclosure 150 matches the thermal expansion coefficient of the flow cell 132. Matching of thermal expansion coefficients may help reduce overall stress on the flow cell. For some forms of optical measurements, it may be desirable for the different laser beams to be focused to different locations in the flow cell 132 at specific locations (e.g., areas spaced about 125 μm apart).

Figure 2A:
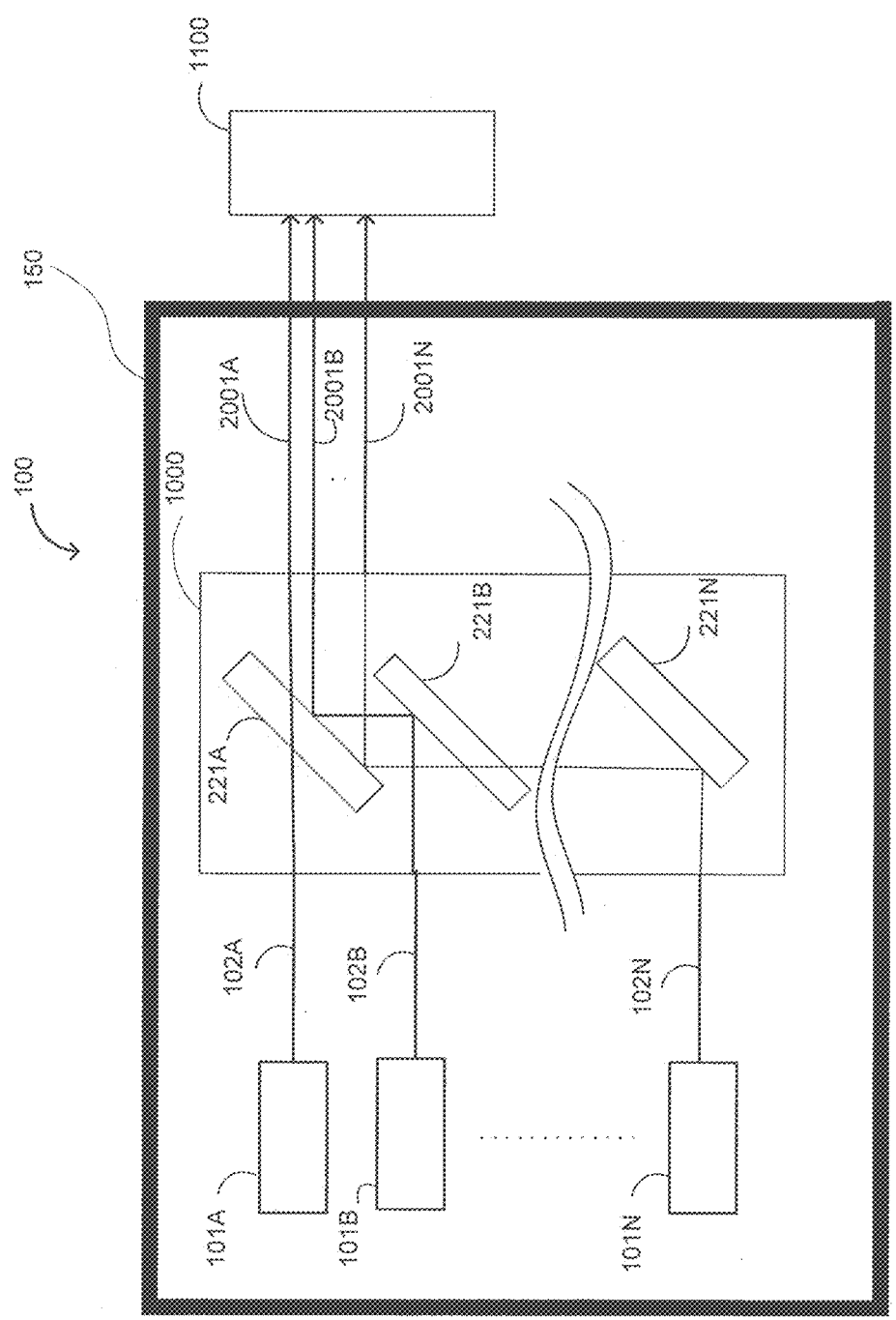
FIG. 2A depicts another example embodiment of a multi-laser system in which the beam positioning/combining system comprises mirrors.

FIG. 2A depicts another example embodiment of a multi-laser system in which the beam positioning/combining system comprises mirrors. As shown in FIG. 2A, a beam positioning combiner system that employs mirrors mounted onto a frame may be used. In various embodiments, the frames on which the mirrors are mountable may be adjustable, e.g., translatable, tiltable, etc. In various embodiments, the wavelength selective mirrors have significantly different reflection or transmission properties at different wavelengths. Accordingly, the wavelength selective mirrors can separate or combine laser beams with different wavelengths.

Through the use of suitable optical coatings, wavelength selective mirrors will selectively reflect (or transmit) light of at least one wavelength and not light of at least one other wavelength. In other embodiments, the wavelength selective mirrors may comprise mirrors with selectivity for a different number of wavelengths. The example embodiment of FIG. 2A depicts a plurality of wavelength-selective mirrors. The mirrors can be used to separate or combine lasers with different wavelengths. Alternatively, non-wavelength selective mirrors that do not selectively reflect (or transmit) light of one laser and not light of another laser may be inserted in the path of the beam to redirect and/or alter the beam path or the beam. Other optical elements can also be inserted into the optical path.

The wavelength-selective mirrors 221A, 221B . . . 221N are configured with highly reflective and anti-reflective coatings in accordance with the wavelengths of the plurality of laser beams 102A, 102B . . . 102N. As shown in FIG. 2A, wavelength selective mirror 221A is configured to be highly reflective of the wavelength of the laser beams 102B through 102N and anti-reflective of the wavelength of laser beam 102A; wavelength-selective mirror 221B is configured to be highly reflective of the wavelength of the laser beam 102B and anti-reflective of the wavelength of the laser beam 102N; and wavelength selective mirror 221N is configured to be highly reflective of the wavelength of the laser beam 102N. Other configurations are possible.

In the multi-laser system 100 shown in FIG. 2A, a plurality of optical paths are depicted. A first optical path originates at laser 101A and is transmitted through wavelength selective mirror 221A and transmitted toward the target object 1100. A second optical path originates at laser 101B, is then reflected at wavelength selective mirrors 221B and 221A, and transmitted toward the target object 1100. An n-th optical path originates at laser 101N, is then reflected at wavelength selective mirror 221N, transmitted at wavelength selective mirror 221B, reflected at wavelength selective mirror 221A, and transmitted toward the target object 1100. Propagating along these paths, laser beams 102A-102N, which may have originally been far from one another, are repositioned to be closer together as beams 2001A-2001N.

The mirrors may be configured to adjust the position of the plurality of laser beams to be at a certain distance of one another, for example in addition to the spacing adjustment that may be provided by placing the lasers at different heights within the enclosure. In some embodiments, the laser beams can be positioned to be coaxial, slightly offset but parallel to each other, or slightly offset but not parallel to each other.

Figure 2B:
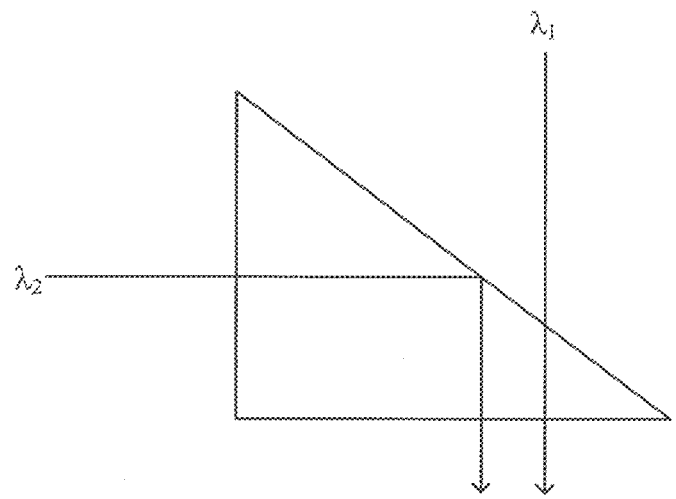
FIG. 2B depicts an example embodiment of a triangular prism.

FIG. 2B depicts an embodiment of a triangular prism. The prism is a transparent optical element comprising a substantially transparent optical material. The prism has flat, polished surfaces that reflect and/or refract light. One or more of these surfaces may be coated with an optical coating such as an interference coating that is reflective and/or anti-reflective. In some embodiments the coating is wavelength selective. For example, the prism may be configured to be highly reflective for certain wavelengths (e.g., of a first laser), and highly anti-reflective for other wavelengths (e.g., of a second laser). The exact angles between the surfaces depend on the application. As shown, the triangular prism generally has a triangular base and rectangular sides. Prisms may be made out of glass, or any material that is transparent to the wavelengths for which they are designed. In some embodiments, the material may include one of polymer, polycarbonate, polyethylene terephthalate, glycol-modified polyethylene terephthalate, amorphous thermoplastic, and/or other substrates. Prisms can be used to reflect light, and to split light into components with different, e.g., wavelength, polarizations. As illustrated in FIG. 2B, a triangular prism includes a glass surface configured to allow transmission of a laser beam of a given wavelength. The surface may be coated with a reflective coating to allow for the reflection of the laser beam of a different wavelength. In some embodiments, each of the wavelength selective mirrors illustrated in FIGS. 2 and 2A may be replaced with a triangular prism as the one illustrated in FIG. 2B. Triangular prisms may also be used that reflect a plurality of wavelength, for example, using total internal reflection. Accordingly, the prisms may be used to redirect laser beams and not for wavelength selection in various cases.

Figure 2C:
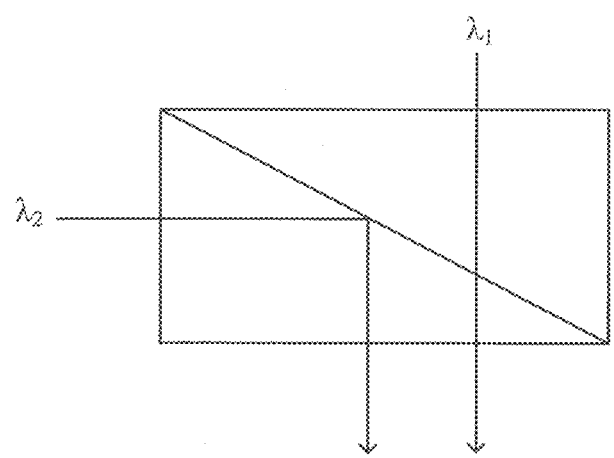
FIG. 2C depicts an example embodiment of a rectangular prism.

FIG. 2C depicts an embodiment of a rectangular prism. This rectangular prism comprises two triangular prisms contacted together. As illustrated in FIG. 2C, a rectangular prism may be used to deflect a beam of light, for example, by 90 degrees, although other angles are also possible. As described above, in some embodiments, prisms employ total internal reflection at the surfaces rather than for dispersion. If light inside the prism hits one of the surfaces at a sufficiently steep angle (greater than the critical angle), total internal reflection occurs and all of the light is reflected. This makes a prism a useful substitute for a mirror in some situations. As described above, triangular prisms or prisms having other shapes can also be used for this purpose. In some embodiments, rectangular prisms can be wavelength selective. For example, the interface between the two triangular prisms or prism portions that make up the rectangular prism shown in FIG. 2C can include an optical coating such as an interference coating that is wavelength selective. In some embodiments, for example, the rectangular prism selectively reflects one laser wavelength and selectively transmits another wavelength. Accordingly, the rectangular prism may include one or more coatings that are highly reflective for one or more laser wavelength. The rectangular prism may include one or more coatings that are anti-reflective for one or more laser wavelength. In some embodiments, each of the wavelength selective mirrors illustrated in FIGS. 2 and 2A may be replaced with a rectangular prism such as the one illustrated in FIG. 2C. Other arrangements and configurations are also possible. For example, a prism (e.g., a rectangular prism) may comprise two or more triangular or other shape prisms that are contacted together.

Figure 2D:
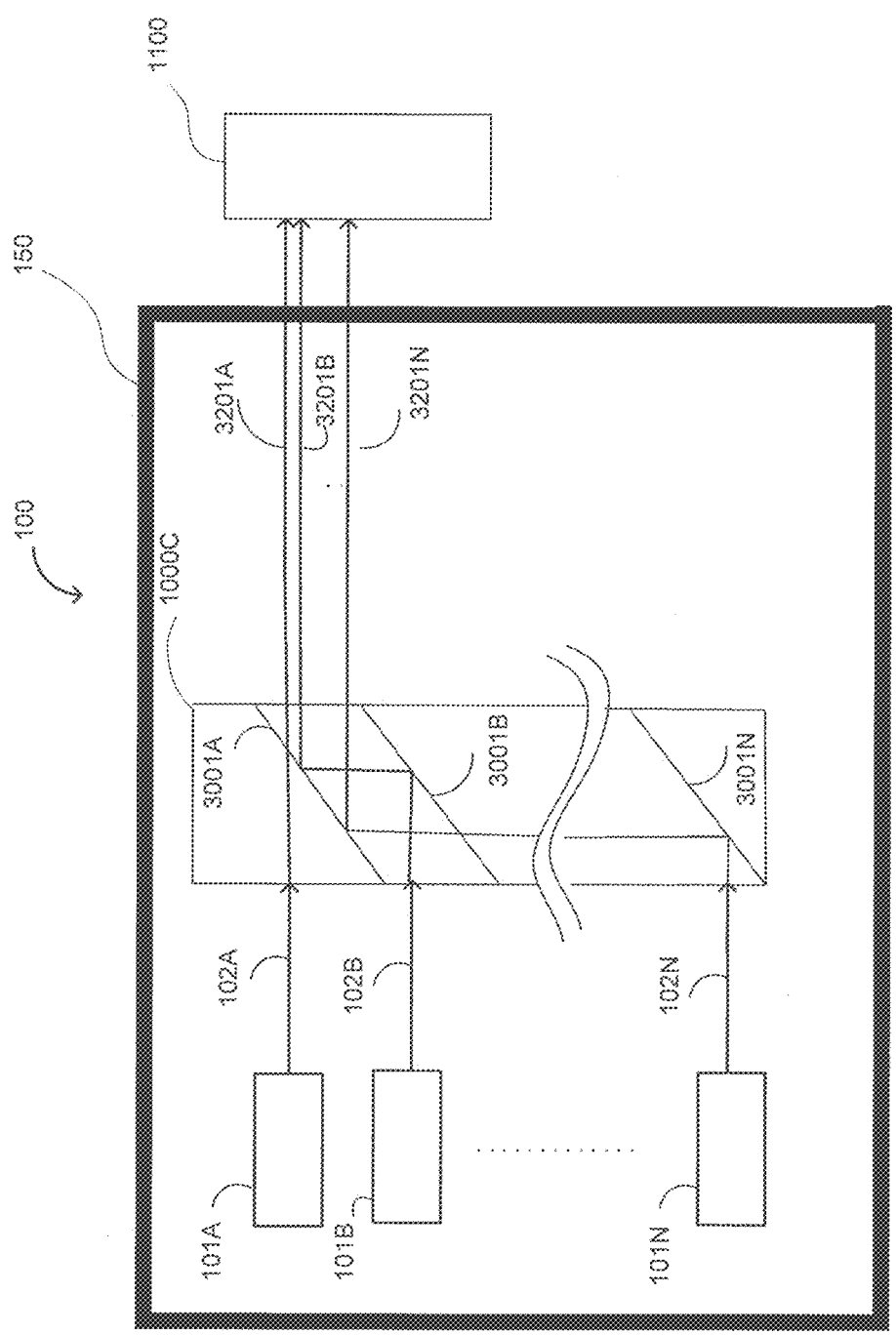
FIG. 2D depicts an example embodiment of a multi-laser system including a prism beam positioning/combining system.

FIG. 2D depicts an embodiment of the multi-laser system including a prism or prism bar beam positioning/combining system 1000C. As shown in FIG. 2D, a prism-based beam positioning combiner system is used to allow the lasers to be arranged in a row at one end of the temperature-controlled enclosure. In some embodiments, the prism beam positioning/combining system may include optically contacted prisms having one or more surfaces coated to allow for the selective transmission or reflection of the laser beams. By proper selection of the surface coatings (such as for example wavelength selective reflective interference coatings), various lasers of different wavelength may be combined and output from the prism beam positioning/combining system.

The prism beam positioning/combining system may also be configured and arranged with respect to the lasers and the respective laser beam paths such that the laser beams can be positioned such that they are, for example, closely spaced and/or parallel or co-linear on the output side of the prism-based beam positioning combiner system. In other embodiments, the prism beam positioning/combining system can be configured to position the beams in converging or diverging with respect to one another.

The prism illustrated in FIG. 2D may comprise a plurality of prisms or prism portions contacted or adhered together (e.g., using optical contact bonding, or optical adhesive at optical interfaces, and the like) to make a monolithic multi-prism beam combiner, or an aggregated prism. In some embodiments, a monolithic multi-prism may comprise 2, 3, 4, 5, or more prism portions. For example, a monolithic multi-prism may comprise N+1 or N+2 prism portions, where N is the number of lasers. In some embodiments, a monolithic multi-prism may comprise 1, 2, 3, 4, or more optical interfaces. For example, a monolithic prism may comprise N or N+1 optical interfaces, where N is the number of lasers. In various embodiments, one or more interface between the prism portions may be wavelength selective. For example, various of the prism portions may be configured to have one or more wavelength selective surfaces with one or more highly reflective and/or an anti-reflective (e.g., interference) coatings in accordance with the wavelengths of the plurality of laser beams 102A-102N. As shown in FIG. 2D, the wavelength selective internal surface 3001A may be configured to be highly anti-reflective of the wavelength of the laser beam 102A and highly reflective of the wavelengths of laser beams 102B-102N. The wavelength selective internal surface 3001B may be configured to be highly reflective of the wavelength of the laser beam 102B. The wavelength selective surface internal surface 3001N may be configured to be highly reflective of the wavelength of the laser beam 102N.

In the embodiment shown in FIG. 2D, various prisms are contacted together (e.g., using cement, adhesive (e.g., optical adhesive), optical contact bonding) to form a monolithic multi-prism beam combiner or an integrated or aggregated prism in the shape of a rectangular structure or bar having a rectangular base and rectangular sides. The different prisms that are contacted together may have different shapes. Some of the prisms, for example, may have a base in the shape of a parallelogram and rectangular sides. Some of the other prisms may have different shaped bases and rectangular sides. For example, at least one triangular prism is shown. Other shapes and configurations are also possible.

In the multi-laser system 100 shown in FIG. 2D, a plurality of optical paths are depicted. A first optical path originates at laser 101A, is transmitted through a prism portion to the internal surface 3001A, and then is transmitted toward the target object 1100. A second optical path originates at laser 101B, then is reflected at internal surfaces 3001A and 3001B, and then is transmitted toward the target object 1100. An n-th optical path originates at laser 101N, is transmitted through internal surfaces 101B through 101N-1, then is reflected at internal surface 3001A, and then is transmitted toward the target object 1100. Propagating along these paths, laser beams 102A-102N, which may have originally been far from one another, are repositioned to be closer together as beams 3201A-3201N.

The prisms and interfaces therebetween within the prism-based beam positioning/combining system are configured to adjust the position of the plurality of laser beams to be at a certain distance from one another, in addition to the spacing adjustment that may be provided by placing the lasers at different heights within the enclosure. In some embodiments, the laser beams can be positioned to be coaxial, slightly offset but parallel to each other, or slightly offset but not parallel to each other.

Figure 2E:
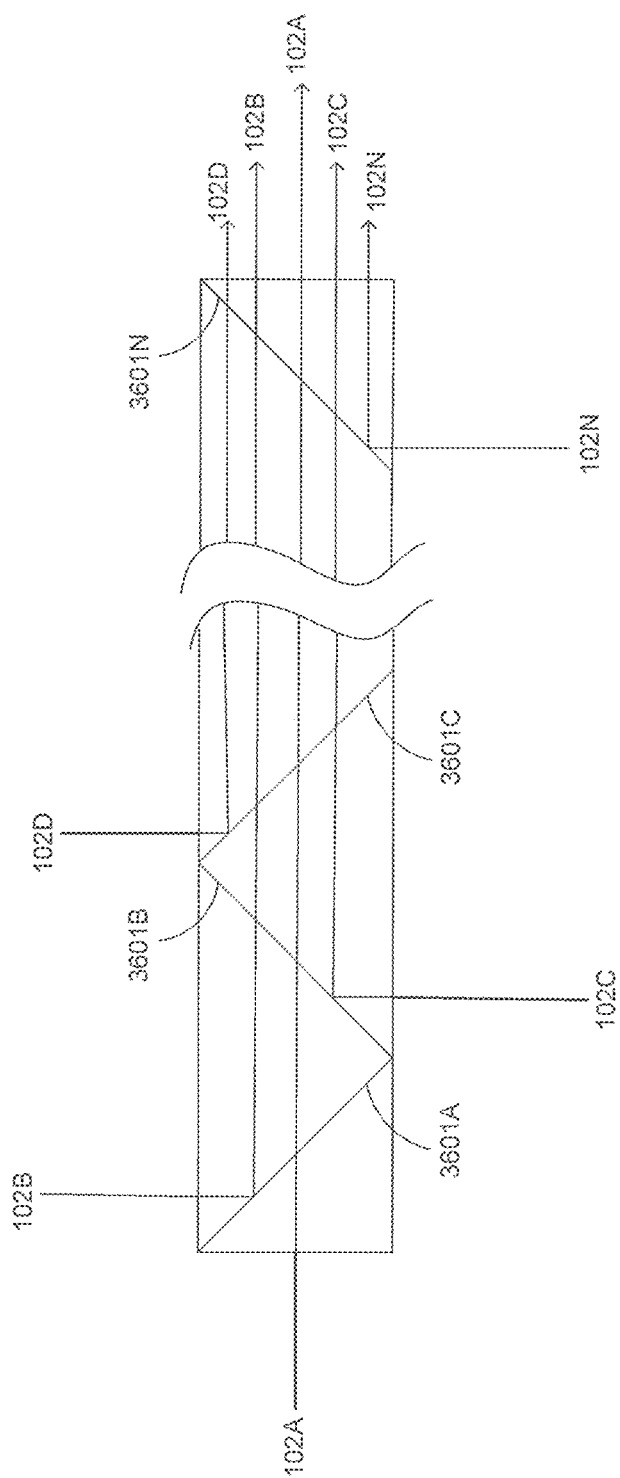
FIG. 2E depicts an example embodiment of a prism beam positioning/combining system.

FIG. 2E depicts another embodiment of a prism beam positioning/combining system. As shown in FIG. 2E, a prism-based beam positioning combiner system is used to allow the lasers to be spread out over the surface of the temperature-controlled enclosure's base plate. The surfaces of the prisms may be coated to allow for the transmission or reflection of the laser beams. The prism illustrated in FIG. 2E may comprise a plurality of prisms or prism portions contacted or adhered together to make an aggregated prism or a monolithic multi-prism beam combiner. In various embodiments, one or more interface between the prism portions may be wavelength selective. For example, various of the prism portions may be configured to have one or more wavelength selective surfaces with one or more highly reflective and/or an anti-reflective (e.g., interference) coatings in accordance with the wavelengths of the plurality of laser beams 102A-102N. As shown in FIG. 2E, the wavelength selective internal surface 3601A may be configured to be highly anti-reflective of the wavelength of the laser beam 102A and highly reflective of the wavelength of laser beam 102B. The wavelength selective internal surface 3601B may be configured to be highly anti-reflective of the wavelength of the laser beams 102A and 102B and highly reflective of the wavelength of laser beam 102C. The wavelength selective surface internal surface 3601C may be configured to be highly anti-reflective of the wavelength of the laser beams 102A, 102B, and 102C, and highly reflective of the wavelength of the laser beam 102D. The wavelength selective surface internal surface 3601N may be configured to be highly anti-reflective of the wavelength of the laser beams 102A, 102B, 102C, through 102N-1, and highly reflective of the wavelength of the laser beam 102N.

In the embodiment shown in FIG. 2E, various prisms are contacted together (e.g., using cement, adhesive (e.g., optical adhesive), optical contact bonding) to form an integrated or aggregated prism in the shape of a rectangular structure or bar having a rectangular base and rectangular sides, or a monolithic multi-prism beam combiner. The different prisms that are contacted together have different shapes. For example, different triangular prisms are shown. Some of the prisms, for example, may have a base in the shape of a right angle triangle and rectangular sides while other prisms may have a base in the shape of an equilateral triangle and have rectangular sides. Other shapes and configurations are also possible.

In the multi-laser system 100 shown in FIG. 2E, a plurality of optical paths are depicted. A first optical path originates at laser 101A, is transmitted through prism portions and internal surfaces 3601A, 3601B, 3601C through 3601N, and is transmitted toward the target object 1100. A second optical path originates at laser 101B, is then reflected at internal surface 3601A, transmitted through prism portions and internal surfaces 3601B, 3601C through 3601N, and toward the target object 1100. A third optical path originates at laser 101C, is then reflected at internal surface 3601B, transmitted through prism portions and internal surfaces 3601C through 3601N, and toward the target object 1100. A fourth optical path originates at laser 101D, is reflected at internal surface 3601C, transmitted through prism portions and internal surfaces 3601D through 3601N, and toward the target object 1100. An n-th optical path originates at laser 101N, is reflected at internal surface 3601N, and transmitted toward the target object 1100. Propagating along these paths, laser beams 102A-102N, which may have originally been coming from different directions and far from one another, are repositioned to be closer together as beams 3701A-3701N. As described herein, the laser beams 102A-102N may also be repositioned to be parallel to each other as beams 3701A-3701N.

An embodiment of a beam combiner can include an arrangement of optical elements, for example, one or more beam splitters and light directing elements. A beam splitter may divide the incident light into two paths, for example, one by transmission and another by reflection. Examples of beam splitters may be coated with a material that enables optical elements to reflect monochromatic light and transmit light of other wavelengths. In various embodiments of beam combiners, a beam combiner may include a wide range of aggregated prisms (or monolithic multi-prism beam combiners). For example, a plurality of prism portions contacted or coupled together. Aggregated prisms (or monolithic multi-prism beam combiners) may include optical coating for example at interfaces between prism portions or prisms that make up the aggregated prism. These optical coatings may be wavelength selective reflective coating or may be anti-reflective (AR) coatings. One example of such an aggregated prism comprising a plurality or prisms or prism portions contacted together is the X-prism. Other aggregated prisms, however, may also be used.

A multi-prism beam combiner may be more advantageous than beam combiners using separate dichroic mirrors mounted in individual flexure mounts, mounted using a glue-block approach, or all mounted in a common mount. In a multi-prism beam combiner, all of the reflective surfaces are tied together so that the number of opto-mechanical components that can contribute to the relative movement of the laser beams with respect to each other is greatly reduced thereby improving the system performance. Additionally, the reduced parts count and reduced complexity make for increased ease of manufacturing and should allow for a decrease in system size. Furthermore, the number of surfaces exposed to possible contamination is reduced. Also, the relatively large size of the prism combiner compared to an individual dichroic mirror reduces the impact that the coefficient of thermal expansion (CTE) mismatch between most adhesives, the optics and the metal used in the optical mounts has on beam position.

Figure 3:
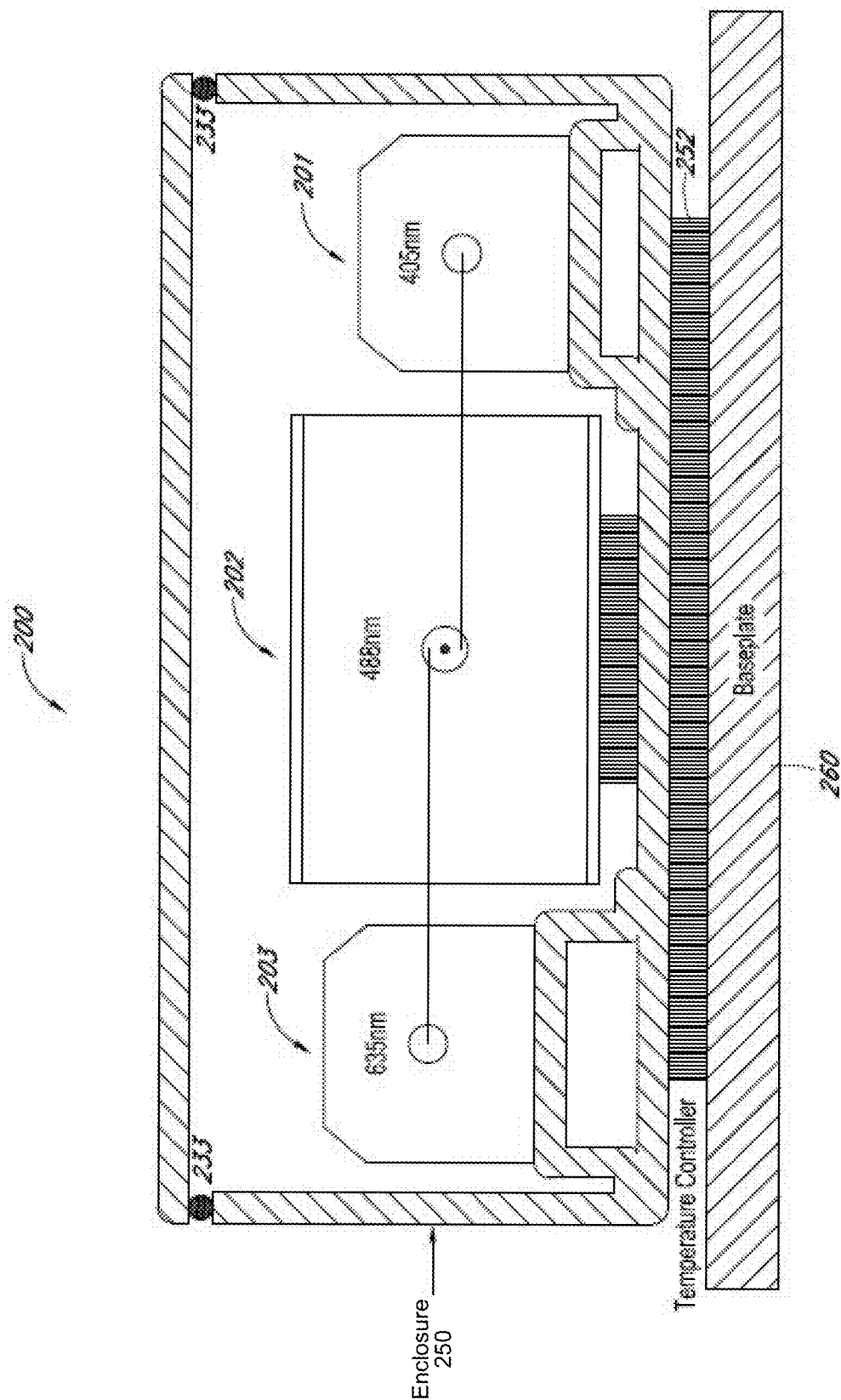
FIG. 3 depicts the front view of the system of FIG. 2.

FIG. 3 depicts the front view of the multi-laser system 100 depicted in FIG. 2. As described above, in some embodiments, the thermally stable enclosure 250 is hermetically sealed. The hermetic sealing may be provided by O-rings 233. Again, hermetically sealing can reduce particles and contamination from outside the enclosure. Moreover, as described above, a hermetic seal may also reduce or prevent the flow of air currents and thus prevent or reduce the flow of ambient temperature changes into the enclosure. This in turn may reduce temperature instability within the enclosure. In some embodiments, the top of enclosure 250 may be thermally coupled, possibly with a copper braid, to the main body of the enclosure 250 to reduce thermal effects.

As shown in FIG. 3, the multi-laser system may further comprise a temperature controller 252. In some embodiments, the temperature controller 252 may comprise a thermo electric cooler (TEC), a temperature sensor and control electronics. The TEC may pump heat from one side to the other depending on the direction of current flow through the TEC. The direction of current flow may be determined by the control electronics. In some embodiments, for example, if the ambient temperature were higher than the enclosure 250's set point temperature then the control electronics may direct current flow through the TEC so that heat was pumped out of the enclosure 250 thereby helping maintain the enclosure's set point temperature. In other embodiments, if the ambient temperature were lower than the enclosure 250's set point temperature, then the control electronics may reverse the current flow through the TEC so that heat was pumped into the enclosure 250 again helping maintain the enclosure's set point temperature. A temperature controller 252 can be thermally coupled to the thermally stable enclosure 250. The temperature controller 252 can include a temperature sensor (not shown) to measure the temperature of the thermally stable enclosure 250, and to provide feedback to the control electronics. In some embodiments, the temperature sensor may comprise a thermistor. The temperature controller 252 may remove heat from or add heat to the thermally stable enclosure 250 in order to maintain a substantially constant temperature in the thermally stable enclosure 250. The high thermal conductivity of the material of the enclosure 250 helps the temperature controller to relatively quickly adjust the temperature within the enclosure 250 in response to temperature variations outside of the enclosure 250 and also reduce the presence of temperature variations across the enclosure 250.

As shown in FIG. 3, the multi-laser system may also comprise a baseplate 260. The baseplate 260 may act as a thermal heat sink for the temperature controller 252.

In some embodiments, the temperature within the thermally stable enclosure 250 can be held stable to within ±1° C., ±2° C., ±3° C., ±5° C., etc., for example, of a target temperature. In some embodiments, the temperatures of the wavelength selective mirrors and the focusing optics can be held to be within ±1° C., ±2° C., ±3° C., ±5° C., etc. of one another. In some embodiments, the temperature over a substantial portion of the enclosure can be held to be within ±1° C., ±2° C., ±3° C., ±5° C., etc. In some embodiments, the temperature over the entire enclosure can be held to be within ±1° C., ±2° C., ±3° C., ±5° C., etc., for example, of a target temperature. In some embodiments, the temperature within the enclosure can be held to be within ±1° C., ±2° C., ±3° C., ±5° C., etc., for example, of a target temperature. In some embodiments, the temperature within the thermally stable enclosure 250 can be held within ±1° C. of the target temperature. In some embodiments, the target temperature can be between 10° C. and 50° C. In some embodiments, the target temperature can be between about 15° C. and about 45° C. In other embodiments, the target temperature can be between about 15° C. and about 35° C. In other embodiments, the target temperature can be between about 10° C. and about 40° C. The temperature controller 252 also maintains the focused laser beams aligned with respect to the flow cell over a wide range of ambient temperatures. In some embodiments, the range of ambient temperatures can be between about 10° C. and about 55° C. In some embodiments, the range of ambient temperatures can be between about 10° C. and about 50° C. In some embodiments, the range of ambient temperatures can be between about 15° C. and about 45° C. In other embodiments, the range of ambient temperatures can be between about 15° C. and about 35° C. In other embodiments, the range of ambient temperatures can be between about 10° C. and about 40° C.

FIG. 3 also depicts that the three lasers 201, 202, and 203 may be placed at different heights within the enclosure 250. The placement at different heights may assist in positioning the focused laser beams at a desired spacing from one another at the flow cell. By disposing the lasers at different heights, the focused beams at the flow cell may be separated by between about 110 µm and about 140 µm of one another. In some embodiments, the focused beams may be separated by between about 100 µm to about 150 µm of one another. In some embodiments, the focused beams may be separated by between about 100 µm to about 500 µm of one another. In some embodiments, the focused beams may be separated by up to about 500 µm of one another. The wavelength selective mirrors, however, can additionally be adjusted to account for the imperfection in laser positions that may result, for example, from manufacturing tolerances. Accordingly, the wavelength selective mirrors may establish better positioning of the beams directed onto the flow cell.

Figure 4:
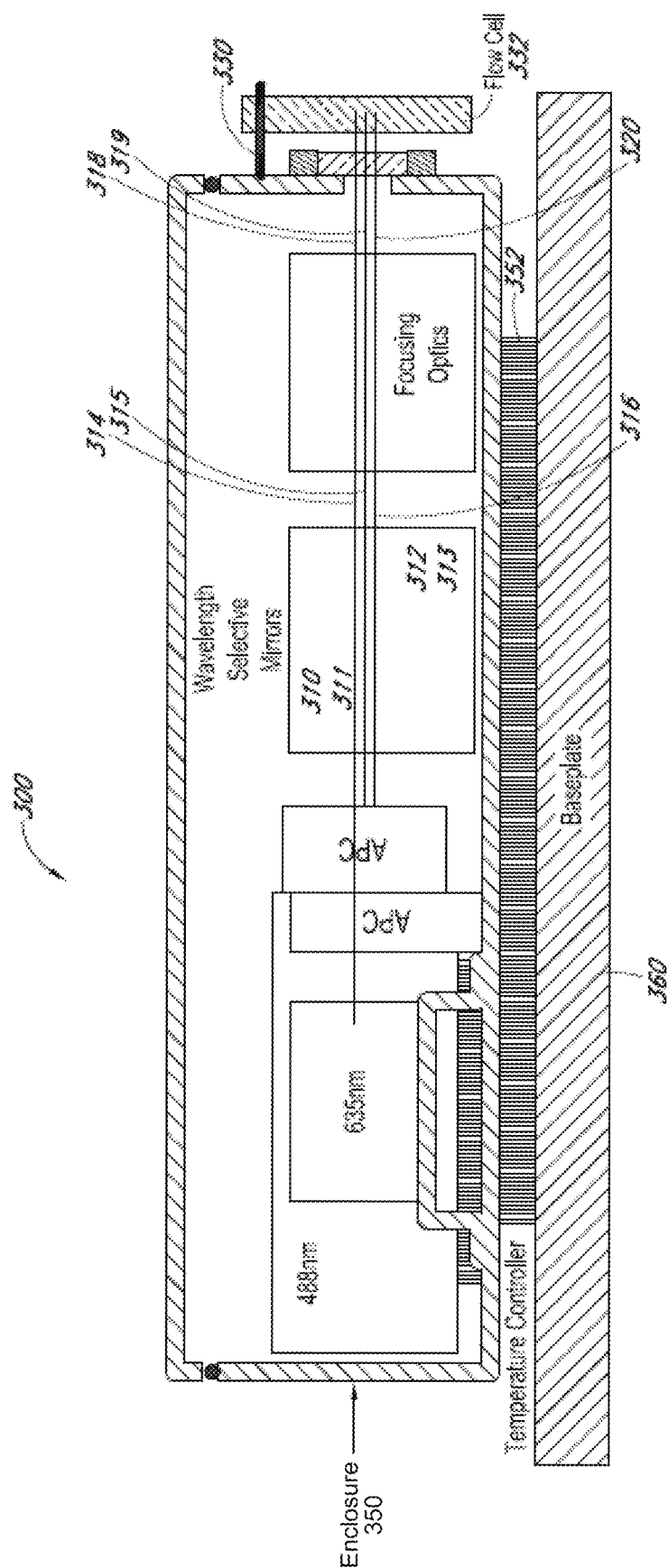
FIG. 4 depicts the side view of the system of FIG. 2.

FIG. 4 depicts the side view of the multi-laser system 100 depicted in FIG. 2. FIG. 4 also shows the placement of the lasers at different heights. The thermally stable enclosure 350 comprises wavelength selective mirrors 310, 311, 312, 313 that are configured to adjust the position of the plurality of laser beams 314, 315, 316 to be at a certain distance of one another, in addition to the spacing adjustment that may be provided by placing the lasers at different heights within the enclosure 350. In some embodiments, the laser beams can be positioned to be coaxial, slightly offset but parallel to each other, or slightly offset but not parallel to each other. In some embodiments, the plurality of focused laser beams 318, 319, 320 may be separated by about 110 µm and about 140 µm of one another. In some embodiments, the plurality of focused laser beams 318, 319, 320 may be separated by about 100 µm and about 150 µm of one another. In some embodiments, the plurality of focused laser beams 318, 319, 320 may be separated by about 100 µm and about 500 µm of one another. In some embodiments, the plurality of focused laser beams 318, 319, 320 may be separated by up to about 500 µm of one another. In some embodiments, the plurality of focused laser beams 318, 319, 320 may be positioned to be at a distance of about 125 µm of one another.

As can be seen in FIG. 4, the thermally stable enclosure 350 comprises a top, a bottom, and four sides. In some embodiments, the thermally stable enclosure 350 has a width of about 3 inches or less, a length of about 6 inches or less, and/or a height of about 2 inches or less. In other embodiments, the length, the width, and the height of the thermally stable enclosure 350 may be relatively larger or smaller. In some embodiments, the thermally stable enclosure 350 has a width of about 6 inches or less, a length of about 12 inches or less, and/or a height of about 3 inches or less. In some embodiments, the thermally stable enclosure 350 has a volume of 36 cubic inches (in$^3$) or less. With a relatively small volume, the temperature controller is better able to adjust the temperature of the enclosure and system in response to variations in ambient temperature. The temperature controller is thus able to avoid temporal variations in temperature induced by fluctuation in ambient conditions. The relatively small volume may reduce temperature instabilities within the enclosure 350 by reducing temperature gradients across the enclosure 350. In other embodiments, the volume of the thermally stable enclosure 350 may be relatively larger or smaller. Also shown in FIG. 4 is the flow cell connection 330, described above.

Figure 5:
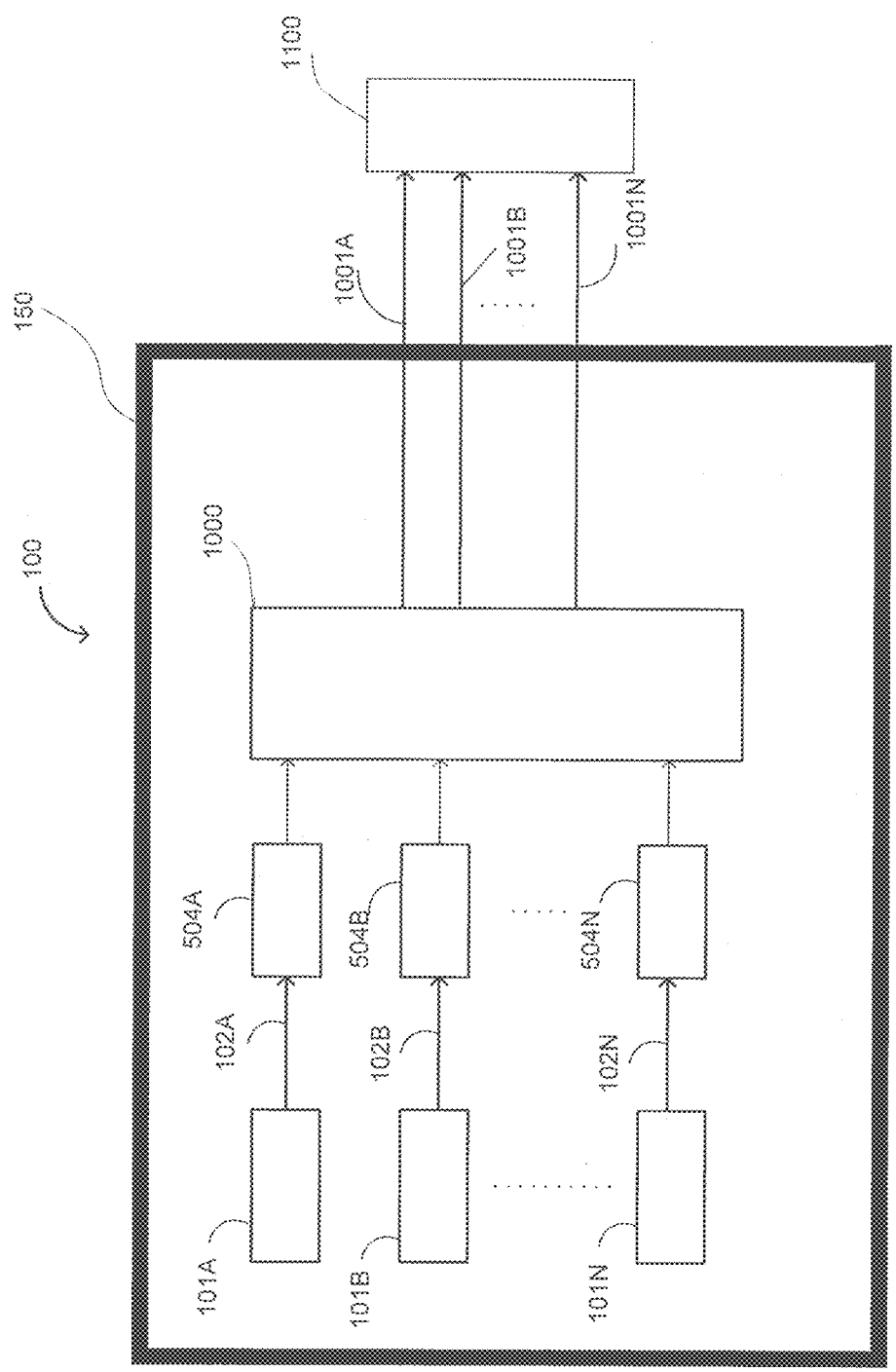
FIG. 5 depicts an example embodiment of a multi-laser system further including a plurality of beam adjusters.

FIG. 5 depicts an example embodiment of a multi-laser system further including an optional plurality of beam adjusters 504A-504N. In various embodiments, the boresight and centration errors of the n laser beams and/or the angular and lateral positioning errors of the opto-mechanical components may be compensated for by using the separate beam position adjusters 504A-504N. The adjusted laser beams may then be positioned and/or combined into a desired spatial arrangement by the beam positioning/combining system that a specific application requires.

Figure 6:
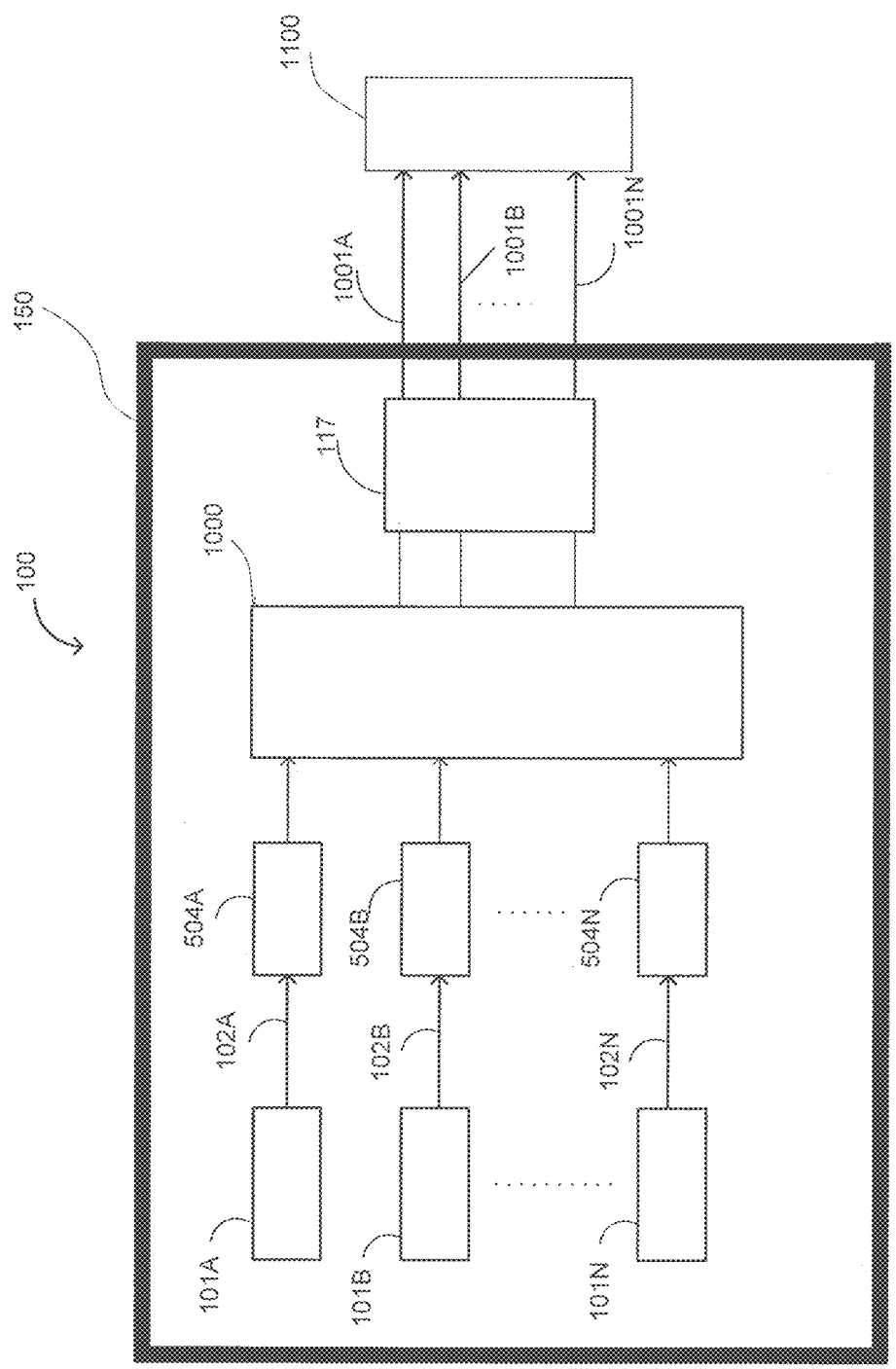
FIG. 6 depicts an example embodiment of a multi-laser system further including focusing optics.

FIG. 6 depicts the embodiment of the multi-laser system of FIG. 5 further including optional focusing or beam shaping optics 117. As described in relation to FIG. 2 above, beam focusing optics or beam shaping optics may be used to provide size reduction and/or shaping to the output laser beams. For example, the focusing/beam shaping optics may focus a laser beam down to a smaller spot. The focusing/beam shaping optics may also be used to change the shape of the laser beams.

The output laser beams depicted in FIG. 6 may have respective spot sizes of between about 55 µm and about 110 µm in one direction and between about 5 µm and about 15 µm in another direction (e.g., perpendicular to the one direction). In other embodiments, the laser beams may have respective spot sizes of between about 70 µm and about 110 µm in one direction and between about 5 µm and about 15 µm in another direction (e.g., perpendicular to the one direction). In other embodiments, the laser beams may have respective spot sizes of between about 50 µm and about 150 m in one direction and between about 5 µm and about 20 µm in another direction (e.g., perpendicular to the one direction). In other embodiments, the laser beams may have spot sizes of between about 55 µm and about 100 µm in one direction and between about 5 µm and about 15 µm in another direction (e.g., perpendicular to the one direction). In other embodiments, the laser beams may have spot sizes of between about 70 µm and about 100 µm in one direction and between about 5 µm and about 15 µm in another direction (e.g., perpendicular to the one direction). In other embodiments, the laser beams may have respective spot sizes of between about 50 µm and about 150 µm in one direction and between about 5 µm and about 20 µm in another direction (e.g., perpendicular to the one direction). In some embodiments, the output laser beams 118, 119, 120 may have respective spot sizes of about 80 µm in one direction and about 10 µm in another direction (e.g., perpendicular to the one direction). In other embodiments, the output laser beams 118, 119, 120 may have respective spot sizes of about 100 µm in one direction and about 10 µm in another direction (e.g., perpendicular to the one direction). These may correspond to major and minor axes of an ellipse for a beam with an elliptical cross-section and spot shape. Other sizes and shapes are possible for the light beams.

Figure 7:
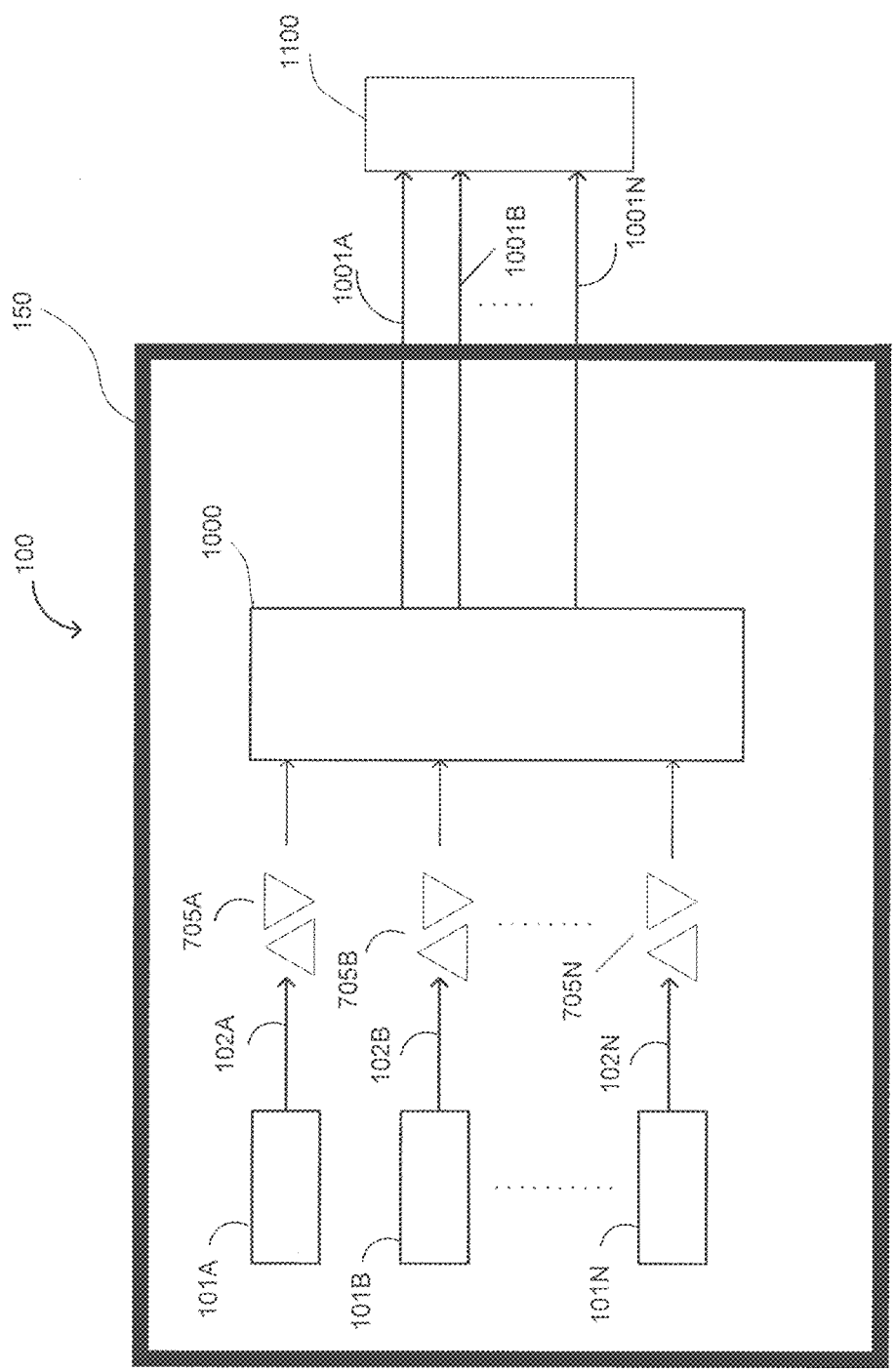
FIG. 7 depicts an example embodiment of a multi-laser system in which the beam adjusters comprise Risley prism pairs.

FIG. 7 depicts an example embodiment of a multi-laser system in which the beam adjusters 504A-504N comprise Risley prism pairs 705A-705N. In other embodiments, other systems may be used as the separate beam position adjusters 504A-504N. In various embodiments, the laser boresight and opto-mechanical angular errors may be compensated for by rotating the Risley prisms while the laser centration and opto-mechanical lateral positioning errors may be compensated for by adjusting the Risley prism assembly pitch, yaw, and/or separation between the individual prisms (e.g., by adjusting one or both of the individual prisms). The aligned laser beams may then be positioned or combined into a desired spatial arrangement that a specific application requires by the beam positioning/combining system.

FIG. 7 depicts a Risley prism pair used with each laser beam. In other embodiments, a different number of Risley prisms may be used. Other optical elements can also be inserted into the optical path.

In various embodiments, Risley prisms comprising wedged optics, usually used in pairs, to redirect optical beams are used. In various embodiments, an incoming light beam enters a Risley prism pair, experiences refraction and redirection under Snell's Law, and exits the Risley prism pair. In some configuration of the Risley prisms, there is just a translation of the output beam with respect to the input beam. If the arrangement of the Risley prisms with respect to each other is changes, the output beam may experience an elevation deviation. The ability to control azimuth may be provided by rotating the prism pair together. Therefore, the Risley prism pair can be used to direct a light beam at a variety of elevation angles and azimuthal angles.

The Risley prism pairs 705A-705N wedge angles and the azimuthal rotation between the prisms are determined in accordance with the respective laser beam 102A-102N. As shown in FIG. 6, Risley prism pair 705A is configured to adjust the laser beam 102A, Risley prism pair 705B is configured to adjust the laser beam 102B, and Risley prism pair 705N is configured to adjust the laser beam 102N.

In the multi-laser system 100 shown in FIG. 7, a plurality of optical paths are depicted. A first optical path originates at laser 101A, passes through the Risley prism pair 705A, where laser boresight, centration and opto-mechanical angular and lateral positioning errors may be compensated through adjustment of the wedge angles of and the azimuthal rotation between the prism pair 705A, and then arrives at the beam combining/positioning system 1000. A second optical path originates at laser 101B, passes through the Risley prism pair 705B, where laser boresight, centration and opto-mechanical angular and lateral positioning errors may be compensated through adjustment of the wedge angles of and the azimuthal rotation between the prism pair 705B, and then arrives at the beam combining/positioning system 1000. An N-th optical path originates at laser 101N, passes through the Risley prism pair 705N, where laser boresight, centration and opto-mechanical angular and lateral positioning errors may be compensated through adjustment of the wedge angles of and the azimuthal rotation between the prism pair 705N, and then arrives at the beam combining/positioning system 1000.

Propagating along these paths, laser beams 102A-102N, which may have originally been far from one another, are repositioned to be closer together as beams 1001A-1001N. In some embodiments, the beams 1001A-1001N are parallel to one another. In other embodiments, the beams 1001A-1001N are not parallel to one another. Other optical components (e.g., lenses, prisms, polarization rotators, waveplates, etc.) can be included to alter the laser beams and/or optical paths.

Figure 8A:
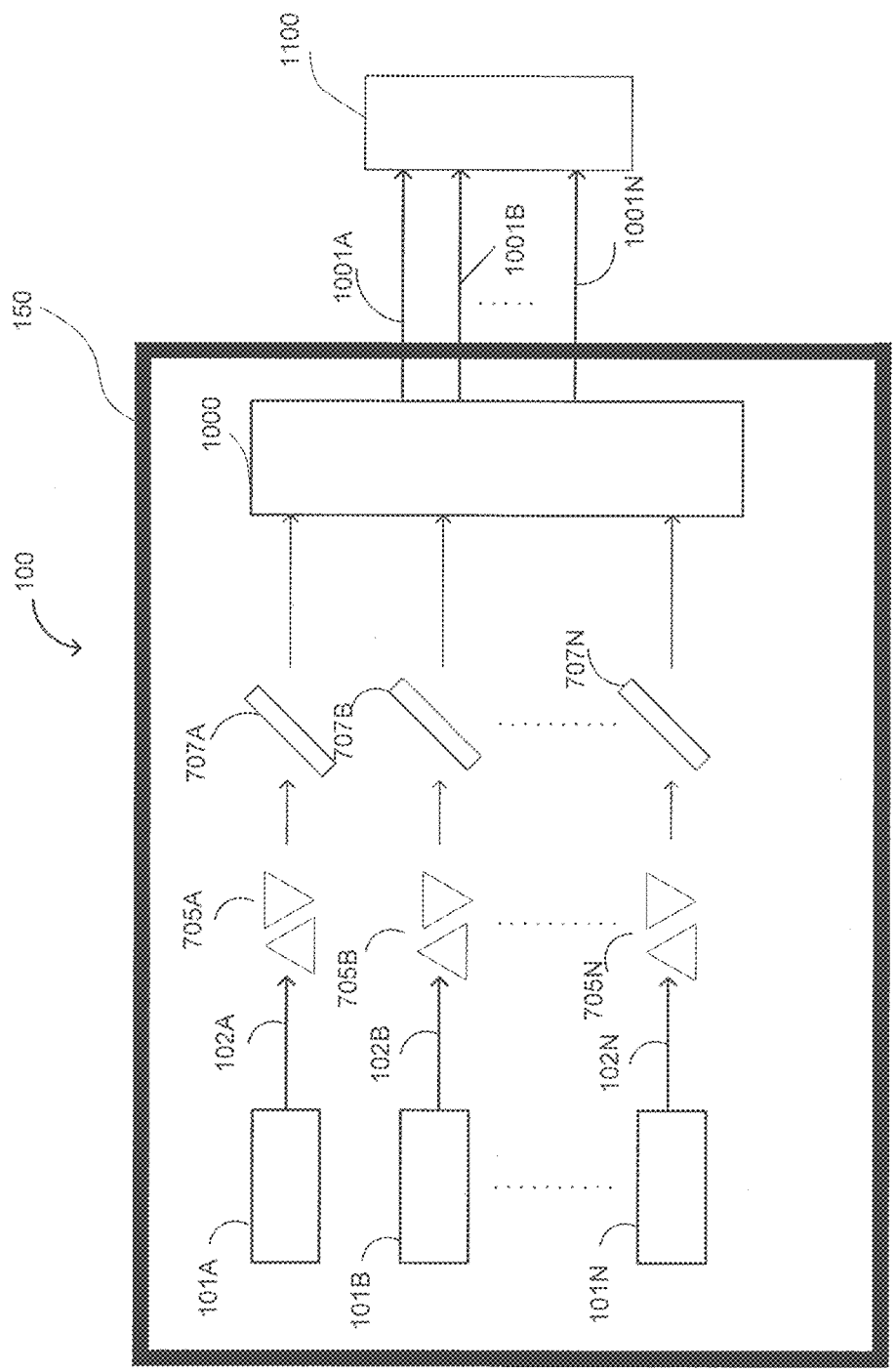
FIGS. 8A-8B depict example embodiments of a multi-laser system in which the beam adjusters comprise Risley prisms and plane parallel plates.
Figure 8B:
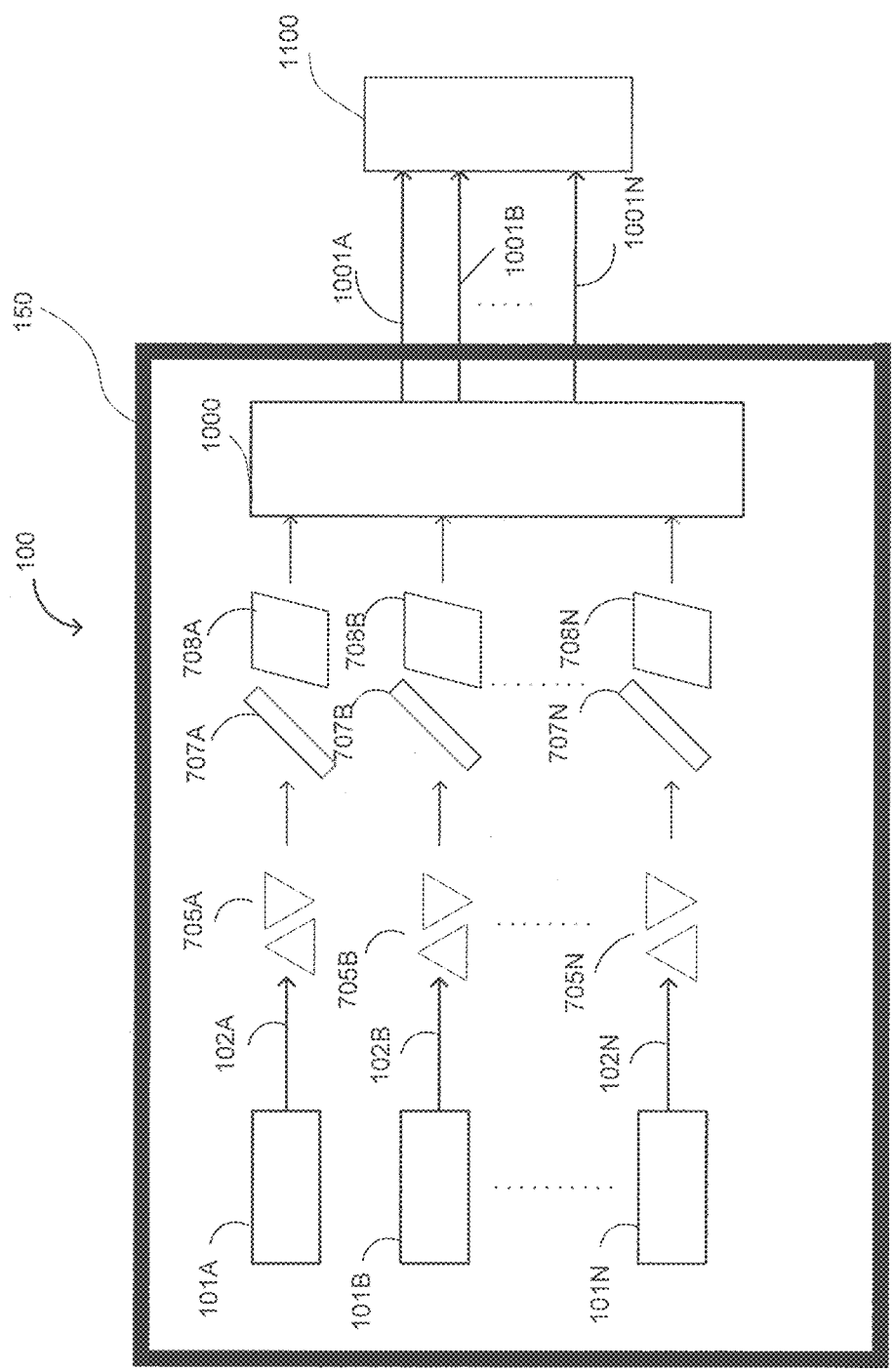

FIGS. 8A-8B depict example embodiments of a multi-laser system in which the beam adjusters comprise Risley prisms and plane parallel plates. In the embodiment of FIG. 8A, a combination of Risley prism pairs 705A-705N and glass etalon plates 707A-707N are used for the separate beam position adjusters 504A-504N illustrated in FIG. 5. In other embodiments, the etalon plates may be comprised of material other than glass. In some embodiments, the plane parallel plates may be made out of glass, or any material that is transparent to the wavelengths for which they are designed. In some embodiments, the material may include one of polymer, polycarbonate, polyethylene terephthalate, glycol-modified polyethylene terephthalate, amorphous thermoplastic, and/or other substrates. The etalon plates comprise plane parallel plates. Other optical elements may however be used in different embodiments. Adjustment of the beams may be provided for by using the combination of Risley prism pairs as described in relation to FIG. 7 above, and glass etalon plates 707A-707N. In the embodiment of FIG. 8A, a single glass etalon plate may be used for providing correction to lateral positioning errors in both x and y planes. In the embodiment of FIG. 8B, a separate glass etalon plate is used for correcting later positioning errors in each (e.g., by being tiltable along one axis) of the x and y planes or in both (e.g., by being tiltable along multiple axes) of the x and y planes.

In various embodiments, the laser boresight and opto-mechanical angular errors may be compensated for by rotating the prisms while the laser centration and opto-mechanical lateral positioning errors may be compensated for by adjusting the pitch and/or yaw of the parallel optical plate. The aligned laser beams may then be positioned or combined into a desired spatial arrangement by the beam positioning/combining system that a specific application requires.

In the multi-laser system 100 shown in FIG. 8A, a plurality of optical paths are depicted. A first optical path originates at laser 101A, passes through the Risley prism pair 705A, where laser boresight and opto-mechanical angular errors may be compensated through adjustment of the wedge angles of the prism pair 705A, passes through the glass etalon plate 707A, where laser centration and opto-mechanical lateral positioning errors may be compensated for by adjusting the pitch and/or yaw of the glass etalon plate 707A, and then arrives at the beam combining/positioning system 1000. A second optical path originates at laser 101B, passes through the Risley prism pair 705B, where laser boresight and opto-mechanical angular errors may be compensated through adjustment of the wedge angles of the prism pair 705B, passes through the glass etalon plate 707B, where laser centration and opto-mechanical lateral positioning errors may be compensated for by adjusting the pitch and/or yaw of the glass etalon plate 707B, and then arrives at the beam combining/positioning system 1000. An N-th optical path originates at laser 101N, passes through the Risley prism pair 705N, where laser boresight, and opto-mechanical angular errors may be compensated through adjustment of the wedge angles of the prism pair 705N, passes through the glass etalon plate 707N, where laser centration and opto-mechanical lateral positioning errors may be compensated for by adjusting the pitch and/or yaw of the glass etalon plate 707N, and then arrives at the beam combining/positioning system 1000.

In the multi-laser system 100 shown in FIG. 8B, a plurality of optical paths are depicted. A first optical path originates at laser 101A, passes through the Risley prism pair 705A, where laser boresight and opto-mechanical angular errors may be compensated through adjustment of the wedge angles of the prism pair 705A, passes through glass etalon plates 707A, 708A, where laser centration and opto-mechanical lateral positioning errors may be compensated for by adjusting the pitch and/or yaw of the glass etalon plates 707A and/or 708A, and then arrives at the beam combining/positioning system 1000. A second optical path originates at laser 101B, passes through the Risley prism pair 705B, where laser boresight and opto-mechanical angular errors may be compensated through adjustment of the wedge angles of the prism pair 705B, passes through glass etalon plates 707B, 708B, where laser centration and opto-mechanical lateral positioning errors may be compensated for by adjusting the pitch and/or yaw of the glass etalon plates 707B and/or 708B, and then arrives at the beam combining/positioning system 1000. An N-th optical path originates at laser 101N, passes through the Risley prism pair 705N, where laser boresight, and opto-mechanical angular errors may be compensated through adjustment of the wedge angles of the prism pair 705N, passes through glass etalon plates 707N, 708N, where laser centration and opto-mechanical lateral positioning errors may be compensated for by adjusting the pitch and/or yaw of the glass etalon plates 707N and/or 708N, and then arrives at the beam combining/positioning system 1000.

Propagating along these paths, laser beams 102A-102N, which may have originally been far from one another, are repositioned to be closer together as beams 1001A-1001N. In some embodiments, the beams 1001A-1001N are parallel to one another. In other embodiments, the beams 1001A-1001N are not parallel to one another. Other optical components (e.g., lenses, prisms, polarization rotators, waveplates, etc.) can be included to alter the laser beams and/or optical paths.

Figure 9:
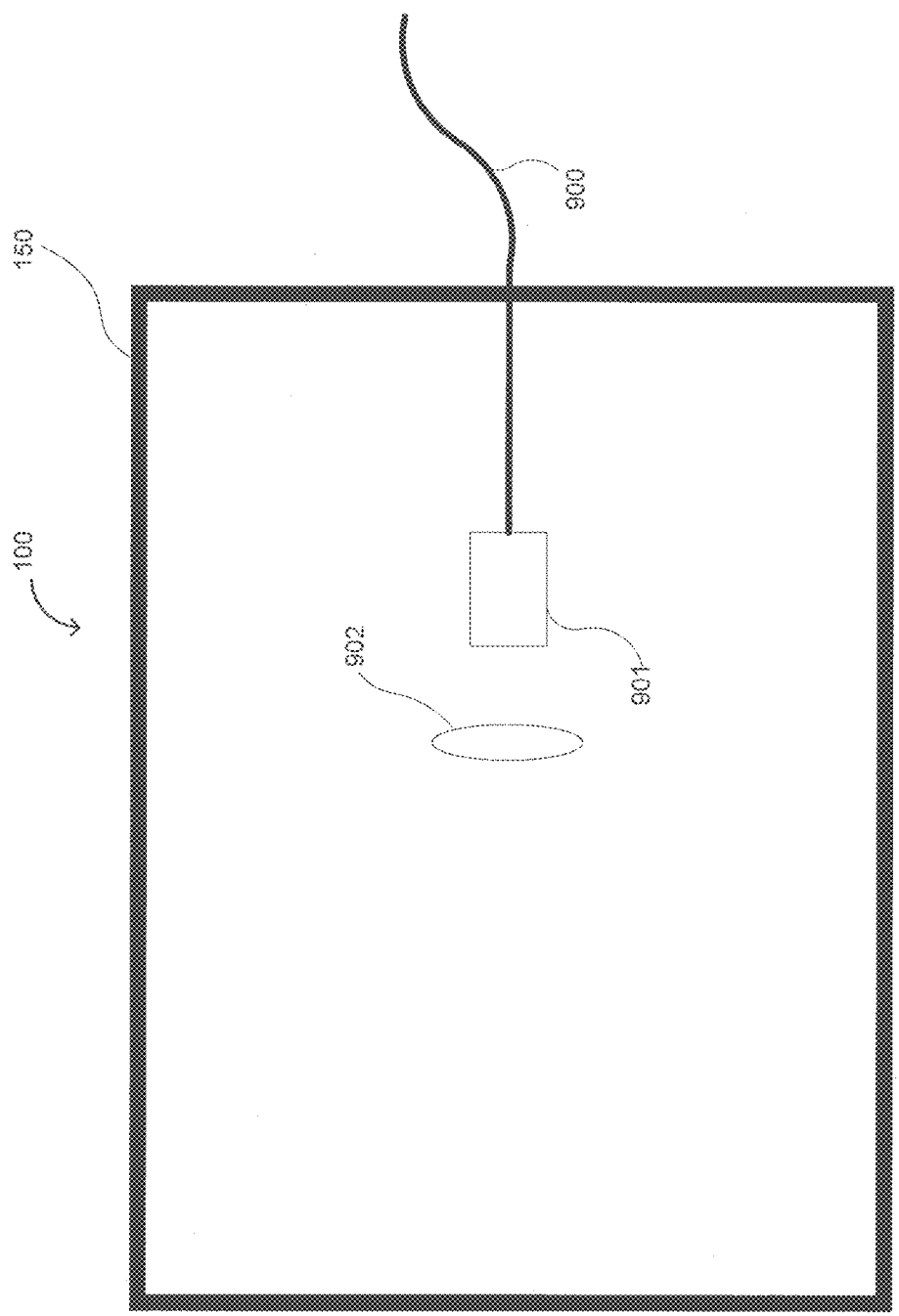
FIG. 9 depicts an example embodiment of a multi-laser system in which the target object comprises an optical fiber or waveguide.

FIG. 9 depicts an example embodiment of a multi-laser system in which the target object 1100 comprises an optical fiber or waveguide. An optional lens 902 may be used to couple the beams into the optical fiber 900. As shown in FIG. 9, the n laser beams may be combined, for example, by one of the embodiments for beam positioning and combining described above, or any combination of the embodiments described above and coupled into an optical fiber or waveguide. Both the coupling optics and fiber or waveguide may be located inside the temperature-controlled enclosure and hard-mounted to the enclosure's temperature controlled base plate 901.

Figure 10:
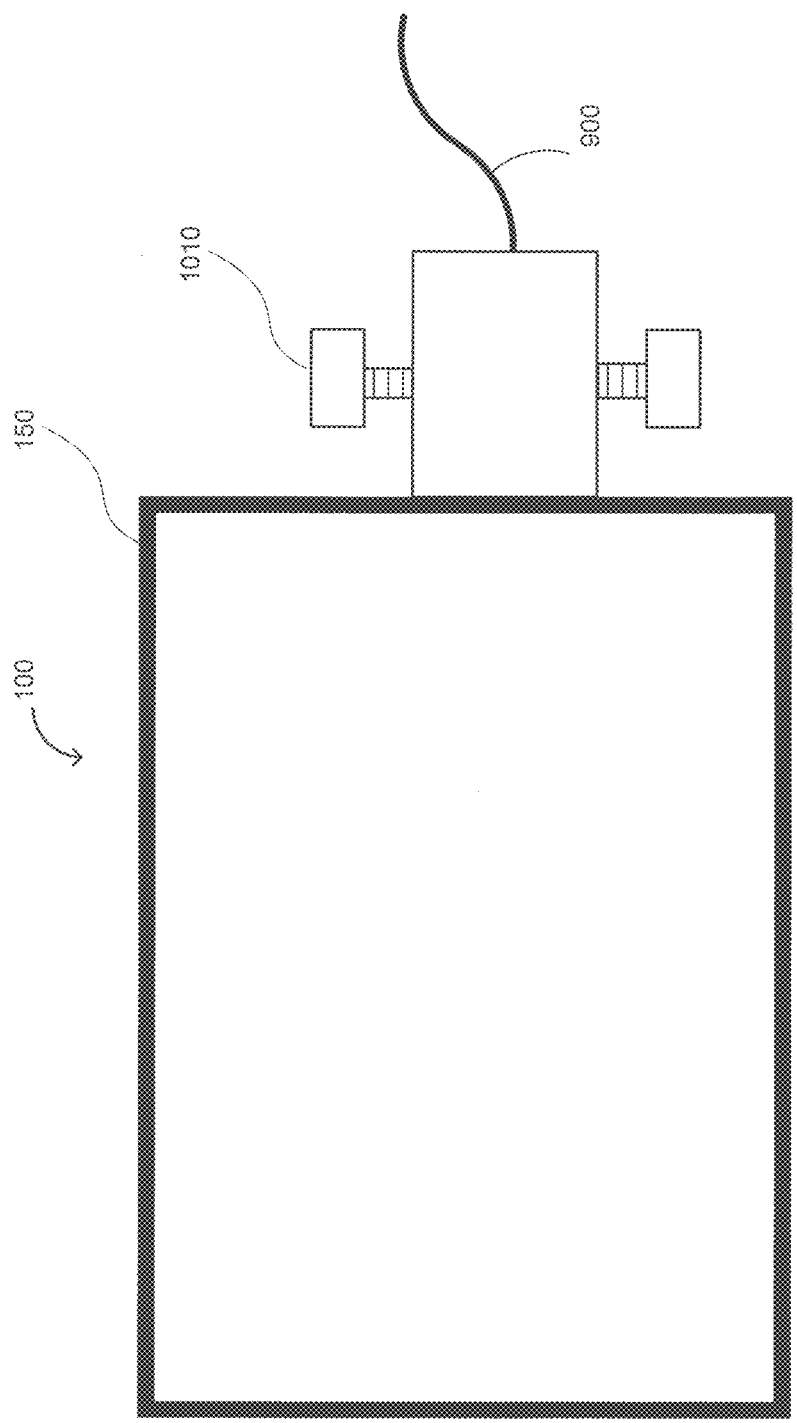
FIG. 10 depicts an example embodiment of a multi-laser system in which the target object comprises an adjuster mount.

FIG. 10 depicts an example embodiment of a multi-laser system in which the target object 1100 comprises an adjuster mount 1010. This adjuster mount may be configured to receive an optical fiber 900. Fiber optic coupling mounts are commercially available. In various embodiments, the fiber optic coupling mounts may comprise coupling optics mounted one focal length away from the optical fiber input with the optical axis of the coupling optics co-linear with a beam that would be emitted from the optical fiber. The coupling optics and optical fiber are mounted in a metal housing (e.g., a cylindrical housing) so that the alignment between the coupling optics and optical fiber input is maintained. This component may be a coupler/collimator assembly. In some embodiments, the mounts may comprise coupling optics and fiber in a metal housing. The coupler/collimator assembly is inserted into a positioning mount which is attached to the temperature-controlled enclosure. For polarization maintaining fibers the coupler/collimator assembly and positioning mounts may be keyed so as to provide registration between the polarization axis of the laser beams and the polarization axis of the optical fiber. The positioning mount may be made of metal. The mount has mechanical adjusters that allow the pitch, yaw, and lateral position of the coupler/collimator assembly to be moved relative to the input laser beams to optimize the amount of light coupled into the optical fiber. As shown in FIG. 10, the n laser beams may be combined, for example, by one of the embodiments for beam positioning and combining described above, or any combination of the embodiments described above and coupled into the adjustor mount or an optical element such as an optical fiber coupled to the adjuster mount. The optical fiber, coupling optics and coupling optimization hardware may be mounted at least partially on the outside of the temperature-controlled enclosure.

Figure 11A:
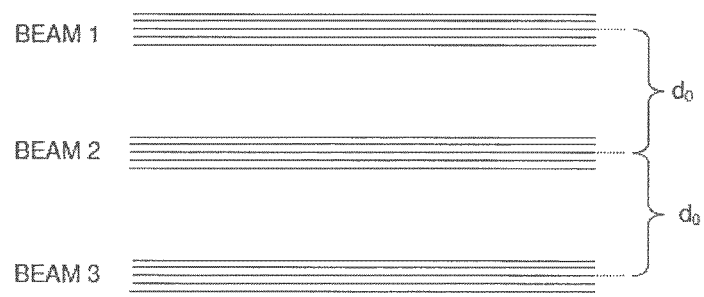
FIGS. 11A-11N depict example spatial arrangements of laser beams in multi-laser systems.
Figure 11B:
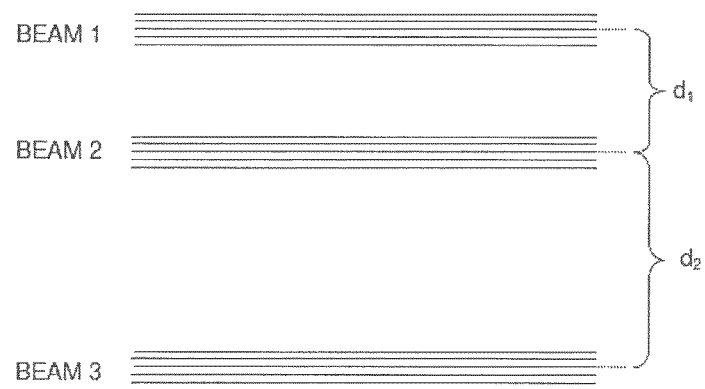
FIG. 11B depicts parallel collimated beams with different beam separations, $d_1$ and $d_2$.
Figure 11C:
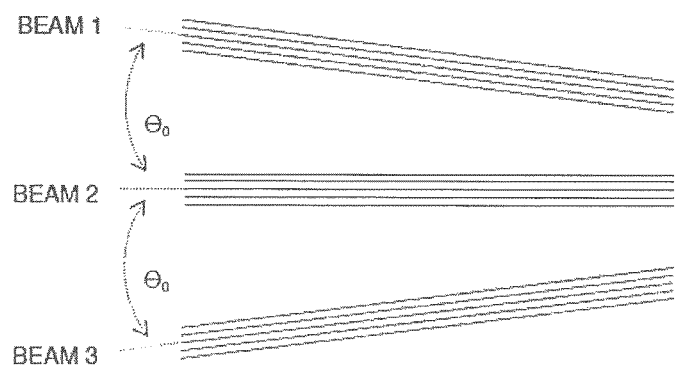
FIG. 11C depicts converging collimated beams with identical angular separations, $\theta_0$.
Figure 11D:
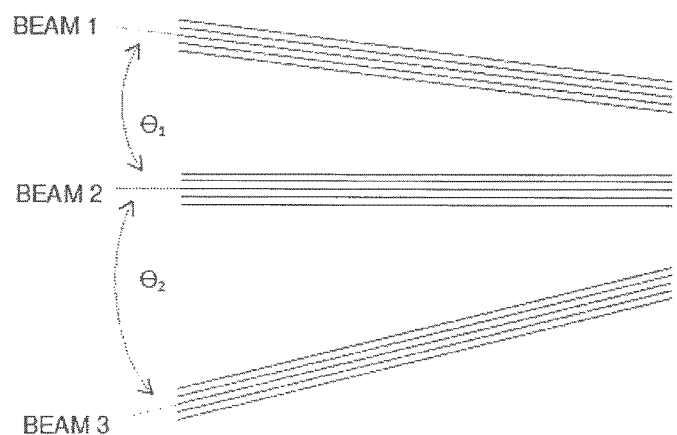
FIG. 11D depicts converging collimated beams with different angular separations, $\theta_1$ and $\theta_2$.
Figure 11:
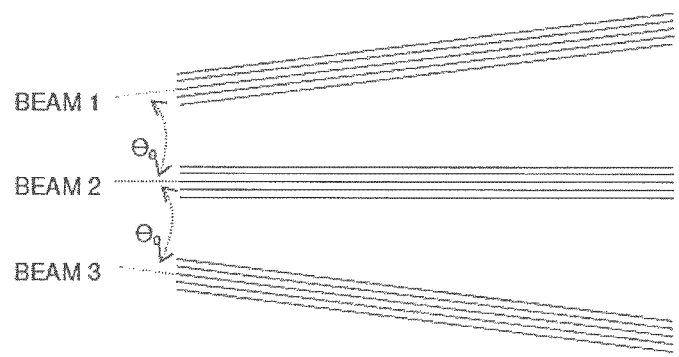
FIG. 11E depicts diverging collimated beams with identical angular separations, $\theta_0$.
FIG. 11F depicts diverging collimated beams with different angular separations, $\theta_1$ and $\theta_2$.
FIG. 11G depicts co-linear collimated beams.
FIG. 11H depicts parallel focused beams with identical beam separations, $d_0$.
FIG. 11I depicts parallel focused beams with different beam separations, $d_1$ and $d_2$.
FIG. 11J depicts converging focused beams with identical angular separations, $\theta_0$.
FIG. 11K depicts converging focused beams with different angular separations, $\theta_1$ and $\theta_2$.
FIG. 11L depicts diverging focused beams with identical angular separations, $\theta_0$.
FIG. 11M depicts diverging focused beams with different angular separations, $\theta_1$ and $\theta_2$.
Figure 11:
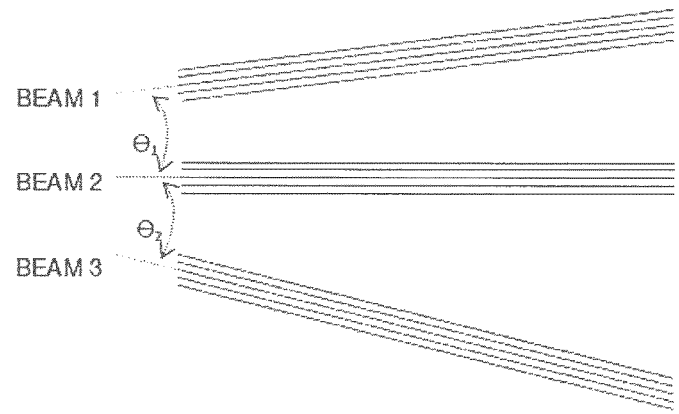
Figure 11G:
Figure 11H:
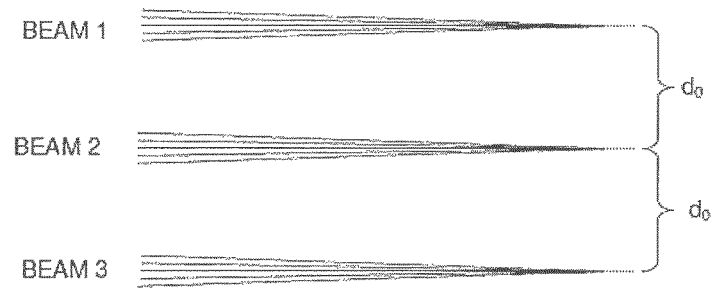
Figure 11I:
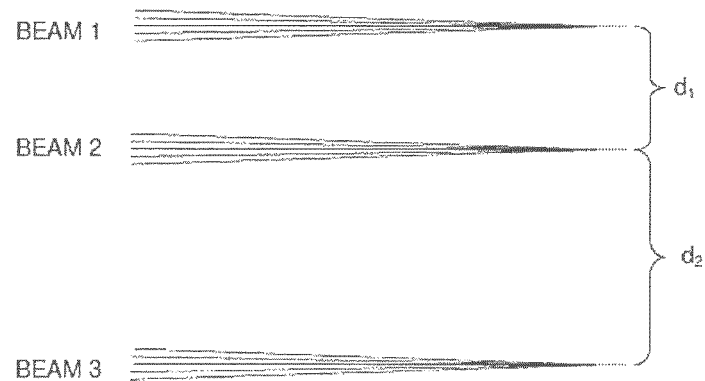
Figure 11J:
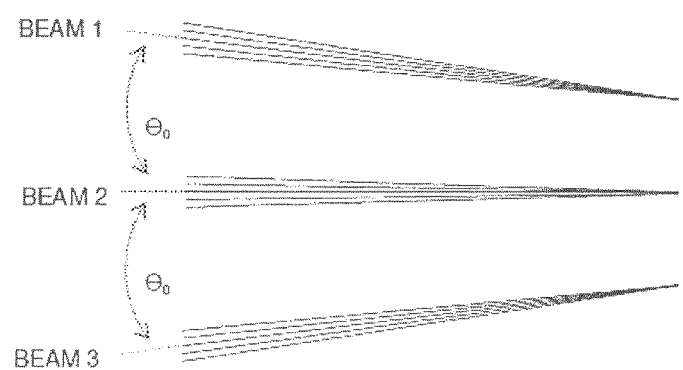
Figure 11K:
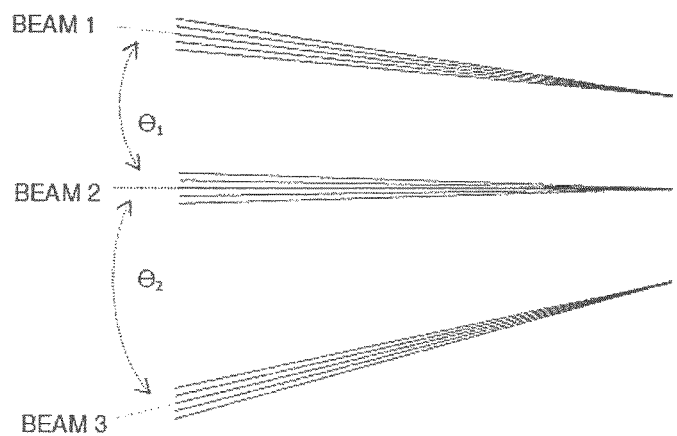
Figure 11L:
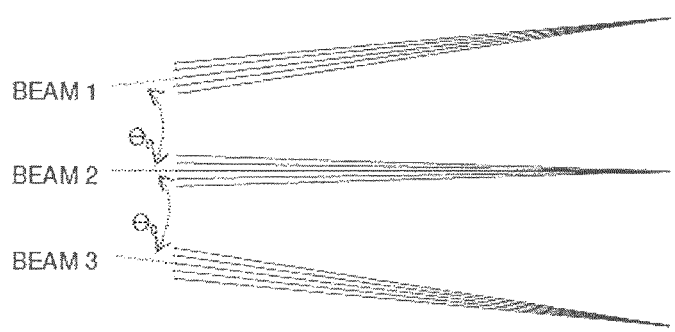
Figure 11M:
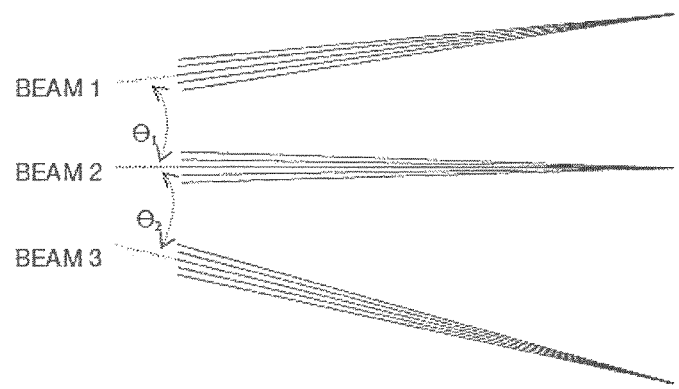
Figure 11N:

FIGS. 11A-11N depict example types and spatial arrangements of laser beams in multi-laser systems. The specific desired type and spatial arrangement of the laser beams may be application specific. The laser beams themselves may be collimated or focused. In some applications, however, it may be desirable to focus the laser beam in order to create small spot sizes at the target object and, hence, to increase power density or brightness on the target object. Accordingly, laser beams that are collimated or focused beams may be used. A plurality of collimated or a plurality of focused beams may be substantially co-linear to one another or at the target object. The plurality of beams may alternatively be substantially parallel to one another but spaced apart from each other, or converging towards each other, or diverging away from one another at the target object. In some embodiments, the plurality of parallel beams may have identical beam separations (such as a substantially constant separation do) at the target object, or different beam separations (such as separations $d_1, d_2, \ldots$) at the target object. In some embodiments, the plurality of converging or diverging beams may have identical angular separations (such as a substantially constant separation $\theta_0$) at the target object, or different angular separations (such as separations $\theta_1, \theta_2, \ldots$) at the target object. In some embodiments, the angular separation may be less than about 5°.

Some examples of spatial arrangements of laser beams are depicted in FIGS. 11A-11N. While these examples illustrate spatial arrangements of two or three laser beams, arrangements with more than two or three laser beams are also contemplated, having similar characteristics of the illustrated arrangements. In a first example, FIG. 11A depicts an example of parallel, or nearly parallel, collimated beams with identical, or nearly identical, beam separations, do. As used herein, the term "identical" is generally used to indicate that two things (e.g., a distance, angle, and the like) are within 3% of the measured characteristic of each other, unless the context of use of the term indicates otherwise. As used herein, the term "nearly identical" is generally used to indicate that two things (e.g., a distance, angle, and the like) are the within 10% of the measured characteristic of each other, unless the context of use of the term indicates otherwise. FIG. 11B depicts an example of parallel collimated beams with different beam separations, $d_1$ and $d_2$. FIG. 11C depicts an example of converging collimated beams with identical angular separations, $\theta_0$. FIG. 11D depicts an example of converging collimated beams with different angular separations, $\theta_1$ and $\theta_2$. FIG. 11E depicts an example of diverging collimated beams with identical angular separations, $\theta_0$. FIG. 11F depicts an example of diverging collimated beams with different angular separations, $\theta_1$ and $\theta_2$. FIG. 11G depicts an example of co-linear collimated beams. FIG. 11H depicts an example of parallel focused beams with identical beam separations, $d_0$. FIG. 11I depicts an example of parallel focused beams with different beam separations, $d_1$ and $d_2$. FIG. 11J depicts an example of converging focused beams with identical angular separations, $\theta_0$. FIG. 11K depicts an example of converging focused beams with different angular separations, $\theta_1$ and $\theta_2$. FIG. 11L depicts an example of diverging focused beams with identical angular separations, $\theta_0$. FIG. 11M depicts an example of diverging focused beams with different angular separations, $\theta_1$ and $\theta_2$. FIG. 11N depicts an example of co-linear focused beams.

Figure 12:
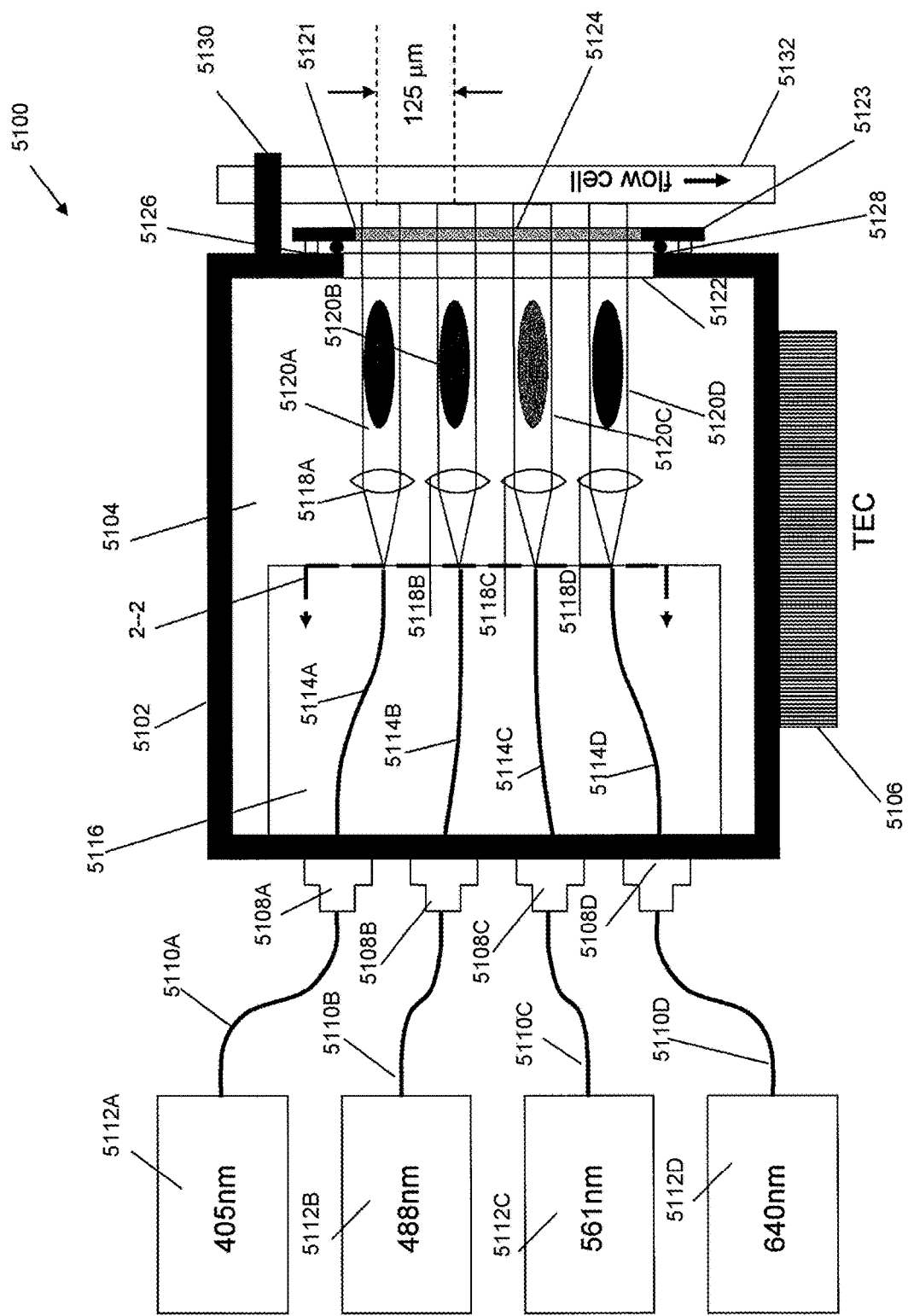
FIG. 12 schematically shows an optical system that can be used to direct light to samples for performing optical measurements such as laser-induced fluorescence and spectroscopic analysis.

FIG. 12 schematically shows an optical system 5100 that can be used to direct light to a sample for performing optical measurements such as laser-induced fluorescence and spectroscopic analysis. The optical system 5100 can include a housing 5102 enclosing an interior chamber 5104. The housing 5102 can be made of a thermally conductive material. The thermally conductive material can have a thermal conductivity between about 50 W/(m-K) and about 2000 W/(m-K). For example, the thermally conductive material may be copper which has a thermal conductivity of about 380 W/(m-K). A variety of thermally conductive metals can be used (e.g., copper or aluminum), as well as thermally conductive non-metals (e.g., ceramics or epoxy). The thermally conductive material can be used to form the entire housing, or merely a portion thereof. For example, substantially thermally conductive material can be used to form the top, the bottom, or any number of the sides of the housing 5102, or any combination thereof. In some embodiments, a majority of the housing 5102 is made of the substantially thermally conductive material. In some embodiments, only a relatively small portion of the housing 5102 is made of the substantially thermally conductive material. In some embodiments, a substantial portion of the housing 5102 is made of the substantially thermally conductive material. In some embodiments, multiple substantially thermally conductive materials can be used, with some areas of the housing 5102 being more thermally conductive than others.

In some of the embodiments discussed above, the housing is hermetically sealed from the ambient air. Thus, the interior chamber 5104 is isolated from air currents which can cause temperature variation, and the internal optical elements are protected from external contaminants. In some embodiments a getter (not shown) is located inside interior chamber 5104 which can reduce contaminant particles or chemical species. Additionally, a desiccant (not shown) can be positioned inside the interior chamber 5104 to reduce moisture.

A thermoelectric controller 5106 can be thermally coupled to the housing 5102. The thermoelectric controller 5106 can include one or more temperature sensors (not shown) (e.g., thermistors) to measure the temperature of the housing 5102 and/or the temperature of the interior chamber 5104, and a heat transfer system (not shown) for removing heat from or adding heat to the housing 5102 in order to maintain a substantially constant temperature in the housing or in the interior chamber. In some embodiments, the thermoelectric controller 5106 can include a cooler for removing heat (e.g., heat resulting from operation of the optical system). In some embodiments, the thermoelectric controller 106 can include a heater for heating the housing 5102 and internal chamber 5104. In some embodiments, the heater can be used to maintain the internal chamber 5104 at a temperature above the anticipated highest ambient temperature. In some embodiments, the thermoelectric controller 5106 can include a thermoelectric cooler (TEC). The heat transfer system can be coupled directly to the housing 5102 and to the cooler and/or heater (e.g. TEC). In some embodiments, the temperature can be held within held within ±1° C., ±2° C., ±3° C., ±5° C., etc. of the target temperature. In some embodiments, the temperature of the interior chamber 5104 is between 15° C. and 45° C.

In some embodiments, the housing is compact. For example, the housing may be a size of less than 10 cubic inches. The relatively small size of the volume allows for rapid adjustment of temperature in response to variations in the ambient temperature and thus more precise control of the temperature in the internal chamber 5104.

The optical system 5100 can include a number of optical input ports 5108A-5108D. Although the embodiment shown in FIG. 12 includes four optical input ports, a different number of optical input ports can be used. In some embodiments, the optical input ports 5108A-5108D can be secured and hermetically sealed into respective apertures formed in the housing 5102, and can engage optical fibers 5110A-5110D. A variety of fiber connectors can be used, such as screw-type optical fiber connectors (e.g., an FC connector), snap-type fiber connectors, or other fiber connectors known in the art or yet to be devised. In some embodiments, the optical input ports 5108A-5108D include an angle-polished fiber connector (e.g., an FC/APC connector). In some embodiments, at least a portion of the optical input ports 5108A-5108D, such as the threading of a screw-type connector, can be integrally formed as part of the housing 5102. The optical fibers 5110A-5110D include fiber connectors (not shown) configured to securely and precisely mate with the optical input ports 5108A-5108D so that light can be efficiently transferred from the optical fibers 5110A-5110D to a plurality of optical fibers 5114A-5114D within the internal chamber 5104. In some embodiments, the optical fibers 5110A-5110D are single mode optical fibers. Highly polarized light can be injected into the optical fibers 5110A-5110D (e.g., from a diode laser), and in some applications it can be advantageous to preserve the polarization of the light. Accordingly, polarization-maintaining optical fibers can be used. In some embodiments different types of optical fibers can be connected to different optical input ports 5108A-5108D. Likewise, in some embodiments, the different optical input ports 5108A-5108D can comprise different types of optical connectors.

The optical fibers 5110A-5110D can be coupled to laser light sources 5112A-5112D. Although the embodiment shown in FIG. 12 includes four lasers, a different number of lasers can be used. The lasers 5112A-5112D can include a variety of different laser types and can provide light of variety of different wavelengths. The optical system 5100 shown in FIG. 12 includes a 405 nm laser, a 488 nm laser, a 561 nm laser, and a 640 nm laser, but other common wavelengths of laser light can be used (e.g., light having a wavelength of 440 nm, 635 nm, or 375 nm). The lasers 5112A-5112D can be diode lasers, diode-pumped solid state lasers, frequency doubled lasers, or other laser types that produce light useful for example in laser-induced fluorescence and spectroscopic analysis. Although FIG. 12 shows the lasers 5112A-5112D connected to the optical input ports 5108A-5108D via the optical fibers 5110A-5110D, in some embodiments the optical fibers 5110A-5110D and the lasers 5112A-5112D can be disconnected from the optical input ports 5108A-5108D by the user so that other lasers can be interchangeably connected to the optical system 5100. Thus, the optical system 5100 is a versatile tool which a user can easily modify to utilize a wide variety of lasers without difficult and time-consuming adjustments.

The optical system 5100 can include a plurality of optical fibers 5114A-5114D contained within the internal chamber 5104. The optical fibers 5114A-5114D can be optically coupled to the optical input ports 5108A-5108D so that they receive light from the optical input ports 5108A-5108D and direct the light into the internal chamber 5104. In some embodiments, the cores of the optical fibers 5114A-5114D can be exposed by optical input ports 5108A-5108D so that the cores of the optical fibers 5110A-5110D can contact the cores of the optical fibers 5114A-5114D directly or come in substantial proximity to the cores of optical fibers 5114A-5114D. As with the optical fibers 5110A-5110D discussed above, the optical fibers 5114A-5114D can be single mode optical fibers and can be polarization-maintaining optical fibers.

In some embodiments, the optical system can include a fiber support structure 5116 that is configured to change the pitch of the optical fibers 5114A-5114D, bringing the output ends closer together than the input ends. For example, the optical input ports 5108A-5108D can be spaced about 10 to 20 millimeters or more apart from each other, so that the user can conveniently connect and disconnect optical fibers. The input ends of the optical fibers 5114A-5114D, which are coupled to the optical input ports 5108A-5108D, can be similarly distributed for example about 10 to 20 millimeters or more apart. The fiber support structure 5116 can have grooves (e.g., V-grooves) defining generally converging pathways, and the optical fibers 5114A-5114D can be secured in the grooves by a top-plate positioned over the grooves or by an adhesive. In some embodiments, the V-grooves can be configured to precisely hold the fibers. In some embodiments, silicon V-grooves manufactured using silicon processing techniques (e.g., etching, photoresists, etc.) can be used to secure the optical fibers 5114A-5114D. Grooves, holes, or slots for supporting the optical fibers 5114A-5114D may be formed in a support material (e.g., aluminum) by a machining process, such as electrical discharge machining (EDM). The fiber support structure 5116 can be configured to bring the optical fibers 5114A-5114D closer together so that when the light is output from the optical fibers 5114A-5114D the light is emitted from nearby locations (e.g., about 110 to 140 microns apart, and more specifically, about 125 microns apart, although other distances are possible).

Figure 13:
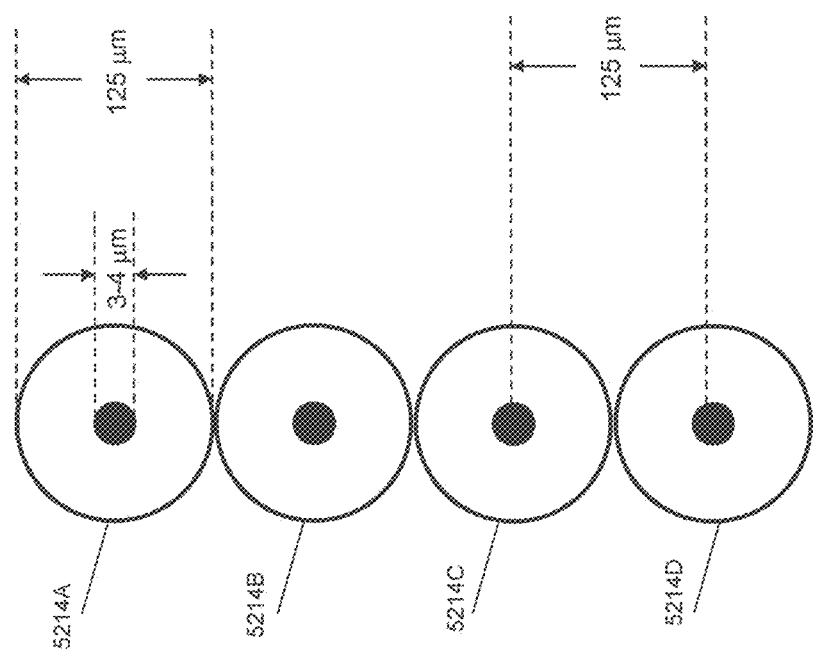
FIG. 13 is a cross-sectional view of an embodiment of an optical fiber array.

FIG. 13 is a cross-sectional view (shown from the position indicated by line 2-2 in FIG. 12) of an embodiment of optical fibers 5214A-5214D. As shown in FIG. 13, the optical fibers 5214A-5214D can be single mode optical fibers that have output ends measuring about 125 microns in total diameter, with the core measuring about 3-4 microns in diameter. Other sizes can be used. In the embodiment shown in FIG. 13, the output ends of the optical fibers 5214A-5214D are brought close together so that the cladding of one optical fiber is adjacent to the cladding of the next optical fiber, and light is emitted by the cores of optical fibers 5214A-5214D at locations which have centers positioned about 125 microns apart. Other arrangements are possible. It should be noted that the drawings herein are not drawn to scale (unless otherwise indicated), and in some embodiments the tapering of the optical fibers provided by the fiber support structure 5116 can be much more pronounced than is indicated in FIG. 12.

In some embodiments, the fiber support structure 5116 does not bring the optical fibers 5114A-5114D significantly closer together, but merely orients the optical fibers 5114A-5114D so that light is emitted in a direction that causes the light to contact the optical elements 5118A-5118D at a suitable angle. Other variations are possible.

Although the embodiment illustrated by FIG. 12 includes optical fibers 5114A-5114D, other types of waveguides can be used (e.g., planar waveguides). In some embodiments, the waveguides can be rigid waveguides. The waveguides can include curved and/or linear paths. The waveguides can include a taper to otherwise have an output end with outputs closer together than inputs at an input end, similar to the embodiment shown in FIG. 12. In some embodiments, an integrated waveguide chip is used.

Although the embodiment illustrated in FIG. 12 shows the optical fibers 5110A-5110D and the optical fibers 5114A-5114D as being different sets of optical fibers, in some embodiments, the optical system can include a single set of optical fibers that extend through the housing and couple to the laser light sources. In these embodiments, the optical input ports 5108A-5108D can be apertures in the housing 5102 through which the optical fibers can pass. In some embodiments, the apertures can include seals formed around the optical fibers to hermetically seal the interior chamber. Epoxy may be used to provide such a hermetic seal, although other approaches can be used. The optical fibers can include optical connectors (e.g., FC/APC connectors) configured to removably couple with the laser light sources 5112A-5112D.

The optical fibers 5114A-5114D (or waveguides) emit light toward a plurality of optical elements 5118A-5118D, which convert the light into beams of light 5120A-5120D having a suitable shape and/or size. The optical elements 5118A-5118D can be lenses, and can be separate individual lenses, or they can be conjoined forming a lens array. In some embodiments, optical elements 5118A-5118D can be compact microlenses. In some embodiments, a single lens can be used to produce each of the light beams 5120A-5120D. In some applications, it can be advantageous to produce elongated beams of light, such as beams of light having a generally elliptical cross-sectional shape (shown schematically in FIG. 12). For example, the beams of light 5120A-5120D can have a generally Gaussian profile, so that when illuminating a flow cell, the intensity of the light illuminating the center of the flow cell is significantly greater than the intensity of the light illuminating the peripheral edges of the flow cell. Accordingly, the beams of light 5120A-5120D can be elongated (e.g., elliptical) beams, so that the relatively high intensity center regions of the light beams extend across the entire width of the flow cell, while the relatively low intensity outer regions of the light beams do not strike the flow cell. By using an elongated (e.g., elliptical) beam of light, a more uniform lateral distribution of light across the narrow width of the flow cell can be achieved while illuminating a relatively small longitudinal area along the length of the flow cell and maintaining high light intensity. In some embodiments, the elliptical light beams can have a substantially elliptical cross sectional shape that measure about 5 to 15 microns in one direction and 55 to 100 microns in the other direction, or more specifically about 10 microns in one direction and about 70 microns in the other direction. Light beams of other shapes and sizes can be used. To produce elongated (e.g., elliptical) beams of light 5120A-5120D, optical elements 5118A-5118D can be anamorphic lenses (e.g., cylindrical lenses) or Powell lenses (Gaussian to flat-top transformers). In one embodiment, optical elements 5118A-5118D can be an anamorphic microlens array. In some embodiments, the optical elements 5118A-5118D can be achromatic lenses. In some embodiments, optical elements 5118A-5118D can be refractive and/or diffractive optical elements used to produce the elongated beams of light 5120A-5120D. In some embodiments, the optical elements 5118A-5119D can be located adjacent to the output ends of the optical fibers 5114A-5114D.

The optical system 5100 can include an output window 5121 that allows the beams of light 5120A-5120D to exit the internal chamber 5104. In some embodiments, the housing 5102 includes an aperture 5122 in a wall thereof and the output window 5121 comprises a transparent window pane 5124, positioned over the aperture 5122. The window pane 5124 can be made from glass or acrylic or a variety of other transparent materials (e.g., plastic). The aperture 5122 and window pane 5124 can assume a variety of shapes, but in some embodiments they are circular or elliptical. The window 5121 can be attached to the housing 5102 by a plurality of fasteners such as bolts 5126. In FIG. 12, only two bolts 5126 are shown in the cross-sectional view, but in some embodiments, additional bolts can be positioned along the edges of the window 5121. In some embodiments, the window 5121 can include a flange 5123 for mounting the window. The flange 5123 may have a plurality of through holes through which fasteners (e.g., bolts 5126) can pass to secure the window 5121 to the housing 5102. A seal 5128 (e.g., an O-ring) can be positioned between the housing 5102 and the window 5121 (e.g., the flange 5123). The bolts 5126 can be tightened, causing the O-ring 5128 to be compressed between the housing 5102 and the window 5121. In some embodiments, the O-ring 5128 produces a hermetic seal. Other approaches can be used to fasten the window 5121 to the housing 5102. For example, the window 5121 can be disposed in recess on the outer or inner surface of the housing 5102, or can be embedded into the housing 5102, or can be mounted onto the inside of the housing 5102. The window 5121 can be secured to the housing 5102 by an adhesive, epoxy, or cement.

Although the embodiment shown in FIG. 12 shows a single output window, multiple output windows can be used. For example, each beam of light 5120A-5120D can exit the interior chamber 5304 via a respective output window. In some embodiments, it is desirable that as much as possible of at least the inner surface area of the housing 5102 comprise the thermally conductive material, to better achieve temperature uniformity. Accordingly, the output windows can be separated by thermally conductive material and can cover only as much area as necessary to allow light beams 5120A-5120D to leave the interior chamber 5104. However, in some embodiments a single output window is easier and less expensive to construct.

In some embodiments, the optical elements (e.g., lenses or lens) that produce the light beams 5120A-5120D can be formed as part of the output window (or windows). For example, the window pane 5124 can include at least one curved surface to produce optical power, which can be configured to produce the plurality of light beams 5120A-5120D having a desired shape and/or size. The window pane 5124 can comprise a lens array such as a microlens array, and can be anamorphic as discussed above.

The optical system 5100 can include a flow cell connector 5130 that is attached to the housing, and the flow cell connector 5130 is configured to secure a flow cell 5132 so that it intersects the beams of light 5120A-5120D. In some embodiments, the flow cell connector 5130 can permanently attach the flow cell 5132 to the housing 5102. However, in some embodiments, the flow cell connector 5130 can allow the flow cell 5132 to be removably attached to the housing 5102. In some embodiments, the flow cell connector 5130 can be compatible with multiple types and/or sizes of flow cells. For example, the flow cell connector can include a clip, a friction or pressure fit coupling, a threaded portion configured to receive a corresponding threaded portion of the flow cell 5132, or a variety of other connectors known in the art or yet to be devised. The flow cell 5132 can be a capillary flow cell, and at least part of the flow cell can comprise a transparent material (e.g., glass) that allows the light beams 5120A-5120D to enter the flow cell 5132 and interact with a sample fluid contained within the flow cell 5132. In one embodiment, the flow cell 5132 can be a thin hollow tube, forming a flow path that has a diameter of about 10 microns. Other flow cell types and/or sizes can be used, and the flow cell 5132 can be oriented differently than as shown in FIG. 12. In some embodiments, the beams of light 5120A-5120D strike the flow cell over areas centered about 110 to 140 microns apart from each other, and in some embodiments, 125 microns apart from each other. For some forms of optical measurements, it is desirable for the laser light to strike the flow cell at specific locations (e.g., areas spaced about 125 microns apart). In some embodiments, the optical system 5100 mounts the optical fibers to automatically direct the light from the laser light sources 5112A-5112D to the desired locations of the flow cell 5132 without requiring the user to manipulate any mirrors or wavelength selective elements such as dichroic mirrors or optical elements.

The optical system 5100 can be compatible with various types of optical (e.g., spectroscopic) analysis. For example, for laser-induced fluorescence spectroscopy, a fluorescent dye designed to bond with an analyte can be introduced into the fluid sample. When the fluid sample passes through the beams of light 5120A-5120D, the fluorescent dye absorbs photons and emits photons that have a longer wavelength (less energy). By using photodetectors such as a photomultiplier tube (PMT) (not shown) to measure the amount of light that is emitted, the presence or concentration of the analyte in the sample fluid can be measured. For absorption spectroscopy, photodetectors (not shown) can be positioned on the side of the flow cell 5132 opposite the housing 5102 to determining the amount of light that is absorbed by the fluid sample. The optical system 5100 can also be compatible with other types of optical measurements or spectroscopic analysis.

Figure 14:
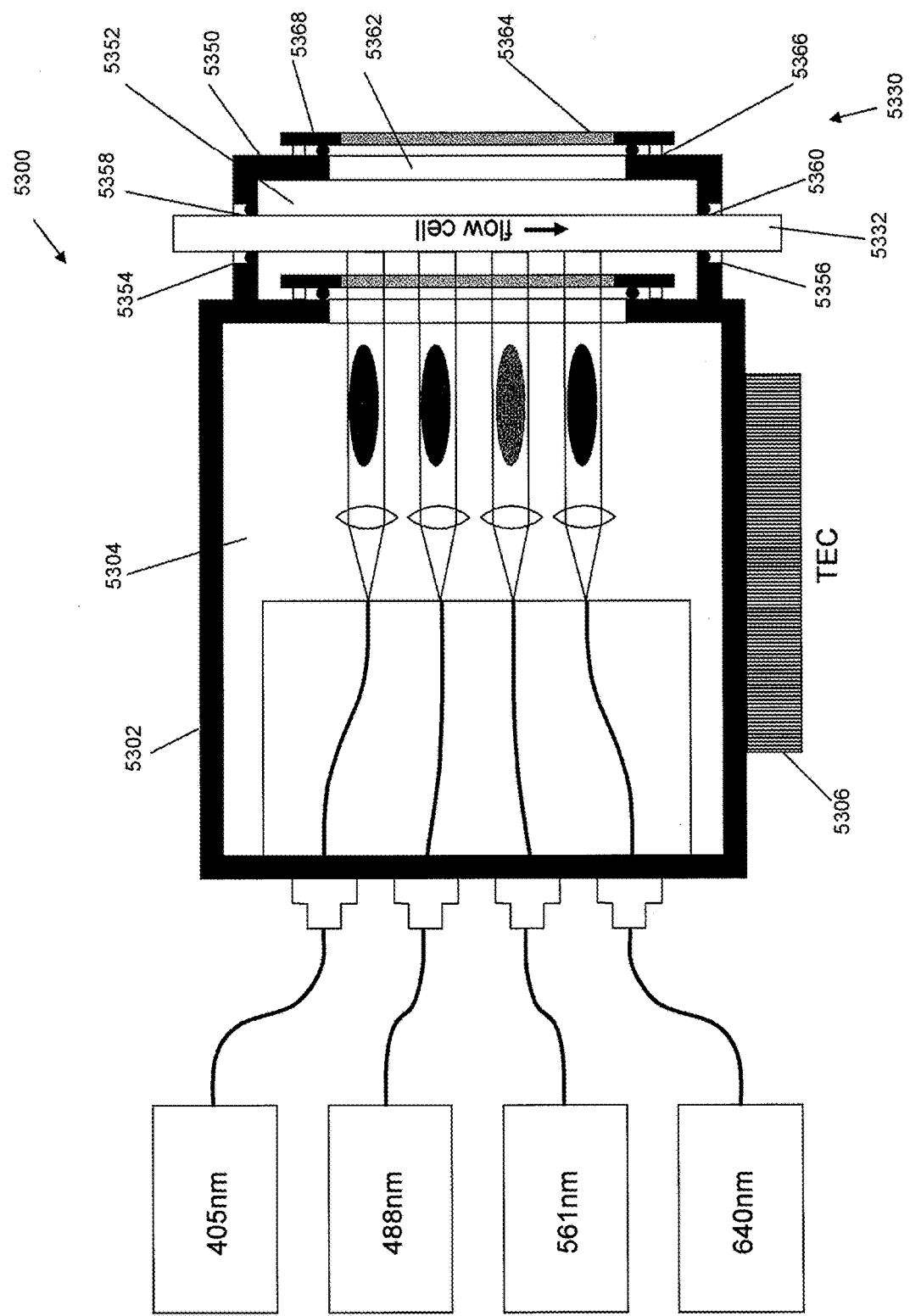
FIG. 14 schematically shows another optical system that can be used to direct light to samples for performing optical measurements such as laser-induced fluorescence and spectroscopic analysis.

FIG. 14 schematically shows an embodiment of an optical system 5300 that can be used to direct light for optical measurements (e.g., laser-induced fluorescence and spectroscopic analysis). The optical system 5300 is similar to optical system 5100 in some aspects, and similar elements are labeled with the same reference numerals used in FIG. 12 except that the numbers are increased by 200. The optical system 5300 can include a flow cell connector 5330 that comprises a thermally conductive auxiliary sample housing 5350 which encloses an interior chamber 5352. The flow cell connector 5330 can be configured to secure a flow cell 5332 so that it passes through the interior chamber 5352. For example, the sample housing 5350 can include two apertures 5354, 5356 and two flexible seals 5358, 5360, so that the flow cell 5332 can be slidably inserted through the apertures 5354, 5356 and held in place by friction against the flexible seals 5358, 5360. Alternatively, the sample housing 5350 can include a door allowing the sample housing 5350 to be opened and the flow cell 5332 to be placed inside. In various embodiments where the interior chamber 5352 of sample housing 5350 is hermetically sealed with respect to interior chamber 5304 of the main housing 5302, the interior chamber 5352 of the sample housing 5350 can be exposed to ambient air without exposing the components contained within interior chamber 5304 of the main housing 5302. Accordingly, the interior chamber 5352 of the sample housing 5350 can be exposed to ambient air when flow cell 5332 is removed and the seals 5358, 5360 may be excluded in some embodiments.

In some embodiments, the sample housing 5350 can be integrally formed as part of the main housing 5302 or can be thermally coupled to the main housing 5302 so that the thermoelectric controller 5306 regulates the temperature within the interior chamber 5352 of the sample housing 5350 as well as the interior chamber 5304 of the main housing 5302. In some applications it may be desirable to maintain the internal chamber 5352 of the sample housing 5352 enclosing the flow cell at a different temperature than the internal chamber 5304 of the main housing 5302, such as when a fluid sample is used that should be maintained at a different temperature than the interior chamber 5304 of the main housing 5302. Accordingly, in some embodiments, a second thermoelectric controller (not shown) can be thermally coupled to the sample housing 5350 and an insulating layer (not shown) can be positioned at the transition between the main housing 5302 and the sample housing 5350 so that the internal chamber 5352 of the sample housing 5350 can be maintained at a different temperature than the interior chamber 5304 of the main housing 5302.

The optical system 5300 can include a second output window for transmitting light out of the internal chamber 5352 of the sample housing 5350. The second output window can be similar to the output window described above, and cover an aperture 5362 covered with a transparent window pane 5364. The transparent window pane 5364 can be attached to the housing 5350 by bolts 5366 and sealed by a seal 5368. In some embodiments, the interior chamber 5352 of the sample housing 5350 is not hermetically sealed and the seal 5368 can therefore be a non-hermetic seal or can be omitted altogether.

Figure 15:
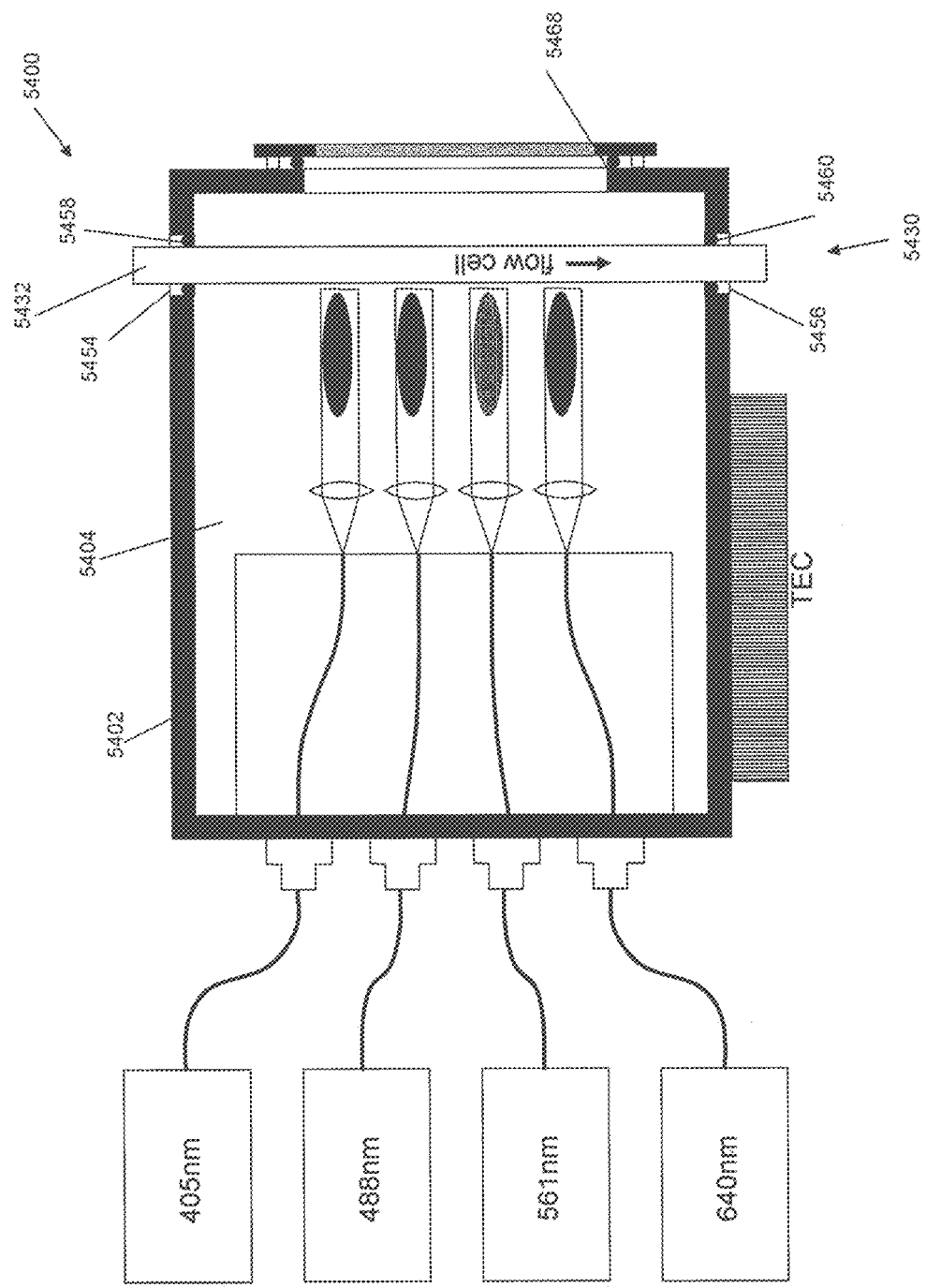
FIG. 15 schematically shows another optical system that can be used to direct light to samples for performing optical measurements such as laser-induced fluorescence and spectroscopic analysis.

FIG. 15 schematically shows an embodiment of an optical system 5400 that can be used to direct light for optical measurements such as laser-induce fluorescence and spectroscopic analysis. The optical system 5400 is similar to optical systems 5100 and 5300 in some aspects, and similar elements are labeled with the same reference numerals used in FIGS. 12 and 14 except that the numbers are increased by 200 and 100 respectively. Optical system 5400 can include a flow cell connector 5430 that attaches a flow cell 5432 to the housing 5402 so that the flow cell 5432 passes through the housing 5402. For example, the housing 5402 can comprise two apertures 5454, 5456 and two flexible seals 5458, 5460, so that the flow cell 5432 can be slidably inserted through the apertures 5454, 5456 and held in place by friction against the flexible seals 5458, 5460. Alternatively, the housing 5402 can include a door allowing the housing 5402 to be opened and the flow cell 5432 to be placed inside. In some embodiments, the interior chamber 5404 can be exposed to ambient air when flow cell 5432 is removed and the seals 5458, 5460 can be non-hermetic seals. Also, the seal 468 can be a non-hermetic seal or can be omitted altogether.

As discussed above, various embodiments of the optical systems described herein can be used to perform a variety of optical measurements, such as, for example laser-induced fluorescence (LIF) measurements. Embodiments disclosed herein, such as those using LIF, can be useful in biological and/or chemical analysis. For example, LIF can be used in DNA sequencing applications, molecular diagnostic applications, confocal microscopy, or flow cytometry. FIG. 16 illustrates an embodiment of an optical system 1600 configured to analyze a sample 1613, for example using laser induced fluorescence. The optical system comprises a light source 1601 configured to direct light at one or more incident wavelengths towards the sample 1613 along an incident path. Light from the light source 1601 can be focused onto a portion of the sample 1613 using a lens 1611. In various implementations, the lens 1611 can comprise a microscope objective lens. In some implementations, the lens 1611 can comprise an infinity corrected objective lens. Other types of focusing lenses can also be used as the lens 1611. In some embodiments, the lens 1611 can include multiple lens elements. The light source 1601 can comprise one or more lasers and/or one or more light emitting diodes (LEDs). The light source 1601 can be configured to emit light at one or more incident wavelengths in a wavelength range between about 250 nm and about 980 nm, or an values or ranges therebetween, in some examples. The optical power of the one or more incident wavelengths emitted from the light source 1601 can be between about 1 mW and about 10,000 mW, or any values or ranges there between, in some example. Various types of lasers can be used, including continuous-wave (CW) lasers, quasi CW lasers, pulsed lasers, laser diodes, multi-mode lasers, etc. The sample 1613 may be a biological or a chemical sample, which can be tagged with one or more fluorescent dyes that absorb the light at the one or more incident wavelengths and emit fluorescence radiation at one or more fluorescent wavelengths. The fluorescence radiation at the one more fluorescent wavelengths emitted by the sample 1613 is directed along an emission path and imaged by an imaging device 1603, such as, for example, a camera.

In various implementations, a portion of the incident path and the emission path can be combined using a beam combiner 1609, such as, for example a dichroic mirror. The beam combiner 1609 can be configured to reflect incident light from the light source 1601 towards the sample 1613 and can transmit fluorescence radiation at the one or more fluorescent wavelengths towards the imaging device 1603. In various implementations, a wavelength selective filter 1602 can be disposed in the incident path to transmit light at one or more selected wavelengths. The wavelength filter 1602 can be disposed in a filter wheel or other filter switcher comprising a plurality of wavelength selective filters configured to transmit light at one or more different wavelengths. The filter 1602 can be used to control the wavelength of light that illuminates the sample. For example, the light source 1601 can output blue, green, and red light, and the filter 1602 can attenuate the red and green light while permitting the blue light to be directed to the sample. The filter 1602 can be selectively change (e.g., using the filter wheel or other filter selector) in order to change the wavelength of light that is directed to the sample 1613 (while using the same light source 1601). Various different colors of lasers and filters can be used, such as depending on the florescent dyes that are used. A second wavelength selective filter 1607 can be disposed in the emission path to transmit fluorescence radiation at one or more selected fluorescent wavelengths. The second wavelength filter 1607 can also be disposed in a filter wheel or other filter selector comprising a plurality of wavelength selective filters configured to transmit light at one or more different wavelengths. The filter 1607 can be selectively changed in order to control the wavelength of light that reaches the camera 1603. The emission path can comprise one or more optical lenses 1605. In some implementations, the one or more optical lenses 1605 can be a tube lens. The one or more optical lenses 1605 can focus the light onto the camera 1603.

Figure 17:
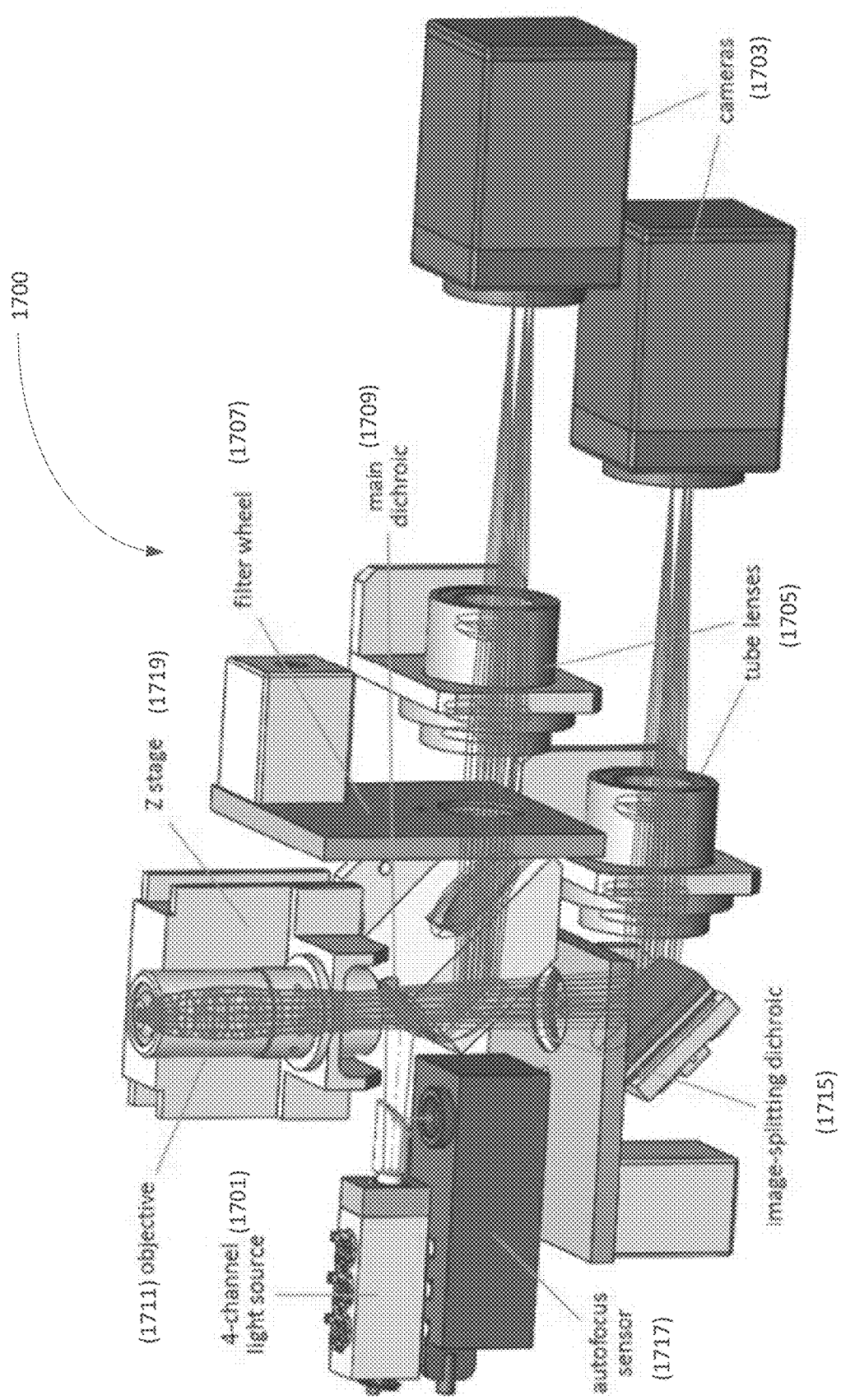
FIG. 17 illustrates another embodiment of an optical system configured to analyze biological and/or chemical samples using laser-induced fluorescence.

FIG. 17 illustrates another embodiment of an optical system 1700 configured to analyze biological and/or chemical samples using laser-induced fluorescence. Various aspects of the optical system depicted in FIG. 17 can be similar to the optical system 1600 depicted in FIG. 16. The optical system comprises a light source 1701 (e.g., a 4-channel light source) configured to emit incident light that is focused onto a sample using a lens 1711 (e.g., a microscope objective lens, an infinity-corrected objective lens, etc.). The lens 1711 can be mounted on a translational stage 1719 configured to adjust the position of the focus with respect to the sample. The optical system can comprise an autofocus system 1717 configured to focus the incident light onto the sample. Fluorescence radiation emitted from the sample is split along two imaging paths and imaged by two imaging devices 1803 (e.g., camera). A filter wheel 1707 or other filter switcher can be disposed in one of the two imaging paths to select one or more fluorescent wavelengths. Many variations are possible. For example, the filter 1707 can be omitted in some embodiments. Multiple cameras can be used, and multiple dichroic mirrors can be used to direct particular wavelengths of light to the cameras.

Referring to FIG. 16, the sample 1613 can be contained in a flow cell. An example flow cell 1830 is depicted in FIG. 18. The flow cell 1830 can comprise an array of tiles 1833. Different tiles in the array can contain different samples to be analyzed. The samples can include DNA, DNA clusters, bacteria, chemical formulations, etc. The optical system 1600 (and/or the optical system 1700) can be configured to analyze the different samples contained in the array of tiles by causing relative movement between the flow cell 1830 and the optical system 1600. For example, the lens 1611 (or the lens 1711) or the flow cell 1830 can be moved in a plane normal to the optical axis of the lens 1611 (or the lens 1711) such that light from the light source 1601 (or the light source 1701) at the one or more incident wavelengths is focused onto different tiles of the tile array at different times. An actuator can move the flow cell and/or optical system relative to each other, such as in two dimensions, such as using an XY stage. To efficiently excite only the sample contained in the tile onto which the light from the light source 1601 (or the light source 1701) at the one or more incident wavelengths is focused, it is desirable that the spot size of the focused light is matched to the size of the tile and that the intensity of light is substantially uniform across the area of the tile. For example, as shown in the inset of FIG. 18, the illumination profile is substantially uniform across the surface of the tile 1833. As used herein, intensity variation less than or equal to about 20% from an average intensity can be considered to be substantially uniform. As illustrated in FIG. 18, the illumination profile can be substantially uniform across a substantial portion (e.g., greater than or equal to about 50%) of the length and the breadth of tile 1833. For example, light intensity along the axis 1835 parallel to the breadth of the tile 1833 can be substantially uniform (e.g., intensity variation less than or equal to about 20% from an average intensity) over at least 50% of the breadth of the tile 1833. The light intensity along the axis 1837 parallel to the length of the tile 1833 can be substantially uniform (e.g., intensity variation less than or equal to about 20% from an average intensity) over at least 50% of the length of the tile 1833. The light intensity across a substantial portion of the breadth of the tile 1833 can be approximately equal to the light intensity across a substantial portion of the length of the tile 1833. Without any loss of generality, the variation of light intensity across the length and the breadth can be substantially flat for a substantial portion of the length and breadth and rapidly fall off near the edges of the tile 1833 to advantageously allow uniform illumination across the surface of the tile 1833 without exciting the samples in adjacent tiles. For example, the intensity of any side lobes can be less than or equal to 1%. In this manner, it can be accomplished that only the fluorescent dyes tagged to the sample contained in the tile 1833 are excited by the incident light and fluorescent dyes tagged to different samples in adjacent tiles are not excited by the incident light. Systems and methods of generating light with uniform intensity profile for laser-induced fluorescence are discussed below. Many variations are possible. The light intensity can vary by less than or equal to about 2%, about 3%, about 5%, about 7%, about 10%, about 15%, about 20%, about 25%, about 30%, or any values or ranges therebetween, across at least about 30%, about 40%, about 50%, about 60%, about 70%, about 80%, or about 90% of the area of the tile, or of the length and/or breadth of the tile, or any values or ranges therebetween. In some embodiments, a flat-top distribution of light can be produced, as discussed herein. The light delivered to the flow cell can have a light profile shape that generally conforms to the shape of the flow cell or frame 1833. In the illustrated embodiment, the frame 1833 has a square shape, and the light delivered to the frame 1833 can have a generally square shaped distribution (e.g., square with rounded edges flat-top distribution). Other shapes of light distribution can be used, such as rectangular, circular, triangle-shaped, etc. The more light intensity and/or covered area that is put into the sample, the shorter the exposure time can be for the camera, which can result in faster measurement times and more throughput. The improved illumination embodiments disclosed herein can also provide improved image quality and measurement accuracy.

Figure 19A:
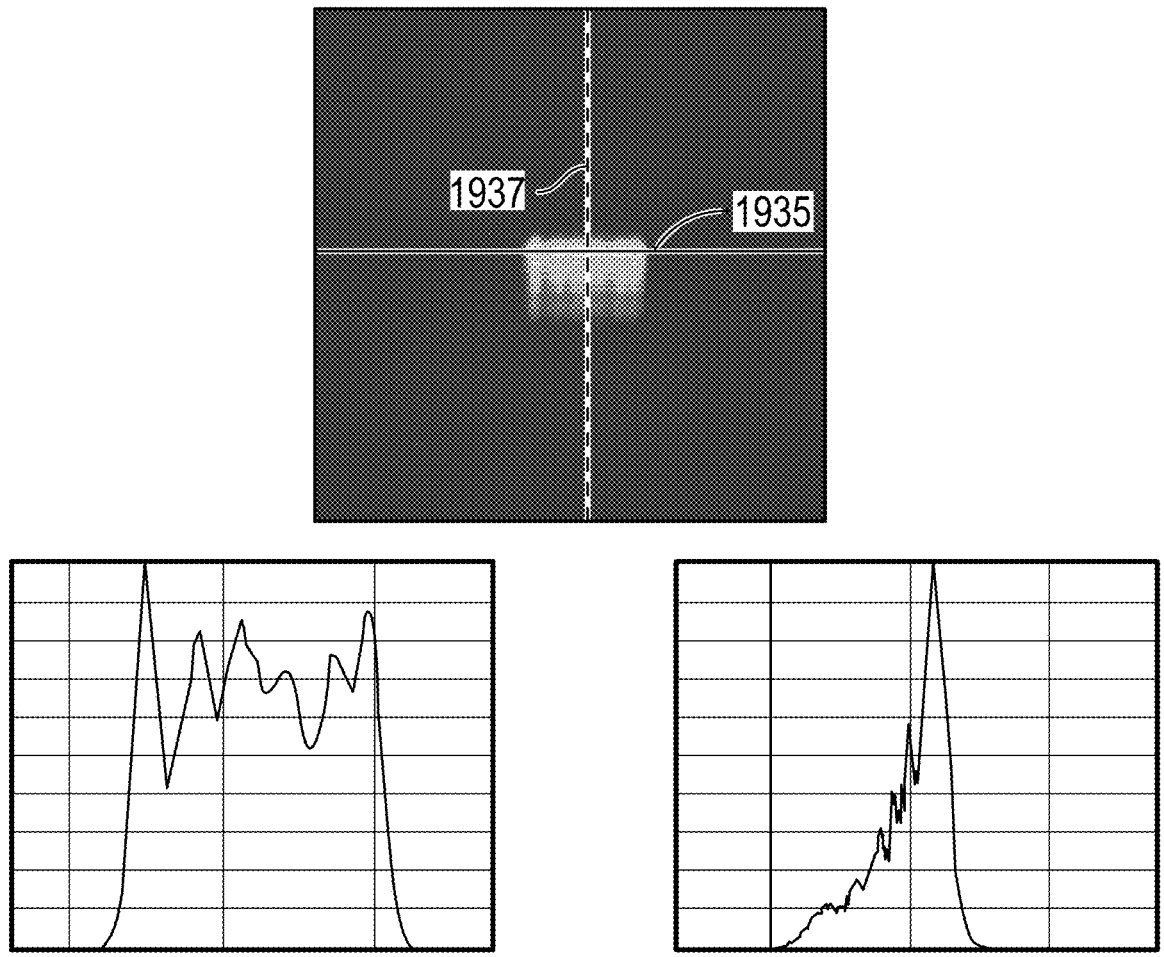
FIG. 19A depicts the intensity profile for light output by an example light source.

Without any loss of generality, intensity light from the light source 1601 (or the light source 1701) comprising one or more lasers or LEDs need not be uniform across the length and the breadth or area of the tile. For example, the variation in the intensity across the length and/or the breadth of the tile can be greater than or equal to about 20% of the average light intensity for the substantial portion of the light area. FIG. 19A depicts the intensity across the length extending along axis 1937 and across the breadth extending along axis 1935, for light output by an example light source. The intensity profile on the left of FIG. 19A corresponds to the variation of intensity across the breadth extending along axis 1935 and the intensity profile on the right of FIG. 19A corresponds to the variation of intensity across the length extending along axis 1937. As noted from FIG. 19A, the variation of intensity across the breadth extending along axis 1935 and across the length extending along axis 1937 is not uniform and exhibits many peaks valleys. In some embodiments, the light source 1601 or 1701 can use one or more multi-mode lasers (e.g., laser diodes), which in some cases can contribute to the non-uniformity of the light distribution. Multi-mode laser diodes can be advantageous for availability and cost reasons, and the optical system can be configured to modify the light to increase uniformity.

Using optical systems and methods described herein, the variation of intensity across the breadth extending along axis 1935 and across the length extending along axis 1937 can be configured to be substantially uniform as shown in FIG. 19B. For example, using optical systems and methods described herein, the variation of intensity across the breadth extending along axis 1935 can be made substantially uniform across a substantial portion of the breadth of the tile as shown in the intensity profile on the left of FIG. 19B. Similarly, the variation of intensity across the length extending along axis 1937 can be made substantially uniform across a substantial portion of the length of the tile as shown in the intensity profile on the right of FIG. 19B. As noted from the intensity profiles on the left and the right of FIG. 19B, the intensity profile has a smooth flat top with steep sides to provide uniform illumination across the length and the breadth or area of tile while dropping of quickly at the edges of the tile to reduce the chance of exciting samples in neighboring tiles.

Figure 20:
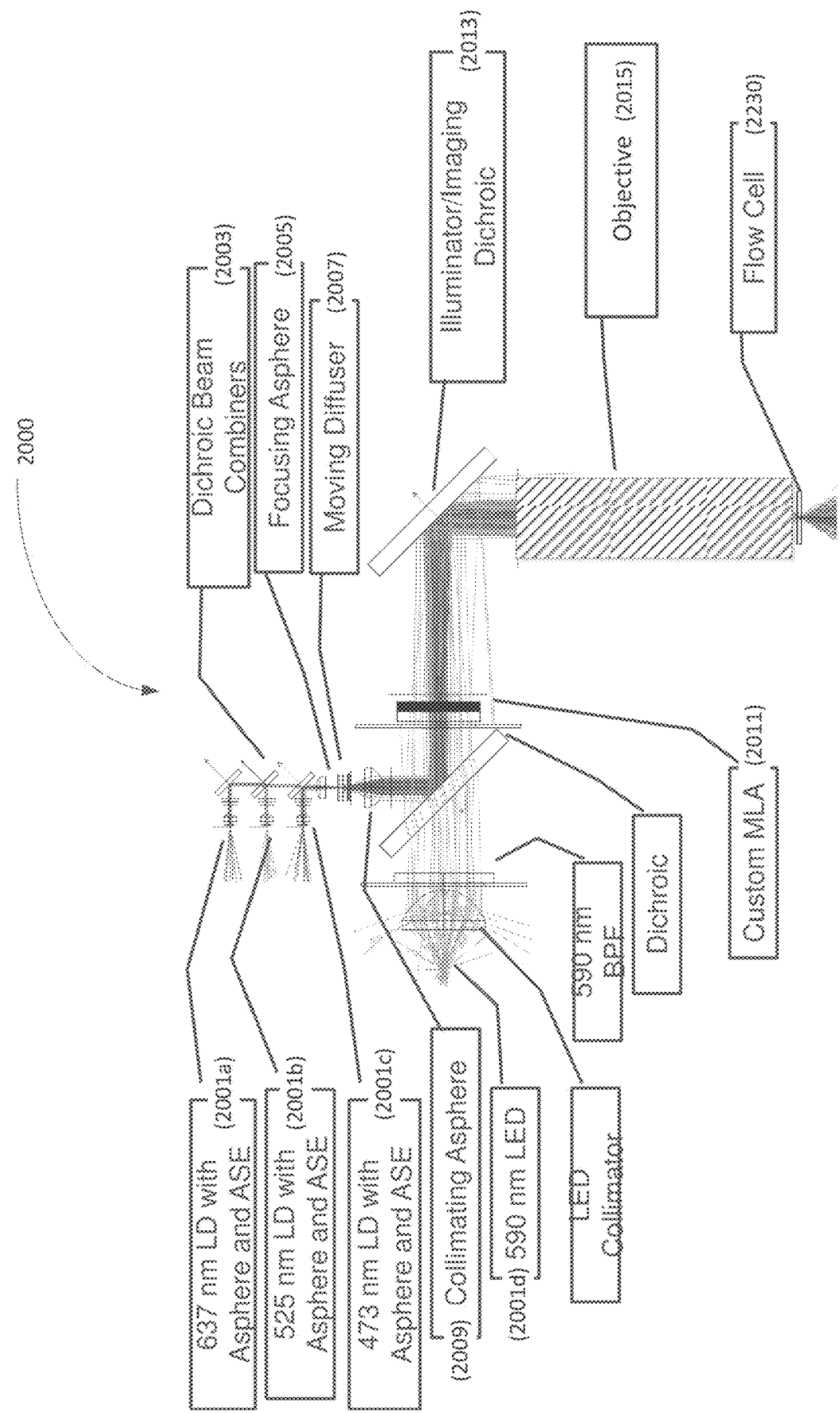
FIG. 20 depicts the incident path of an embodiment of an optical system configured to analyze samples (e.g., biological and/or chemical samples), such as using laser-induced fluorescence.

To achieve an intensity profile with a smooth flat top that falls off rapidly near the edges of the tile as shown in FIG. 19B, a beam shaping system can be disposed in the incident path. The beam shaping system can comprise a focusing lens, a dynamic diffuser, and a micro-lens array, in some embodiments. FIG. 20 depicts the incident path of an embodiment of an optical system 2000 configured to analyze samples (e.g., biological and/or chemical samples), such as using laser-induced fluorescence. The optical system 2000 can be an illumination system, such as for illuminating a sample (e.g., to induce fluorescence). The incident path of the optical system 2000 comprises a plurality of laser diodes 2001a, 2001b and 2001c. The plurality of laser diodes 2000a-2000c can be configured to output laser light at red, green and blue wavelengths, although any suitable wavelengths, or any suitable number of light sources (e.g., lasers) can be used. In various embodiments, the plurality of laser diodes 2001a-2001c can be further configured to output amplified spontaneous emission (ASE) along with laser light (e.g., at red, green and blue wavelengths). The optical system can include one or more lenses to modify light emitted by the one or more lasers 2001a-c. For example, collimating lenses (e.g., aspheric lenses) can be used to collimate light from the lasers 2001a-c. The optical system can include one or more filters to modify light emitted by the one or more lasers 2001a-c. For example, clean-up filters can be used to attenuate some frequencies of light from the lasers. For example, the filters can attenuate light at portions of the tails of laser light, while permitting light at the peaks of the laser light to pass substantially unattenuated.

The laser light (e.g., at red, green and blue wavelengths) can be combined using beam combiners 2003 (e.g., which can include dichroic mirrors). The combined beam (e.g., having light at red, green and blue wavelengths) can be focused onto a dynamic diffuser 2007 using a focusing optical element (e.g., lens) 2005. In various implementations, the focusing lens 2005 can be either be a plano-convex or a focusing aspheric lens. Light output from the dynamic diffuser 2007 can be collimated using a collimating optical element (e.g., lens) 2009 and incident on a micro-lens array 2011.

Light output from the micro-lens array can be incident on the sample contained in a flow cell 2030 via a dichroic mirror (e.g., a beam combiner) 2013 and a focusing lens 2015. The dichroic mirror 2013 can operate similar to the dichroic mirror 1609 of FIG. 16. The dichroic mirror 2013 can reflect light from the light source (e.g., lasers 2001a-c) for illuminating a sample, and the dichroic mirror 2013 can transmit light emitted from the sample (e.g., by fluorescence) for imaging. The flow cell 2030 can comprise an array of tiles as shown in FIG. 18. The focusing lens 2015 can be a microscope objective (e.g., which can have multiple lens elements, as shown). For example, the focusing lens 2015 can be an objective lens having an effective focal length (EFL) of about 14.43 mm and a numerical aperture (NA) of 0.68, although various other configurations are possible (e.g., focal length between about 5 mm and about 25 mm, or values outside this range).

In various implementations, light at amber wavelength, for example, can be combined with the laser light (e.g., of red, green and blue wavelengths) either before the focusing lens 2005 of the beam shaping system or collimating lens 2009 using another beam combiner. In some embodiments, one or more LED light sources 2001d can be used. A collimating optical element, such as a collimating lens (e.g., aspherical lens) can collimate light from the LED. In some cases a filter 2017, such as a band pass filter, can attenuate some wavelengths of light, while passing at least some wavelengths of light output by the LED. Light from the one or more LEDs can be combined (e.g., with the laser light) using one or more beam combiners 2019 (e.g., one or more dichroic mirrors, as shown in FIG. 20). In some embodiments, the LED 2001d, filter 2017, and/or dichroic mirror 2019 can be omitted. In some embodiments, light from the diffuser 2007 can be reflected by the dichroic mirror 2019 to the micro-lens array 2013. In some embodiments, LED light sources similar to 2001d can be used in place of lasers 2001a-c. Many variations are possible.

The micro-lens array can modify the distribution of light, such as to increase uniformity. By way of example, various lenslets (e.g., each of a plurality of lenslets) of the micro-lens array 2011 can sample the incident illumination profile. Each sample can be imaged onto the field of view (FOV) at the plane of the flow cell 2030 with the focusing lens 2015. The samples from the various lenslets (e.g., each lenslet) of micro-lens array 2011 can add together to generate a flat-top profile in the plane of the flow cell 2030, e.g., similar to the intensity profiles depicted in FIG. 19B.

The distance between the focusing lens 2005 and the dynamic diffuser 2007 can be adjusted to achieve a spot size sufficiently small to illuminate a target (e.g., a desired region of the flow cell 2030) and have sufficiently high intensity to excite fluorescence in the sample. For example, the distance between the focusing lens 2005 and the dynamic diffuser 2007 can be adjusted such that a size of the focused spot on the desired region of the flow cell 2030 is less than or equal to the size of the desired region of the flow cell 2030 and the focused spot has a sufficiently high intensity to excite fluorescence in the sample. As another example, consider that the desired region of the flow cell 2030 is a square or a rectangle shaped region having a length 'l' and a breadth 'b'. The distance between the focusing lens 2005 and the dynamic diffuser 2007 can be adjusted such that focused spot has a square or a rectangle shape having a length and breadth less than or equal to the length 'l' and breadth 'b' of the selected region of the flow cell 2030 and has a sufficiently high intensity to excite fluorescence in the sample. In some implementations, the distance between the focusing lens 2005 and the dynamic diffuser 2007 can be adjusted such that focused spot has a circular shape having a diameter less than or equal to the length 'l' and/or breadth 'b' of the selected region of the flow cell 2030 and has a sufficiently high intensity to excite fluorescence in the sample. In some implementations, the distance between the focusing lens 2005 and the dynamic diffuser 2007 can be adjusted such that focused spot has an elliptical shape wherein a length of the major axis and the minor axis is less than or equal to the length 'l' and/or breadth 'b' of the selected region of the flow cell 2030 and has a sufficiently high intensity to excite fluorescence in the sample. Various other shapes for the focused spot are contemplated herein.

The dynamic diffuser 2007 can comprise an optical diffuser coupled to a mechanical actuator. The dynamic diffuser 2007 can move (e.g., vibrate). The mechanical actuator can be configured to move the optical diffuser along one or more directions in the plane of the diffuser. For example, the diffuser 2007 can move (e.g., vibrate) in one dimension (e.g., a back and forth motion). The diffuser 2007 can move in two-dimensions (e.g., a circular motion) while the distance between the diffuser 2007 and the focusing optical element 2005 remains substantially constant. In some cases, the diffuser can be configured to move along one or more directions that are substantially orthogonal to a normal to the plane of the diffuser. Additionally, the diffuser can be configured to move in a direction substantially orthogonal to the beam such that the beam can sample different regions of the diffuser at different times. The diffuser can be configured to move at a frequency of a few 100 Hz. In various implementations, the mechanical actuator can be configured to vibrate the optical diffuser e.g., along one or more directions in the plane of the diffuser. For the laser beam having a generally elliptical spot (e.g., having a width along a major axis that is longer than a width along a minor axis), the mechanical actuator can be configured to move/vibrate the optical diffuser along a direction that is substantially parallel (e.g., within about 1 degree, about 2 degrees, about 5 degrees, about 10 degrees, or any values or ranges therebetween, although other values can be used) to the direction of the major axis of the generally elliptical laser beam. The diffuser can move more in the direction of the major axis than in the direction of the minor axis (e.g., which can be orthogonal to the major axis). Movement along the major axis can decrease the area of the diffuser that is illuminated at only sometimes as the diffuser moves, as compared to movement along the minor axis. This can promote uniformity of the light, because movement along the major axis causes more of the light to merely move around on the portions of the diffuser that were already illuminated. Moving (e.g., vibrating) the diffuser can advantageously reduce the speckle (e.g., which can result from the laser light), and can help achieve the smooth (e.g., flat-top) illumination profile.

The optical diffuser can increase etendue (or divergence) of the laser light. Accordingly, focusing the laser light using the focusing lens 2005 can advantageously help to maintain the etendue of the laser beam after the beam shaping element below a threshold etendue value. For example, the divergence of the laser beam after the dynamic diffuser 2007 can be between about 4 degrees and about 30 degrees, or any values or ranges therebetween, although other configurations are also possible. Without being bound by any theory, the smaller the spot size of the light focused by the focusing optical element 2005 onto the diffuser 2007, the more the etendue of the light can be maintained. Focusing the light onto a relatively small spot size on the diffuser 2007 can produce light having lower etendue, as compared to focusing light onto a relatively large spot size on the diffuser 2007. In various embodiments, the maximum spot size of the light focused by the focusing element 2005 at the diffuser can be determined based on the etendue of the optical element receiving the light from the diffuser 2007. For example, as discussed below with reference to FIG. 22, for optical fiber based applications, the maximum spot size at the diffuser 2007 can depend on the core diameter and numerical aperture of the optical fiber into which the light output from the diffuser is coupled. As another example, for optical fiber based applications, the spot size at the diffuser 2007 can have a size that is sufficiently large to generate diffused light with RMS noise less than about 10% and that is small enough to be coupled into an optical fiber using compact coupling optical systems.

Figure 21:
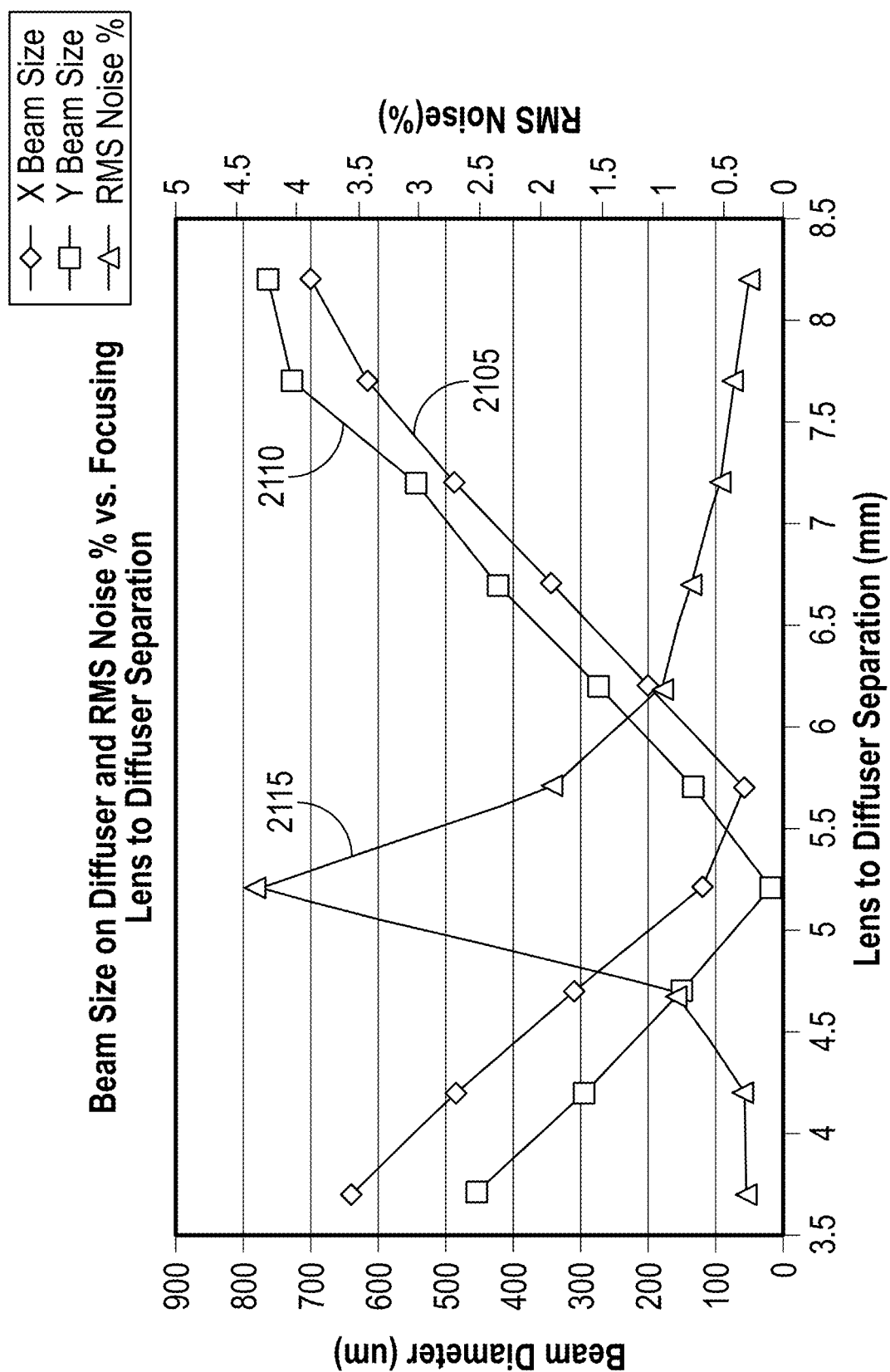
FIG. 21 shows the variation of the beam diameter and the intensity noise at the output of a dynamic diffuser as a function of the distance between a focusing lens and the dynamic diffuser.

To minimize the etendue of the laser light after the dynamic diffuser 2007, it is advantageous to adjust the distance between the focusing lens 2005 and the dynamic diffuser 2007 such that the laser light is focused onto the dynamic diffuser 2007 and the spot size of the laser light at the output of the dynamic diffuser 2007 is minimized. However, it was discovered that minimizing the etendue by minimizing the spot size of the laser light at the output of the dynamic diffuser 2007 can disadvantageously increase the intensity noise of the output light. This is illustrated in FIG. 21 which shows the variation of the beam diameter in the horizontal direction (represented by curve 2105) and the vertical direction (represented by curve 2110) in the plane of the dynamic diffuser 2007 as a function of the distance between the focusing lens 2005 and the dynamic diffuser 2007. The corresponding intensity noise as a function of the distance between the focusing lens 2005 and the dynamic diffuser 2007 is represented by curve 2115. Without any loss of generality, the intensity noise is measured as the percentage variation in the root mean square (RMS) noise with respect to an average intensity. For example, RMS noise is obtained by calculating the ratio of the variation in time in the RMS value of the AC component of the electrical signal generated by the laser light in a photodiode to an average value of the DC component of the electrical signal generated by the laser light in the photodiode. As observed from FIG. 21, in this example, the smallest beam diameter in the horizontal direction (represented by curve 2105) is obtained when the distance between the focusing lens 2005 and the dynamic diffuser 2007 is about 5.75 mm and the smallest beam diameter in the vertical direction (represented by curve 2110) is obtained when the distance between the focusing lens 2005 and the dynamic diffuser 2007 is about 5.2 mm. The distance between the focusing lens 2005 and the dynamic diffuser 2007 that results in the smallest beam diameter in the horizontal/vertical direction can correspond to the focal distance of the focusing lens 2005. The intensity noise has a maximum value when the distance between the focusing lens 2005 and the dynamic diffuser 2007 is about 5.2 mm. Accordingly, it can be concluded that when the distance between the focusing lens 2005 and the dynamic diffuser 2007 is equal to the focal distance of the focusing lens 2005 or is within ±10% of the focal distance, the spot size of the laser light at the output of the dynamic diffuser 2007 has the smallest beam diameter in the horizontal/vertical direction and an increased intensity noise. The increase in the intensity noise can be at least partially attributed to the variation in time in the transmissivity through the diffuser as the dynamic diffuser 2007 is moved/vibrated. As the dynamic diffuser 2007 is moved/vibrated the laser beam from the focusing lens 2005 is incident at different portions of the dynamic diffuser 2007 which can have different transmissivities. This can result in a variation in the intensity of light transmitted through the diffuser which manifests as intensity noise. From FIG. 21 it is observed that as the dynamic diffuser 2007 is displaced toward or away from the focal plane of the focusing lens 2005 (e.g., by a distance that is greater than about 10% of the focal distance of the focusing lens 2005), then the intensity noise decreases. In other words, as the light output from the focusing lens 2005 is focused above or below the plane of the dynamic diffuser 2007 the intensity noise decreases. Without being bound by theory, it is believed that as the spot size of the light on the diffuser is increased and the light 'samples' a larger area of the diffuser, then the properties of the diffuser average across the illuminated area average out so that movement of the illuminated spot on the diffuser (e.g., by vibration of the diffuser) does not make a significant different in the averaged properties of the diffuser. In contrast, a very small spot size can experience more significant changes as it 'samples' different portions of the diffuser. Accordingly, it can be advantageous to increase the spot size of the light on the diffuser 2007. However, a larger spot size on the diffuser can resulted in increased etendue or other undesired optical qualities. Accordingly, a balance can be performed between producing a sufficiently large spot size to have low noise, while also producing a sufficiently small spot size to have the desired optical qualities (e.g., low etendue). However, focusing the light output from the focusing lens 2005 above or below the plane of the dynamic diffuser 2007 can result in an increase in the beam diameter horizontal/vertical direction and/or an increase the spot size of the laser beam at the output of the dynamic diffuser 2007.

Without being bound by any theory, the amount of intensity noise in the light at the output of the diffuser can depend on the size and distribution of the diffusing elements of the dynamic diffuser 2007. For example, an implementation of a dynamic diffuser 2007 having regions with higher concentration of the diffusing elements interspersed with regions having lower concentration of the diffusing elements can have higher intensity noise as compared to an implementation of a dynamic diffuser 2007 in which the diffusing elements are uniformly dispersed. Accordingly, the spot size of the light focused on the implementation of the dynamic diffuser 2007 in which the diffusing elements are uniformly dispersed can be smaller (e.g., low etendue) than the spot size of the light focused on the implementation of the dynamic diffuser 2007 having regions with higher concentration of the diffusing elements interspersed with regions having lower concentration of the diffusing elements to achieve a similar amount of intensity noise. Thus, based on the physical and optical characteristics of the dynamic diffuser 2007, the spot size of the light focused by the focusing element 2005 on the dynamic diffuser 2007 can be selected to achieve a desired intensity noise.

In some embodiments, the optical system can be configured so that the focusing optical element 2005 produces a spot of light on the diffuser 2007 that has a width (e.g., diameter) larger than about 20 microns, about 25 microns, about 30 microns, about 50 microns, about 75 microns, about 100 microns, about 150 microns, about 200 microns, about 250 microns, about 300 microns, or more (as shown in FIG. 21), or any values therebetween, or any ranges bounded therebetween. In some embodiments, the optical system can be configured so that the focusing optical element 2005 produces a spot of light on the diffuser 2007 that has an area larger than about 200 square microns, about 300 square microns, about 500 square microns, about 750 square microns, about 1,000 square microns, about 1,250 square microns, about 1,500 square microns, about 1,750 square microns, about 2,000 square microns, about 2,500 square microns, about 3,000 square microns, about 4,000 square microns, about 5,000 square microns, about 7,500 square microns, about 10,000 square microns, about 15,000 square microns, about 20,000 square microns, about 25,000 square microns, about 50,000 square microns, about 75,000 square microns, about 100,000 square microns, about 150,000 square microns, or more, or any values therebetween, or any ranges bounded therein. In some embodiments, the diffuser 2007 can be spaced away from the focus or focal plane of the focusing optical element 2005 so that defocused light forms the spot of light on the diffuser. In some embodiments, the focusing optical element 2005 or other features of the optical system can be configured so that the spot of light produced at the focus or focal plane of the focusing optical element has a size that is sufficiently large to reduce light intensity noise, as discussed herein. Various embodiments described herein are configured such that the spot size of the light output from the focusing element 2005 at the diffuser 2007 has a spot size that is large enough to reduce intensity noise (e.g., spot size large enough such that the light at the output of the diffuser has a RMS noise less than 10%) and small enough to match the etendue of the optical element that receives the light output from the diffuser. For example, for some applications, the maximum spot size of the light at the diffuser can be 200 µm×200 µm.

Without any loss of generality, the distance between the focusing lens 2005 and the dynamic diffuser 2007 can be adjusted to any distance greater than or less than the focal distance of the focusing lens 2005 that generates a laser spot having a size that matches or substantially matches (e.g., within ±10%, within ±5%, within ±2%, etc.) of the size of the region of the flow cell 2030 that is desired to be illuminated such that the RMS noise is less than or equal to about 10%. For example, the distance between the focusing lens 2005 and the dynamic diffuser 2007 can be adjusted to any distance greater than or less than the focal distance of the focusing lens 2005 that generates a laser spot having a size that matches or substantially matches (e.g., within ±10%, within ±5%, within ±2%, etc.) the size of the desired region of the flow cell 2030 such that the RMS noise is less than or equal to about 8%, less than or equal to about 5%, less than or equal to about 3%, less than or equal to about 2%, less than or equal to about 1.5%, less than or equal to about 1%, or less (as shown in FIG. 21), or any value in a range defined by any of these values. The term "substantially" is s general term as used herein, and when used in conjunction with a number or a range forms a phrase that will be readily understood by a person of ordinary skill in the art. For example, is readily understood that such language will include a number or range were little difference is discernible or matters. For example, the term substantially can mean within 20% of the number or the range. In various implementations, the distance between the focusing lens 2005 and the dynamic diffuser 2007 can be adjusted to any distance greater than or less than the focal distance of the focusing lens 2005 that generates a laser spot having a size that is greater than or equal to about 10% of the size of the desired region of the flow cell 2030 such that the RMS noise is less than or equal to about 10%. For example, the distance between the focusing lens 2005 and the dynamic diffuser 2007 can be adjusted to any distance greater than or less than the focal distance of the focusing lens 2005 that generates a laser spot having a size that is greater than or equal to about 20% of the size of the desired region of the flow cell 2030, greater than or equal to about 30% of the size of the desired region of the flow cell 2030, greater than or equal to about 40% of the size of the desired region of the flow cell 2030, greater than or equal to about 50% of the size of the desired region of the flow cell 2030, greater than or equal to about 60% of the size of the desired region of the flow cell 2030, greater than or equal to about 70% of the size of the desired region of the flow cell 2030, greater than or equal to about 80% of the size of the desired region of the flow cell 2030, greater than or equal to about 90% of the size of the desired region of the flow cell 2030, and less than or equal to the size of the desired region of the flow cell 2030. Although various embodiments are discussed in connection with the spot size relative to the size of the desired region of the flow cell, any suitable target can be used instead of a flow cell. For example, the embodiments discussed herein can be modified to have spot size relative to an optical fiber end or coupler, or any other suitable target.

In various implementations, the dynamic diffuser 2007 can be displaced toward or away from the focal plane of the focusing lens 2005 by a distance that is greater than about 12% of the focal distance of the focusing lens 2005, a distance that is greater than about 15% of the focal distance of the focusing lens 2005, a distance that is greater than about 20% of the focal distance of the focusing lens 2005, a distance that is greater than about 25% of the focal distance of the focusing lens 2005, a distance that is greater than about 30% of the focal distance of the focusing lens 2005, a distance that is greater than about 35% of the focal distance of the focusing lens 2005, a distance that is greater than about 40% of the focal distance of the focusing lens 2005, a distance that is greater than about 45% of the focal distance of the focusing lens 2005, and a distance that is less than about 50% of the focal distance of the focusing lens 2005, or any values or ranges therebetween, such as to reduce the RMS noise percentage and/or to generate a laser or light spot having a size that is greater than or equal to about 10% of the size of the target (e.g., the desired region of the flow cell 2030) and less than or equal to the size of the target (e.g., the desired region of the flow cell 2030). It is noted that in the various implementations discussed above, the intensity across the target (e.g., the surface of the desired region of the flow cell 2030) is substantially uniform (e.g., within ±20% of an average light intensity) for a substantial portion thereof.

Figure 22:
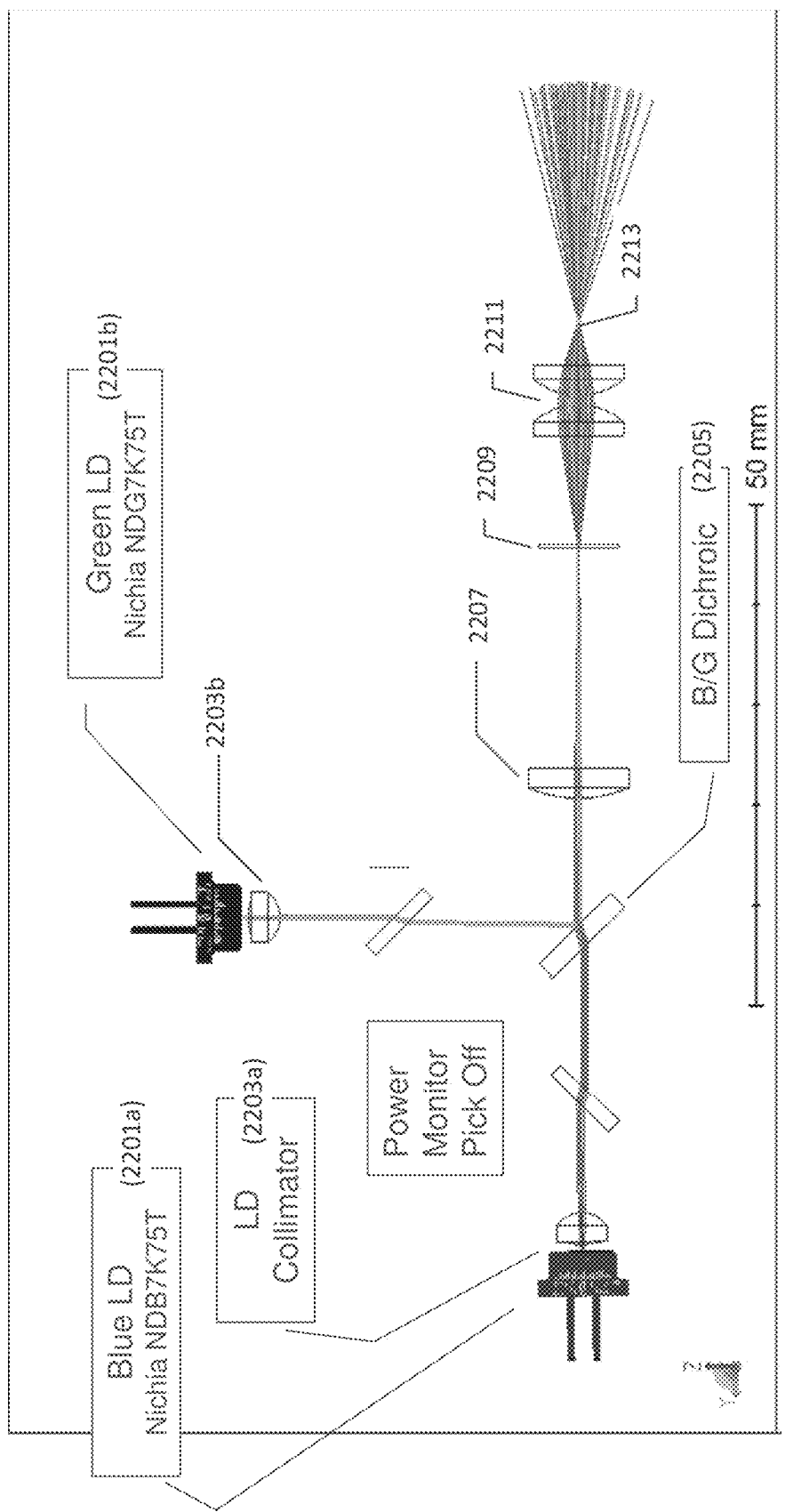
FIG. 22 illustrates an embodiment of a fiber coupled illuminator comprising two laser diodes.

Although various embodiments are discussed in connection with directing light to a sample (e.g., a flow cell), various other targets for the light can be used, such as for fiber couplings. The beam shaping system described above can also be integrated with fiber-coupled illumination sources. FIG. 22 illustrates an embodiment of a fiber coupled illuminator comprising two laser diodes 2201a and 2201b respectively coupled to a collimator 2203a and 2203b. The light output from the two laser diodes 2201a and 2201b is combined with a beam combiner 2205 (e.g., a dichroic mirror) and focused by a focusing lens 2207. A dynamic diffuser 2209 can be positioned away from the focal plane of the focusing lens 2207 such that the combined laser beam from the two laser diodes 2201a and 2201b is focused above or below the plane of the dynamic diffuser 2209. Light output from the dynamic diffuser 2209 is coupled into a multimode fiber 2213, such as using coupling lens system 2211. In various implementations, the multimode fiber 2213 can comprise a square or a rectangle shaped core such that intensity profile of the light output from the multimode fiber has a smooth flat top as shown in FIG. 19B. In various implementations, the multimode fiber can have a 300 micron core. In some implementations, a micro-lens array can be coupled at the output of the multimode fiber as discussed above with reference to FIG. 20.

As discussed above, the dynamic diffuser 2209 can be displaced toward or away from the focal plane of the focusing lens 2207 by a distance that is greater than about 10% of the focal distance of the focusing lens 2207, a distance that is greater than about 12% of the focal distance of the focusing lens 2207, a distance that is greater than about 15% of the focal distance of the focusing lens 2207, a distance that is greater than about 20% of the focal distance of the focusing lens 2207, a distance that is greater than about 25% of the focal distance of the focusing lens 2207, a distance that is greater than about 30% of the focal distance of the focusing lens 2207, a distance that is greater than about 35% of the focal distance of the focusing lens 2207, a distance that is greater than about 40% of the focal distance of the focusing lens 2207, a distance that is greater than about 45% of the focal distance of the focusing lens 2207, and a distance that is less than about 50% of the focal distance of the focusing lens 2207, or any values or ranges therebetween, such as generate a laser or light spot having a size that is greater than or equal to about 10% of the size of a region to be illuminated and less than or equal to the size of the region to be illuminated. The region to be illuminated can be a portion (e.g., a tile) of a flow cell or a portion of an optical fiber (e.g., single mode or multi-mode fiber), or coupling. The distance between the dynamic diffuser 2209 and the focusing lens 2207 can be selected such that the RMS noise percentage has a value less than about 10% (e.g., a value between about 1% or about 2% and about 10%). As discussed above, the intensity across a substantial portion of the region to be illuminated can be substantially uniform (e.g., within ±20% of an average light intensity).

Figure 23A:
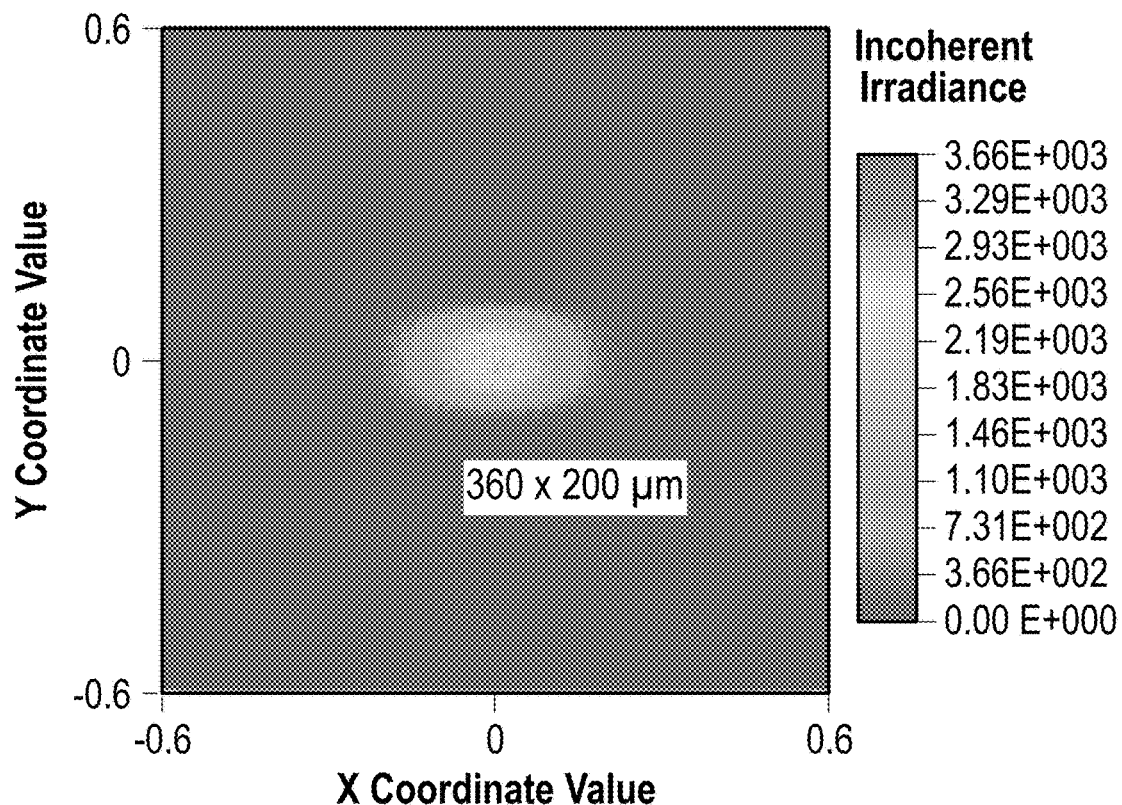
FIGS. 23A-23E show the variation in the beam profile at the output of the dynamic diffuser as the spacing between the dynamic diffuser and a focusing lens is increased from a value less than the focal distance to a value greater than the focal distance.
Figure 23B:
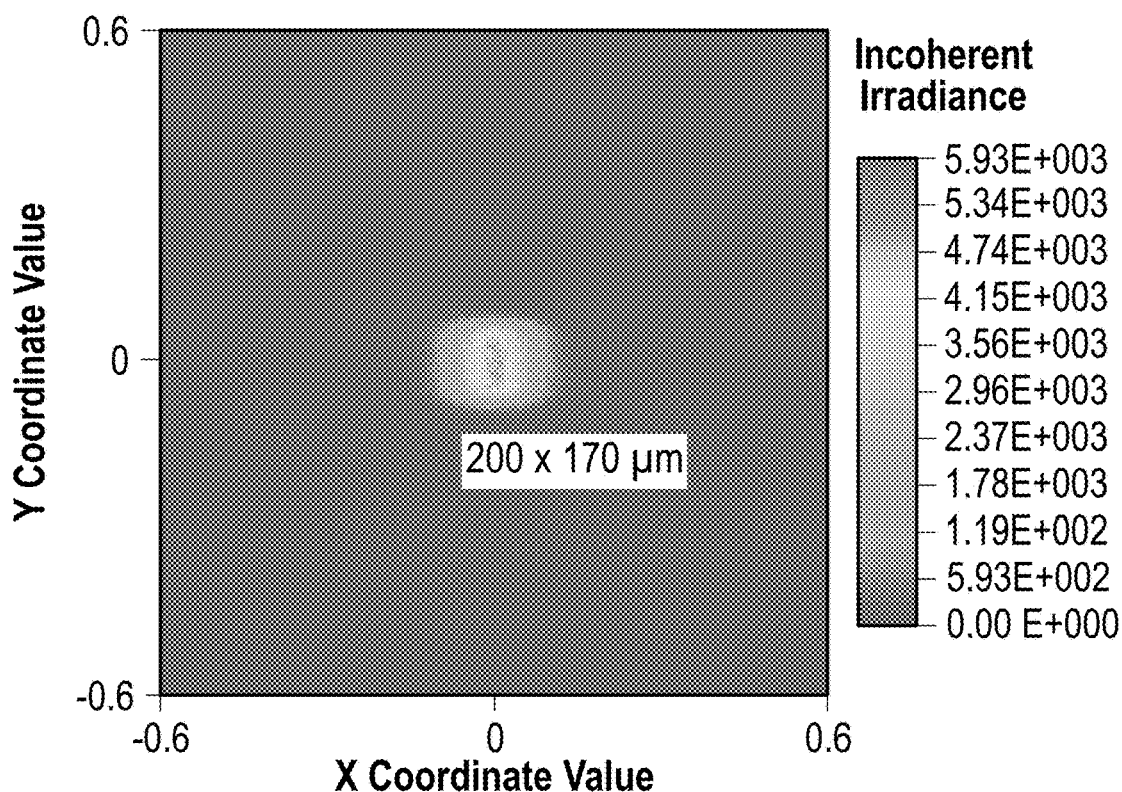
Figure 23C:
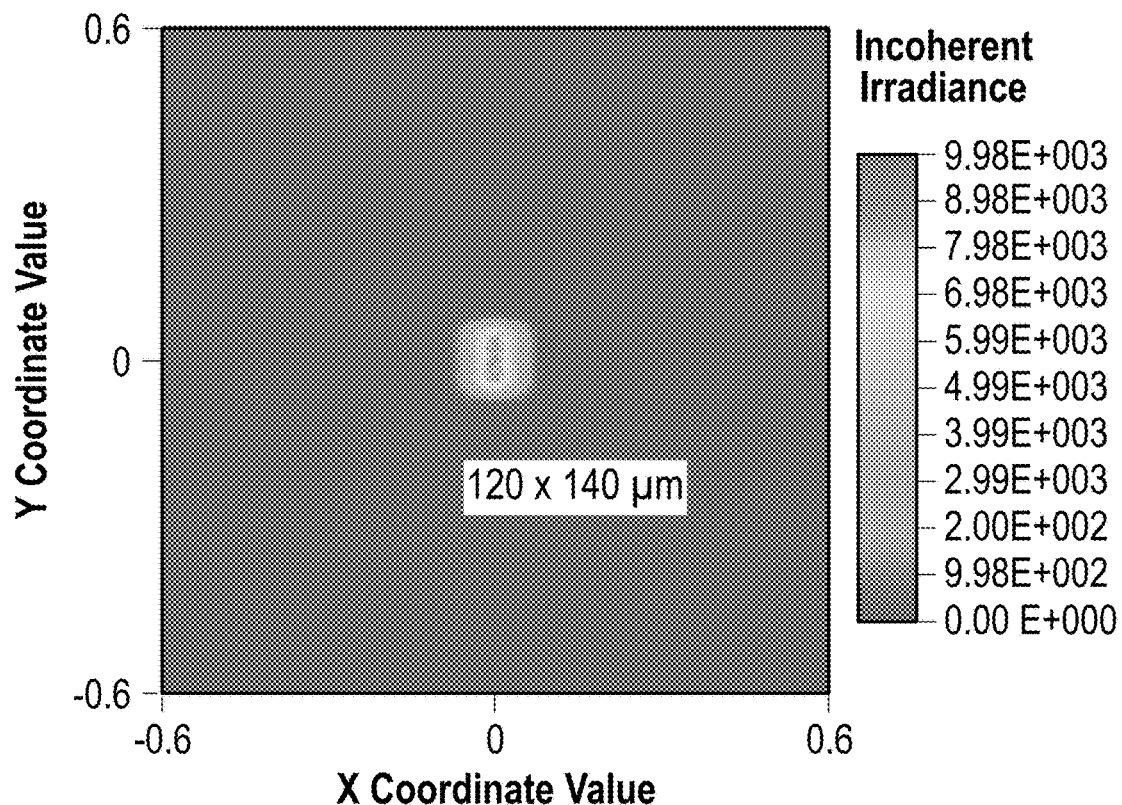
Figure 23D:
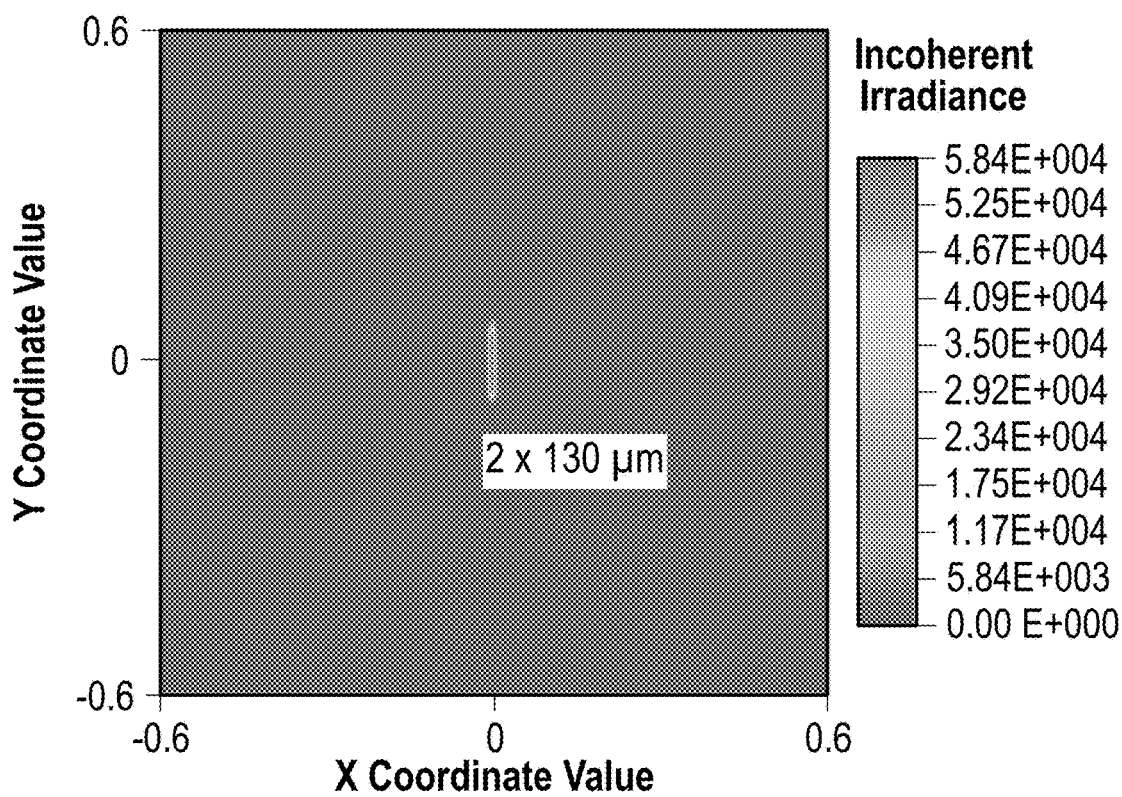
Figure 23E:
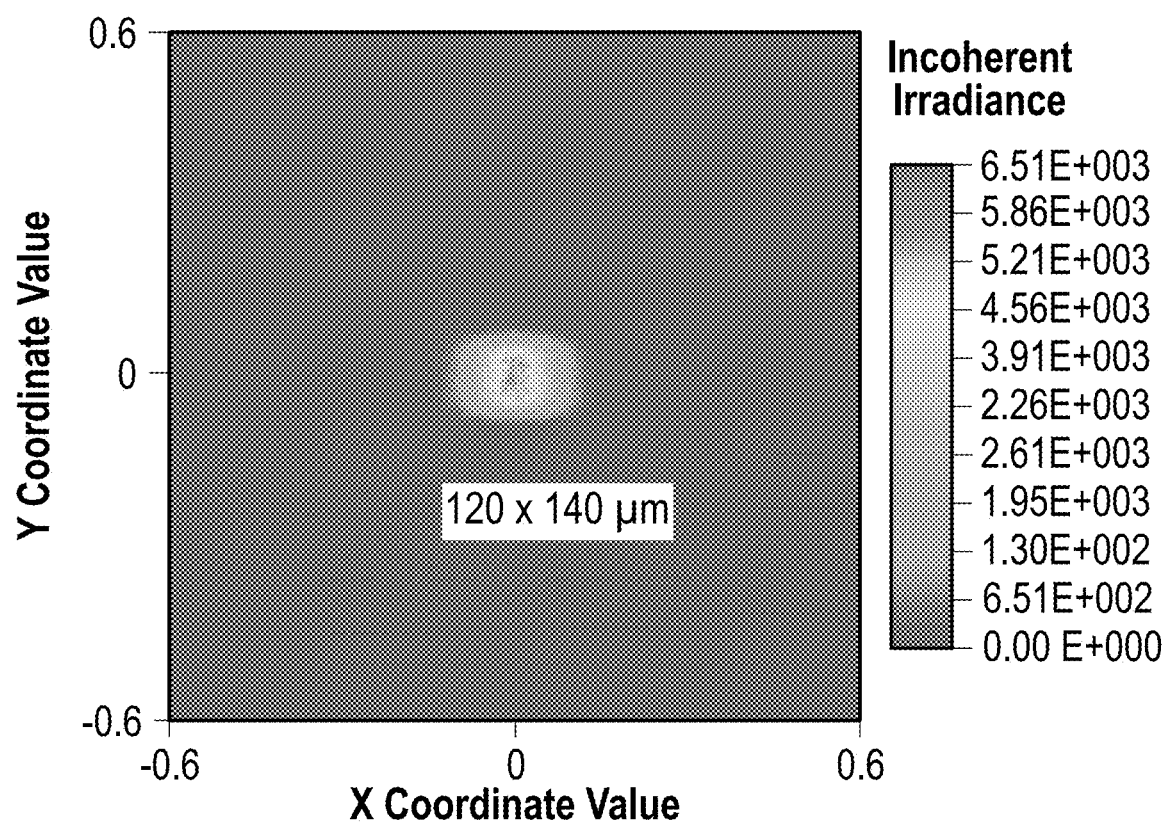

FIGS. 23A-23E show the variation in the spot size at the output of the dynamic diffuser 2209 as the distance between the focusing lens 2207 and the dynamic diffuser 2209 is increased from a value less than the focal distance to a value greater than the focal distance. FIG. 23A illustrates a laser spot having a size of about 360 µm×200 µm at the output of the dynamic diffuser 2209 when the dynamic diffuser 2209 is disposed several millimeters above the focal plane of the focusing lens 2207. FIG. 23B illustrates a laser spot having a size of about 200 µm×170 µm at the output of the dynamic diffuser 2209 when the dynamic diffuser 2209 is moved closer toward the focal plane of the focusing lens 2207. FIG. 23C illustrates a laser spot having a size of about 120 µm×140 µm at the output of the dynamic diffuser 2209 when the dynamic diffuser 2209 is moved further closer toward the focal plane of the focusing lens 2207. FIG. 23D illustrates a laser spot having a size of about 2 µm×130 µm at the output of the dynamic diffuser 2209 when the dynamic diffuser 2209 is disposed at the focal plane of the focusing lens 2207. FIG. 23E illustrates a laser spot having a size of about 120 µm×140 µm at the output of the dynamic diffuser 2209 when the dynamic diffuser 2209 is moved away from the focal plane of the focusing lens 2207 such that the focal plane of the focusing lens 2207 is above the plane of the dynamic diffuser 2209.

Figure 24:
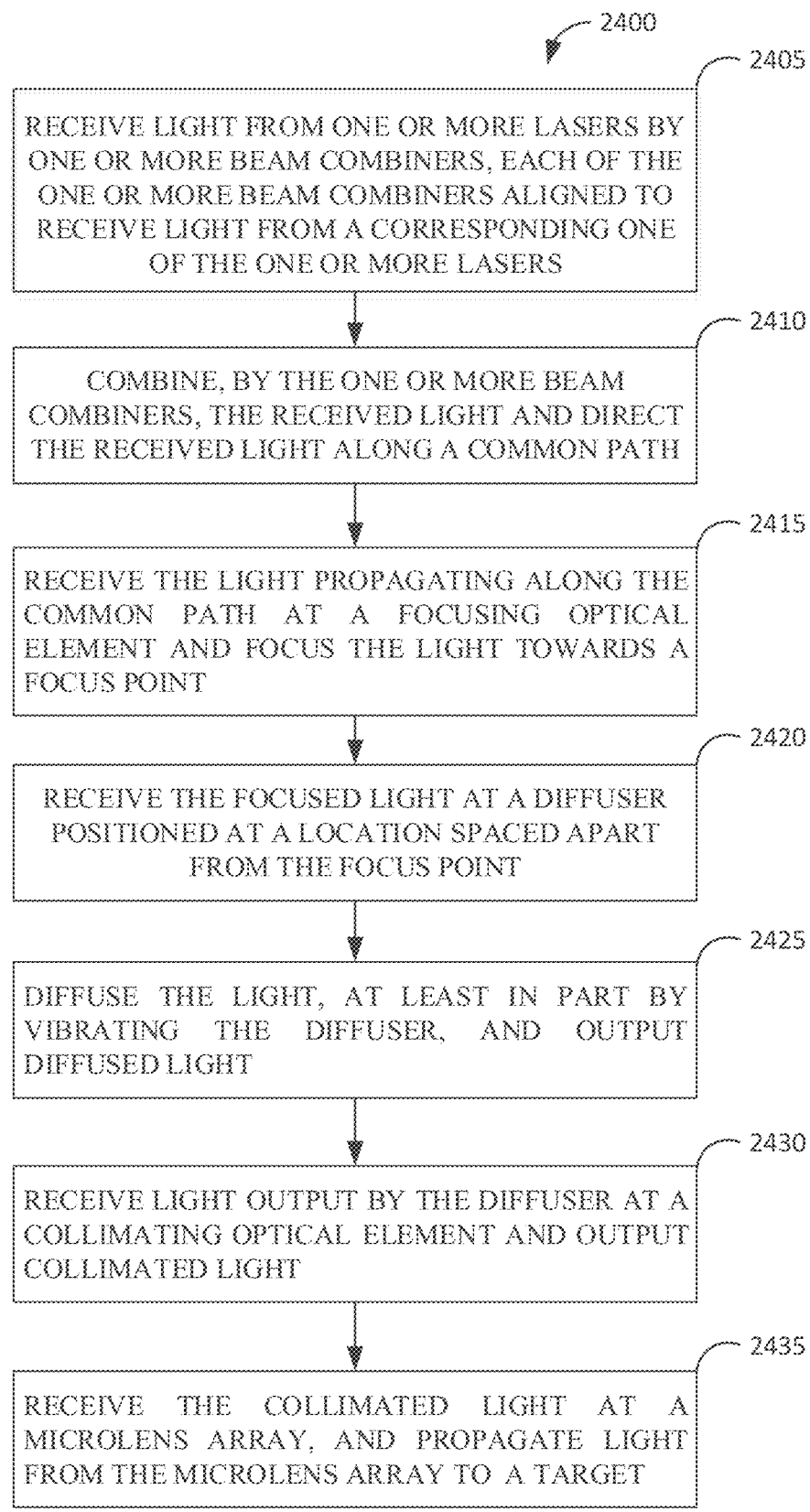
FIG. 24 is a flow diagram illustrating a method of illuminating a target.

FIG. 24 is a flow diagram illustrating a process 2400 of illuminating a target. At block 2405 the process 2400 includes receiving light from one or more lasers at one or more beam combiners. Each of the one or more beam combiners is positioned and aligned to receive light from a corresponding one of the one or more lasers. In some embodiments, the one or more beam combiners can be dichroic beam combiners. At block 2410, the process 2400 includes combining, by the one or more beam combiners, the received light and directing the received light along a common path. The beam combiners of an illumination system can be positioned in the system in various ways. For example, FIG. 20 and the corresponding description illustrates an embodiment having beam combiners directing light from a plurality of lasers along a common path (or the light is at least substantially aligned along a common path). At block 2415, the process 2400 receives the light propagating along the common path at a focusing optical element and focuses the light. For example, the focusing optical element focuses the light towards a focus point (or focal point). The focusing optical element can be, in some embodiments, focusing lens 2005 (FIG. 20). At block 2420 of the process 2400, the focused light is received at a diffuser. The diffuser can be positioned such that it is not at the focus point. That is, the diffuser is positioned at a location spaced apart from the focus point. In some embodiments, the diffuser is positioned between the focusing optical element and the focus point such that light propagating from the focusing optical element converging to the focus point is incident on the diffuser. In some embodiments, the diffuser is positioned such that the focus point is between the focusing optical element and the diffuser such that light propagating from the focusing optical element has propagated past the focus point and when the light is incident on the diffuser. For example, such that light propagating past the focus point is diverging when it is incident on the diffuser. At block 2425 of process 2400, the light is diffused by the diffuser, and light propagating from the diffuser is diffused light. In various embodiments, the diffuser is moved, or vibrated diffusing the light, at least in part by vibrating the diffuser, and light from the diffuser is output as diffused light. In some embodiments, vibrating the diffuser comprises moving the diffuser in a two-dimensional motion. In some embodiments, the two-dimensional motion is substantially orthogonal to an optical axis of the focusing optical element. In some embodiments, vibrating the diffuser comprises moving the diffuser in a plane. In some embodiments, vibrating the diffuser comprises moving the diffuser in a circular motion. In some embodiments, vibrating the diffuser comprises moving the diffuser in a linear motion. At block 2530 of process 2400, light from the diffuser is received by a collimating optical element, which outputs collimated light. Collimating lens 2009 in FIG. 16 is one example of a device for performing this portion of the process. Light propagating from the diffuser enters the collimating lens 2009 and propagates through the collimating lens 2009, and the light propagating from the collimating lens 2009 is more collimated than the light received by the collimating lens 2009. At block 2435, a microlens array receives light from the collimating optical element, and light propagating from the microlens array is provided towards a target to illuminate the target. In some embodiments, the target comprises a flow cell. The microlens array can modify the distribution of light, such as to increase uniformity. By way of example, various lenslets (e.g., each of a plurality of lenslets) of the micro-lens array 2011 (FIG. 20) can sample (or receive) the incident illumination profile of light that is propagating from the diffuser. Each sample can be imaged onto the field of view (FOV) at the plane of a flow cell 2230 (e.g., FIG. 20; flow cell 1830 FIG. 18) with the focusing lens 2015. The samples from the various lenslets (e.g., each lenslet) of the micro-lens array can add together to generate a flat-top profile in the plane of the flow cell. An example of such an intensity profile is illustrated in FIG. 19B.

FIGS. 20 and 22 illustrate optical systems for generating a beam for analyzing samples using laser-induced fluorescence. FIGS. 25-42 also relate to optical systems for generating a light beam with a shaped beam profile that can be used for analyzing samples, where the beam incident on the sample (e.g., the sample plane) is a flat top line beam. The optical systems illustrated in FIGS. 25, 29, 33, and 41 can include many of the same components, and configurations, as the systems in FIGS. 20 and 22 even if they are not specifically mentioned in the description of FIGS. 25, 29, 33, and 41, and thus the description will focus on differences in the systems for generating a flat top line beam.

Figure 25:
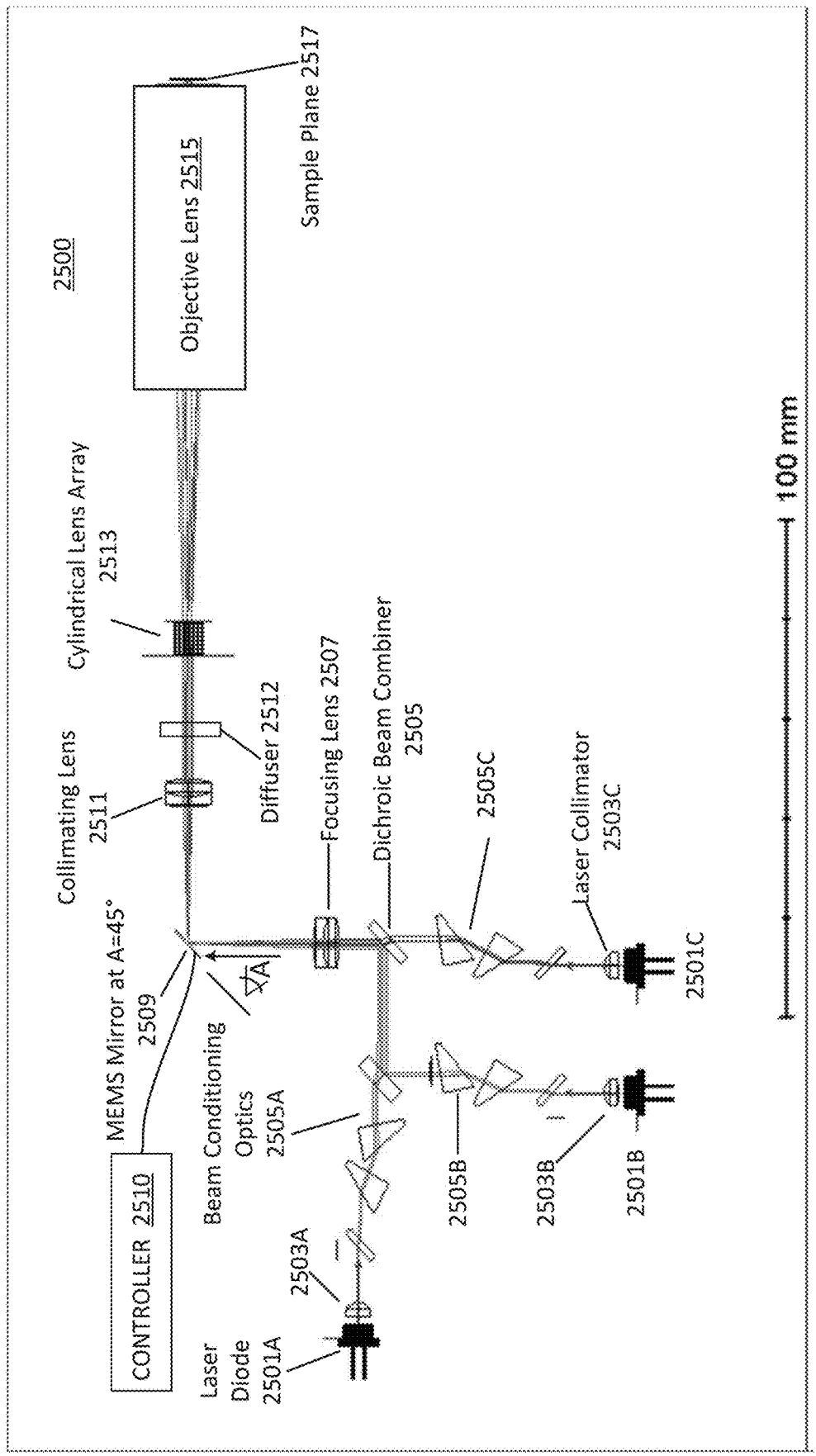
FIG. 25 illustrates an embodiment of an optical system configured to generate a flat top line beam for analyzing samples (e.g., biological and/or chemical samples) using laser-induced fluorescence, the optical system including a MEMS mirror and a cylindrical lens array (CLA), where the MEMS mirror is positioned at a 45° angle relative to incident light received at the MEMS mirror from the focusing lens.
Figure 26:
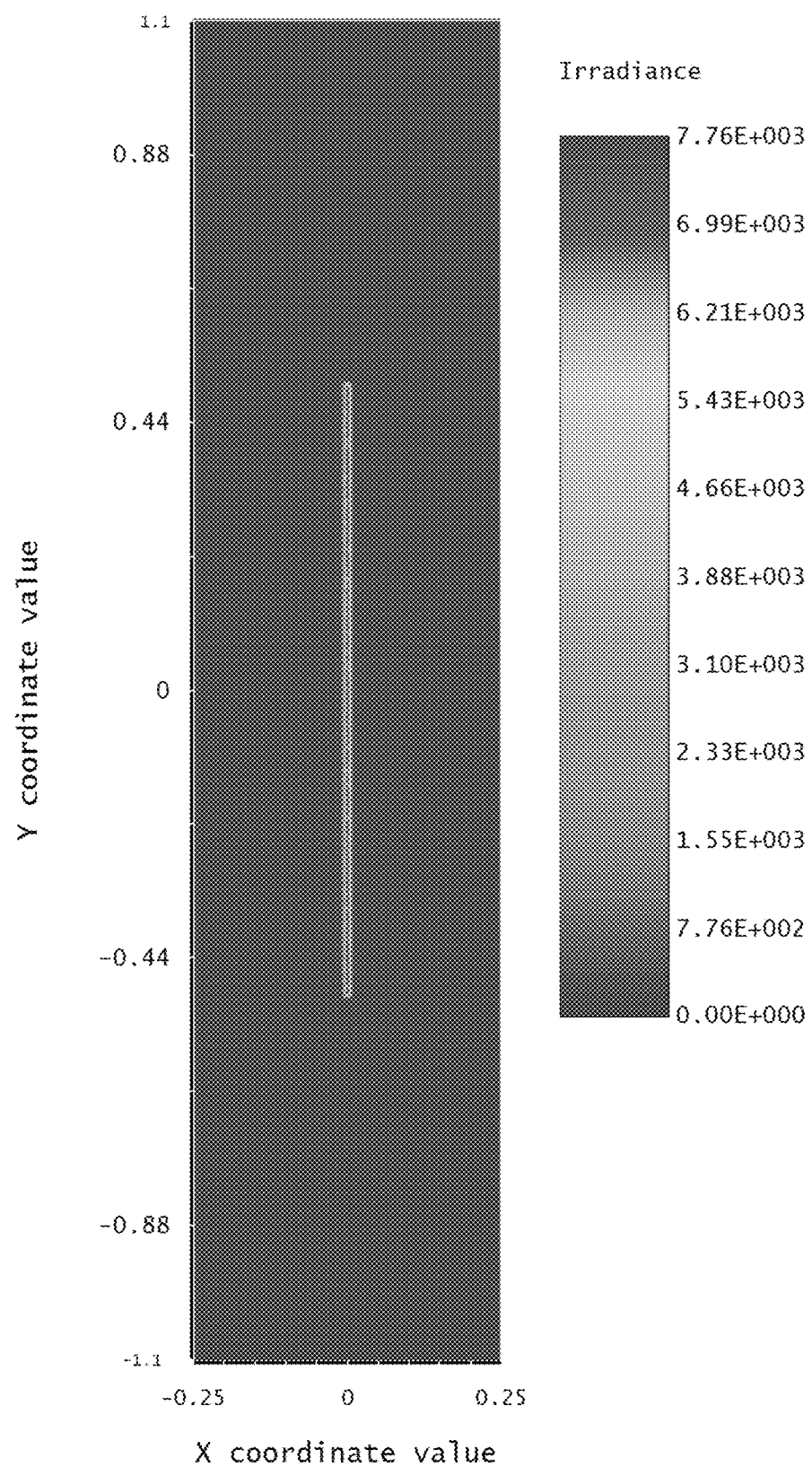
FIG. 26 is a diagram illustrating an example of the X and Y-coordinate beam profile at the sample plane of the optical system of FIG. 25, the MEMS mirror being positioned at a 45° angle relative to incident light received at the MEMS mirror from the focusing lens.
Figure 27:
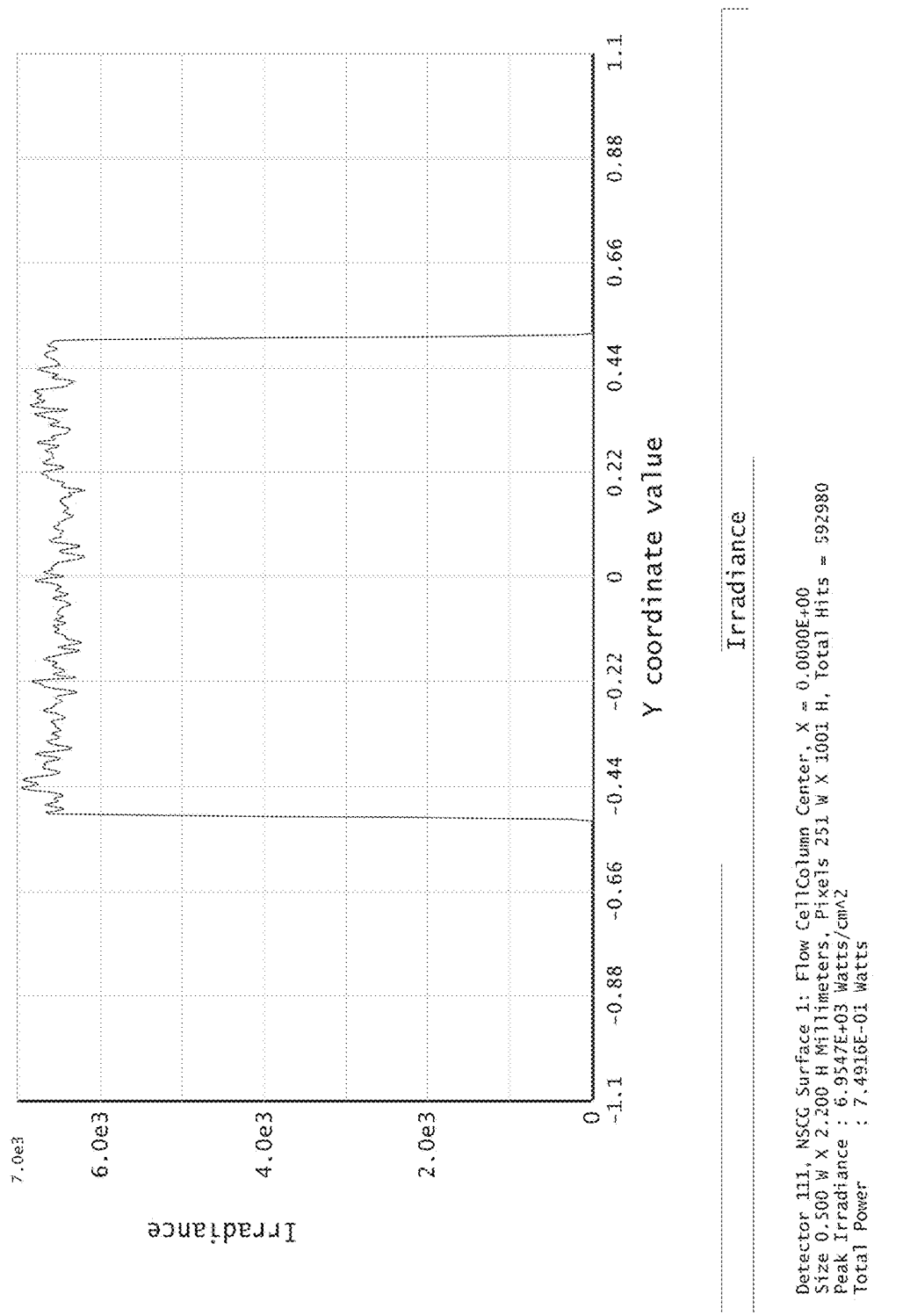
FIG. 27 is a graph illustrating an example of irradiance along the long-axis beam profile (e.g., the Y coordinate value) at the sample plane of the system of FIG. 25 when the MEMS mirror is positioned at a 45° angle relative to incident light received at the MEMS mirror from the focusing lens.
Figure 28:
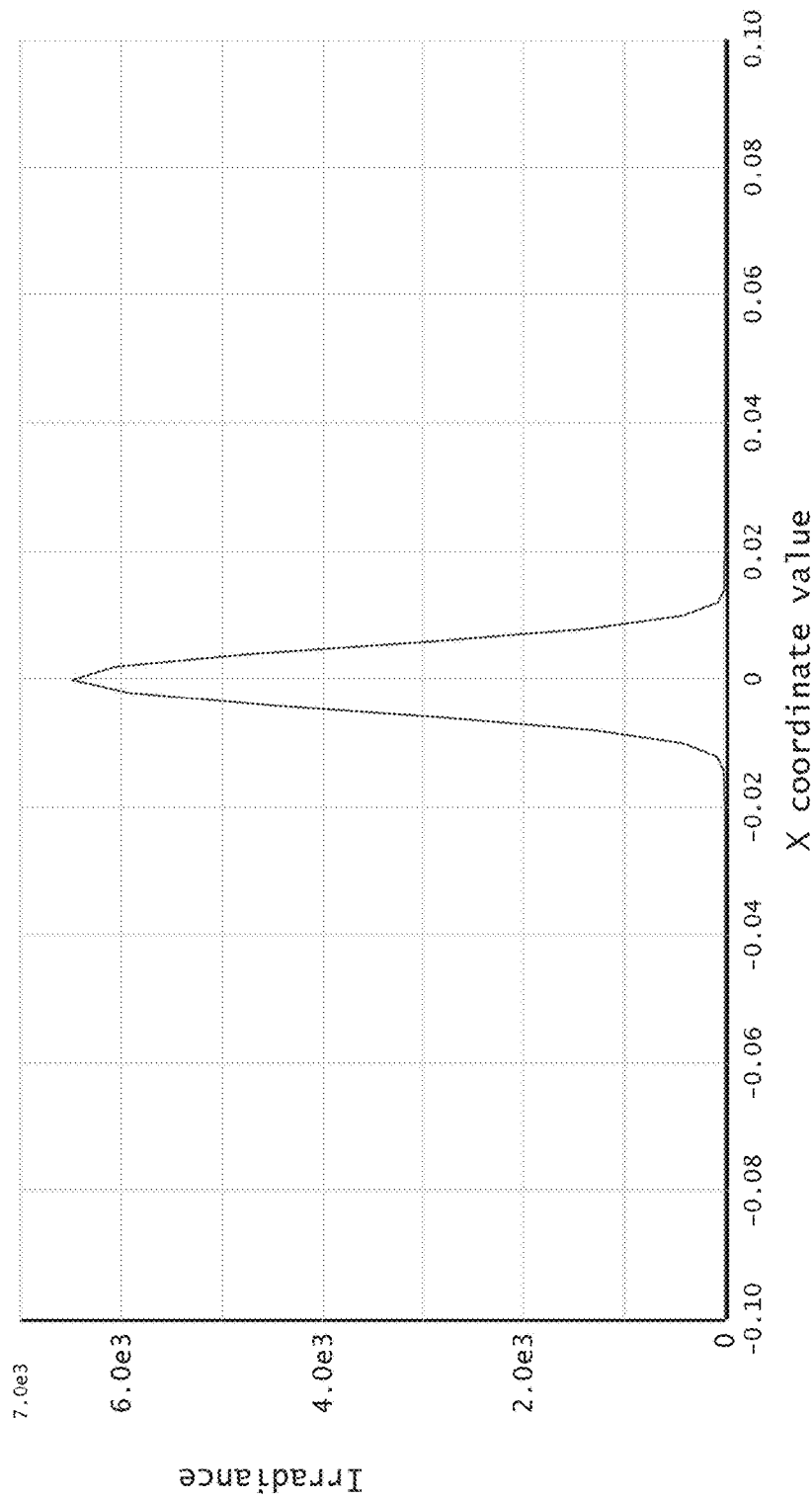
FIG. 28 is a graph illustrating an example of irradiance along the short-axis beam profile (e.g., the X coordinate value) at the sample plane of the system of FIG. 25, the MEMS mirror being positioned at a 45° angle relative to incident light received at the MEMS mirror from the focusing lens.
Figure 33:
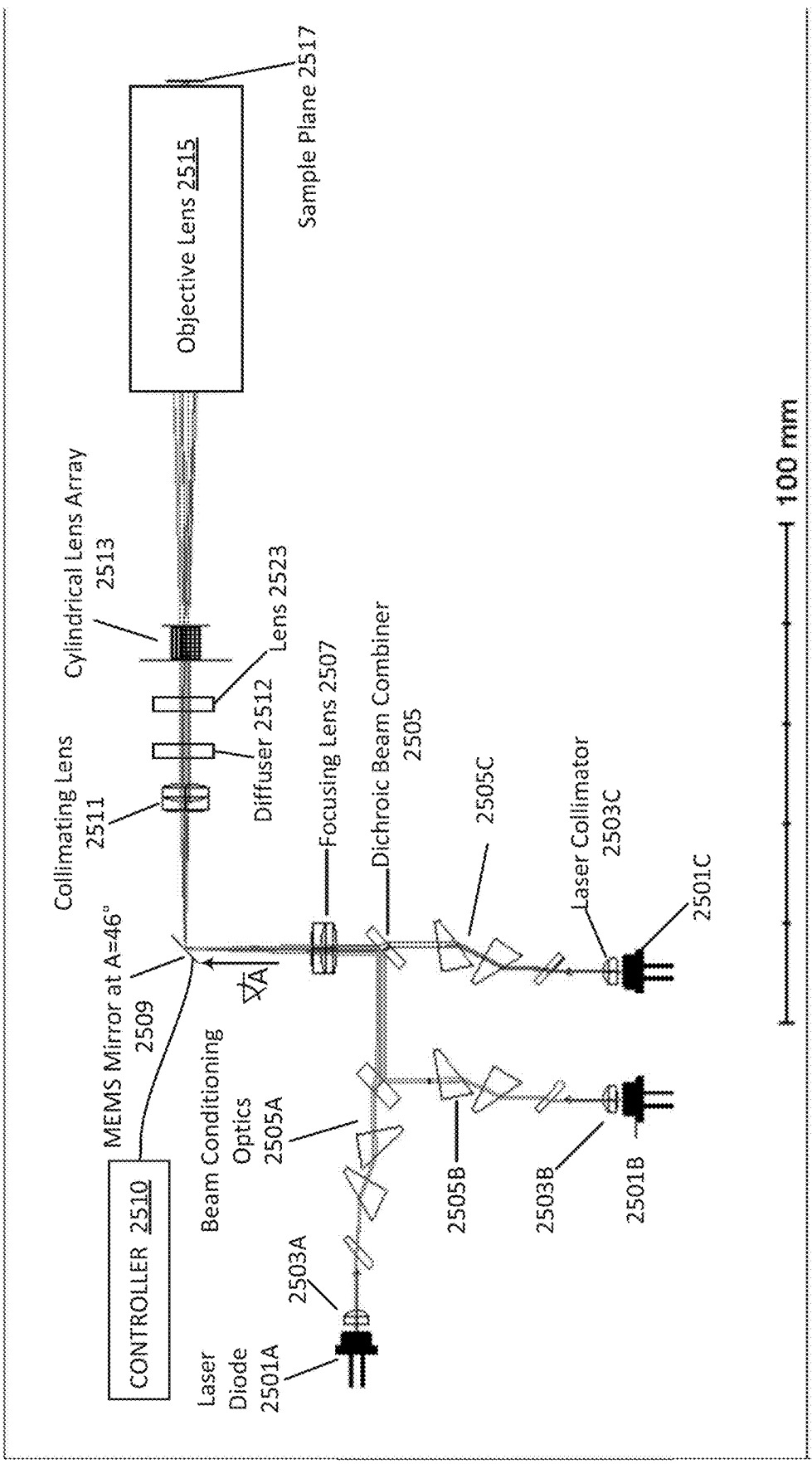
FIG. 33 illustrates the incident light path of an embodiment of the optical system of FIG. 25, where the MEMS mirror is positioned at a 46° angle relative to incident light received at the MEMS mirror from the focusing lens.
Figure 43:
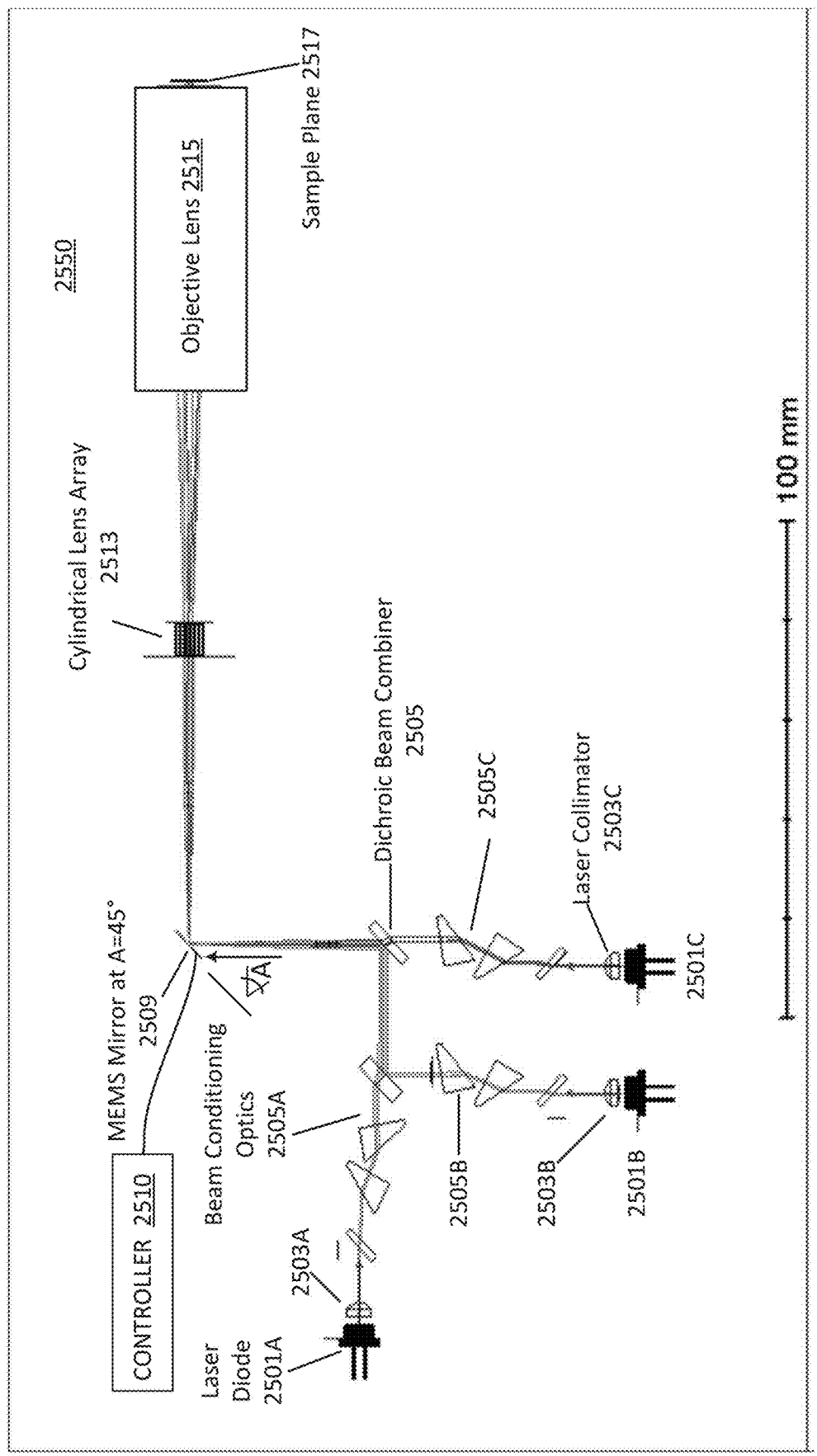
FIG. 43 illustrates an embodiment of an optical system configured to generate a flat top line beam for analyzing samples the optical system including a MEMS mirror and a cylindrical lens array (CLA). Unlike the optical system of FIG. 25, the example of an optical system in FIG. 43 does not include a collimating lens between the MEMS mirror and the CLA, and does not include a focusing lens between the beam combiner and the MEMS mirror.

FIG. 25 illustrates certain components and the incident light path of an embodiment of an optical system 2500 configured to generate a beam for analyzing samples (e.g., biological and/or chemical samples) using laser-induced fluorescence, the optical system including a MEMS mirror 2509 and a cylindrical lens array (CLA) 2513. Various implementations of the optical system 2500 may include more components or fewer components (for example, as illustrated in FIG. 43). As illustrated in the example of FIG. 25, the system 2500 includes three laser diodes 2501A, 2501B, 2501C which emit light that is initially in three separate optical paths. Although this example includes three lasers, other systems may include two lasers, more than three lasers, or one laser. In an example, the lasers are multimode laser diodes. Light from each laser diode 2501A, 2501B, 2501C propagates through a laser collimator 2503A, 2503B, 2503C and through beam conditioning optics 2505A, 2505B, 2505C to a dichroic beam combiner 2505 which combines the beams from the laser diodes. In an example, the beam conditioning optics can 2504 can include anamorphic prisms. The beam conditioning optics 2505 condition the light beam emitted by the laser to have a more elliptical shape. For example, changing the shape of the light beam (e.g., the beam profile) from a generally circular shape to an elliptical shape. Changing the shape of the beam helps to fill the CLA with the incident beam. That is, the beam is shaped such that is spans across more of the lenslets of the CLA, which increases the uniformity and helps to better form the desired flat top line beam profile, of the light beam output from the CLA. In systems having one laser, a beam combiner is not needed. The combined beam propagates through a focusing lens 2507 to the MEMS mirror 2509, which reflects the combined beam, based on a MEMS actuation process, to a collimating lens 2511. The beam propagates through the collimating lens 2511 to the CLA 2513. The CLA 2513 can include a one-dimensional lens array that includes an arrangement of cylindrical lenses that generate a flat top line beam from the light beam from the MEMS mirror 2509. The CLA shapes the beam to produce a flat top line beam (for examples, the beam profile illustrated in FIGS. 26, 27, and 28). The movement of the incident light beam on the plurality of lenses in the CLA helps to create uniformity in the irradiance of the flat top line beam. Each of the lenses creates a beam that is (at least partially) superimposed on the other, producing a mixing effect the provides for uniformity. The light beam output from the CLA 2513, now a flat top line beam (e.g., as illustrated in FIGS. 26, 27, and 28) propagates through an objective lens system 2515 (which may include one or more optical elements) and is incident on the sample plane 2517. The beam profile of the beam on the sample plane 2517 is a flat top line beam, where the flat top portion is uniform (or substantially uniform), as illustrated in FIG. 26. In other words, the uniformity of the flat top portion of the flat top line beam is more uniform due to the movement of the beam by a movable mirror system. The movable mirror system can be a MEMS mirror 2509 as illustrated in FIG. 25, or a mirror galvanometer, or the like. For ease of reference, a movable mirror system is generally referred to herein as a MEMS mirror. The movement of the MEMS mirror can be, for example, at a frequency of between about 5 Hz to 50 kHz. In some examples, the frequency is between 50 Hz and 10 kHz. In another example, the frequency is between 100 Hz and 10 kHz. In another example, the frequency is between 500 Hz and 10 kHz. In some embodiments, the system 2500 may also include a diffuser optical element to add additional diffusion to the combined beam. For example, system 2500 can include an engineered diffuser 2512 positioned between the collimating lens 2511 and the CLA 2513. The diffuser 2512 can be a 1D engineered diffuser. When the optical system 2500 includes the engineered diffuser 2512, the beam conditioning optics need not include the anamorphic prisms in the beam conditioning optics, although some embodiments can include both the engineered diffuser and the anamorphic prisms. The 1D engineered diffuser (and the anamorphic prisms) provide a formed diffuse light beam to the CLA to produce a more "filled" light beam on the CLA, that is, a light beam with more uniformity and less irregularity when measured along an axis. In some embodiments, the CLA includes a pair of 1D cylindrical lens arrays spaced apart and having the axis of the cylindrical lenses aligned in the same direction. In some embodiments, the optical system does not include the focusing lens 2507 and/or the collimating lens 2511 (see for example the optical system in FIG. 43). As illustrated in FIG. 33, in some examples the optical system can includes a lens 2523 (e.g., a cylindrical lens) positioned between the engineered diffuser 2512 and the CLA 2513

In these embodiments, the MEMS mirror 2509 is used instead of the moving diffuser 2007 (e.g., FIG. 20) to diffuse the incident beam and increase uniformity of the flat top line beam, for example, to reduce the effects of speckle caused by the coherent light sources (i.e., lasers). In any of the embodiments described herein, in some implementations a mirror galvanometer is used instead of the MEMS mirror. The MEMS mirror 2509 can be configured to operate as a single-axis one-dimensional type. Although a single-axis movement of the light beam may generally be preferred, in various embodiments, the MEMS mirror 2509 can be a dual-axis two-dimensional type. In examples of dual-axis MEMS mirror implementations, the movement of the mirror in a one direction is much less than in a second direction as the moving beam propagates to a cylindrical array of lenses and the system is designed to form light beams with a flat top line beam profile having substantially uniform irradiance along the flat-top of the line beam (as uniform as possible). The MEMS mirror 2509 includes a movable reflective surface (mirror) that is moved (e.g., rapidly) using current (e.g., for a single-axis MEMS mirror) or current and a magnetic field (e.g., for a dual-axis MEMS mirror). There are many types of MEMS mirror devices (which may be referred to herein as a "MEMS mirror" for ease of reference) from a variety of manufacturers. A MEMS mirror typically operates using low power and can provide very rapid optical beam steering, in one-dimension or two-dimensions. For example, various configurations of a MEMS mirror can include an actuatable mirror that deflect laser beams at deflection angles of 0° up to plus/minus 5°, 10°, 15°, 25°, or 32°, at high speeds and along one or two-axes. In reference to the examples relating to FIGS. 25-42, the MEMS mirror 2509 is positioned in the optical system 2500 to receive a light beam from a focusing lens 2507. The focus of the light beam received at the MEMS mirror 2509 from the focusing lens 2507 does not need to be exactly at the surface of the MEMS mirror 2509, although it can be. Instead, the focus of the light beam from the focusing lens 2507 can be before or after the MEMS mirror 2509 (e.g., the MEMS mirror 2509 can be positioned at a distance, less than or greater than, or at, the focal length of the focusing lens 2507, so long as the light beam on the MEMS mirror 2509 fits on the MEMS mirror 2509 and does not overfill the MEMS mirror 2509. The MEMS mirror 2509 reflects the beam from the focusing lens 2507 to a collimating lens 2511. Some examples of such optical systems do not include a collimating lens 2511. In operation, the MEMS mirror 2509 is actuated to move the incident beam such that the beam reflected from the MEMS mirror 2509 moves a distance (e.g., back and forth, or in some other pattern) on the surface of the CLA 2513 to provide a more diffuse light to the objective lens 2515 and subsequently to the sample plane 2517. Reference to the MEMS mirror 2509 being at 45°, 45.5°, or 46° indicates the mirror is at initial position of 45° relative to the incident light beam (e.g., based on the positioning of the MEMS mirror housing), and then actuated to move to be in a position of 45.5° or 46° relative to the incident light beam. These angles are merely examples, other angles can be used. For example, an angle for moving the MEMS mirror can be determined such that the angle corresponds with a desired movement distance of the light beam on the CLA 2513, e.g., movement of the centroid of the light beam across a certain portion of a lens of the CLA 2513.

In the example configuration of FIG. 25, the MEMS mirror 2509 is initially positioned at a 45° angle relative to incident light received at the MEMS mirror from the focusing lens. FIGS. 26-28 illustrate beam profiles at the sample plane of this configuration (MEMS mirror positioned at a 45° angle). FIGS. 29-32 relate to a similar optical system as illustrated in FIG. 25, where the MEMS mirror is positioned at a 45.5° angle. FIGS. 33-36 relate to a similar optical system as illustrated in FIG. 25, and the resulting beam profiles, where the MEMS mirror is positioned at a 46° angle. In this example, the MEMS mirror 2509 is driven by signals provided by a controller 2510, which can be a separate controller or incorporated into, or part of, another system (e.g., another computer system). The controller 2510 drives the MEMS mirror 2509 to move the mirror at a certain frequency, and a certain amount (e.g., in degrees) in one direction, or in two directions (e.g., tip and tilt). The controller 2510 can drive the MEMS mirror 2509 based on predetermined drive information that is stored on the controller 2510 or provided to the controller. The drive information can include the frequency of the mirror movement, the amount of mirror movement (+/−) along a first axis and/or along a second axis orthogonal to the first axis. In some embodiments, the predetermined information is generated by measuring one or more characteristics of the beam formed at the sample plane (or at the objective lens, or another plane in the light path after the MEMS mirror) and adjusting the movement of the mirror to produce the desired beam profile. For example, the flat top line beam can be measured, and the movement of the mirror can be changed to increase (or optimize) the uniformity of irradiance at the flat top of the line beam. In an example implementation, the flat top line beam can be measured (e.g., that the sample plane) and the movement of the mirror can be changed automatically using a feedback loop between the measuring sensor and the controller to automatically change (e.g., increase or optimize) the uniformity of irradiance at the flat top of the line beam. In some examples, various samples can be positioned at the sample plane, and the controller 2510 can be adjusted to produce a flat top line beam that best reads the samples, and this information can be electronically saved as a particular beam profile for that type of sample.

FIG. 26 is a diagram illustrating an example of the X and Y-coordinate beam profile at the sample plane of the optical system of FIG. 25, the MEMS mirror being positioned at a 45° angle relative to incident light received at the MEMS mirror from the focusing lens. Unlike the beam generated by the optical systems of FIGS. 20 and 22, this beam has a thin line profile which is useful for scanning certain types of samples such as in flow cells.

FIG. 27 is a graph illustrating an example of irradiance along the long-axis beam profile (e.g., the Y coordinate value) at the sample plane of the system of FIG. 25 when the MEMS mirror is positioned at a 45° angle relative to incident light received at the MEMS mirror from the focusing lens. Along the Y coordinate, the irradiance curve shows a sharp transition from near zero values to a flat-top portion having small irregularities centered around the "0" Y coordinate value. FIG. 28 is a graph illustrating an example of the irradiance along the short-axis beam profile (e.g., the X coordinate value) at the sample plane of the system of FIG. 25. The irradiance along the X coordinate is more of a steep Gaussian curve centered at the "0" X coordinate value.

Figure 29:
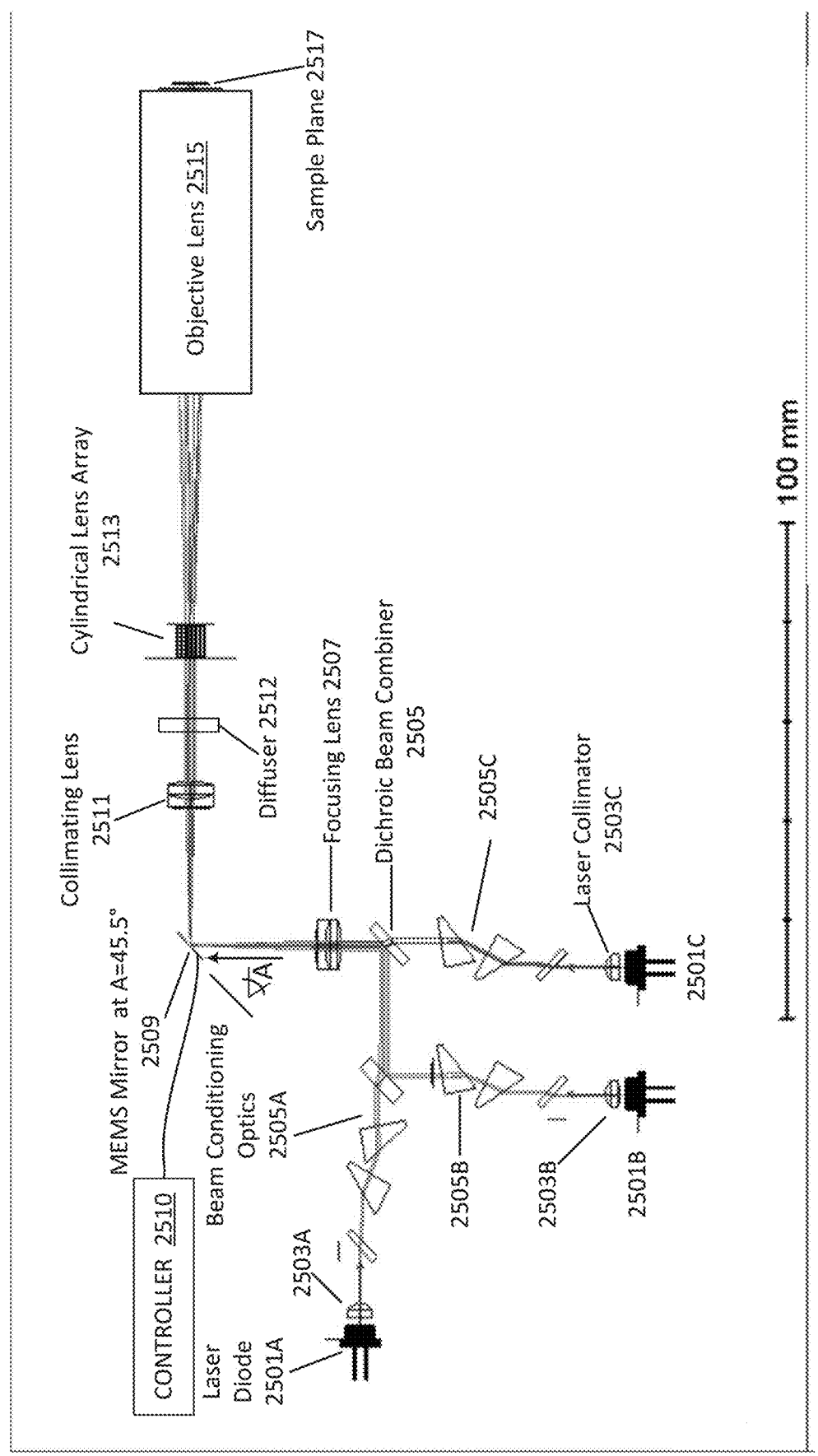
FIG. 29 illustrates the incident light path of an embodiment of the optical system of FIG. 25, where the MEMS mirror is positioned at a 45.5° angle relative to incident light received at the MEMS mirror from the focusing lens.
Figure 30:
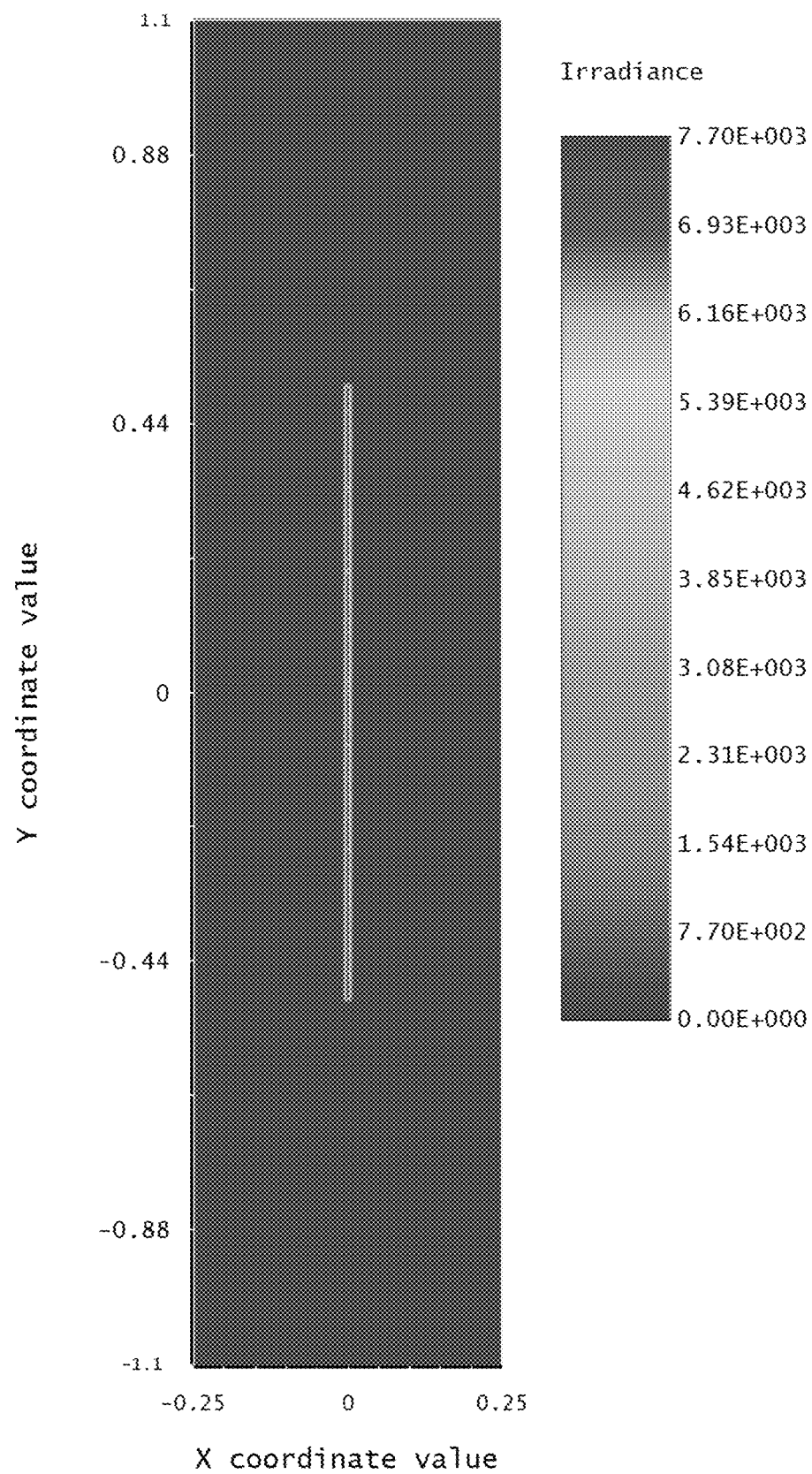
FIG. 30 is a diagram illustrating an example of the X and Y-coordinate beam profile at the sample plane of the optical system of FIG. 29, the MEMS mirror being positioned at a 45.5° angle relative to incident light received at the MEMS mirror from the focusing lens.
Figure 31:
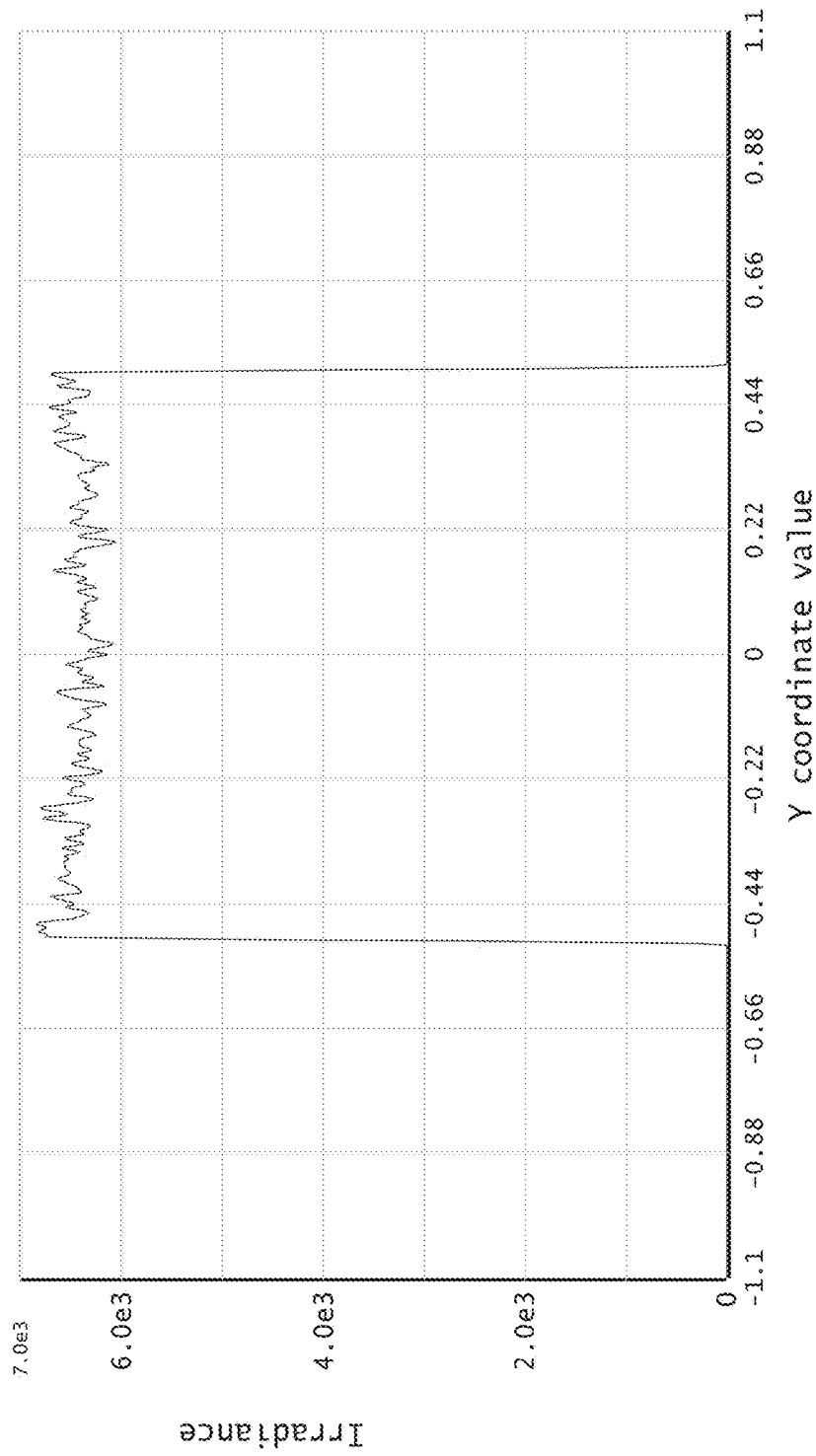
FIG. 31 is a graph illustrating an example of irradiance along the long-axis beam profile (e.g., the Y coordinate value) at the sample plane of the system of FIG. 29, the MEMS mirror being positioned at a 45.5° angle relative to incident light received at the MEMS mirror from the focusing lens.

FIG. 29 illustrates certain components and the incident light path of an embodiment of the optical system of FIG. 25, where the MEMS mirror is positioned at a 45.5° angle relative to incident light received at the MEMS mirror from the focusing lens. FIG. 30 is a diagram illustrating an example of the X and Y-coordinate beam profile at the sample plane of the optical system of FIG. 25, the MEMS mirror being positioned at a 45.5° angle relative to incident light received at the MEMS mirror from the focusing lens. FIG. 31 is a graph illustrating an example of irradiance along the long-axis beam profile (e.g., the Y coordinate value) at the sample plane of the system of FIG. 29 when the MEMS mirror 2509 is positioned at a 45.5° angle relative to incident light received at the MEMS mirror 2509 from the focusing lens. Along the Y coordinate, the irradiance curve again shows a sharp transition from near zero values to a flat-top portion having small and different irregularities centered around the "0" Y coordinate, the irregularities being different than those shown in FIG. 27 with the MEMS mirror 2509 at 45°.

Figure 32:
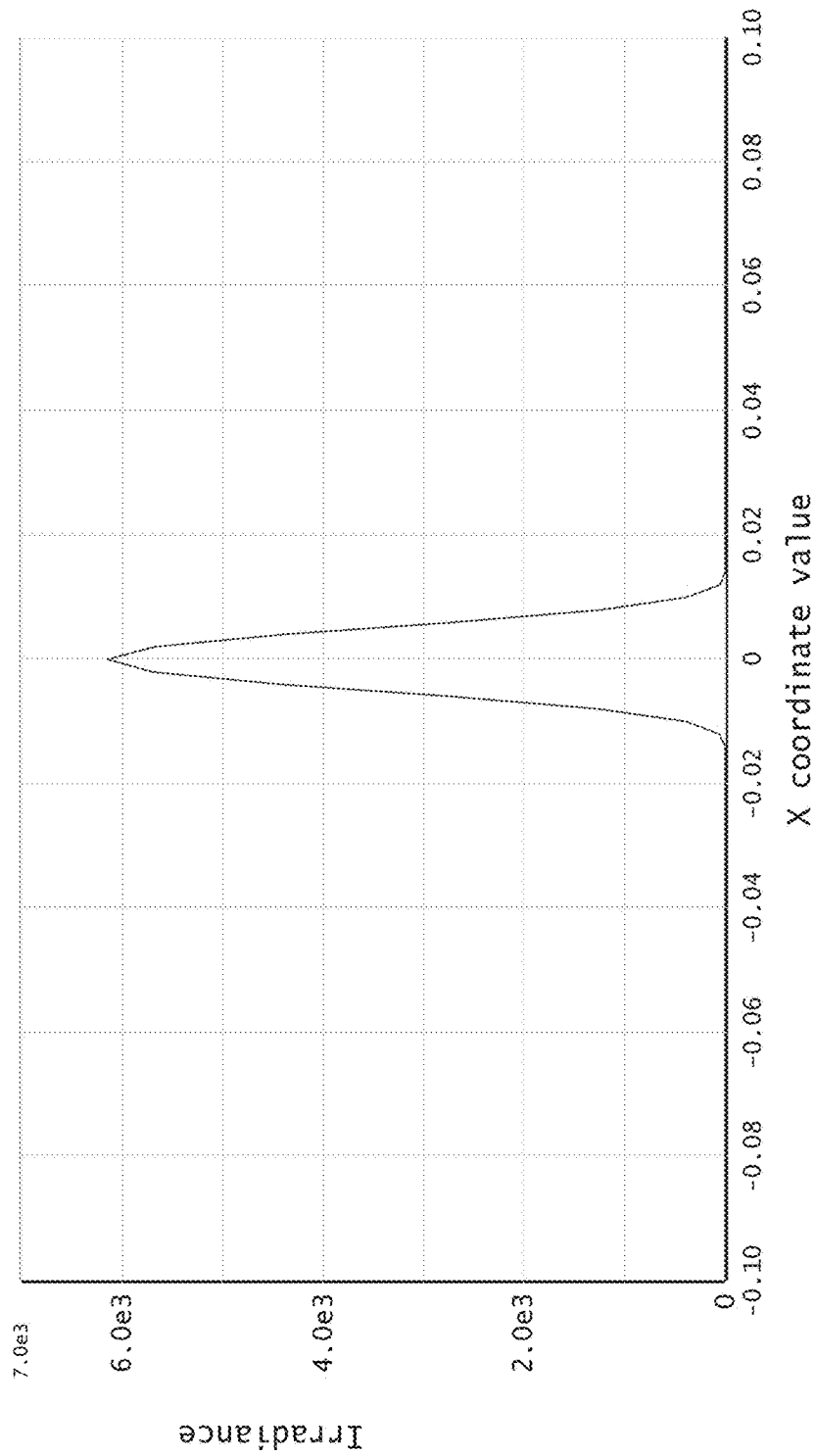
FIG. 32 is a graph illustrating an example of irradiance along the short-axis beam profile (e.g., the X coordinate value) at the sample plane of the system of FIG. 29, the MEMS mirror being positioned at a 45.5° angle relative to incident light received at the MEMS mirror from the focusing lens.

FIG. 32 is a graph illustrating an example of irradiance along the short-axis beam profile (e.g., the X coordinate value) at the sample plane of the system of FIG. 29, the MEMS mirror 2509 being positioned at a 45.5° angle relative to incident light received at the MEMS mirror 2509 from the focusing lens. The irradiance along the X coordinate is more of a steep Gaussian curve centered at the "0" X coordinate value. In various embodiments, the MEMS mirror can be moved to change the angle of incident of the light beam on the CLA 2513 in the range of plus or minus 0.001°, 0.002°, 0.003°, 0.004°, 0.005°, 0.006°, 0.007°, 0.008°, 0.009°, or 0.010°. In some embodiments, the MEMS mirror can be moved to change the angle of incident of the light beam on the CLA 2513 in the range of plus or minus 0.01°, 0.02°, 0.03°, 0.04°, 0.05°, 0.06°, 0.07°, 0.08°, 0.09°, or 0.11°. In some embodiments, the MEMS mirror can be moved to change the angle of incident of the light beam on the CLA 2513 in the range of plus or minus 0.1°, 0.2°, 0.3°, 0.4°, 0.5°, 0.6°, 0.7°, 0.8°, 0.9°, or 1.0°. In some embodiments, the MEMS mirror 2509 can be moved to change the angle of incident of the light beam on the CLA 2513 in the range of plus or minus 1°, 2°, 3°, 4°, 5°, 6°, 7°, 8°, 9°, or 10°, or greater than 10°. The angle determines how much the beam moves on the lens array. In various embodiments, the MEMS mirror 2509 can move the light beam to any angle that is just less than the acceptance angle of the CLA 2513.

Figure 34:
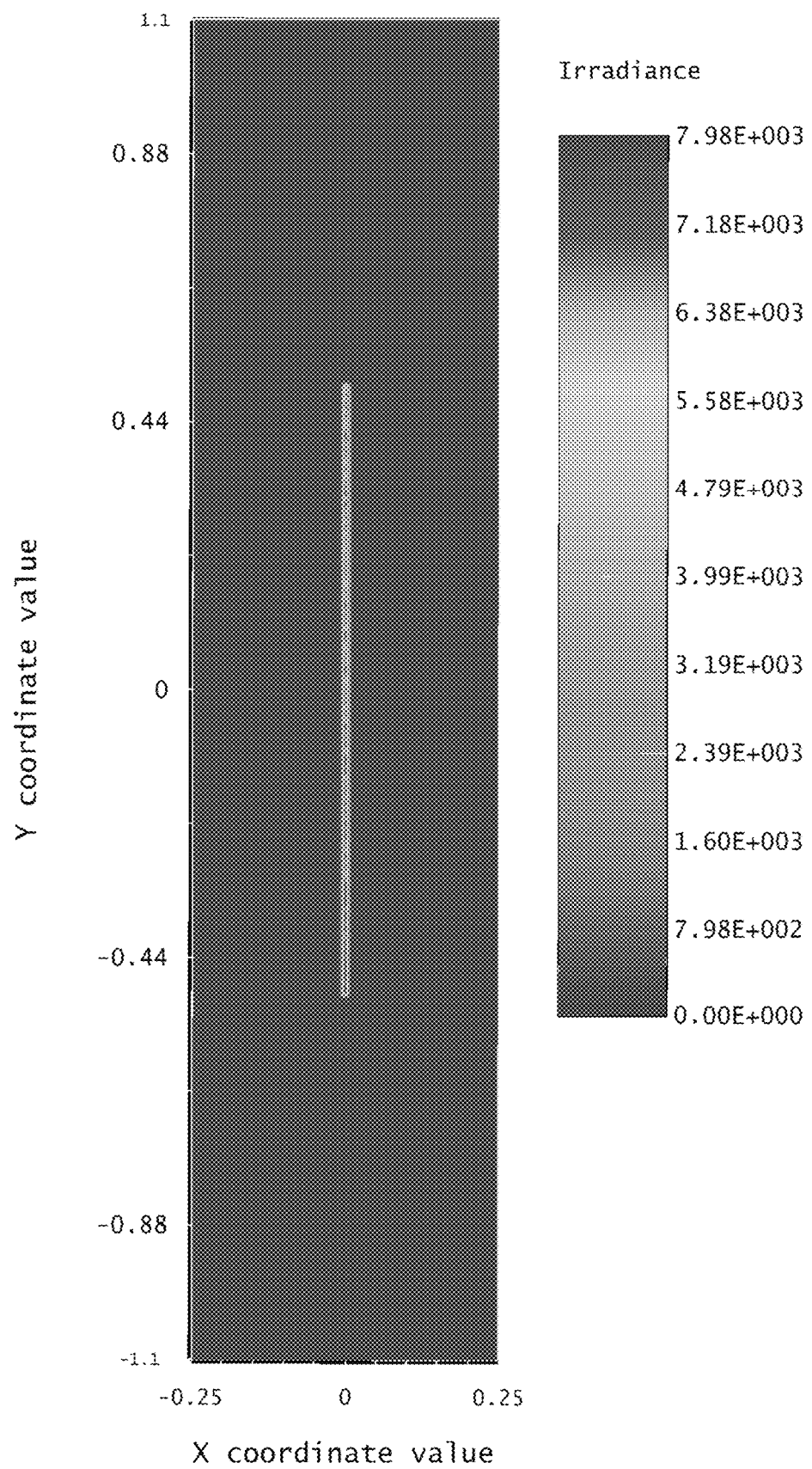
FIG. 34 is a diagram illustrating an example of the X and Y-coordinate beam profile at the sample plane of the optical system of FIG. 29, the MEMS mirror being positioned at a 46° angle relative to incident light received at the MEMS mirror from the focusing lens.
Figure 35:
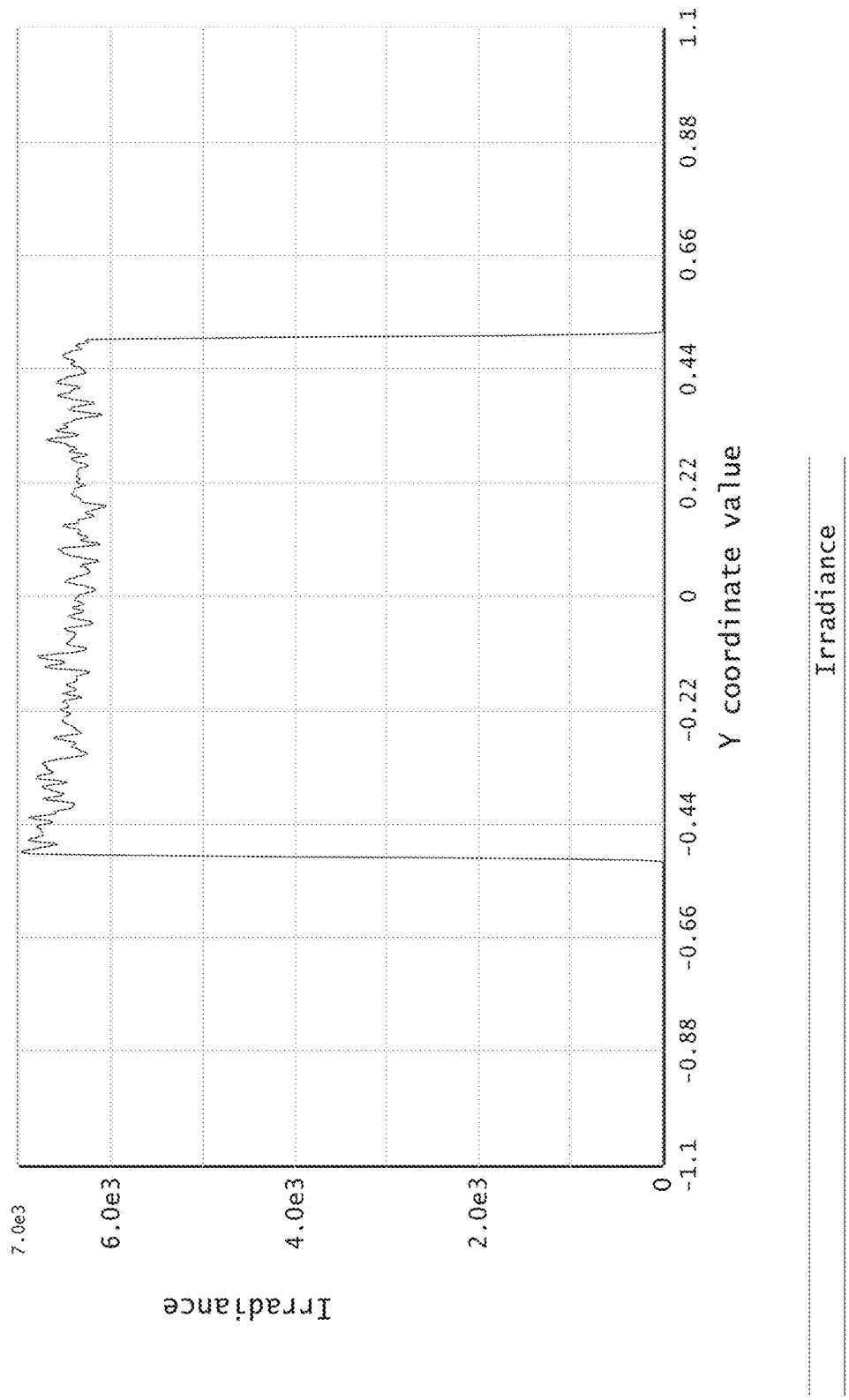
FIG. 35 is a graph illustrating an example of irradiance along the long-axis beam profile (e.g., the Y coordinate value) at the sample plane of the system of FIG. 29, the MEMS mirror being positioned at a 46° angle relative to incident light received at the MEMS mirror from the focusing lens.
Figure 36:
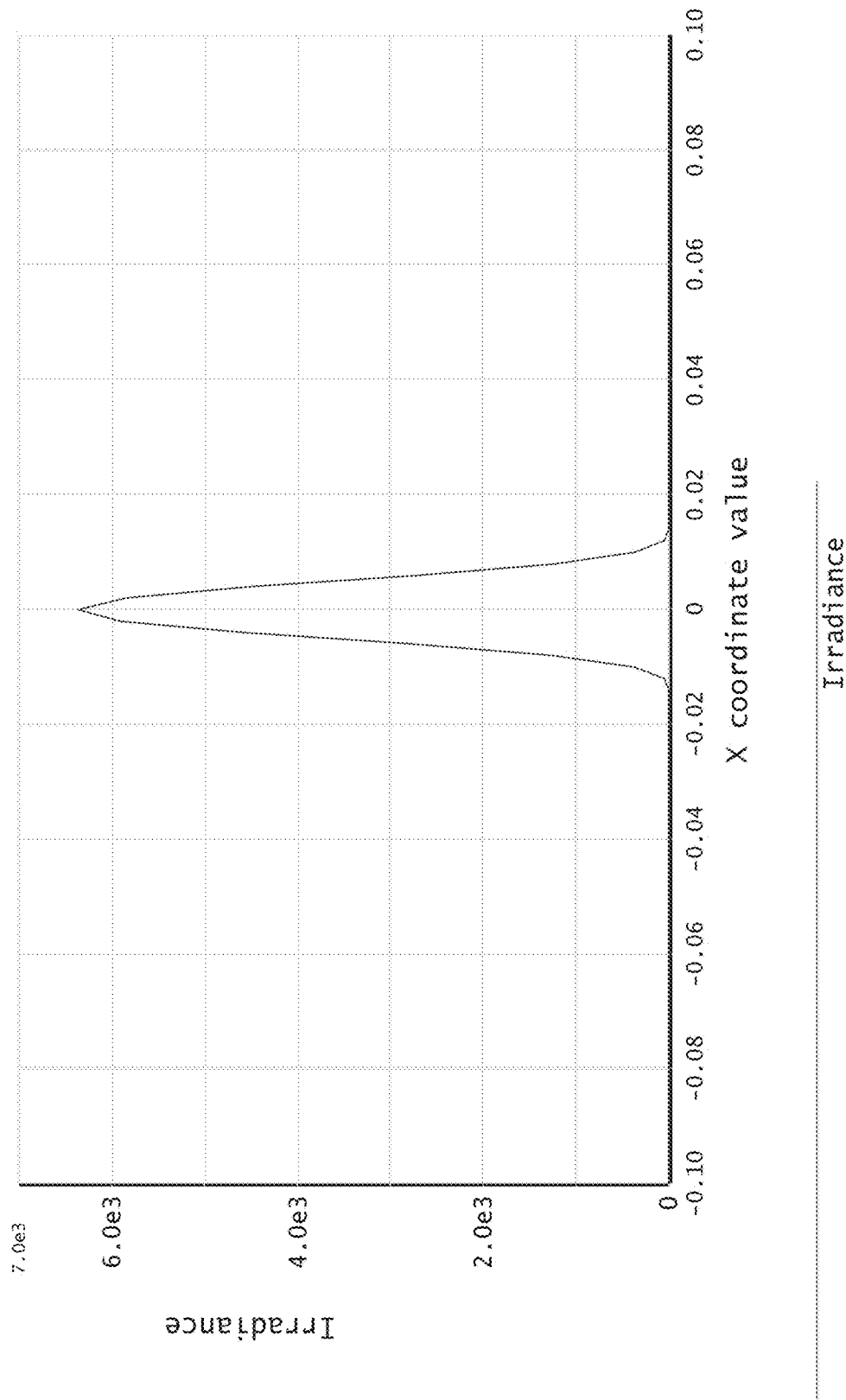
FIG. 36 is a graph illustrating an example of irradiance along the short-axis beam profile (e.g., the X coordinate value) at the sample plane of the system of FIG. 29, the MEMS mirror being positioned at a 46° angle relative to incident light received at the MEMS mirror from the focusing lens.

FIG. 33 illustrates certain components and the incident light path of an embodiment of the optical system of FIG. 25, where the MEMS mirror is positioned at a 46° angle relative to incident light received at the MEMS mirror from the focusing lens. FIG. 33 also illustrates that the optical system may include a lens 2523 positioned between an engineered diffuser 2512 and the CLA 2513. The lens 2523 can be a cylindrical lens which focuses light from the diffuser into a line at the CLA 2513. FIG. 34 is a diagram illustrating an example of the X and Y-coordinate beam profile at the sample plane of the optical system of FIG. 33, the MEMS mirror being positioned at a 46° angle relative to incident light received at the MEMS mirror from the focusing lens. FIG. 35 is a graph illustrating an example of irradiance along the long-axis beam profile (e.g., the Y coordinate value) at the sample plane of the system of FIG. 33 when the MEMS mirror is positioned at a 46° angle relative to incident light received at the MEMS mirror from the focusing lens. Along the Y coordinate, the irradiance curve again shows a sharp transition from near zero values to a flat-top portion having small and different irregularities centered around the "0" Y coordinate, the irregularities being different than those shown in FIGS. 27 and 31 with the MEMS mirror at 45° and 45.5°, respectively. The irradiance profile in FIG. 35 shows some sag in the profile (e.g., from left-to-right in the graph), which may be due to clipping in the objective lens. FIG. 36 is a graph illustrating an example of the irradiance along the short-axis beam profile (e.g., the X coordinate value) at the sample plane of the system of FIG. 33. Again, irradiance along the X coordinate is a steep Gaussian curve centered at the "0" X coordinate value.

Figure 37:
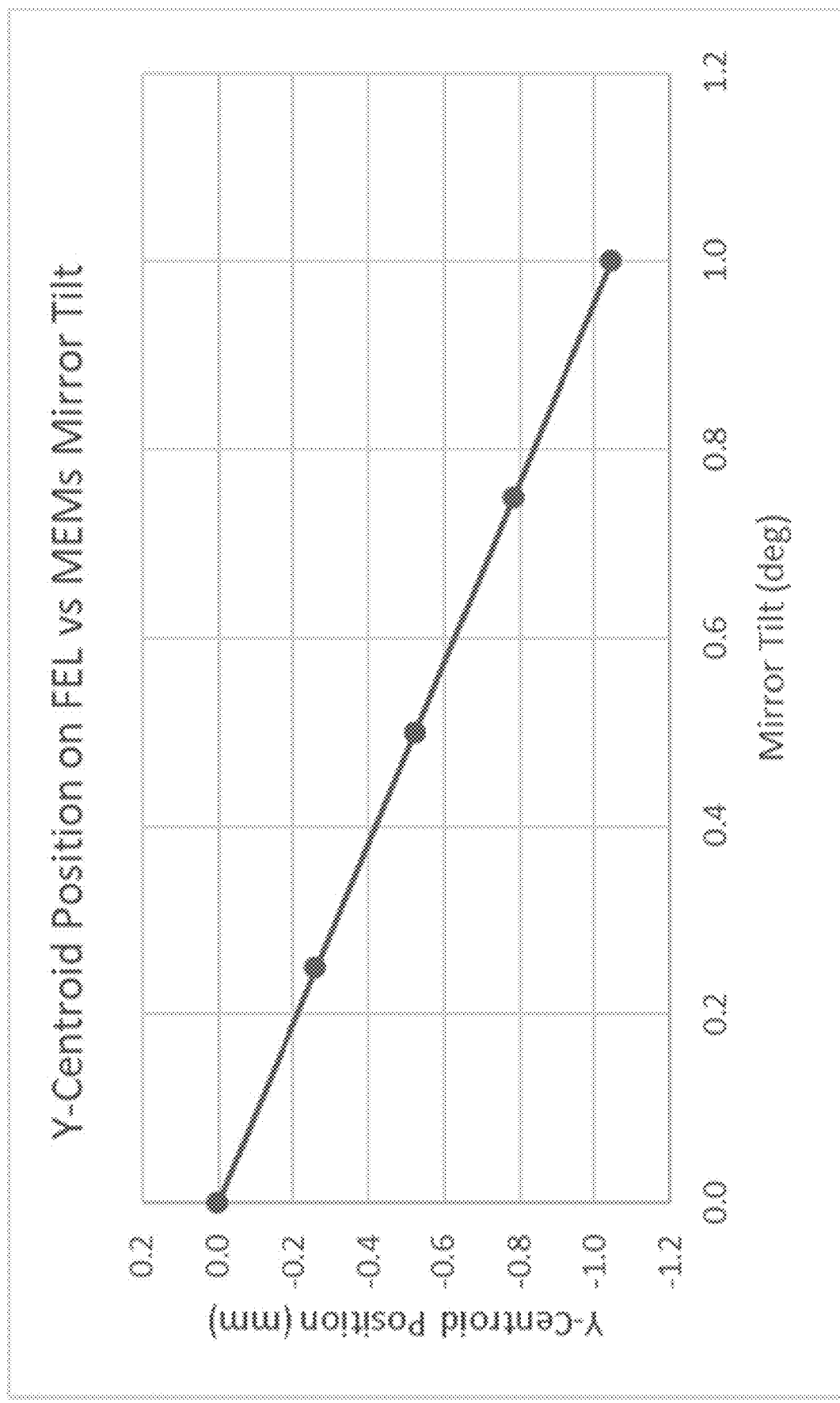
FIG. 37 is a graph illustrating the Y-Centroid position of the beam (mm) on the cylindrical lens array (y-axis) as a function of the MEMS mirror tilt (x-axis).

FIG. 37 is a graph illustrating the Y-Centroid position of the beam (mm) on the CLA (y-axis) as a function of the MEMS mirror tilt (x-axis), showing this to be a linear relationship. In an example, the CLA 2513 includes a 1D array of cylindrical lenses. Actuating the MEMS mirror 2509 moves the centroid of the beam to be at different positions on the surface of the CLA. Depending on the implementation, the movement of the beam may move the centroid across a portion of a lens of the CLA, or across a whole lens. In some embodiments, the fraction of a lens which the beam is displaced across may be determined empirically. The lenses of the CLA can be configured to have a certain pitch, array size length, array size width, and array size thickness. Each lens in the CLA is configured to have a pitch, focal length, and diameter. In some embodiments, the Y centroid position of the beam on the CLA is moved by the MEMS mirror 2509 across about 1% or less of a dimension of a lens in the CLA (e.g., a diameter of a lens). In other embodiments, the Y centroid position of the beam on the CLA is moved by the MEMS mirror 2509 across about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, 99%, or 100%, (plus or minus 0.05%) of a lens in the CLA. In some embodiments, the Y centroid position of the beam on the CLA is moved more than one lens.

Figure 38:
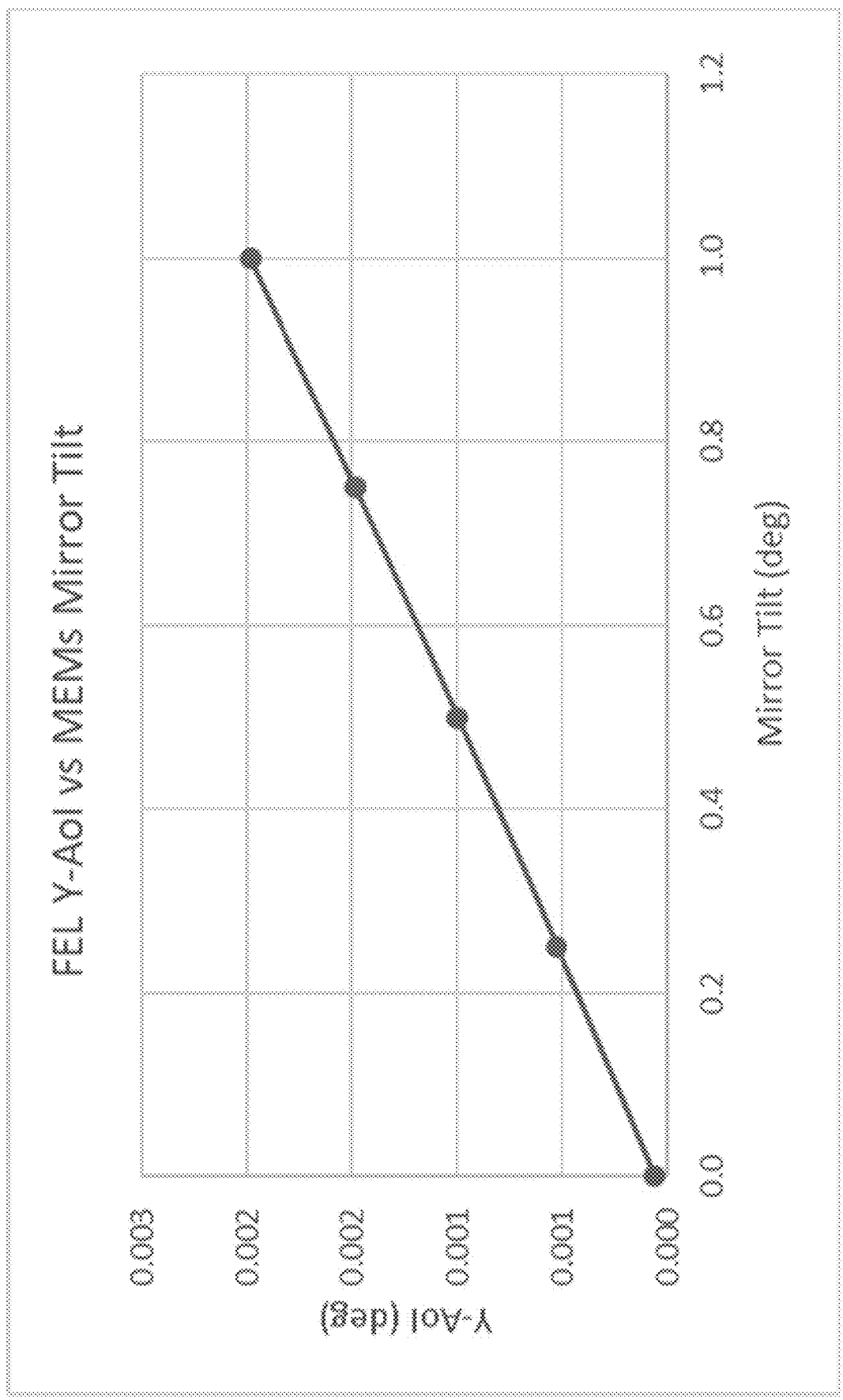
FIG. 38 is a graph illustrating the cylindrical lens array (CLA) Y-angle of incidence (AoI) (y-axis) as a function of the MEMS mirror tilt (x-axis), showing that CLA AoI changes only slightly with MEMS mirror tilt, which prevents (or at least partially prevents) side lobes from appearing.

FIG. 38 is a graph illustrating the cylindrical lens array (CLA) Y-AoI (y-axis) as a function of the MEMS mirror tilt (x-axis). This graph shows that the angle of incidence of the beam on the CLA (reflected from the MEMS mirror) changes only slightly with MEMS mirror tilt, which prevents (or at least partially prevents) side lobes from appearing. Side lobes appear if the incident beam angle on the CLA is greater than the CLA acceptance angle. In this example, the Y-AoI changes linearly from about 0.000 degrees to about 0.002 degrees as the mirror tilt changes from 0.0 degrees to 1 degree.

Figure 39:
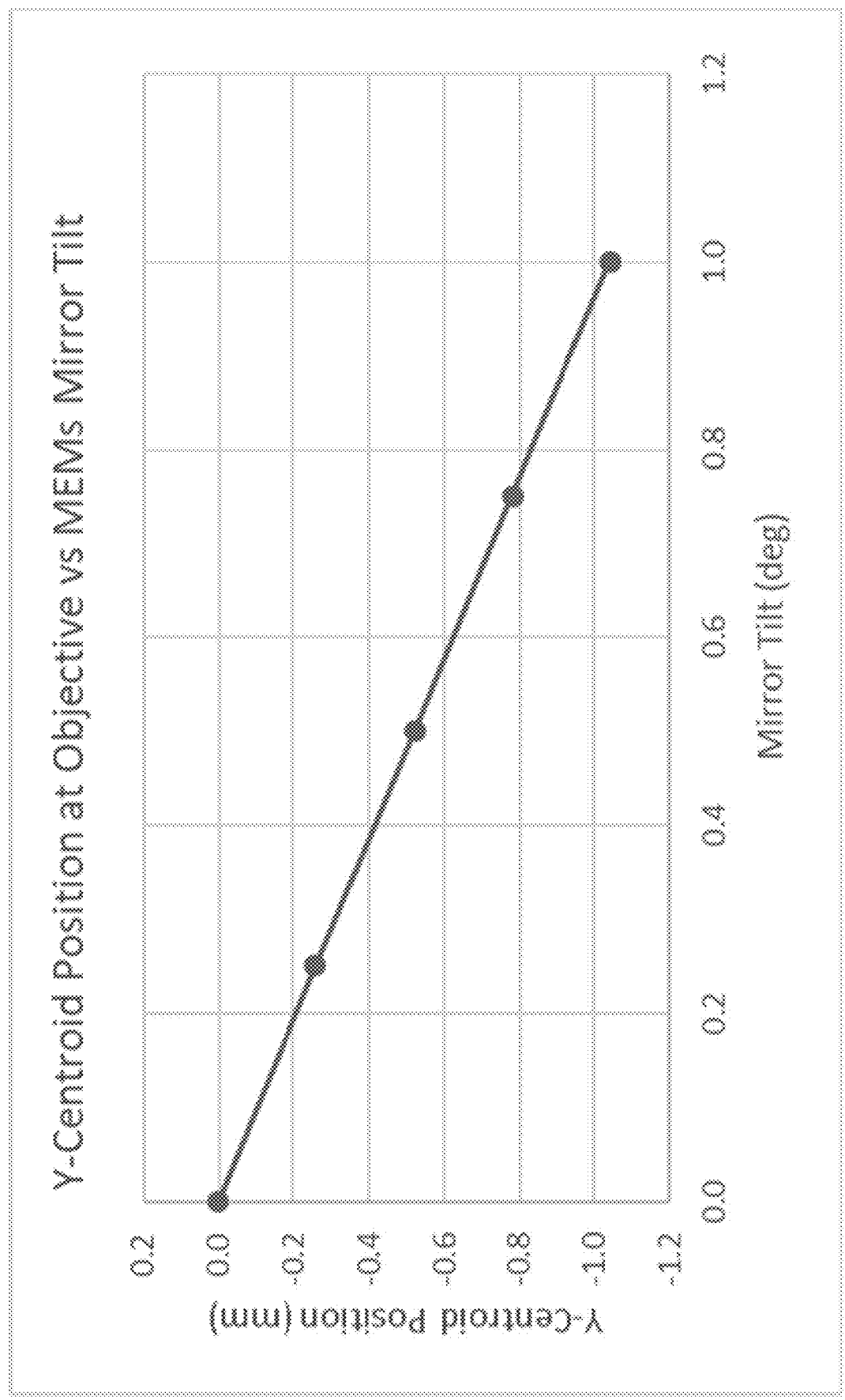
FIG. 39 is a graph illustrating the Y-Centroid position (mm) of the beam on the objective lens (y-axis) as a function of the MEMS mirror tilt (x-axis).

FIG. 39 is a graph illustrating the Y-Centroid position (mm) of the beam on the objective lens (y-axis) as a function of the MEMS mirror tilt (x-axis). In this example, the Y-centroid position changes linearly with respect to the mirror tilt, from an initial Y-centroid position of 0.0 to about −1.05 mm as the mirror is tilted from 0 degrees to 1.0 degree. At some point the beam will start to clip on the objective lens stop, which will result in line uniformity degradation.

Figure 40:
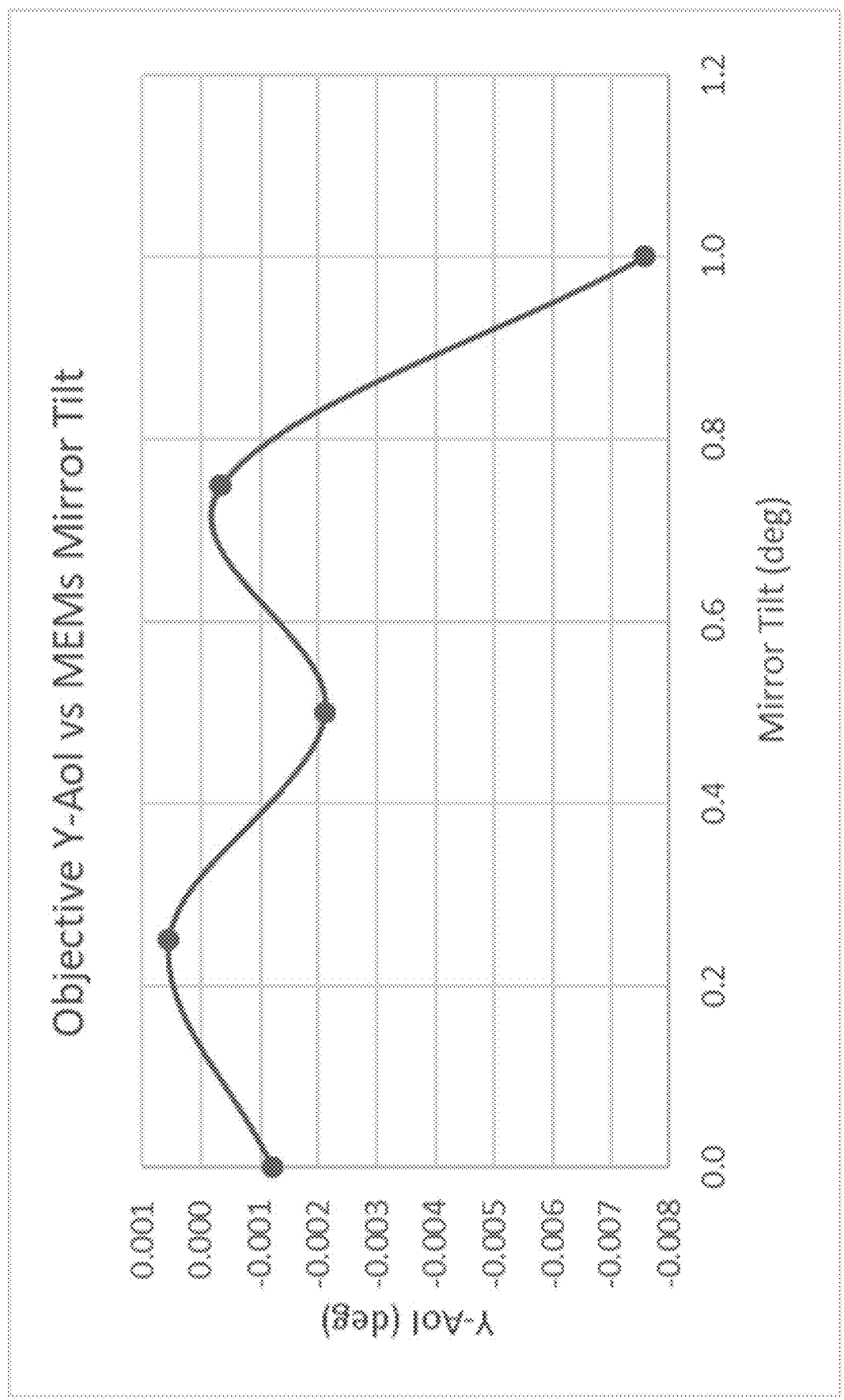
FIG. 40 is a graph illustrating the objective lens Y-AoI (y-axis) as a function of the MEMS mirror tilt (x-axis), showing that objective AoI changes only slightly with MEMS mirror tilt, which is important for maintaining the position of the illumination field-of-view (FOV) as the MEMS mirror moves.

FIG. 40 is a graph illustrating the objective lens Y-AoI (y-axis) as a function of the MEMS mirror tilt (x-axis). This graph shows that objective Y-AoI changes only slightly with MEMS mirror tilt, which is important for maintaining the position of the illumination field-of-view (FOV) as the MEMS mirror moves. As can be seen in this graph, the objective AoI changes only slightly with MEMS mirror tilt, which is critical for maintaining the position of the illumination FOV as the MEMS mirror moves.

Figure 41:
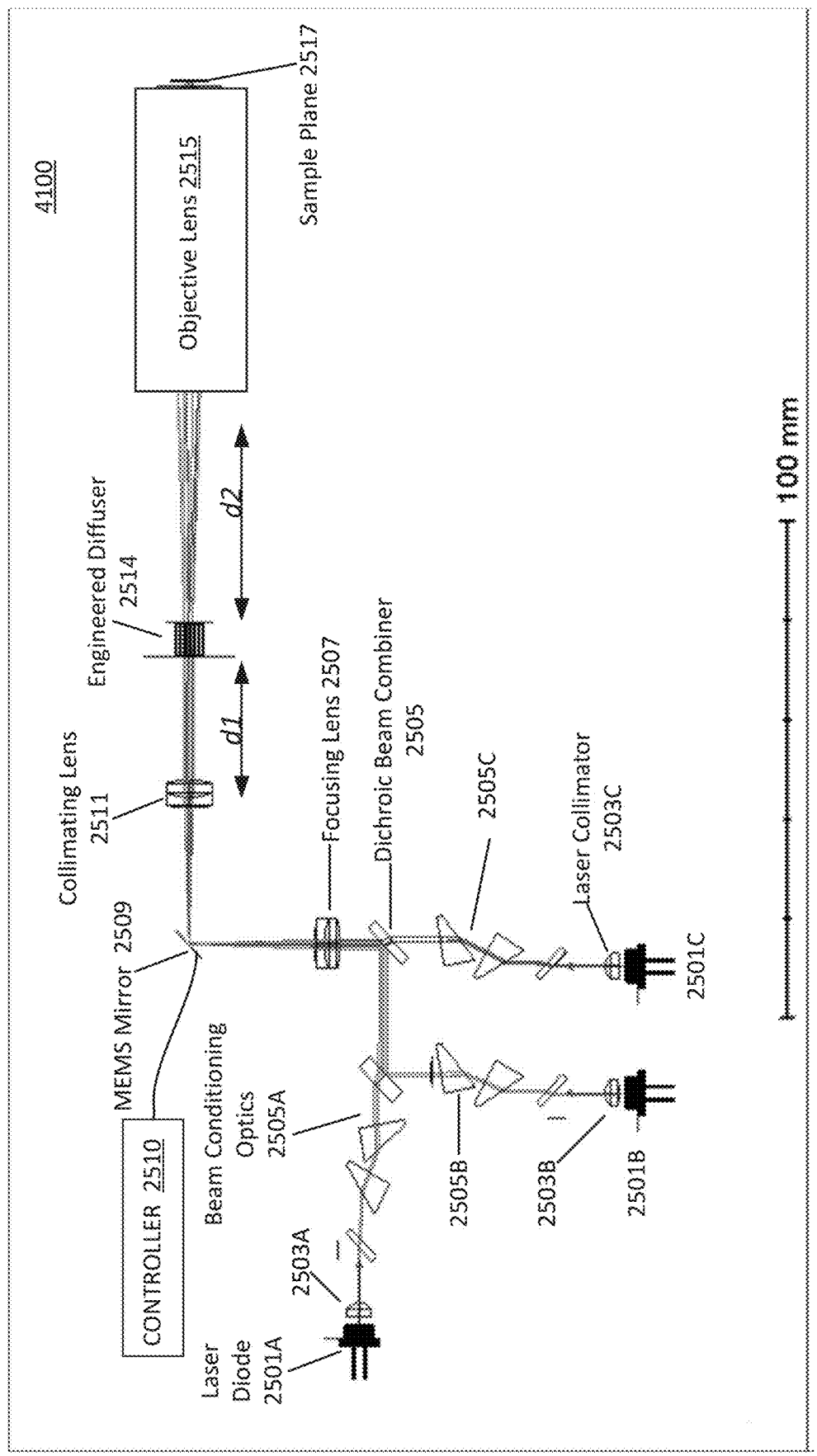
FIG. 41 illustrates the incident light path of an embodiment of an optical system configured to analyze samples generally similar to the optical system of FIG. 25 including having a MEMS mirror in the beam path between a focusing lens and a collimating lens, except that in this system the CLA has been replaced by a diffuser positioned at a distance d1 from the collimating lens and at a distance d2 from the objective lens.

FIG. 41 illustrates the incident light path of an embodiment of an optical system 4100 generally similar to the optical system of FIG. 25, including having a MEMS mirror 2509 in the beam path between a focusing lens 2507 and a collimating lens 2511. System 4100 also is configured to generate a flat top line beam. However, in system 4100 the CLA has been replaced by a diffuser 2514 positioned at a distance d1 from the collimating lens and at a distance d2 from the objective lens. In some embodiments, the diffuser 2514 is an engineered diffuser. In some embodiments, the use of an engineered diffuser allows the elimination of prisms in the beam conditioning optics. For example, a 1D diffuser can be used to "fill" the lens array (i.e., provide light across a portion of the CLA, or across all of the CLA). In some embodiments, a cylindrical lens can be used to fill the CLA. The engineered diffuser can be configured to diffuse light in one direction but not in an orthogonal direction. For example, to diffuse light in the Y-direction but not diffuse light in the X-direction (or provide a much lower diffusion of light in the X-direction). As illustrated in FIG. 41, in some embodiments, an engineered diffuser can provide sufficient diffusing and beam shaping to and is used in place of the CLA (see for example, FIG. 41). In this case, the movement of the light beam by the MEMS mirror provides dithering to smooth out the high spatial frequency noise we see on the output of the engineered diffuser. In other embodiments, an engineered diffuser can be positioned in the light path before the CLA and is used to fill the linear cylindrical lens array without affecting the orthogonal axis.

Figure 42:
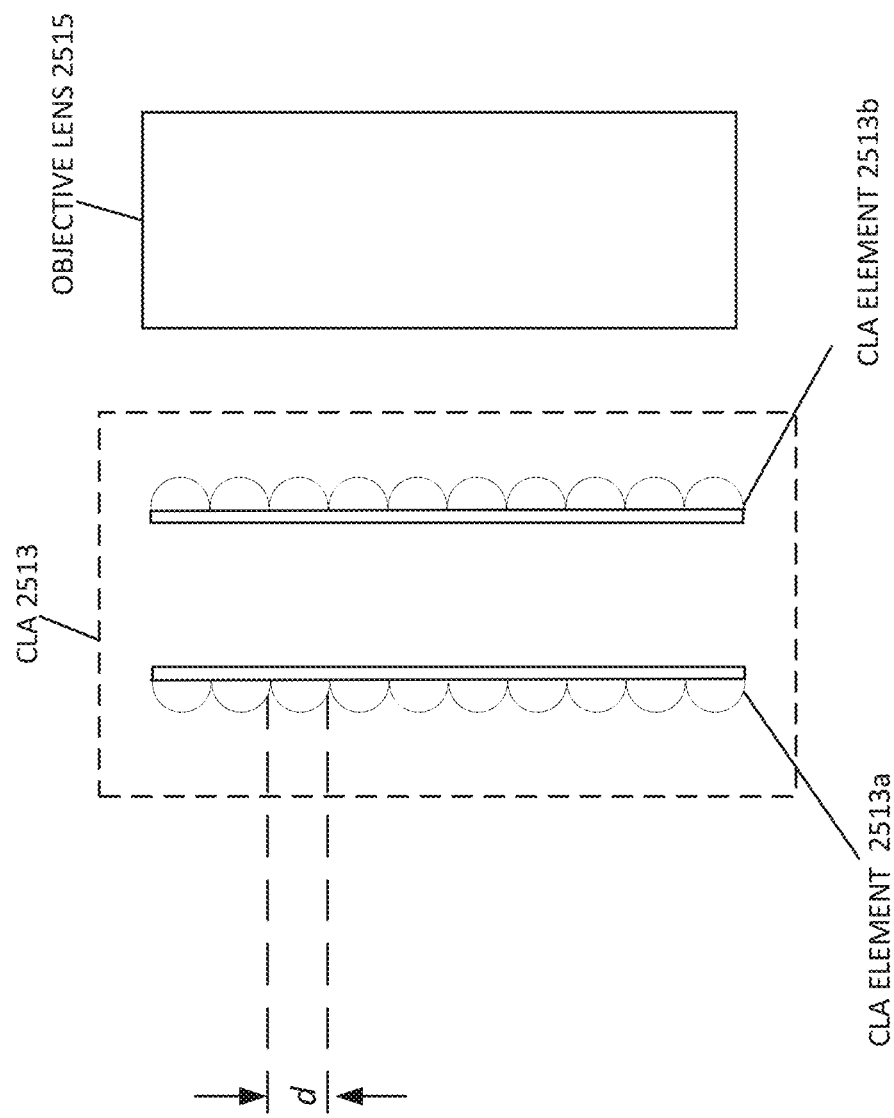
FIG. 42 illustrates an example of an embodiment of a cylindrical lens array (CLA) that can be used in illumination systems described herein.

FIG. 42 is a schematic that illustrates an example of a cylindrical lens array 2513 (CLA). In an example, the CLA has a single element 2513*a* that is a one-dimensional (1D) array having cylindrical lenses. In another example, the CLA has a pair of cylindrical lens arrays, CLA element 2513*a* and CLA element 2513*b*, that are spaced apart, each element being a one-dimensional (1D) array having cylindrical lenses. With such CLAs, the shaping of the light is on one axis such that the output beam is a flat top line beam. In the example shown in FIG. 42, each of the cylindrical lenses of the CLA has a diameter distance d. As indicated above, the MEMS mirror 2509 can be driven to move the Y-centroid position of the beam on the CLA a certain distance, the distance being less than or equal to the diameter distance d.

FIG. 43 illustrates an embodiment of an optical system 2550 configured to generate a flat top line beam for analyzing samples the optical system including a MEMS mirror and a cylindrical lens array (CLA). This system includes many of the elements of the optical system illustrated in FIG. 25, for example, one or more lasers 2501, and for each laser a collimator 2503, beam conditioning optics 2505, and a beam combiner 2505. The optical system 2550 also includes a mirror system (MEMS mirror 2509) and a CLA 2513, and an objective lens 2515. Unlike the optical system of FIG. 25, the example of an optical system in FIG. 43 does not include a collimating lens between the MEMS mirror and the CLA, and does not include a focusing lens between the beam combiner and the MEMS mirror. In some embodiments, the beam conditioning optics 2505 can includes anamorphic prisms. In some embodiments, the beam conditioning optics 2505 includes an engineered diffuser instead of the prisms. When the beam conditioning optics includes an engineered diffuser, depending on the implementation the optical system may not include a focusing lens 2507 or a collimating lens 2511, or it may include one or both of the focusing lens 2507 and the collimating lens 2511.

In various embodiments, including any of the embodiments described above or elsewhere herein, an optical fiber can be included in this system to transport light from one location to another. Accordingly, an optical fiber may be included, for example, in an optical path between any two elements instead of propagating light in free space. Accordingly, an optical fiber may be included at different locations within the optical system. Additionally, such optical fiber may be included in one or more locations within the optical system. Likewise, one or more optical fibers may be included in the optical system.

Figure 44:
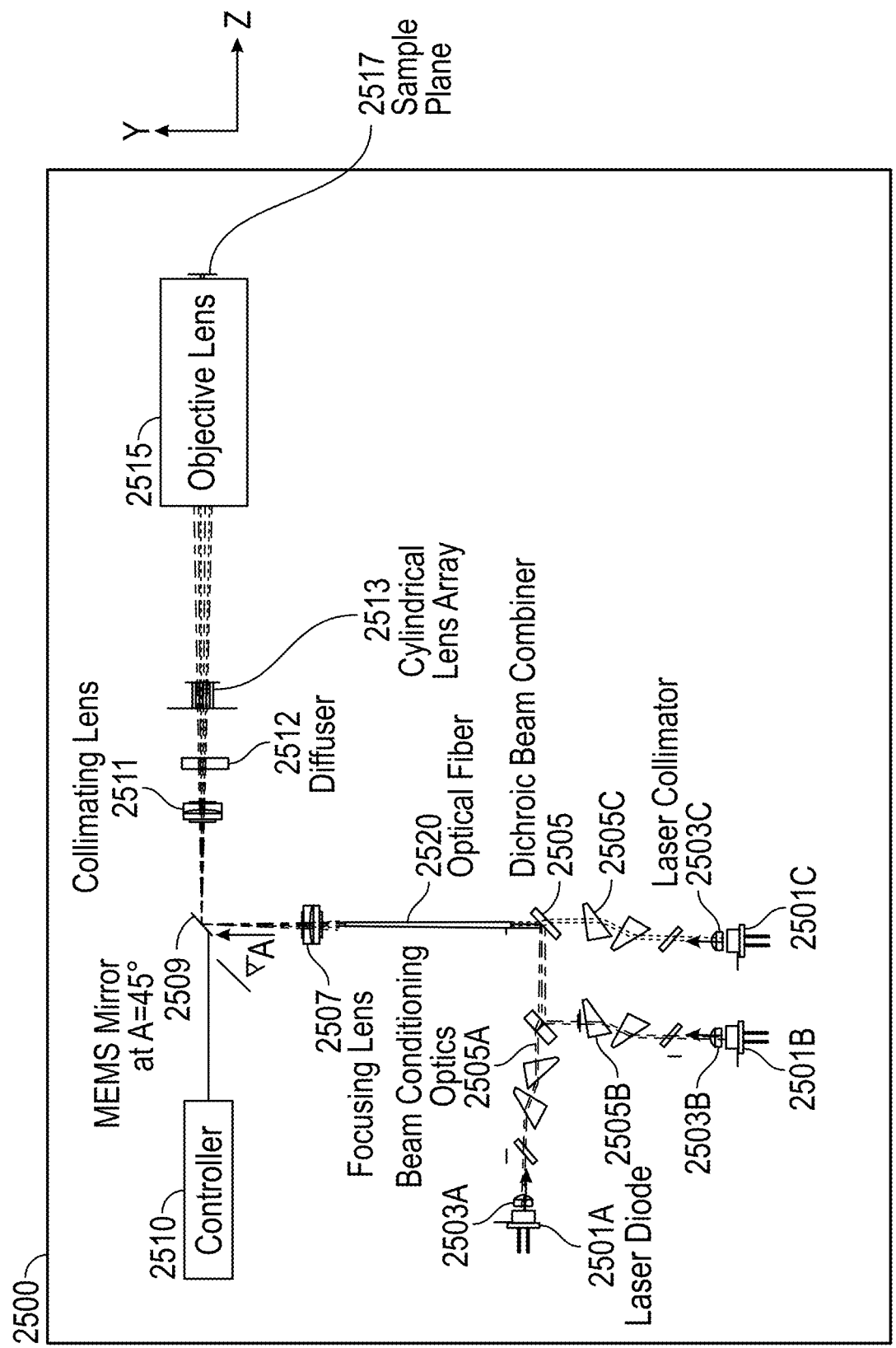
FIG. 44 illustrates an embodiment of an optical system configured to generate a flat top line beam for analyzing samples (e.g., biological and/or chemical samples) using laser-induced fluorescence, the optical system including a MEMS mirror and a cylindrical lens array (CLA), wherein an optical fiber is disposed to couple light from the light source to the MEMS mirror.

An optical fiber, for example, can be positioned in the optical path between the light source (e.g., laser diodes 2501A, 2501B, and 2501C) and one or more downstream optical component such that the light source can be remote from the sample plane 2517 and/or the sample. In various implementations, for example, the laser source (e.g., laser diodes 2501A, 2501B, and 2501C) can be located a distance of between 10 centimeters (cm) and 5 meters or 50 centimeters and 1 meter or 1 meter and 5 meters from the sample plane 2417 and/or the sample being illuminated with laser light and/or evaluated or any range of distances formed by any of these values or the distance may be outside these ranges in some implementations. As shown in FIG. 44, for example, an optical fiber 2520 is disposed in an optical path between the laser diodes 2501A, 2501B, and 2501C and the moveable mirror system or MEMS mirror 2509. In particular, in this example, the optical fiber 2520 is disposed in an optical path between one of the dichroic beam combiners 2505 and a lens such as a focusing lens 2507 disposed between the optical fiber and the MEMS mirror 2509. The focusing lens 2507 may comprise, for example, a positive power lens having a positive focal length and may be disposed with respect to the optical fiber 2520 and the MEMS mirror 2509 to received light from the optical fiber and focus light onto the MEMS mirror. In various implementations, for example, the optical fiber 2520 has a first end disposed to receive light from the light sources and a second end disposed to output light to the MEMS mirror 2509.

The optical fiber 2520 may comprise a core and a cladding and may be a single or multimode optical fiber. The optical fiber 2520 may have a core of any shape, including circular, square or rectangular. A fiber optic 2520 with a square or rectangular core may advantageously provide increased homogenization of the laser light prior to being incident on the MEMS mirror 2509 within the optical imaging system and potentially yield a more uniform flat-top line profile. Corners of the square or rectangle where sides of the core meet may, for example, provide for increased homogenization. In various implementations, the cross-section of the core orthogonal to its length can have a width, diameter, height, or any combination of these, that is between 5 μm and 600 μm for one axis and 5 μm and 600 μm for the orthogonal axis. For example, a 150 μm×450 μm fiber could be used with the laser beams scanning via the MEMS mirror along the 450 μm axis. The optical fiber 2520 may have flexible and/or easily bendable as opposed to being rigid and unable to be bent easily. The material of the optic fiber 2520 may comprise plastic, glass or fused silica or other material(s).

As shown in FIG. 44, light from the laser diodes 2501A, 2501B, and 2501C propagates through respective laser collimators 2503A, 2503B, 2503C and beam conditioning optics 2505A, 2505B, 2505C to dichroic beam combiners 2505A, 2505B, which combine light from the different light sources (e.g., laser diodes). In systems having one laser, a beam combiner is not needed. The light from the light sources 2501A, 2501B, and 2501C is input into the first (e.g., proximal) end of the fiber optic 2520 and exits through the second (e.g., distal) end of the optical fiber. The light output from the second end of the optical fiber 2520 is directed onto the MEMS mirror 2509, which reflects the light to the cylindrical lens array 2513. In the design shown in FIG. 44, the focusing lens 2507 causes light output from the second end of the optical fiber 2520 to converge prior to being incident on the MEMS mirror 2509. Accordingly, in various implementations, the focusing lens 2507 focuses light exiting the optical fiber 2520 onto the MEMS mirror 2509.

Figure 45:
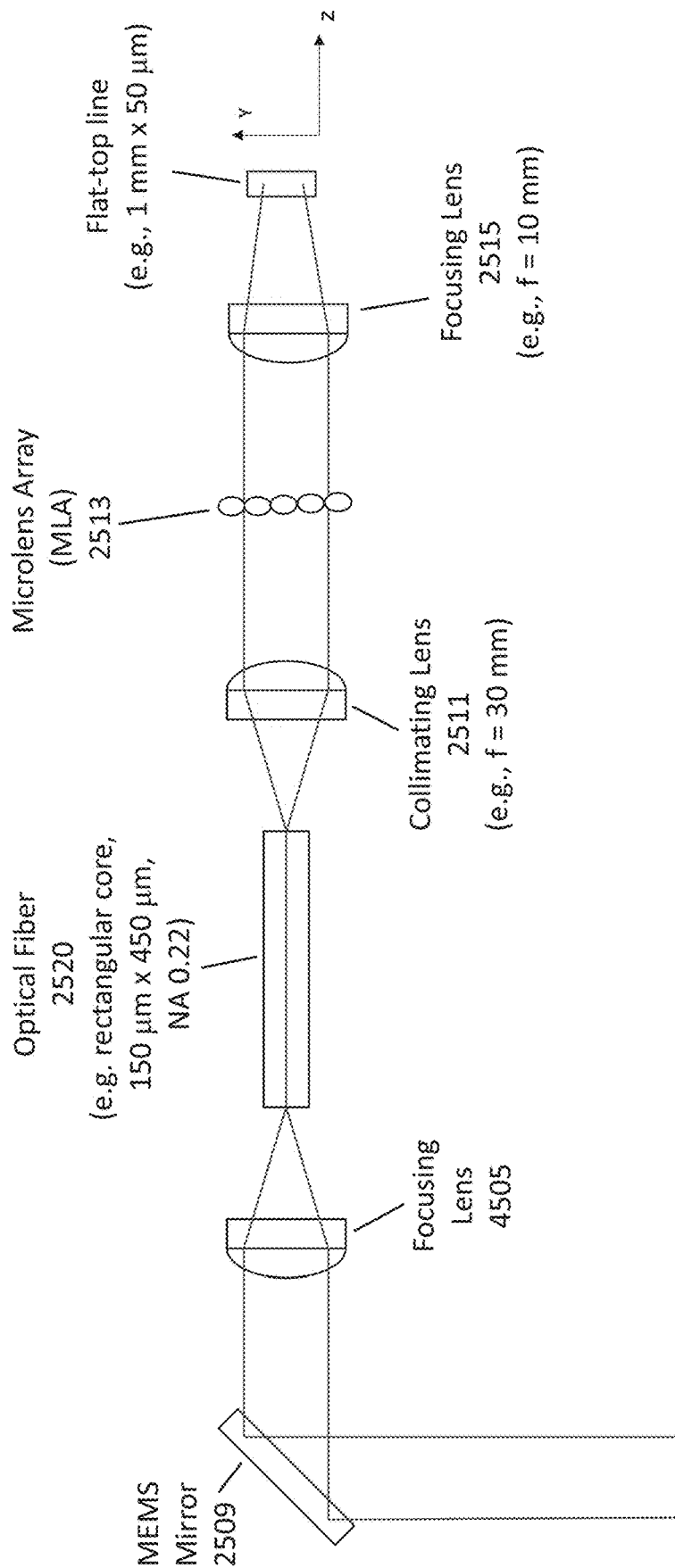
FIG. 45 is a schematic drawing that illustrates another embodiment of an optical system configured to generate a flat top line beam for analyzing samples (e.g., biological and/or chemical samples) using laser-induced fluorescence, the optical system including a MEMS mirror and a cylindrical lens array (CLA), wherein an optical fiber is disposed to couple light from the MEMS mirror to the cylindrical lens array.

In another example, as shown in FIG. 45, for example, an optical fiber 2520 is disposed in an optical path between the MEMS mirror 2509 and the microlens array 2513. In various implementations, the optical fiber 2520 has a first end disposed to receive light from the MEMS mirror 2509 and a second end disposed to output light to the microlens array 2513. In particular, in this example, a lens such as a focusing lens 2505 is disposed in an optical path between the MEMS mirror 2509 and the optical fiber 2520. The focusing lens 2507 may comprise for example a positive power lens having a positive focal length and may be disposed with respect to the optical fiber 2520 and the MEMS mirror 2509 to received light from the MEMS mirror and focus light onto the optical fiber 2520. In some implementations, the lens may be positioned a focal length away from the first (input) end of the optical fiber 2520. In various implementation, the light from the light sources that is incident on and reflected from the MEMS mirror 2509 is collimated. Such collimated light may be incident on the focusing lens 4505 and be focused down, for example, onto the first/input end of the optical fiber 2520. Another lens, such as collection lens and/or collimating lens 2511 may receive light exiting the second (output) end of the optical fiber 2520. This collimating lens 2511 may also comprise a positive power lens having a positive focal length, in some embodiments. In some configurations, this collimating lens 2511 is position a distance from the second/exit end of the optical fiber that corresponds to the focal length of the collimating lens. Accordingly, the light from the optical fiber 2520 collected by the collimating lens 2511 may having increased collimation when incident on the microlens array.

The optical fiber 2520 may comprise a core and a cladding and may be a single or multimode optical fiber in various implementations. The optical fiber 2520 may have a core of any shape, including circular, square or rectangular. A fiber optic 2520 with a square or rectangular core may advantageously provide increased homogenization of the laser light prior to being incident on the MEMS mirror 2509 within the optical imaging system and may potentially yield a more uniform flat-top line profile. Corners of the square or rectangle, where sides of the core meet, may for example provide for increased homogenization. In various implementations, the cross-section of the core orthogonal to its length can have a width, diameter, height, or any combination of these, that is between 5 μm and 600 μm for one axis and 5 μm and 600 μm for the orthogonal axis. For example, a 150 μm×450 μm fiber could be used with the laser beams scanning via the MEMS mirror along the 450 μm axis. In various implementations, the optical fiber 2520 may be flexible and/or easily bendable as opposed to being rigid and unable to be bent easily. In some implementations, the material of the optic fiber 2520 may comprise plastic, glass or fused silica or other material(s).

In various implementations, the optical fiber can provide for appropriate entendue. For example, in various implementations, e.g., where the MEMS mirror is upstream of the fiber, to achieve a 50 μm×1 mm line profile at the flow cell if a 0.7 numerical aperture (NA) objective lens is being used with a 0.22 NA fiber, a fiber having a core with a width along the small axis that is no larger than ~(0.7/0.22) 50 μm=159 μm can be employed in some cases. This relationship applies to the small axis of the line in this example. The larger axis can be larger size than the size set forth in this relationship. Accordingly, in various implementations, the size of the core, e.g., the width of the core such as in the direction or along the axis of the core that has a smaller width/height or lateral dimension (e.g., x direction), may be less than or equal to the product of the width of the output beam at the sample or sample plane along the shortest direction and the ratio of the numerical aperture of the objective lens to the numerical aperture of the optical fiber (i.e., the numerical aperture of the objective lens divided by the numerical aperture of the optical fiber). For example, the width of the core such as in the direction or along the axis of the core that is smallest may be less than or equal to $(NA_{objective}/NA_{fiber}) \times width_{beam}$, where $NA_{objective}$ is the numerical aperture of the objective lens, $NA_{fiber}$ is the numerical aperture of the fiber, and $width_{beam}$ is the width of the beam in the direction of the shortest width of the beam cross-section at the sample or sample plane. Other designs are possible.

As discussed above, the MEMS mirror 2509 can be scanned, for example along one direction (such as the y-direction) and/or may be scanned the fastest along this direction and/or the most (e.g., largest distance or over largest angle) in this direction. In some implementations, this one direction is the only direction that the MEMS mirror tilts or scans. In various implementations, the incident beam on the MEMs mirror 2509 is scanned in one direction (possibly more) through the focusing lens 4505, such that the beam moves laterally across the first/input end of the optical fiber 2520, e.g., across the input face of the optical fiber. The position on the core of the optical fiber 2520 at which the light is incident and input into the core may thus be scanned and change with time and thereby may excite different optical modes of the fiber over time. Such designs may therefore advantageously provide a time-varying pattern on the output end of the optical fiber 2520 that forms a homogenous light distribution (at the second/output end of the fiber as well as at the sample plane and sample) when measured or integrated over a time period longer than the period of the scanning of the MEMs mirror 2509. This light output from the second/output end of the optical fiber 2520 may then propagate to the micro-lens array 2513. In the implementation shown in FIG. 45, this light passes through the collimating lens 2511 onto the micro-lens array 2513 increasing the collimation of the light incident on the micro-lens array.

In the example shown in FIG. 45, the microlens array comprises a cylindrical lens array having optical power along the long direction of the beam spot at the sample plane (e.g., in the y-direction) and zero optical power along the short direction of the beam spot at the sample plane (e.g., in the x direction). In some implementations, this long direction may also correspond to the direction the MEMS mirror is tilted or tilted fastest and/or most. In some implementations, this long direction is the only direction that the MEMS mirror tilts or scans. Accordingly, in various implementations such as shown in FIG. 45, the microlens array primarily or only affects the beam along the MEMS scan direction or along the axis coinciding with the MEMS scan direction (e.g., y direction). In the example shown in FIG. 45, this direction corresponds to the longer direction of the cross-section of the core of the fiber (e.g., the direction that is 450 µm in width, for the example, for a core that has rectangular cross-section having a height and width of 150 µm×450 µm). The microlens array does not affect or does not affect as much the beam or beam shape in the shorter direction of the cross-section of the core (e.g., the direction that is 150 µm in height for the example core that is 150 µm×450 µm). The light may, for example, be focused in the y direction but not in the x direction by the microlens array and travels to a focusing lens and an image is formed at the sample plane. With the combination of lenses (e.g., the collimating lens 2511 and the focusing lens 2515) shown in FIG. 45, the size of the beam in the shorter direction is reduced, e.g., by a demagnification of ⅓ to 50 µm. The microlens array angle, in conjunction with the focusing lens 2515, can be chosen to generate the desired length of the line in the long direction (y-direction) at the sample plane. In this example, this length of the spot at the sample plane is about 1 mm along the long axis (y direction). As a result, in this example, a flat-top line of about 1 mm×50 um is formed.

In any of the examples above or elsewhere herein, one or more of the lenses such as focusing lenses, collimating lenses, etc. may include color correction to reduce chromatic aberration. Accordingly, such lenses may comprise achromats such as achromatic doublets in various implementations. In some implementations, the micro-lens array may comprise one or more cylindrical lens arrays.

Figure 46:
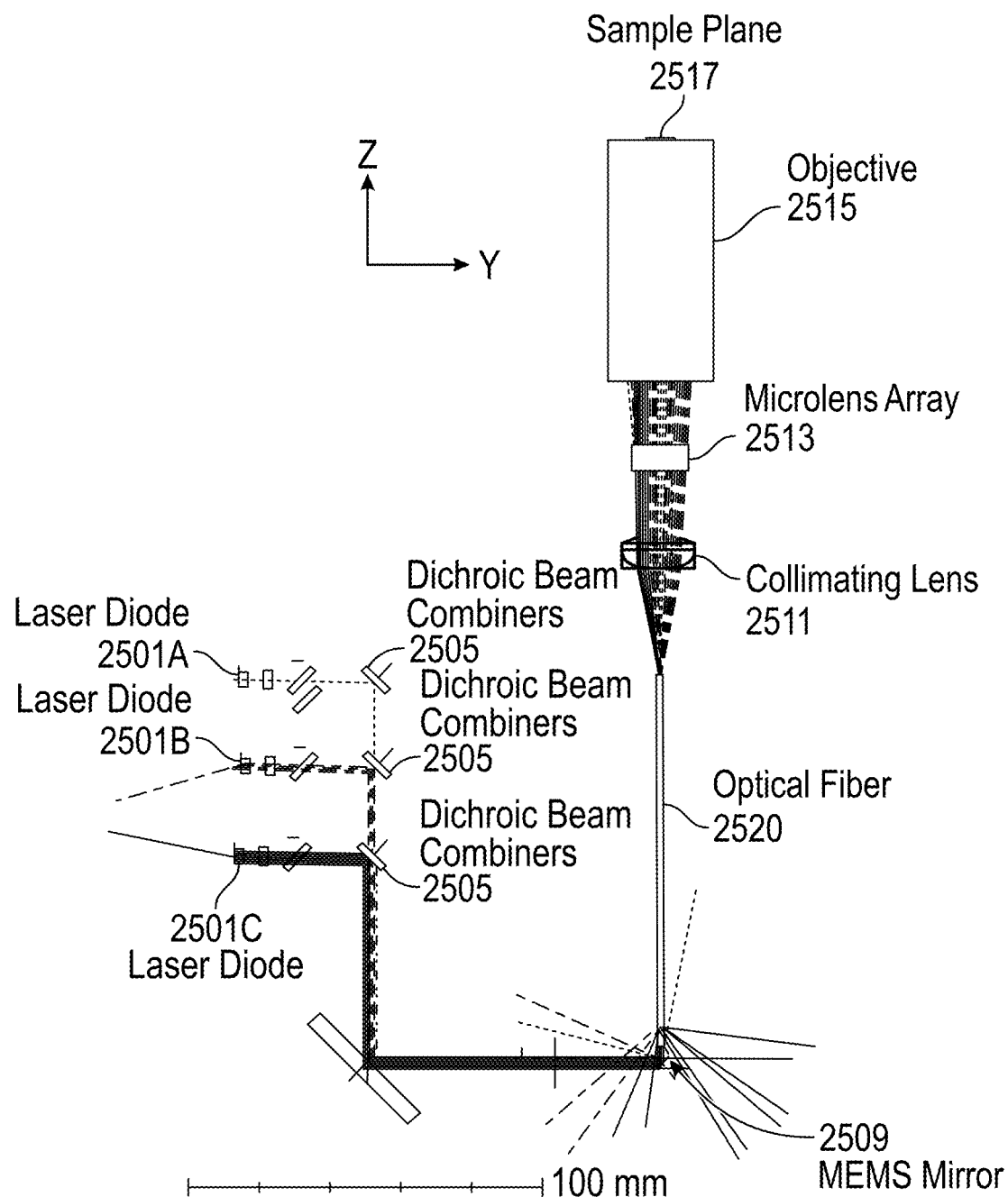
FIG. 46 is a drawing of a design of an optical system configured to generate a flat top line beam for analyzing samples (e.g., biological and/or chemical samples) using laser-induced fluorescence, the optical system including a MEMS mirror and a cylindrical lens array (CLA), wherein an optical fiber is disposed to couple light from the MEMS mirror to the cylindrical lens array. In this design, a rotationally symmetric collimating lens is disposed in an optical path between the output of the optical fiber and the cylindrical array.

FIG. 46 shows a design that includes a single achromat (e.g., an achromatic doublet) 2511 collimating light exiting the second/output end of the optical fiber 2520. As discussed above, in various implementations, this collimating lens 2511 comprises a positive power lens with a positive focal length. In some implementations, the lens is positioned a distance from the second/output end of the optical fiber 2520 corresponding to the focal length. In the design shown, for example, the collimating lens has a focal length of 35 mm. The collimating lens 2511 may in some implementations be rotationally symmetrical and may have the same optical power in orthogonal directions, such as x and y directions. Accordingly, in various implementations, this collimating lens 2511 is not a cylindrical lens or an anamorphic lens. In various implementations, this collimating lens 2511 is an achromatic such as an achromatic doublet.

Figure 47:
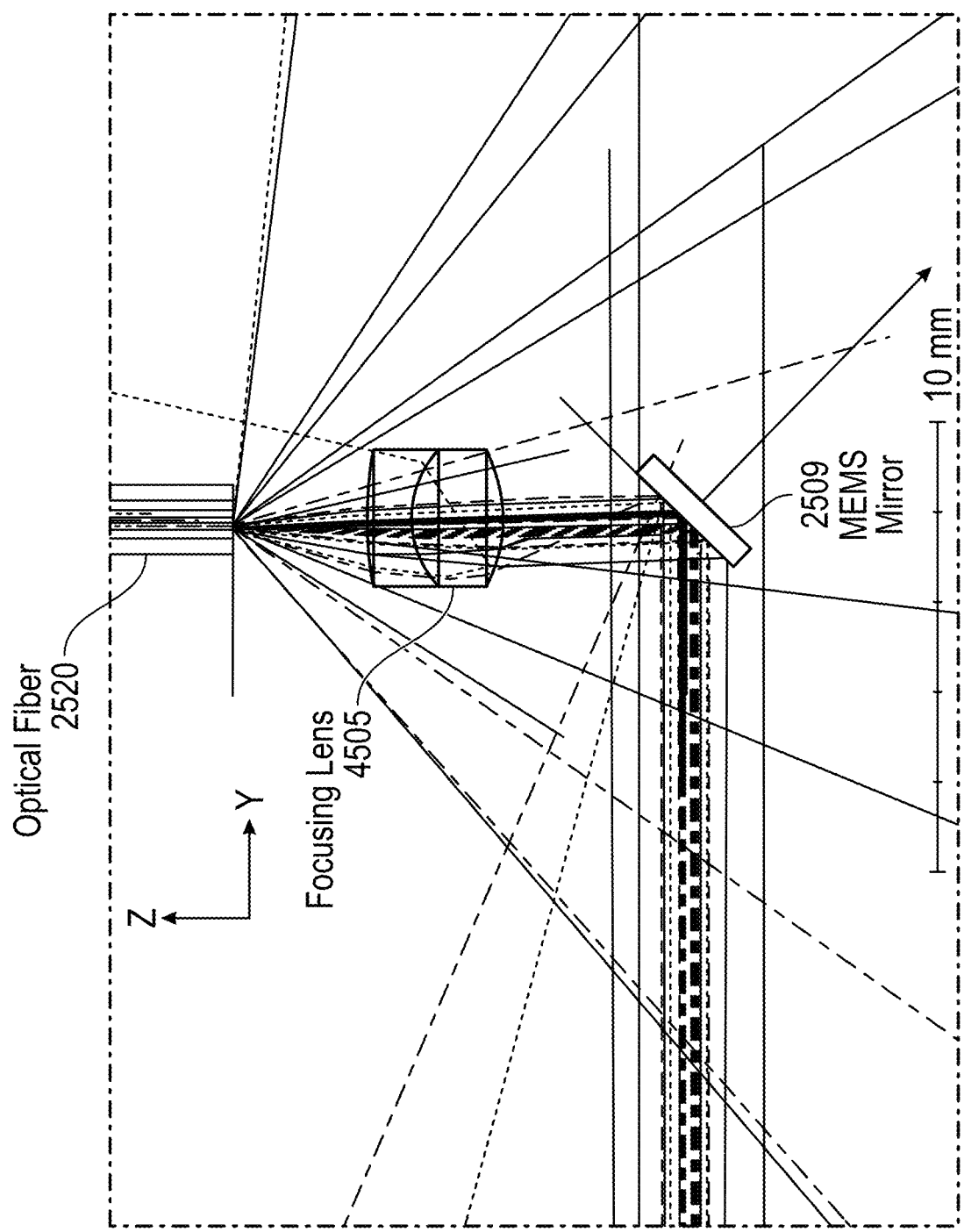
FIG. 47 is a close-up view of the MEMS mirror shown in FIG. 46.

FIG. 47 shows a close-up view of the system of FIG. 46 depicting MEMS mirror 2509 directing light through the focusing lens 4505 onto the input face of the optical fiber 2520. The changing orientation of the MEMS mirror 2509 thereby positions the light beam input into the core of the optical fiber 2520 at various positions across the core of the fiber at various times as the MEMS mirror is scanned. The focusing lens 4505 in this example comprises an achromat (e.g., an achromatic doublet) having an effective focal length of 4.5 mm.

Figure 48:
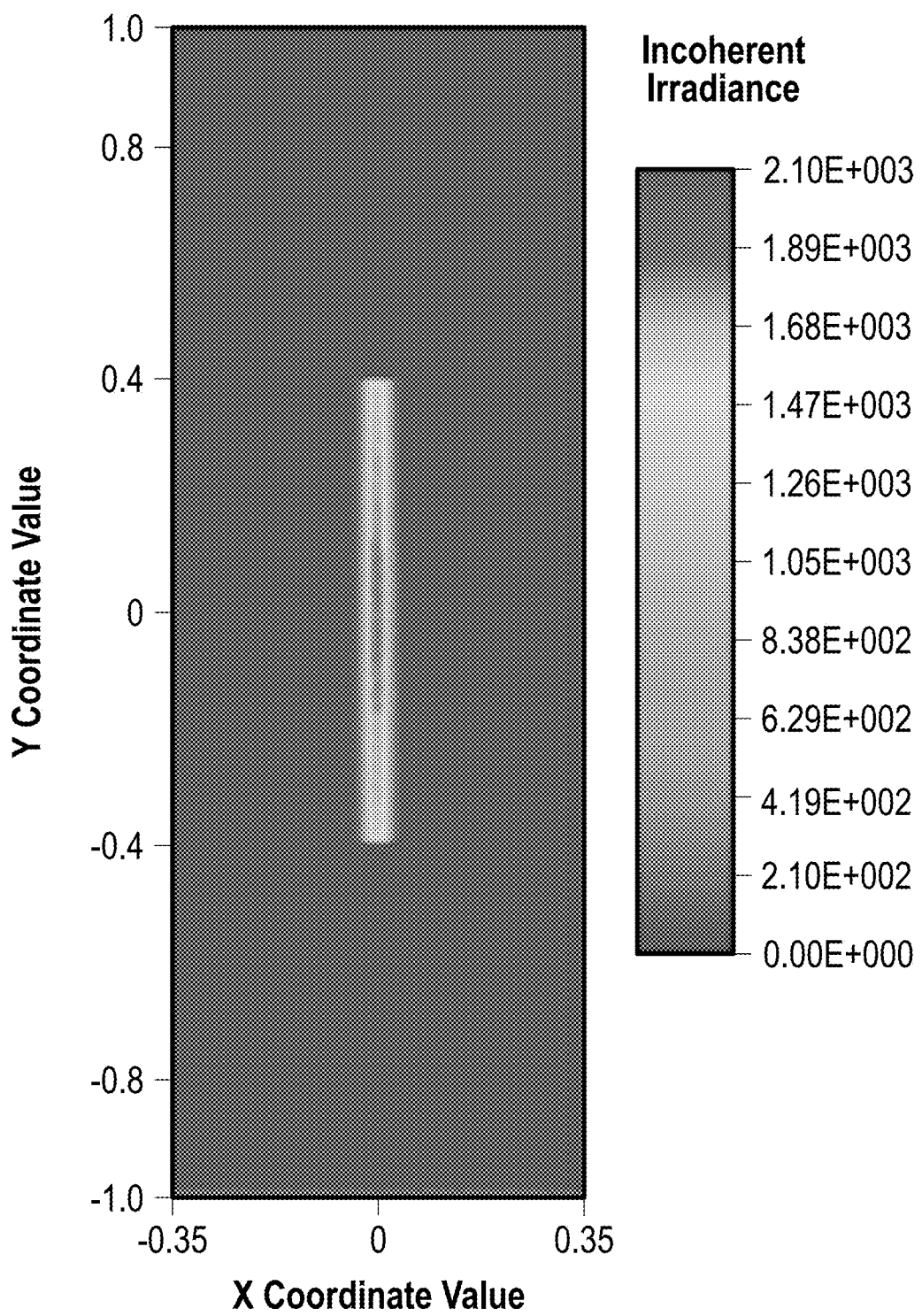
FIG. 48 is a diagram illustrating an example of the X and Y-coordinate beam profile at the sample plane of the optical system of FIGS. 46 and 47.

FIG. 48 is a diagram illustrating an example of the X and Y-coordinate beam profile at the sample plane of the optical system of FIGS. 46 and 47. This beam has a thin line profile which is useful for scanning certain types of samples such as in flow cells.

Figure 49:
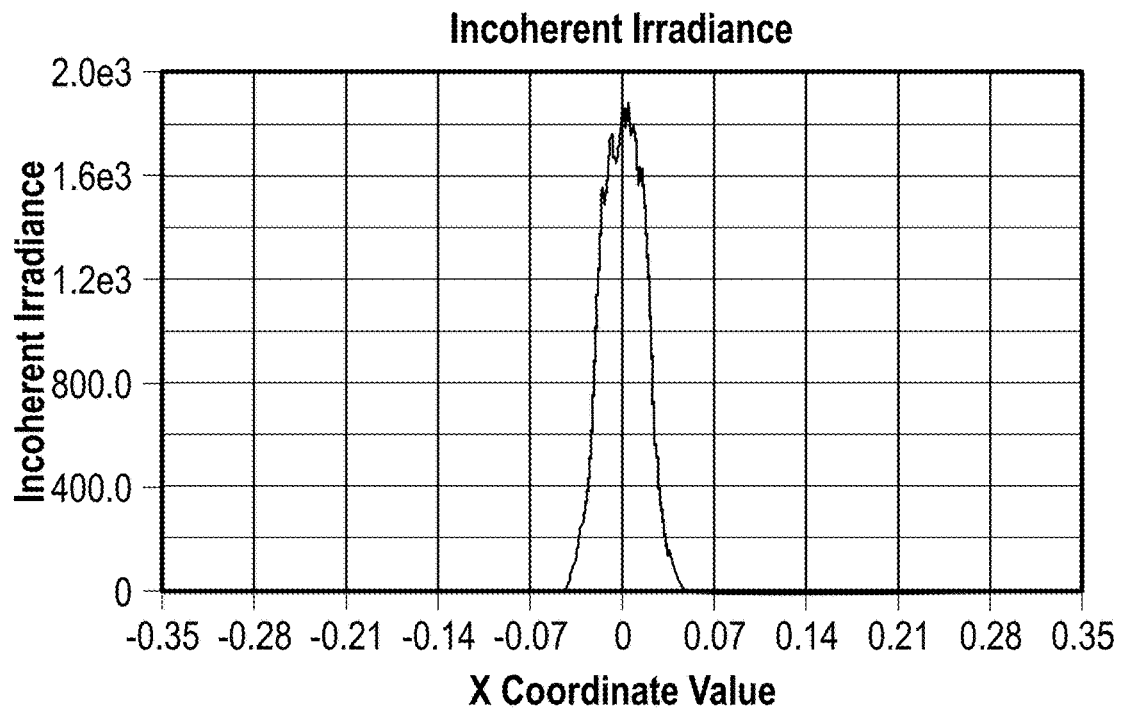
FIG. 49 is a graph illustrating an example of irradiance along the short-axis beam profile (e.g., the X coordinate value) at the sample plane of the system of FIGS. 46 and 47.

FIG. 49 is a graph illustrating an example of the irradiance along the short-axis beam profile (e.g., the X coordinate value) at the sample plane of the system of FIG. 48.

Figure 50:
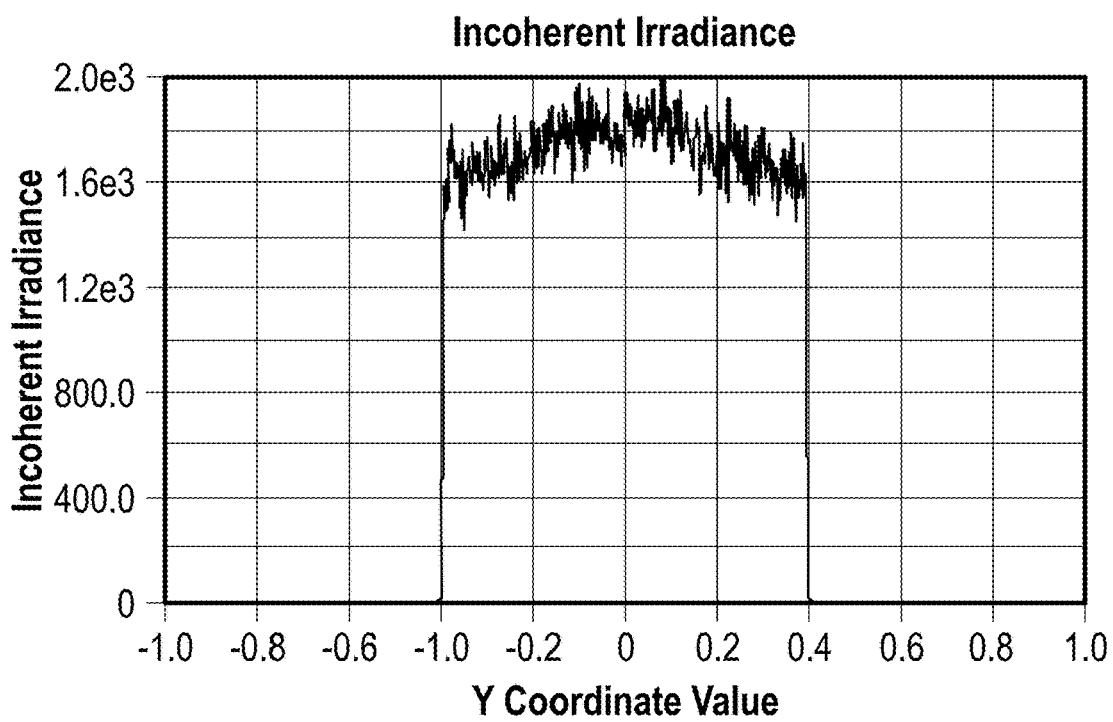
FIG. 50 is a graph illustrating an example of irradiance along the long-axis beam profile (e.g., the Y coordinate value) at the sample plane of the system of FIGS. 46 and 47.

FIG. 50 is a graph illustrating an example of irradiance along the long-axis beam profile (e.g., the Y coordinate value) at the sample plane of the system of FIG. 48. Along the Y coordinate, the irradiance curve shows a sharp transition from near zero values to an approximately flat-top portion having somewhat higher values around the "0" Y coordinate value.

Figure 51:
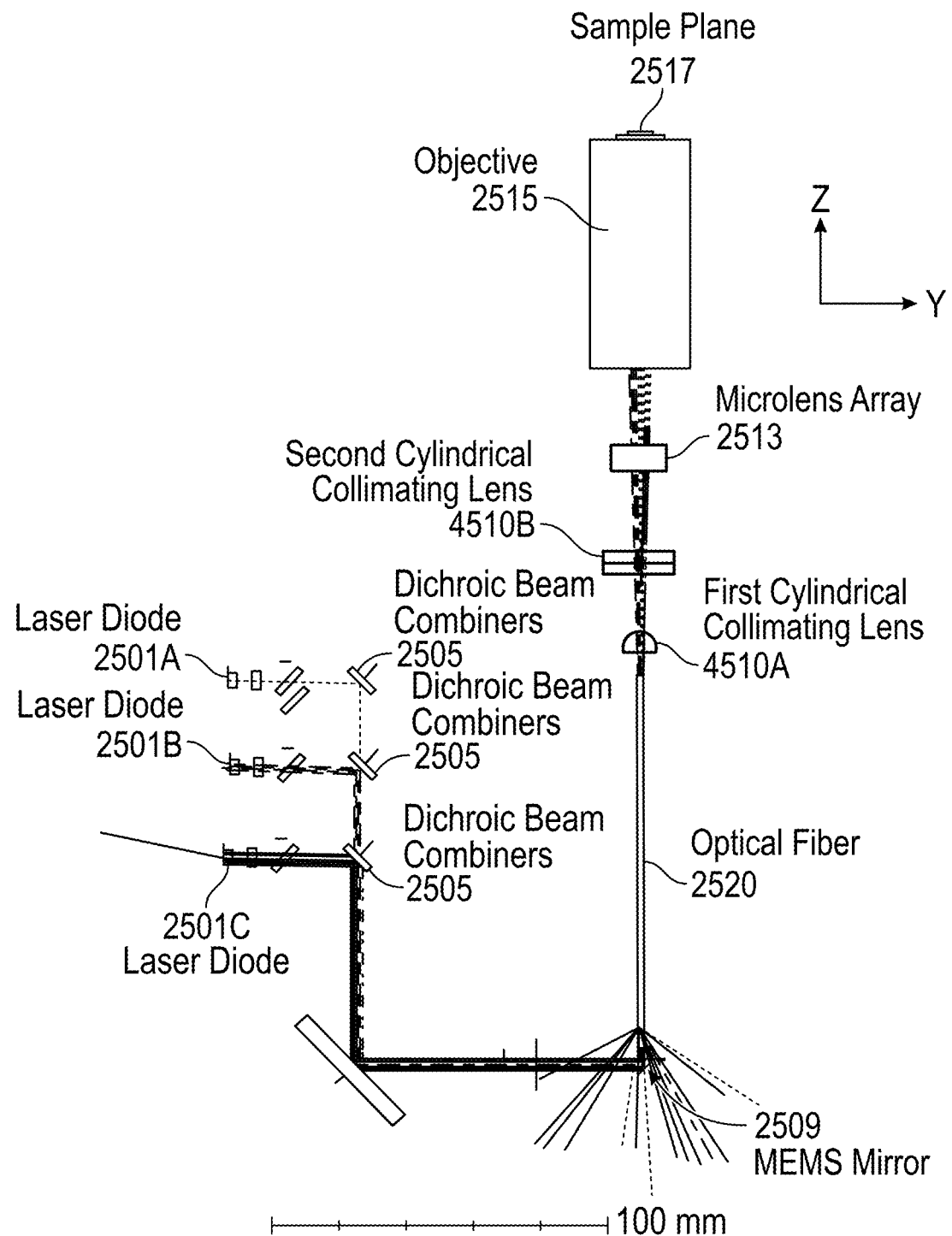
FIG. 51 is a drawing of a design of an optical system configured to generate a flat top line beam for analyzing samples (e.g., biological and/or chemical samples) using laser-induced fluorescence, the optical system including a MEMS mirror and a cylindrical lens array (CLA), wherein an optical fiber is disposed to couple light from the MEMS mirror to the cylindrical lens array. In this design, first and second cylindrical collimating lens are used to collimate the light exiting the optical fiber. The first and second cylindrical lenses have different focal lengths in orthogonal directions (e.g., in x and y directions) and are located at different distance from the optical fiber to produce different beam sizes in orthogonal directions. For example, the beam size is larger in the x direction than in the y direction, e.g., at the CLA.

FIG. 51 shows a design that includes a first cylindrical collimating lens 4510A and a second cylindrical collimating lens 4510B collimating light exiting the second/output end of the optical fiber 2520. In various implementations, the first cylindrical collimating lens 4510A comprises optical power in a first direction (e.g., y-direction) and not in the orthogonal second direction (e.g., x-direction), while the second cylindrical collimating lens 4510B comprise optical power in the second orthogonal direction (e.g., x-direction) and not in the first direction (e.g., y-direction) at the sample plane (e.g., at the flow cell). In the example design shown, the first cylindrical collimating lens 4510A has an effective focal length of 10 mm along the direction where the beam at the sample plane is widest and/or in the direction of the MEMS mirror scan and/or in the direction where the MEMS mirror scans the fastest and/or the widest or most distance (e.g., along the y-direction) and the second cylindrical collimating lens 4510B has an effective focal length of 30 mm the orthogonal axis (y-axis) at the sample plan (e.g., at the flow cell). In some implementations, the effective focal length of the second cylindrical collimating lens 4510B is 35 mm. Other effective focal lengths, however, may be used.

As discussed above, in various implementation this collimating lens comprises a positive power lens with a positive focal length. In some implementations, the lens is positioned a distance from the second/output end of the optical fiber 2520 corresponding to the focal length.

Figure 52:
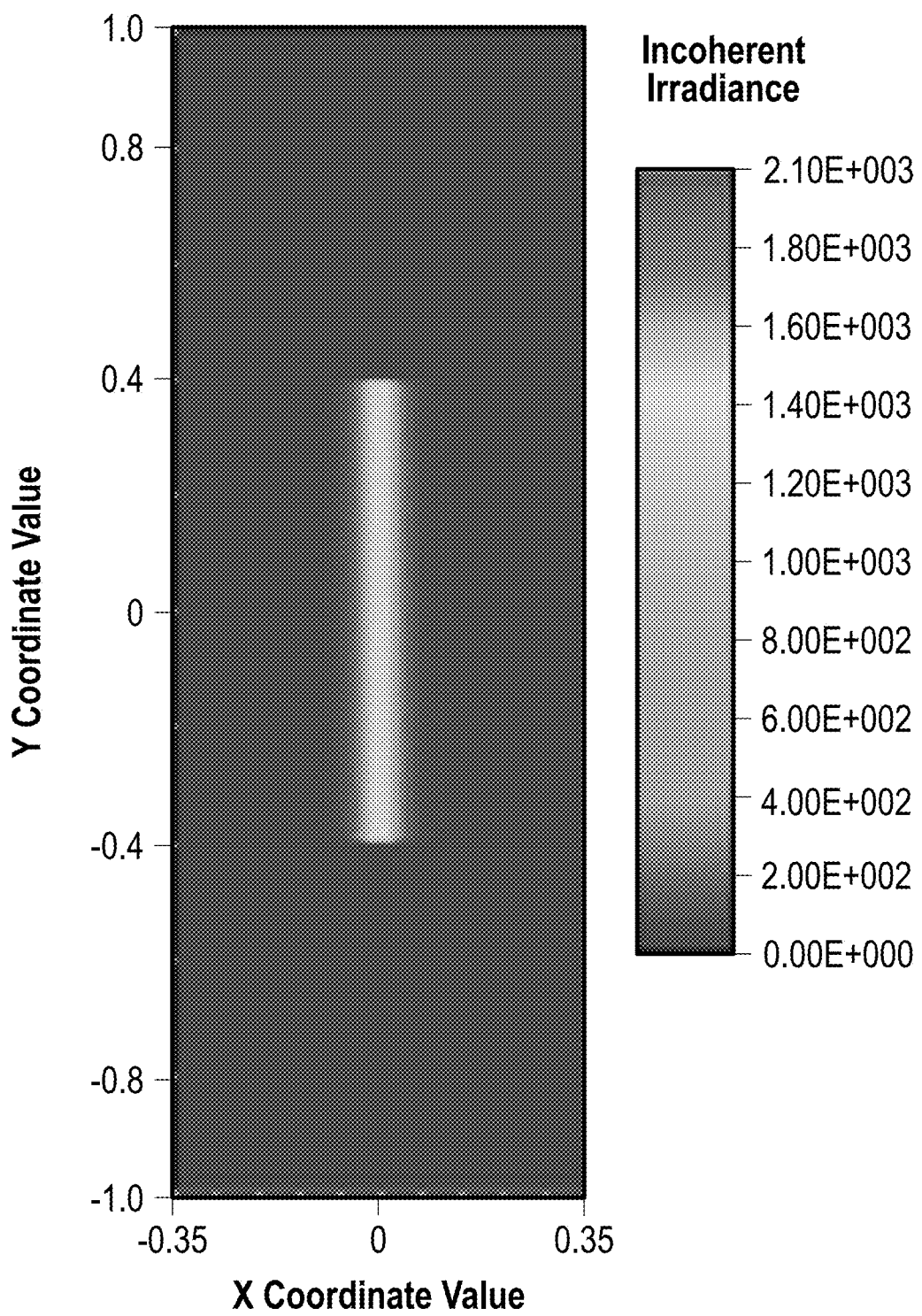
FIG. 52 is a diagram illustrating an example of the X and Y-coordinate beam profile at the sample plane of the optical system of FIG. 51.

FIG. 52 is a diagram illustrating an example of the X and Y-coordinate beam profile at the sample plane of the optical system of FIG. 51. This beam has a thin line profile which is useful for scanning certain types of samples such as in flow cells.

Figure 53:
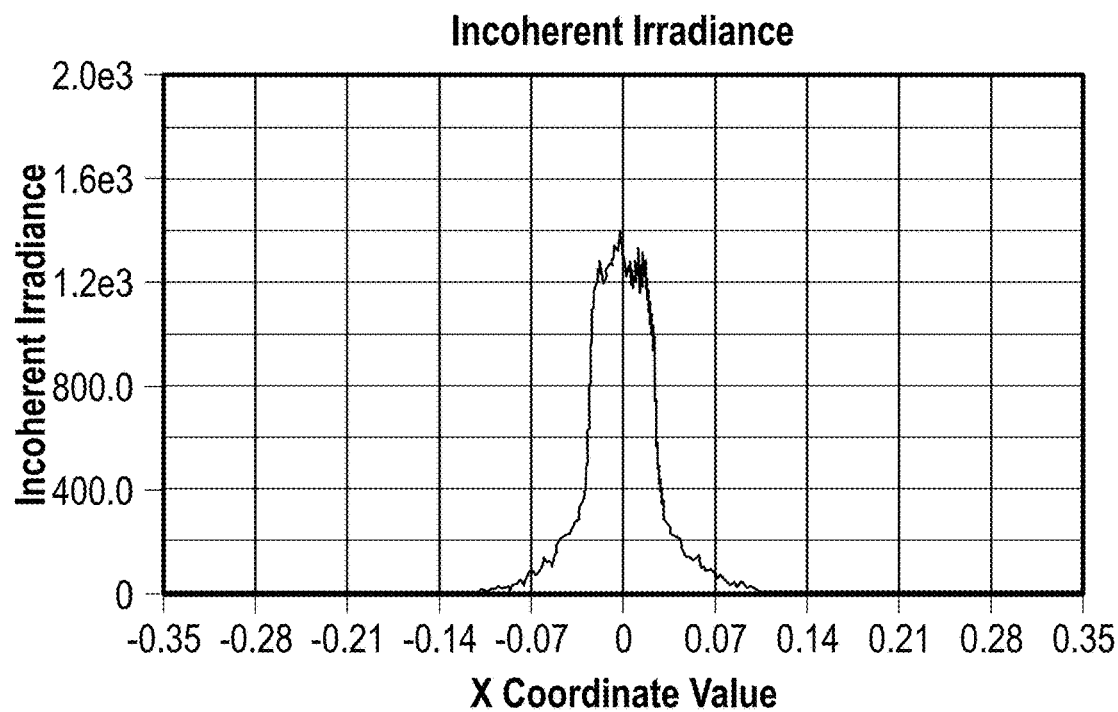
FIG. 53 is a graph illustrating an example of irradiance along the short-axis beam profile (e.g., the X coordinate value) at the sample plane of the system of FIG. 51.

FIG. 53 is a graph illustrating an example of the irradiance along the short-axis beam profile (e.g., the X coordinate value) at the sample plane of the system of FIG. 48.

Figure 54:
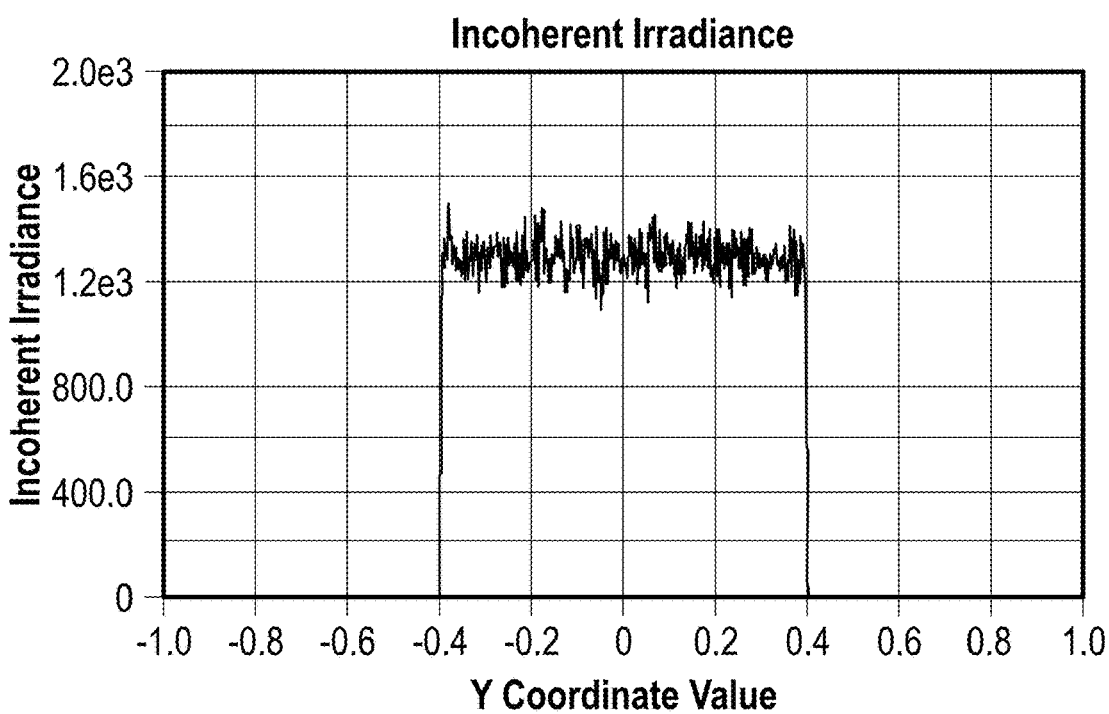
FIG. 54 is a graph illustrating an example of irradiance along the long-axis beam profile (e.g., the Y coordinate value) at the sample plane of the system of FIG. 51.

FIG. 54 is a graph illustrating an example of irradiance along the long-axis beam profile (e.g., the Y coordinate value) at the sample plane of the system of FIG. 48. Along the Y coordinate, the irradiance curve shows a sharp transition from near zero values to an approximately flat-top portion having some variation across.

Examples of systems and methods configured to provide illumination are described herein such as the examples enumerated below:

PART-1

Example 1: An illumination system, comprising:
  at least one laser configured to emit light;
  a microelectromechanical system (MEMS) mirror positioned to receive light emitted from the at least one laser, the MEMS mirror driven to provide a moving light beam moving in a first angular range $ar_1$ along a first direction and at a certain frequency $f_1$;
  a collimating optical element configured to receive the moving light beam from the MEMS mirror and output a light beam that is more collimated than the light received from the MEMS mirror;
  a cylindrical lens array (CLA) positioned to receive the light beam from the collimating optical element and configured to alter the distribution of light received from the collimating optical element and output a substantially flat-top distribution of light; and
  an objective lens system positioned to receive the light from the CLA and propagate an output beam to a sample plane, the output beam being a flat top line beam.

Example 2: The illumination system of Example 1, wherein the moving light beam from the MEMS mirror moves back and forth in the angular range $ar_1$.

Example 3: The illumination system of Example 1, wherein CLA includes a one dimensional array of cylindrical lenses.

Example 4: The illumination system of Example 3, wherein the angular range art of the moving light beam output from the MEMS mirror moves a centroid of the light beam received at the CLA moves across a surface of the CLA a distance that is less than or equal to a dimension of a lens of the CLA.

Example 5: The illumination system of Example 4, wherein the dimension is the diameter of a lens of the CLA.

Example 6: The illumination system of Example 4, wherein the distance is less than or equal to 10% of a dimension of a lens of the CLA.

Example 7: The illumination system, of Example 4, wherein the distance is less than or equal to 20% of a dimension of a lens of the CLA.

Example 8: The illumination system of Example 4, wherein the distance is less than or equal to 30% of a dimension of a lens of the CLA.

Example 9: The illumination system of Example 4, wherein the distance is less than or equal to 40% of a dimension of a lens of the CLA.

Example 10: The illumination system of Example 4, wherein the distance is less than or equal to 50% of a dimension of a lens of the CLA.

Example 11: The illumination system of Example 4, wherein the distance is less than or equal to 60% of a dimension of a lens of the CLA.

Example 12: The illumination system of Example 4, wherein the distance is less than or equal to 70% of a dimension of a lens of the CLA.

Example 13: The illumination system of Example 4, wherein the distance is less than or equal to 80% of the diameter of a lens of the CLA.

Example 14: The illumination system of Example 4, wherein the distance is less than or equal to 90% of a dimension of a lens of the CLA.

Example 15: The illumination system of Example 1, wherein the MEMS mirror is driven to provide the moving light beam to move in a second direction orthogonal to the first direction and in a second angular range $ar_2$.

Example 16: The illumination system of Example 1, wherein second angular range $ar_2$ is less than the first angular range $ar_1$.

Example 17: The illumination system of Example 1, wherein the at least one laser comprises two or more lasers, and wherein the illumination system further comprises a beam combiner aligned to receive light from the two or more lasers and configured to form a combined light beam which propagates to the MEMS mirror.

Example 18: The illumination system of Example 17, wherein the beam combiner comprises one or more dichroic mirrors.

Example 19: The illumination system of Example 1, further comprising beam conditioning optics positioned to receive light from one or more lasers and structured to provide an output beam.

Example 20: The illumination system of Example 1, further comprising a focusing optical element configured to receive light from the at least one laser and propagate a focused light beam towards the MEMS mirror.

Example 21: The illumination system of Example 20, wherein the focusing optical element has a focal length FL and the MEMS mirror is positioned at a distance d from the focusing optical element, where d is less than the focal length FL.

Example 22: The illumination system of Example 20, wherein focusing optical element has a focal length FL and the MEMS mirror is positioned at a distance d from the focusing optical element, where d is greater than the focal length FL.

Example 23: The illumination system of Example 20, wherein focusing optical element has a focal length FL and the MEMS mirror is positioned at a distance d from the focusing optical element, where d is equal to the focal length FL.

Example 24: The illumination system of Example 1, wherein the angular range $ar_1$ is less than 1 degree.

Example 25: The illumination system of Example 1, wherein the angular range $ar_1$ is less than 2 degrees.

Example 26: The illumination system of Example 1, wherein the angular range $ar_1$ is less than 0.5 degrees.

Example 27: The illumination system of Example 1, wherein the frequency $f_1$ is between 0.1 and 50 kHz.

Example 28: The illumination system of Example 1, wherein the frequency $f_1$ is between 50 Hz and 10 kHz.

Example 29: The illumination system of Example 1, further comprising a diffuser positioned between the collimating optical element and the CLA.

Example 30: The illumination system of Example 1, further comprising a diffuser in a light path between the at least one laser and the CLA, wherein the diffuser comprises an engineered diffuser.

Example 31: The illumination system of Example 29, further comprising a diffuser in a light path between the at least one laser and the CLA, wherein the diffuser comprises an engineered diffuser.

Example 32: The illumination system of any of Examples 1-31, further comprising an optical fiber disposed in an optical path between said at least one laser and said MEMS mirror to couple light from said at least one laser to said MEMS mirror.

Example 33: The illumination system of Example 32, wherein said optical fiber is disposed in an optical path between a dichroic beam combiner and said MEMS mirror to couple light from said at least one laser that is reflected from and/or transmitted through said dichroic beam combiner to said MEMS mirror.

Example 34: The illumination system of Example 32 or 33, wherein said optical fiber comprises a rectangular or square core.

Example 35: The illumination system of any of Examples 32-34, further comprising at least one focusing lens disposed in an optical path between said optical fiber and said MEMS mirror to receive light from said optical fiber and focus said light on said MEMS mirror.

Example 36: The illumination system of any of Examples 1-31, further comprising an optical fiber disposed in an optical path between said MEMS mirror and said cylindrical lens array (CLA) to couple light from said at least one laser to said MEMS mirror.

Example 37: The illumination system of Example 36, wherein said optical fiber comprises a rectangular or square core.

Example 38: The illumination system of Example 36 or 37, wherein said collimating optical element is disposed in an optical path between said optical fiber and said cylindrical lens array (CLA) to receive light from said optical fiber and increase collimation of light from said optical fiber that is incident on said cylindrical lens array.

Example 39: An illumination system, comprising:
  at least one laser configured to emit light;
  a mirror system positioned to receive light emitted from the at least one laser, the mirror system driven to provide a moving light beam moving in a first angular range $ar_1$ along a first direction and at a certain frequency $f_1$;
  a collimating optical element configured to receive the moving light beam from the mirror system and output a light beam that is more collimated than the light received from the mirror system;
  a cylindrical lens array (CLA) positioned to receive the light beam from the collimating optical element and configured to alter the distribution of light received from the collimating optical element and output a substantially flat-top distribution of light; and
  an objective lens system positioned to receive the light from the CLA and propagate an output beam to a sample plane, the output beam being a flat top line beam.

Example 40: The illumination system of Example 39, wherein the mirror system comprises a mirror galvanometer.

Example 41: The illumination system of Example 39, wherein the mirror system comprises a MEMS mirror device.

Example 42: The illumination system of any of Examples 39-41, further comprising an optical fiber disposed in an optical path between said at least one laser and said mirror system to couple light from said at least one laser to said mirror system.

Example 43: The illumination system of Example 42, wherein said optical fiber is disposed in an optical path between a dichroic beam combiner and said mirror system to couple light from said at least one laser that is reflected from and/or transmitted through said dichroic beam combiner to said mirror system.

Example 44: The illumination system of Example 42 or 43, wherein said optical fiber comprises a rectangular or square core.

Example 45: The illumination system of any of Examples 42-44, further comprising at least one focusing lens disposed in an optical path between said optical fiber and said mirror system to receive light from said optical fiber and focus said light directed to said mirror system.

Example 46: The illumination system of any of Examples 39-41, further comprising an optical fiber disposed in an optical path between said mirror system and said cylindrical lens array (CLA) to couple light from said at least one laser to said mirror system.

Example 47: The illumination system of Example 46, wherein said optical fiber comprises a rectangular or square core.

Example 48: The illumination system of Example 46 or 47, wherein said collimating optical element is disposed in an optical path between said optical fiber and said cylindrical lens array (CLA) to receive light from said optical fiber and increase collimation of light from said optical fiber that is incident on said cylindrical lens array.

Example 49: A method of illuminating a target, the method comprising:
  outputting a light beam from at least one laser;
  receiving the light beam at a MEMS mirror positioned to receive the light from the laser, and driving the MEMS mirror to provide a moving light beam moving in a certain angular range $ar_1$ and at a certain frequency $f_1$;
  receiving the moving light beam from the MEMS mirror at a collimating optical element and output collimated light;
  receiving the collimated light at a cylindrical lens array (CLA) which forms the collimated light into a flat top line beam; and
  propagating the flat top line beam to a target.

Example 50: The method of Example 49, wherein the target comprises a flow cell.

Example 51: The method of Example 49, further comprising driving the MEMS mirror such that the moving light beam has motion in a first direction and a second direction that is orthogonal to the first direction.

Example 52: The method of Example 51, wherein the motion of the moving light beam in the first direction is larger than the motion in the second direction.

Example 53: The illumination method of any of Examples 49-52, wherein receiving the light beam at a MEMS mirror comprises coupling light from said at least one laser to said MEMS mirror through an optical fiber disposed in an optical path between said at least one laser and said MEMS mirror.

Example 54: The method of Example 53, wherein receiving the light beam at a MEMS mirror comprises coupling receiving light from at least one laser that is reflected from and/or transmitted through a dichroic beam combiner to said MEMS mirror through an optical fiber disposed in the optical path between the dichroic beam combiner and said MEMS mirror.

Example 55: The method of Example 53 or 54, wherein coupling light through said optical fiber comprises coupling light through an optical fiber with a rectangular or square core.

Example 56: The method of any of Examples 53-55, wherein coupling light through said optical fiber comprises receiving light from said optical fiber and focusing said light on said MEMS mirror through at least one focusing lens disposed in an optical path between said optical fiber and said MEMS mirror.

Example 57: The method of any of Examples 49-52, wherein receiving the light at a cylindrical lens array (CLA) comprises coupling light from said at least one laser to said cylindrical lens array (CLA) through an optical fiber disposed in an optical path between said MEMS mirror and said cylindrical lens array (CLA).

Example 58: The method of Example 57, wherein coupling light through said optical fiber comprises coupling light through an optical fiber with a rectangular or square core.

Example 59: The method of Example 57 or 58, further comprising increasing collimation of light from said optical fiber that is incident on said cylindrical lens array with said collimating optical element which is disposed in an optical path between said optical fiber and said cylindrical lens array (CLA).

Example 60: A method of illuminating a target, the method comprising:
  outputting a light beam from at least one laser;
  receiving the light beam at a MEMS mirror positioned to receive the light from the laser, and driving the MEMS mirror to provide a moving light beam moving in a certain angular range $ar_1$ and at a certain frequency $f_1$;
  receiving the moving light beam from the MEMS mirror at a collimating optical element and outputting collimated light;
  receiving the collimated light at an engineered diffuser which forms the collimated light into a flat top line beam; and
  propagating the flat top line beam to a target.

Example 61: The method of Example 60, wherein the target comprises a flow cell.

Example 62: The method of Example 60, further comprising driving the MEMS mirror such that the moving light beam has motion in a first direction and a second direction that is orthogonal to the first direction.

Example 63: The method of Example 62, wherein the motion of the moving light beam in the first direction is larger than the motion of the moving light beam in the second direction.

Example 64: The illumination method of any of Examples 60-62, wherein receiving the light beam at a MEMS mirror comprises coupling light from said at least one laser to said MEMS mirror through an optical fiber disposed in an optical path between said at least one laser and said MEMS mirror.

Example 65: The method of Example 64, wherein receiving the light beam at a MEMS mirror comprises coupling light from at least one laser that is reflected from and/or transmitted through a dichroic beam combiner to said MEMS mirror through an optical fiber disposed in the optical path between the dichroic beam combiner and said MEMS mirror.

Example 66: The method of Example 64 or 65, wherein coupling light through said optical fiber comprises coupling light through an optical fiber with a rectangular or square core.

Example 67: The method of any of Examples 64-66, wherein coupling light through said optical fiber comprises receiving light from said optical fiber and focusing said light on said MEMS mirror through at least one focusing lens disposed in an optical path between said optical fiber and said MEMS mirror.

Example 68: The method of any of Examples 60-62, wherein receiving the light at said engineered diffuser comprises coupling light from said at least one laser to said engineered diffuser through an optical fiber disposed in an optical path between said MEMS mirror and said engineered diffuser.

Example 69: The method of Example 68, wherein coupling light through said optical fiber comprises coupling light through an optical fiber with a rectangular or square core.

Example 70: The method of Example 68 or 69, further comprising increasing collimation of light from said optical fiber that is incident on said engineered diffuser with said collimating optical element which is disposed in an optical path between said optical fiber and said engineered diffuser.

Example 71: An illumination system for providing a flat-top line beam to a target, comprising:
  at least one laser;
  a mirror system positioned to receive light emitted from the at least one laser, the mirror system driven to provide a moving light beam moving in a first angular range $ar_1$ along a first direction and at a frequency $f_1$, where frequency $f_1$ is equal to or greater than 50 Hz and less than or equal to 10 kHz; and
  a cylindrical lens array (CLA) positioned to receive the moving light beam and configured to output a flat-top line beam for propagation to the target.

Example 72: The illumination system of Example 71, further comprising an objective lens system positioned to receive the flat-top line beam from the CLA and propagate a flat-top line beam output beam to be focused at a plane at the target.

Example 73: The illumination system of Example 71, wherein CLA includes a one dimensional array of cylindrical lenses.

Example 74: The illumination system of any of Examples 71-73, further comprising an optical fiber disposed in an optical path between said at least one laser and said mirror system to couple light from said at least one laser to said mirror system.

Example 75: The illumination system of Example 74, wherein said optical fiber is disposed in an optical path between a dichroic beam combiner and said mirror system to couple light from said at least one laser that is reflected from and/or transmitted through said dichroic beam combiner to said mirror system.

Example 76: The illumination system of Example 74 or 75, wherein said optical fiber comprises a rectangular or square core.

Example 77: The illumination system of any of Examples 74-76, further comprising at least one focusing lens disposed in an optical path between said optical fiber and said mirror system to receive light from said optical fiber and focus said light directed to said mirror system.

Example 78: The illumination system of any of Examples 71-73, further comprising an optical fiber disposed in an optical path between said mirror system and said cylindrical lens array (CLA) to couple light from said at least one laser to said cylindrical lens array.

Example 79: The illumination system of Example 78, wherein said optical fiber comprises a rectangular or square core.

Example 80: The illumination system of Example 78 or 79, further comprising at least one collimating optical element disposed in an optical path between said optical fiber and said cylindrical lens array (CLA) to receive light from said optical fiber and increase collimation of light from said optical fiber that is incident on said cylindrical lens array.

Example 81: A method of providing a flat-top line beam to a target flow cell, the method comprising:
  emitting light from a laser;
  receiving the emitted light on a mirror;
  driving the mirror to generate a moving light beam reflected from the mirror, the moving light beam moving in a first angular range $ar_1$ along a first direction and at a frequency $f_1$;
  receiving the moving light beam on a cylindrical lens array (CLA) configured to output a flat-top line beam; and
  propagating the flat-top line beam to a target flow cell. for propagation to the target.

Example 82: The method of Example 81, wherein the frequency $f_1$ is equal to or greater than 50 Hz and less than or equal to 10 kHz.

Example 83: The method of Example 81, further comprising receiving the moving light beam on a MEMS device, the MEMS device comprising the mirror.

Example 84: The method of Example 81, further comprising receiving the moving light beam on a mirror galvanometer, the mirror galvanometer comprising the mirror.

Example 85: The illumination method of any of Examples 81-83, wherein receiving the light beam at a mirror comprises coupling light from said at least one laser to said mirror through an optical fiber disposed in an optical path between said at least one laser and said mirror.

Example 86: The method of Example 85, wherein receiving the light beam at a mirror comprises coupling light from at least one laser that is reflected from and/or transmitted through a dichroic beam combiner to said mirror through an optical fiber disposed in the optical path between the dichroic beam combiner and said MEMS mirror.

Example 87: The method of Example 85 or 86, wherein coupling light through said optical fiber comprises coupling light through an optical fiber with a rectangular or square core.

Example 88: The method of any of Examples 85-87, wherein coupling light through said optical fiber comprises receiving light from said optical fiber and focusing said light on said mirror through at least one focusing lens disposed in an optical path between said optical fiber and said mirror.

Example 89: The method of any of Examples 81-83, wherein receiving the light at a cylindrical lens array (CLA) comprises coupling light from said at least one laser to said cylindrical lens array (CLA) through an optical fiber disposed in an optical path between said mirror and said cylindrical lens array (CLA).

Example 90: The method of Example 89, wherein coupling light through said optical fiber comprises coupling light through an optical fiber with a rectangular or square core.

Example 91: The method of Example 89-90, further comprising increasing collimation of light from said optical fiber that is incident on said cylindrical lens array by directing light from said optical fiber to at least one collimating optical element disposed in an optical path between said optical fiber and said cylindrical lens array (CLA).

Example 92: A method of providing a flat-top line beam to a target flow cell, the method comprising:
  emitting light from a laser;
  receiving the emitted light on a mirror;
  driving the mirror to generate a moving light beam reflected from the mirror, the moving light beam moving in a first angular range $ar_1$ along a first direction and at a frequency $f_1$;
  receiving the moving light beam on an engineered diffuser configured to output a flat-top line beam; and
  propagating the flat-top line beam through an objective lens to a target flow cell.

Example 93: The method of Example 92, wherein the frequency $f_1$ is equal to or greater than 50 Hz and less than or equal to 10 kHz.

Example 94: The method of Example 92, further comprising receiving the moving light beam on a MEMS device, the MEMS device comprising the mirror.

Example 95: The method of Example 92, further comprising receiving the moving light beam on a mirror galvanometer, the mirror galvanometer comprising the mirror.

Example 96: The method of any of Examples 92-95, wherein receiving the light beam at a mirror comprises coupling light from said at least one laser to said mirror through an optical fiber disposed in an optical path between said at least one laser and said mirror.

Example 97: The method of Example 96, wherein receiving the light beam at a mirror comprises coupling light from at least one laser that is reflected from and/or transmitted through a dichroic beam combiner to said mirror through an optical fiber disposed in the optical path between the dichroic beam combiner and said mirror.

Example 98: The method of Example 96 or 97, wherein coupling light through said optical fiber comprises coupling light through an optical fiber with a rectangular or square core.

Example 99: The method of any of Examples 96-98, wherein coupling light through said optical fiber comprises receiving light from said optical fiber and focusing said light on said mirror through at least one focusing lens disposed in an optical path between said optical fiber and said mirror.

Example 100: The method of any of Examples 92-95, wherein receiving the light beam on said engineered diffuser comprises coupling light from said at least one laser to said engineered diffuser through an optical fiber disposed in an optical path between said mirror and said engineered diffuser.

Example 101: The method of Example 100, wherein coupling light through said optical fiber comprises coupling light through an optical fiber with a rectangular or square core.

Example 102: The method of Example 100 or 101, further comprising increasing collimation of light from said optical fiber that is incident on said engineered diffuser by directing light from said optical fiber through at least one collimating optical element disposed in an optical path between said optical fiber and said engineered diffuser.

PART-2

Example 1: An illumination system comprising:
at least one laser configured to emit light that forms a light beam;
a beam steering system positioned to receive light emitted from the at least one laser, the beam steering system configured to cause said light in said light beam to repeatedly move back and forth; and
an optical homogenizer positioned to receive the light beam from the beam steering system and configured to alter the distribution of light received from the beam steering system and output a beam having a more homogenous distribution of light.

Example 2: The illumination system of Example 1, wherein the beam steering system comprises a mirror system configured to be repeatedly move back and forth to cause light comprising said light beam to repeatedly move back and forth.

Example 3: The illumination system of Example 1 or 2, wherein the beam steering system comprises a reflector and a movable support, said movable support configured to receive a signal to drive said moveable support such that said moveable support repeatedly changes the orientation of said reflector.

Example 4: The illumination system of Example 1 or 2, wherein the beam steering system comprises a mirror and a movable support, said movable support configured to receive a signal to drive said moveable support such that said moveable support repeatedly changes the orientation of said mirror.

Example 5: The illumination system of any of Examples 1-4, wherein the beam steering system comprises a galvanometer optical scanner.

Example 6: The illumination system of any of Examples 1-4, wherein the beam steering system comprises a microelectromechanical system (MEMS) mirror.

Example 7: The illumination system of any of the Examples above, further comprising electronics configured to provide a signal to drive said beam steering system to repeatedly alter said beam steering system and move said beam.

Example 8: The illumination system of any of the Examples above, further comprising beam shaping optics disposed between said at least one laser and said beams steering system.

Example 9: The illumination system of Example 8, wherein said beam shaping optics comprises at least one lens configured to adjust the size of the beam of light from said at least one laser that is received by said beam steering system.

Example 10: The illumination system of Example 8, wherein said beam shaping optics comprises at least one lens configured to reduce the size of the beam of light from said at least one laser that is received by said beam steering system.

Example 11: The illumination system of any of Examples 8-10, wherein said beam shaping optics comprising a focusing lens configured such that the beam from said at least one laser does not overfill a reflector of said beam steering system.

Example 12: The illumination system of any of Examples 8-11, wherein said beam shaping optics comprising a focusing lens configured such that the beam from said at least one laser does not overfill a microelectromechanical system (MEMS) mirror of said beam steering system.

Example 13: The illumination system of any of Examples 8-12, wherein said beam shaping optics is configured such that the beam from said at least one laser fills said homogenizer.

Example 14: The illumination system of any of Examples 8-13, wherein said beam shaping optics comprises one or more prisms.

Example 15: The illumination system of any of Examples 8-14, wherein said beam shaping optics comprises one or more anamorphic prisms.

Example 16: The illumination system of any of Examples 8-15, wherein said beam shaping optics comprises a plurality of prisms.

Example 17: The illumination system of any of Examples 8-16, wherein said beam shaping optics comprises a plurality of anamorphic prisms.

Example 18: The illumination system of any of Examples 8-16, wherein said beam shaping optics comprises a plurality of differently oriented anamorphic prisms.

Example 19: The illumination system of any of Examples 8-17, wherein said beam shaping optics comprises an engineered diffuser.

Example 20: The illumination system of any of Examples 8-17, wherein said beam shaping optics comprises an engineered diffuser configured to diffuse light more in one direction than in another direction.

Example 21: The illumination system of any of Examples 8-17, wherein said beam shaping optics comprises an engineered diffuser configured to diffuse light more in one direction than in another orthogonal direction.

Example 22: The illumination system of any of Examples 8-21, wherein said beam shaping optics are configured to change the shape of the beam cross-section orthogonal to the beam propagation direction.

Example 23: The illumination system of any of Examples 8-21, wherein said beam shaping optics are configured to change the shape of the beam cross-section orthogonal to the beam propagation direction into a more elongated shape.

Example 24: The illumination system of any of Examples 8-21, wherein said beam shaping optics are configured to change the shape of the beam cross-section orthogonal to the beam propagation direction into a more elliptical shape.

Example 25: The illumination system of any of the Examples above, wherein said beam steering system comprises a single MEMS mirror.

Example 26: The illumination system of any of the Examples above, wherein said homogenizer comprises at least one lens array.

Example 27: The illumination system of Example 26, wherein said lens array comprises a plurality of lenslets.

Example 28: The illumination system of Example 26 or 27, wherein said lens array comprises a one-dimensional (1D) array of lenses.

Example 29: The illumination system of any of Examples 26-28, wherein said lens array comprises lenses having a different shape in different directions.

Example 30: The illumination system of any of Examples 26-29, wherein said lens array comprises lenses having positive optical power in one direction and negligible optical power in another direction.

Example 31: The illumination system of any of Examples 26-30, wherein said lens array comprises lenses having different curvature in different directions.

Example 32: The illumination system of any of Examples 26-31, wherein said lens array comprises lenses having curvature in one direction and negligible curvature in another direction.

Example 33: The illumination system of any of Examples 26-32, wherein said lens array comprises a plurality of cylindrical lenses.

Example 34: The illumination system of Example 26 or 27, wherein said lens array comprises a two-dimensional (2D) array of lenses.

Example 35: The illumination system of any of Examples 26, 27 or 34, wherein said lens array comprises lenses having the same shape in different directions.

Example 36: The illumination system of any of Examples 26, 27, 34, or 35, wherein said lens array comprises lenses having the same curvature in different directions.

Example 37: The illumination system of any of Examples 26, 27, or 34-36, wherein said lens array comprises a plurality of spherical lenses.

Example 38: The illumination system of Example 34, wherein said lens array comprises lenses having different shape in different directions.

Example 39: The illumination system of Example 34 or 38, wherein said lens array comprises lenses having different curvature in different directions.

Example 40: The illumination system of Examples 34, 38 or 39, wherein said lens array have different power in different directions.

Example 41: The illumination system of any of Examples 29-32, 35-36, or 38-40, wherein said different directions comprise orthogonal directions.

Example 42: The illumination system of any of Examples 26-41, wherein said at least one lens array comprises a pair of lens arrays separated from each other longitudinally such the light passes through both lens arrays in said pair of lens arrays.

Example 43: The illumination system of any of Examples 26-41, wherein said at least one lens array comprises a pair of lenslet arrays separated from each other longitudinally such the light passes through both lenslet arrays in said pair of lens arrays.

Example 44: The illumination system of any of the Examples above, wherein said homogenizer comprises a fly's eye lens.

Example 45: The illumination system of any of the Examples above, wherein said homogenizer comprises a diffuser.

Example 46: The illumination system of any of the Examples above, wherein said homogenizer comprises an engineered diffuser.

Example 47: The illumination system of any of the Examples above, wherein said homogenizer is configured to spread light out more in one direction than another direction.

Example 48: The illumination system of any of the Examples above, wherein said homogenizer is configured to spread light out more in one direction than another orthogonal direction.

Example 49: The illumination system of any of the Examples above, wherein said homogenizer is configured to provide a beam having an elongate cross-section orthogonal to the direction of propagation, said elongate cross-section narrow in one direction and wide in another direction.

Example 50: The illumination system of any of the Examples above, wherein said homogenizer is configured to provide a beam having an elongate cross-section orthogonal to the direction of propagation, said elongate cross-section narrow in a first direction and wide in a second direction orthogonal to said first direction.

Example 51: The illumination system of any of the Examples above, wherein said homogenizer to produce a line-shaped output of said illumination system.

Example 52: The illumination system of any of the Examples above, further comprising an output lens.

Example 53: The illumination system of Example 52, wherein said output lens comprises an objective.

Example 54: The illumination system of Example 52, wherein said output lens comprises a microscope objective.

Example 55: The illumination system of Example any of said Examples above, wherein said illumination system is configured to produce an output beam having a flat top light distribution at an output.

Example 56: The illumination system of any of said Examples above, wherein said illumination system is configured to produce an output beam having a flat top light distribution and having a line-shaped cross-section at an output.

Example 57: The illumination system of any of said Examples above, further comprising at least one lens disposed between said beams steering system and said homogenizer.

Example 58: The illumination system of any of said Examples above, further comprising at least one collimating lens disposed between said beams steering system and said homogenizer, said at least one collimating lens configured to increase collimation of light incident thereon.

Example 59: The illumination system of any of said Examples above, further comprising at least one diffuser disposed between said beam steering system and said homogenizer.

Example 60: The illumination system of any of said Examples above, further comprising at least one diffuser disposed between said beams steering system and said homogenizer, said at least one diffuser configured to increase the fill of said homogenizer with said light from said beam steering system.

Example 61: The illumination system of any of said Examples above, further comprising a collimating lens and at least one diffuser disposed between said beams steering system and said homogenizer, said at least one diffuser disposed between said collimating lens and said homogenizer.

Example 62: The illumination system of any of said Examples above, wherein said beam steering system is configured to move said beam back and forth at a frequency of from 50 Hz to 10 kHz.

Example 63: The illumination system of any of said Examples above, wherein said beam steering system is configured to move said beam back and forth at a frequency of from 1 kHz to 10 kHz.

Example 64: The illumination system of any of said Examples above, wherein said beam steering system is configured to move said beam back and forth at a frequency of from 500 Hz to 1 kHz.

Example 65: The illumination system of any of said Examples above, wherein said beam steering system is configured to move said beam back and forth at a frequency of from 100 Hz to 1 kHz.

Example 66: The illumination system of any of said Examples above, wherein said beam steering system is configured to move said beam back and forth at a frequency of from 500 Hz to 10 kHz.

Example 67: The illumination system of any of said Examples above, wherein said beam steering system is configured to move said beam back and forth at a frequency of from 100 Hz to 10 kHz.

Example 68: The illumination system of any of said Examples above, wherein said beam steering system is configured to move light in said beam back at a frequency of from 50 Hz to 10 kHz.

Example 69: The illumination system of any of said Examples above, wherein said beam steering system is configured to move light in said beam back and forth at a frequency of from 1 kHz to 10 kHz.

Example 70: The illumination system of any of said Examples above, wherein said beam steering system is configured to move light in said beam back and forth at a frequency of from 500 Hz to 1 kHz.

Example 71: The illumination system of any of said Examples above, wherein said beam steering system is configured to move light in said beam back and forth at a frequency of from 100 Hz to 1 kHz.

Example 72: The illumination system of any of said Examples above, wherein said beam steering system is configured to move light in said beam back and forth at a frequency of from 500 Hz to 10 kHz.

Example 73: The illumination system of any of said Examples above, wherein said beam steering system is configured to move light in said beam back and forth at a frequency of from 100 Hz to 10 kHz.

Example 74: The illumination system of any of said Examples above, wherein said homogenizer comprises a lens array and the beam steering system is configured to move the beam no more than the width of a lens at the lens array.

Example 75: The illumination system of any of said Examples above, wherein said homogenizer comprises a lenslet array and the beam steering system is configured to move the beam no more than the width of a lenslet at the lenslet array.

Example 76: The illumination system of any of said Examples above, wherein said homogenizer comprises a lens array and the beam steering system is configured to move the beam less than the width of a lens at the lens array.

Example 77: The illumination system of any of said Examples above, wherein said homogenizer comprises a lenslet array, and the beam steering system is configured to move the beam less than the width of a lenslet at the lenslet array.

Example 78: The illumination system of any of said Examples above, wherein the beam steering system is configured to move the light of the beam in a first direction, and to dither the light of the beam in a second different direction an amount less than the movement in the first direction.

Example 79: The illumination system of Example 78, wherein said homogenizer comprises a lens array and the beam steering system is configured to move the light of the beam in the first direction less than the width of a lens at the lens array.

Example 80: The illumination system of Example 78, wherein said homogenizer comprises a lenslet array, and the beam steering system is configured to move the light of the beam in the first direction less than the width of a lenslet at the lenslet array.

Example 81: The illumination system of any of said Examples above, wherein beam steering system comprises a reflector oriented at an angle between 43 and 47 degrees with respect to a beam of light from the at least one laser incident thereon.

Example 82: The illumination system of any of said Examples above, wherein beam steering system comprises a reflector oriented at an angle between 44 and 47 degrees with respect to a beam of light from the at least one laser incident thereon.

Example 83: The illumination system of any of said Examples above, wherein beam steering system comprises a reflector oriented at an angle between 44 and 46 degrees with respect to a beam of light from the at least one laser incident thereon.

Example 84: The illumination system of any of said Examples above, configured to illuminate a flow cell.

Example 85: The illumination system of any of said Examples above, wherein said at least one laser comprises a plurality of lasers.

Example 86: The illumination system of any of said Examples above, wherein said at least one laser comprises a plurality of different color lasers.

Example 87: The illumination system of any of said Examples above, further comprising at least one dichroic combiner to receive light form a plurality of different lasers.

Example 88: The illumination system of any of said Examples above, further comprising at least one dichroic combiner to receive light form a plurality of different color lasers.

Example 89: The illumination system of any of said Examples above, wherein the beam steering system is configured to cause said light beam to repeatedly move back and forth.

Example 90: The illumination system of any of said Examples above, wherein the beam steering system is configured to cause the centroid of said light beam to repeatedly move back and forth.

Example 91: The illumination system of any of said Examples above, further comprising a cylindrical lens between said beam steering system and said homogenizer.

Example 92: The illumination system of Example 91, wherein said cylindrical lens between said diffuser and said homogenizer.

Example 93: The illumination system of Example 91 or 92, wherein said diffuser comprises an engineered diffuser.

Example 94: The illumination system of any of Examples 91-93, wherein said engineered diffuser is configured to diffuse light more in one direction than in another direction.

Example 95: The illumination system of any of Examples 91-94, wherein said engineered diffuser is configured to diffuse light more in one direction than in another orthogonal direction.

Example 96: The illumination system of any of Examples 91-95, wherein said engineered diffuser is configured to change the shape of the beam cross-section orthogonal to the beam propagation direction.

Example 97: The illumination system of any of Examples 91-96, wherein said engineered diffuser is configured to change the shape of the beam cross-section orthogonal to the beam propagation direction into a more elongated shape.

Example 98: The illumination system of any of Examples 91-97, wherein said engineered diffuser is configured to change the shape of the beam cross-section orthogonal to the beam propagation direction into a more elliptical shape.

Example 99: The illumination system of any of said Examples above, further comprising an optical fiber disposed in an optical path between said at least one laser and said beam steering system to couple light from said at least one laser to said beam steering system.

Example 100: The illumination system of Example 99, wherein said optical fiber is disposed in an optical path between a dichroic beam combiner and said beam steering system to couple light from said at least one laser that is reflected from and/or transmitted through said dichroic beam combiner to said beam steering system.

Example 101: The illumination system of Example 99 or 100, wherein said optical fiber comprises a rectangular or square core.

Example 102: The illumination system of any of Examples 99-101, further comprising at least one focusing lens disposed in an optical path between said optical fiber and said beam steering system to receive light from said optical fiber and focus said light directed to said beam steering system.

Example 103: The illumination system of any of any of said Examples above, further comprising an optical fiber disposed in an optical path between said beam steering system and said optical homogenizer to couple light from said at least one laser to said optical homogenizer.

Example 104: The illumination system of Example 103, wherein said optical fiber comprises a rectangular or square core.

Example 105: The illumination system of Example 103 or 104, further comprising at least one collimating lens disposed in an optical path between said optical fiber and said optical homogenizer to receive light from said optical fiber and increase collimation of light from said optical fiber that is incident on said optical homogenizer.

A wide variety of other variations, for example, to any of the embodiments or implementation disclosed herein, are possible. Components can be added, removed, and/or rearranged. Similarly, in any method or process disclosed herein, steps or operations can be added, removed, and/or rearranged. For example, although optical fiber is shown in systems including a microlens array such as a cylindrical lens array the optical fiber can be included in any of the systems described herein including systems that include different types of homogenizers including systems with diffusers, engineered diffusers, combination of diffusers and microlens arrays (e.g., cylindrical lens arrays), pairs of cylindrical lens arrays, both those disclosed herein as well as in systems having other configurations and optical components. Also, as discussed above, the MEMS mirror can be scanned, for example along one direction such as the direction where the cross-section of the beam orthogonal to the beam direction is the longest at the sample or sample plane (such as in the y-direction) and/or may be scanned the fastest along this direction and/or the most (e.g., largest distance or over largest angle) in this direction. In some implementations, this one direction is the only direction that the MEMS mirror tilts and/or scans. For example, MEMS mirrors that scan in one direction as opposed to two directions may be configured to scan faster. In some implementations, the objective lens is disposed with respect to the microlens array or cylindrical lens array and the sample or sample plane is located with respect to the objective lens such that the objective lens transforms angles of light exiting said microlens array or cylindrical lens array into position along said sample or sample plane. For example, the sample or sample plane may be the Fourier transform plane of the objective lens in some implementations. Other configurations are possible.

Configurations other than those described herein are possible. The structures, devices, systems, and methods may include additional components, features, and steps and any of these components, features, and steps may be excluded and may or may not be replaced with others. The arrangements may be different. Reference throughout this specification to "some embodiments," "certain embodiments," or "an embodiment" means that a particular feature, structure or characteristic described in connection with the embodiment is included in at least some embodiments. Thus, appearances of the phrases "in some embodiments" or "in an embodiment" in various places throughout this specification are not necessarily all referring to the same embodiment and may refer to one or more of the same or different embodiments. Furthermore, the particular features, structures or characteristics may be combined in any suitable manner, as would be apparent to one of ordinary skill in the art from this disclosure, in one or more embodiments.

As used in this application, the terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Similarly, it should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Rather, inventive aspects lie in a combination of fewer than all features of any single foregoing disclosed embodiment.

Some examples of some of certain embodiments disclosed and/or described herein are listed below. These examples of various embodiments are not meant to be limiting, but rather illustrate some of the embodiments of systems and methods that that are disclosed by this description and accompanying figures. Such embodiments can include:

Although the inventions presented herein have been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. Thus, it is intended that the scope of the inventions herein disclosed should not be limited by the particular embodiments described above.

What is claimed is:

1. An illumination system, comprising:
   at least one laser configured to emit light;
   a microelectromechanical system (MEMS) mirror positioned to receive light emitted from the at least one laser, the MEMS mirror driven to provide a moving light beam moving in a first angular range $ar_1$ along a first direction and at a certain frequency $f_1$;
   a collimating optical element configured to receive the moving light beam from the MEMS mirror and output a light beam that is more collimated than the light received from the MEMS mirror;
   a cylindrical lens array (CLA) positioned to receive the light beam from the collimating optical element and configured to alter the distribution of light received from the collimating optical element and output a substantially flat-top distribution of light; and an objective lens system positioned to receive the light from the CLA and propagate an output beam to a sample plane, the output beam being a flat top line beam.

2. The illumination system of claim 1, wherein the moving light beam from the MEMS mirror moves back and forth in the angular range $ar_1$.

3. The illumination system of claim 1, wherein CLA includes a one dimensional array of cylindrical lenses.

4. The illumination system of claim 3, wherein the angular range $ar_1$ of the moving light beam output from the MEMS mirror moves a centroid of the light beam received at the CLA across a surface of the CLA a distance that is less than or equal to a dimension of a lens of the CLA.

5. The illumination system of claim 4, wherein the dimension is the diameter of a lens of the CLA.

6. The illumination system of claim 4, wherein the distance is less than or equal to 10% of a dimension of a lens of the CLA.

7. The illumination system of claim 4, wherein the distance is less than or equal to 50% of a dimension of a lens of the CLA.

8. The illumination system of claim 4, wherein the distance is less than or equal to 90% of a dimension of a lens of the CLA.

9. The illumination system of claim 1, wherein the MEMS mirror is driven to provide the moving light beam to move in a second direction orthogonal to the first direction and in a second angular range $ar_2$.

10. The illumination system of claim 1, wherein second angular range $ar_2$ is less than the first angular range $ar_1$.

11. The illumination system of claim 1, wherein the at least one laser comprises two or more lasers, and wherein the illumination system further comprises a beam combiner aligned to receive light from the two or more lasers and configured to form a combined light beam which propagates to the MEMS mirror.

12. The illumination system of claim 11, wherein the beam combiner comprises one or more dichroic mirrors.

13. The illumination system of claim 1, further comprising beam conditioning optics positioned to receive light from one or more lasers and structured to provide an output beam.

14. The illumination system of claim 1, further comprising a focusing optical element configured to receive light from the at least one laser and propagate a focused light beam towards the MEMS mirror.

15. The illumination system of claim 14, wherein the focusing optical element has a focal length FL and the MEMS mirror is positioned at a distance d from the focusing optical element, where d is less than the focal length FL.

16. The illumination system of claim 14, wherein focusing optical element has a focal length FL and the MEMS mirror is positioned at a distance d from the focusing optical element, where d is greater than the focal length FL.

17. The illumination system of claim 14, wherein focusing optical element has a focal length FL and the MEMS mirror is positioned at a distance d from the focusing optical element, where d is equal to the focal length FL.

18. The illumination system of claim 1, wherein the angular range $ar_1$ is less than 2 degrees.

19. The illumination system of claim 1, wherein the frequency $f_1$ is between 0.1 and 50 kHz.

20. The illumination system of claim 1, wherein the frequency $f_1$ is between 50 Hz and 10 kHz.

21. The illumination system of claim 1, further comprising a diffuser positioned between the collimating optical element and the CLA.

22. The illumination system of claim 21, wherein the diffuser comprises an engineered diffuser.

23. The illumination system of claim 1, further comprising a diffuser in a light path between the at least one laser and the CLA, wherein the diffuser comprises an engineered diffuser.

24. An illumination system, comprising:
at least one laser configured to emit light;
a mirror system positioned to receive light emitted from the at least one laser, the mirror system driven to provide a moving light beam moving in a first angular range $ar_1$ along a first direction and at a certain frequency $f_1$;
a collimating optical element configured to receive the moving light beam from the mirror system and output a light beam that is more collimated than the light received from the mirror system;
a cylindrical lens array (CLA) positioned to receive the light beam from the collimating optical element and configured to alter the distribution of light received from the collimating optical element and output a substantially flat-top distribution of light; and
an objective lens system positioned to receive the light from the CLA and propagate an output beam to a sample plane, the output beam being a flat top line beam.

25. The illumination system of claim 24, wherein the mirror system comprises a mirror galvanometer.

26. The illumination system of claim 24, wherein the mirror system is driven to provide the moving light beam moving in a second direction orthogonal to the first direction and in a second angular range $ar_2$.

27. A method of illuminating a target, the method comprising:
outputting a light beam from at least one laser;
receiving the light beam at a MEMS mirror positioned to receive the light from the laser, and driving the MEMS mirror to provide a moving light beam moving in a certain angular range $ar_1$ and at a certain frequency $f_1$;
receiving the moving light beam from the MEMS mirror at a collimating optical element and output collimated light;
receiving the collimated light at a cylindrical lens array (CLA) which forms the collimated light into a flat top line beam; and
propagating the flat top line beam to a target.

28. The method of claim 27, wherein the target comprises a flow cell.

29. The method of claim 27, further comprising driving the MEMS mirror such that the moving light beam has motion in a first direction and a second direction that is orthogonal to the first direction.

30. The method of claim 29, wherein the motion of the moving light beam in the first direction is larger than the motion in the second direction.

* * * * *